US012069944B2

(12) United States Patent
Lee et al.

(10) Patent No.: US 12,069,944 B2
(45) Date of Patent: Aug. 20, 2024

(54) ORGANIC LIGHT EMITTING DIODE

(71) Applicant: LG CHEM, LTD., Seoul (KR)

(72) Inventors: Sung Jae Lee, Daejeon (KR); Sung Kil Hong, Daejeon (KR); Yongbum Cha, Daejeon (KR); Woo Jin Cho, Daejeon (KR); Joo Yong Yoon, Daejeon (KR); Hyeon Jin Mun, Daejeon (KR)

(73) Assignee: LG Chem, Ltd., Seoul (KR)

( * ) Notice: Subject to any disclaimer, the term of this patent is extended or adjusted under 35 U.S.C. 154(b) by 658 days.

(21) Appl. No.: 17/294,370

(22) PCT Filed: Jan. 14, 2020

(86) PCT No.: PCT/KR2020/000672

§ 371 (c)(1),
(2) Date: May 14, 2021

(87) PCT Pub. No.: WO2020/149609

PCT Pub. Date: Jul. 23, 2020

(65) Prior Publication Data

US 2022/0029101 A1 Jan. 27, 2022

(30) Foreign Application Priority Data

Jan. 14, 2019 (KR) ........................ 10-2019-0004682

(51) Int. Cl.
*H01L 51/00* (2006.01)
*H10K 50/15* (2023.01)
(Continued)

(52) U.S. Cl.
CPC ........... *H10K 85/636* (2023.02); *H10K 85/00* (2023.02); *H10K 85/633* (2023.02); *H10K 50/15* (2023.02);
(Continued)

(58) Field of Classification Search
None
See application file for complete search history.

(56) References Cited

U.S. PATENT DOCUMENTS 8,395,143 B2 3/2013 Lee et al.
8,940,412 B2 1/2015 Takashima et al.
(Continued)

FOREIGN PATENT DOCUMENTS

KR 10-2011-0114545 A 10/2011
KR 10-1127264 B1 3/2012
(Continued)

*Primary Examiner* — Tae H Yoon
(74) *Attorney, Agent, or Firm* — Bryan Cave Leighton Paisner LLP

(57) ABSTRACT

An organic light emitting device including a first electrode; a second electrode provided to face the first electrode; and an organic material layer having one, two or more layers provided between the first electrode and the second electrode, wherein the organic material layer includes a first organic material layer including a compound of Chemical Formula 1 and a second organic material layer including a compound of Chemical Formula 2.

[Chemical Formula 1]

(Continued)

-continued

[Chemical Formula 2]

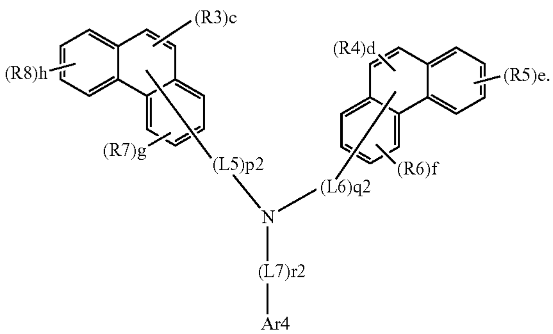

6 Claims, 1 Drawing Sheet

(51) Int. Cl.

| | |
|---|---|
| ***H10K 85/00*** | (2023.01) |
| ***H10K 85/60*** | (2023.01) |
| *H10K 50/17* | (2023.01) |
| *H10K 50/18* | (2023.01) |

(52) U.S. Cl.
CPC ............. *H10K 50/17* (2023.02); *H10K 50/18* (2023.02); *H10K 85/626* (2023.02); *H10K 85/6572* (2023.02)

(56) References Cited

U.S. PATENT DOCUMENTS

| | | | | |
|---|---|---|---|---|
| 10,326,081 | B2 | 6/2019 | Cho | |
| 10,923,663 | B2 | 2/2021 | Takada et al. | |
| 11,024,805 | B2 * | 6/2021 | Lee | H10K 85/631 |
| 2017/0317290 | A1 | 11/2017 | Lee et al. | |
| 2018/0093962 | A1 * | 4/2018 | Choi | H10K 50/15 |
| 2018/0219157 | A1 * | 8/2018 | Yamaki | H10K 85/633 |
| 2019/0252613 | A1 | 8/2019 | Song et al. | |

FOREIGN PATENT DOCUMENTS

| | | | |
|---|---|---|---|
| KR | 10-1389527 | B1 | 4/2014 |
| KR | 10-2014-0089221 | A | 7/2014 |
| KR | 10-2016-0048575 | A | 5/2016 |
| KR | 10-2016-0091198 | A | 8/2016 |
| KR | 10-2018-0044799 | A | 5/2018 |
| KR | 10-2018-0051356 | A | 5/2018 |
| KR | 101857632 | B1 | 5/2018 |
| KR | 10-2018-0066855 | A | 6/2018 |

* cited by examiner

【FIG. 1】
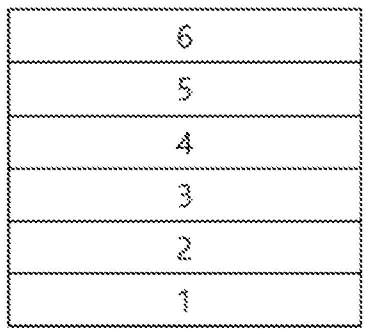
【FIG. 2】
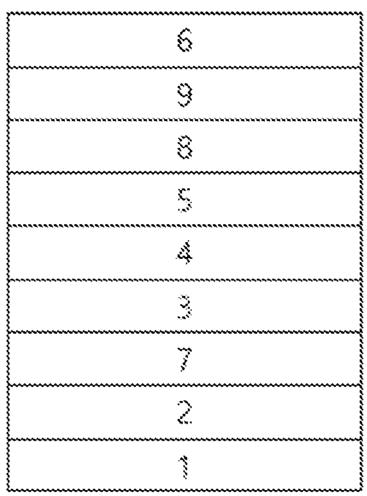

ORGANIC LIGHT EMITTING DIODE

CROSS-REFERENCE TO RELATED APPLICATION(S)

This application is a National Stage Application of International Application No. PCT/KR2020/000672 filed on Jan. 14, 2020, which claims priority to Korean Patent Application No. 10-2019-0004682, filed on Jan. 14, 2019, the disclosures of which are incorporated herein by reference in their entireties.

FIELD OF DISCLOSURE

The present specification relates to an organic light emitting device.

BACKGROUND

An organic light emission phenomenon generally refers to a phenomenon converting electrical energy to light energy using an organic material. An organic light emitting device using an organic light emission phenomenon normally has a structure including an anode, a cathode, and an organic material layer therebetween. Herein, the organic material layer is often formed in a multilayer structure formed with different materials in order to increase efficiency and stability of the organic light emitting device, and for example, may be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

SUMMARY

The present specification is directed to providing an organic light emitting device.

One embodiment of the present specification provides an organic light emitting device including a first electrode; a second electrode provided to face the first electrode; and an organic material layer having one, two or more layers provided between the first electrode and the second electrode, wherein the organic material layer includes a first organic material layer including a compound of the following Chemical Formula 1 and a second organic material layer including a compound of the following Chemical Formula 2.

[Chemical Formula 1]

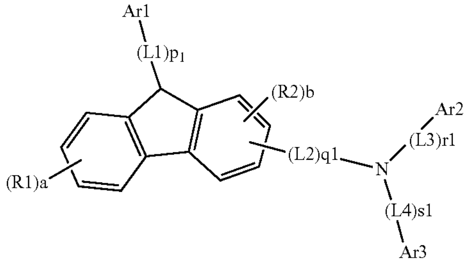

-continued

[Chemical Formula 2]

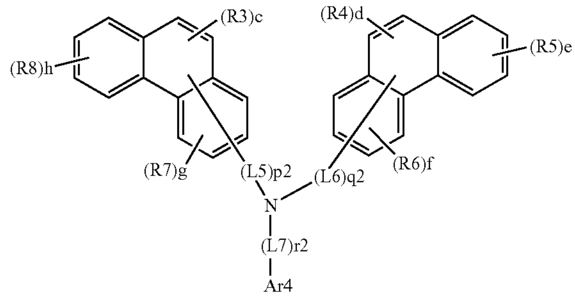

In Chemical Formulae 1 and 2,

Ar1 to Ar4 are the same as or different from each other, and each independently hydrogen; deuterium; a nitrile group; a halogen group; a substituted or unsubstituted alkyl group; a substituted or unsubstituted aryl group; a substituted or unsubstituted arylalkyl group; a substituted or unsubstituted arylalkenyl group; or a substituted or unsubstituted heteroaryl group, R1 is hydrogen; a nitrile group; a halogen group; a substituted or unsubstituted alkyl group; a substituted or unsubstituted silyl group; an aryl group, a substituted or unsubstituted arylalkyl group; a substituted or unsubstituted arylalkenyl group; or a substituted or unsubstituted heteroaryl group, R2 to R8 are the same as or different from each other, and each independently hydrogen; deuterium, a nitrile group; a halogen group; a substituted or unsubstituted alkyl group; a substituted or unsubstituted silyl group; a substituted or unsubstituted aryl group; a substituted or unsubstituted arylalkyl group; a substituted or unsubstituted arylalkenyl group; or a substituted or unsubstituted heteroaryl group, L1 to L7 are the same as or different from each other, and each independently a direct bond; a substituted or unsubstituted alkylene group; a substituted or unsubstituted arylene group; or a substituted or unsubstituted heteroarylene group, p1, q1, r1, s1, p2, q2 and r2 are each an integer of 0 to 2, when p1, q1, r1, s1, p2, q2 and r2 are 2, substituents in the parentheses are the same as or different from each other, a and e to h are an integer of 0 to 4, b is an integer of 0 to 3, c and d are an integer of 0 to 2, $d+f \leq 5$, $c+g \leq 5$, and when a to f are 2 or greater, substituents in the parentheses are the same as or different from each other.

Advantageous Effects

By using a compound represented by Chemical Formula 1 as a hole transfer layer and using a compound represented by Chemical Formula 2 as an electron blocking layer, an organic light emitting device according to one embodiment of the present specification is capable of controlling HOMO and LUMO energy levels of the compounds and thereby controlling an energy barrier with each organic material layer. Through this, effects of low voltage, high efficiency and long lifetime can be obtained in the organic light emitting device according to one embodiment of the present specification.

DESCRIPTION OF DRAWINGS

FIG. 1 illustrates an organic light emitting device according to one embodiment of the present specification.

FIG. 2 illustrates an organic light emitting device according to another embodiment of the present specification.

DESCRIPTION OF REFERENCE NUMERALS

1: Substrate
2: First Electrode
3: Hole Transfer Layer
4: Electron Blocking Layer
5: Light Emitting Layer
6: Second Electrode
7: Hole Injection Layer
8: Hole Blocking Layer
9: Electron Injection and Transfer Layer

DETAILED DESCRIPTION

Hereinafter, the present specification will be described in more detail.

One embodiment of the present specification provides an organic light emitting device including a first electrode; a second electrode provided to face the first electrode; and an organic material layer having one, two or more layers provided between the first electrode and the second electrode, wherein the organic material layer includes a first organic material layer including a compound of Chemical Formula 1 and a second organic material layer including a compound of Chemical Formula 2.

In the present application, a description of a certain part "including" certain constituents means capable of further including other constituents, and does not exclude other constituents unless particularly stated on the contrary.

In the present application, a description of a certain member being placed "on" another member includes not only a case of the one member in contact with the another member but a case of still another member being present between the two members.

Examples of substituents in the present specification are described below, however, the substituents are not limited thereto.

The term "substitution" means a hydrogen atom bonding to a carbon atom of a compound being changed to another substituent. The position of substitution is not limited as long as it is a position at which the hydrogen atom is substituted, that is, a position at which a substituent can substitute, and when two or more substituents substitute, the two or more substituents may be the same as or different from each other.

In the present specification, the term "substituted or unsubstituted" means being substituted with one, two or more substituents selected from the group consisting of deuterium; a nitrile group; a substituted or unsubstituted alkyl group; a substituted or unsubstituted cycloalkyl group; a substituted or unsubstituted silyl group; a substituted or unsubstituted aryl group; and a substituted or unsubstituted heterocyclic group, or being substituted with a substituent linking two or more substituents among the substituents illustrated above, or having no substituents. For example, "a substituent linking two or more substituents" may include an aryl group substituted with an aryl group, an aryl group substituted with a heteroaryl group, a heterocyclic group substituted with an aryl group, an aryl group substituted with an alkyl group, and the like.

In the present specification, the alkyl group may be linear or branched, and although not particularly limited thereto, the number of carbon atoms is preferably from 1 to 30. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 4-methylhexyl, 5-methylhexyl and the like, but are not limited thereto.

In the present specification, the cycloalkyl group is not particularly limited, but preferably has 3 to 30 carbon atoms, and more preferably has 3 to 20 carbon atoms. Specific examples thereof may include a cyclopropyl group; a cyclobutyl group; a cyclopentyl group; a 3-methylcyclopentyl group; a 2,3-dimethylcyclopentyl group; a cyclohexyl group; a 3-methylcyclohexyl group; a 4-methylcyclohexyl group; a 2,3-dimethylcyclohexyl group; a 3,4,5-trimethylcyclohexyl group; a 4-tert-butylcyclohexyl group; a cycloheptyl group; a cyclooctyl group and the like, but are not limited thereto.

In the present specification, the aryl group is not particularly limited, but preferably has 6 to 30 carbon atoms, and the aryl group may be monocyclic or polycyclic.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthracenyl group, a phenanthryl group, triphenylene group, a pyrenyl group, a phenalenyl group, a perylenyl group, a chrysenyl group, a fluorenyl group and the like, but are not limited thereto.

In the present specification, the fluorenyl group may be substituted, and adjacent groups may bond to each other to form a ring.

When the fluorenyl group is substituted,

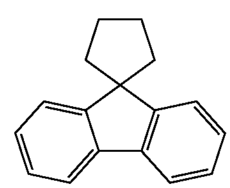,
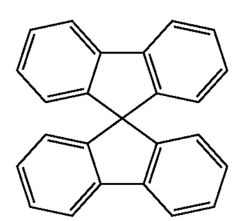,
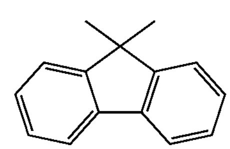,
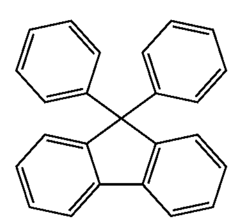,

-continued

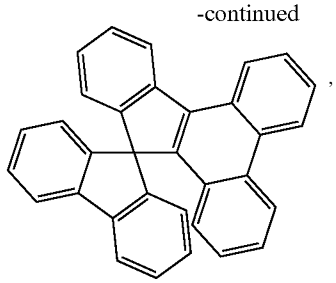

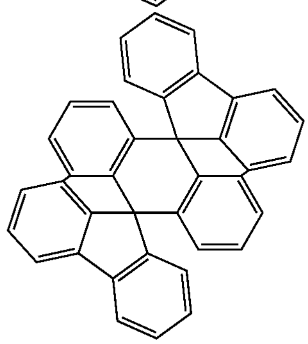

and the like may be included. However, the structure is not limited thereto.

In the present specification, the heteroaryl group is a group including one or more atoms that are not carbon, that is, heteroatoms, and specifically, the heteroatom may include one or more atoms selected from the group consisting of O, N, Se, S and the like. The number of carbon atoms of the heteroaryl group is not particularly limited, but is preferably from 2 to 30, and the heteroaryl group may be monocyclic or polycyclic. Examples of the heterocyclic group may include a thiophene group, a furanyl group, a pyrrole group, an imidazolyl group, a triazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidinyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group, an isoxazolyl group, a thiadiazolyl group, a phenothiazinyl group, a dibenzofuranyl group and the like, but are not limited thereto.

In the present specification, the arylene group has the same definition as the aryl group except for being divalent.

In the present specification, the heteroarylene group has the same definition as the heteroaryl group except for being divalent.

In the present specification, the hydrocarbon ring has the same definition as the aryl group or the cycloalkyl group except for being not monovalent.

In the present specification, R2 to R8 are the same as or different from each other, and each independently hydrogen; deuterium; a nitrile group; a halogen group; a substituted or unsubstituted alkyl group having 1 to 10 carbon atoms; a silyl group unsubstituted or substituted with an alkyl group having 1 to 10 carbon atoms; a substituted or unsubstituted aryl group having 6 to 30 carbon atoms; an arylalkyl group having 6 to 30 carbon atoms; or a substituted or unsubstituted heteroaryl group having 6 to 30 carbon atoms.

In the present specification, R2 to R8 are the same as or different from each other, and each independently hydrogen; deuterium; an aryl group having 6 to 30 carbon atoms unsubstituted or substituted with an arylalkyl group having 6 to 30 carbon atoms or an alkyl group having 1 to 10 carbon atoms; or a heteroaryl group having 3 to 30 carbon atoms.

In the present specification, R2 to R8 are the same as or different from each other, and each independently hydrogen; deuterium; a phenyl group unsubstituted or substituted with an aryl group having 6 to 30 carbon atoms; a naphthyl group unsubstituted or substituted with an aryl group having 6 to 30 carbon atoms; a biphenyl group unsubstituted or substituted with an aryl group having 6 to 30 carbon atoms; a terphenyl group unsubstituted or substituted with an aryl group having 6 to 30 carbon atoms; an anthracene group unsubstituted or substituted with an aryl group having 6 to 30 carbon atoms; a phenanthrene group unsubstituted or substituted with an aryl group having 6 to 30 carbon atoms; a triphenylene group unsubstituted or substituted with an aryl group having 6 to 30 carbon atoms; a fluorene group unsubstituted or substituted with an aryl group having 6 to 30 carbon atoms or an alkyl group having 1 to 10 carbon atoms; a spirobifluorene group unsubstituted or substituted with an aryl group having 6 to 30 carbon atoms; a carbazole group unsubstituted or substituted with an aryl group having 6 to 30 carbon atoms; a dibenzofuran group unsubstituted or substituted with an aryl group having 6 to 30 carbon atoms; or a dibenzothiophene group unsubstituted or substituted with an aryl group having 6 to 30 carbon atoms.

In the present specification, R2 to R8 are the same as or different from each other, and each independently hydrogen; deuterium; a phenyl group unsubstituted or substituted with an aryl group having 6 to 30 carbon atoms; a biphenyl group unsubstituted or substituted with an aryl group having 6 to 30 carbon atoms; a naphthyl group unsubstituted or substituted with an aryl group having 6 to 30 carbon atoms; a terphenyl group; a quaterphenyl group; a phenanthrene group; a triphenylene group; a spirobifluorene group; a fluorene group unsubstituted or substituted with an aryl group having 6 to 30 carbon atoms or an alkyl group having 1 to 10 carbon atoms; a carbazole group unsubstituted or substituted with an aryl group having 6 to 30 carbon atoms; a dibenzofuran group; or a dibenzothiophene group.

In the present specification, R2 to R8 are the same as or different from each other, and each independently any one selected from the following chemical structures.

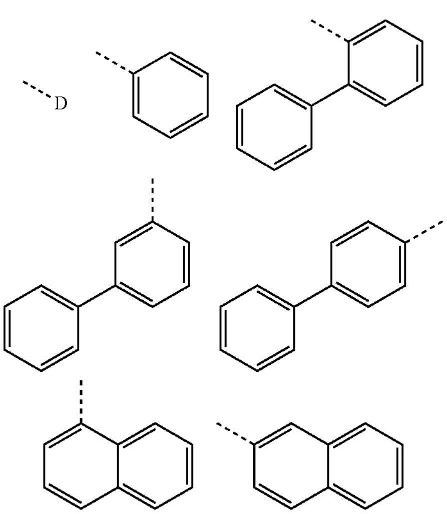

-continued
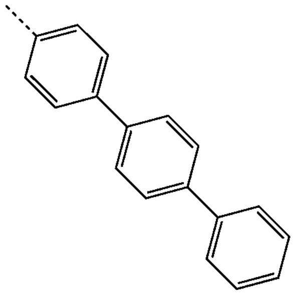
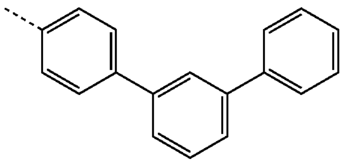
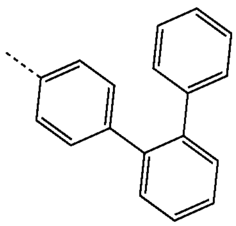
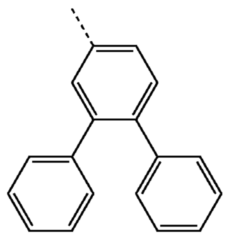
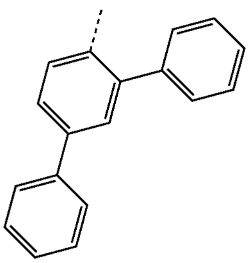
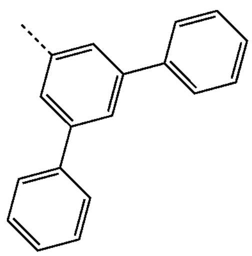
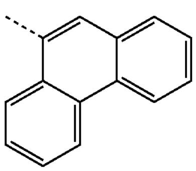
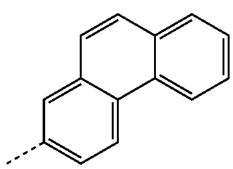
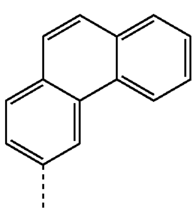
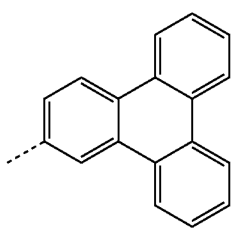
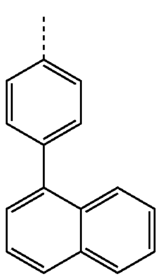
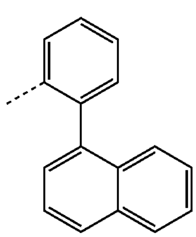
-continued
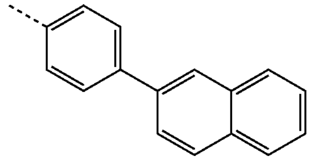
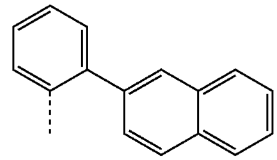
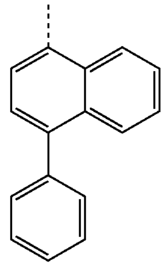
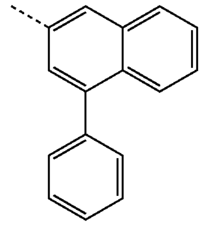
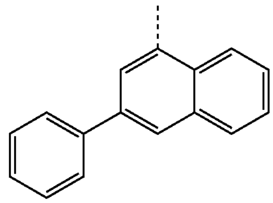
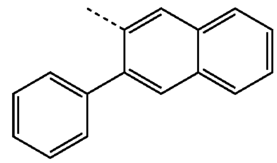
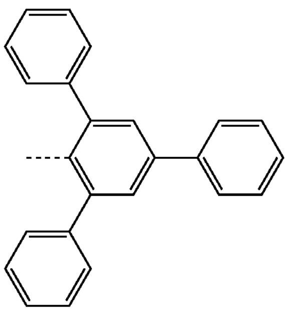
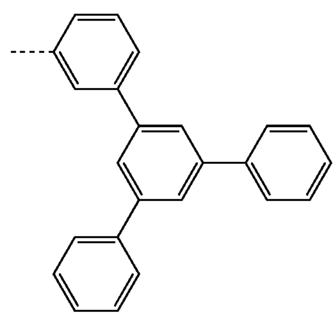
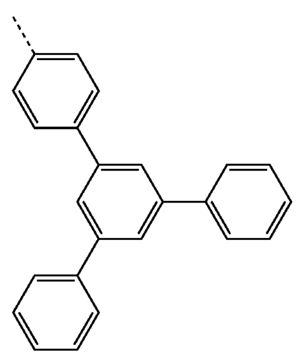

-continued

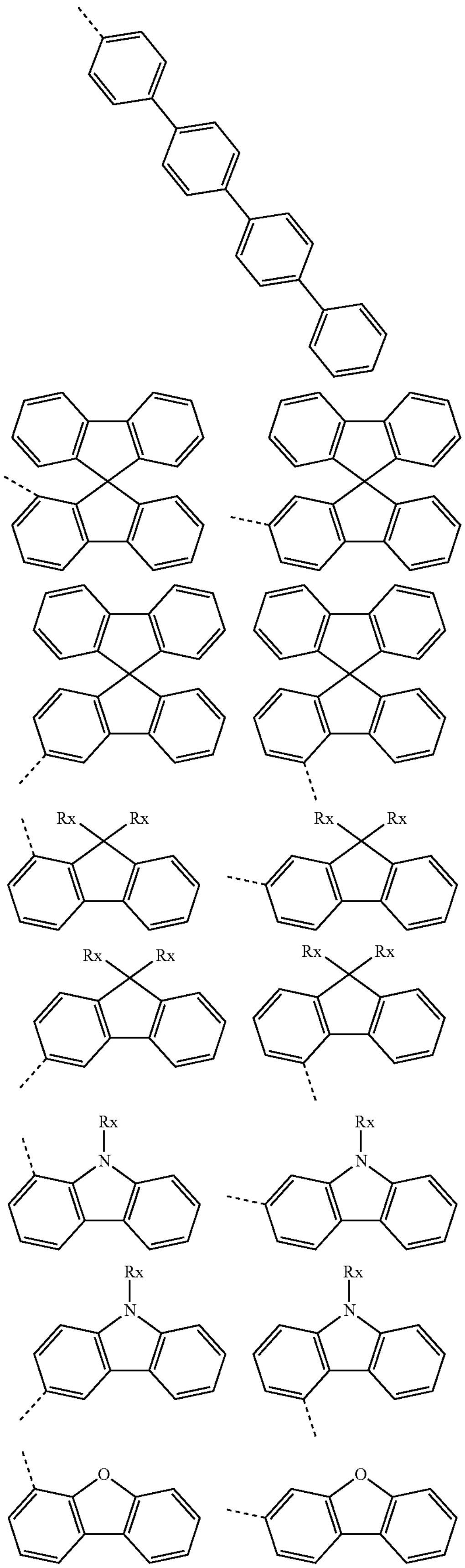

-continued

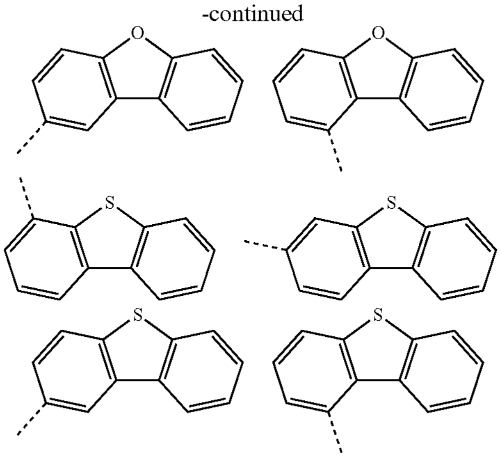

The dotted line means a bond to the core.

Rxs are the same as or different from each other, and are each deuterium; a nitrile group; a substituted or unsubstituted alkyl group; a substituted or unsubstituted aryl group; or a substituted or unsubstituted heteroaryl group.

In the present specification, R2 is hydrogen.

In the present specification, R3 to R8 are the same as or different from each other, and each independently hydrogen; or a substituted or unsubstituted aryl group having 6 to 30 carbon atoms.

In the present specification, R3 to R8 are the same as or different from each other, and each independently hydrogen; or an aryl group having 6 to 30 carbon atoms unsubstituted or substituted with alkyl group having 1 to 10 carbon atoms, a phenyl group unsubstituted or substituted with an aryl group having 6 to 30 carbon atoms, a biphenyl group unsubstituted or substituted with an aryl group having 6 to 30 carbon atoms, or a naphthyl group unsubstituted or substituted with an aryl group having 6 to 30 carbon atoms.

In the present specification, R3 to R8 are the same as or different from each other, and each independently hydrogen; a phenyl group; a biphenyl group; or a naphthyl group.

In the present specification, R3 to R8 are the same as or different from each other, and each independently hydrogen or a phenyl group.

In the present specification, R1 is hydrogen; a nitrile group; a halogen group; a substituted or unsubstituted alkyl group having 1 to 10 carbon atoms; a substituted or unsubstituted silyl group; an aryl group having 6 to 30 carbon atoms; or a substituted or unsubstituted heteroaryl group having 3 to 30 carbon atoms.

In the present specification, R1 is hydrogen; an aryl group having 6 to 30 carbon atoms; or a heteroaryl group having 3 to 30 carbon atoms.

In the present specification, R1 is hydrogen; an aryl group having 6 to 20 carbon atoms; or a heteroaryl group having 3 to 20 carbon atoms.

In the present specification, R1 is hydrogen; an aryl group having 6 to 15 carbon atoms; or a heteroaryl group having 3 to 15 carbon atoms.

In the present specification, R1 is hydrogen.

In the present specification, when R1 is hydrogen, effects of low voltage, high efficiency and long lifetime are obtained compared to when substituted with other substituents such as deuterium or a substituted aryl group.

In the present specification, Ar1 to Ar4 are the same as or different from each other, and each independently hydrogen; deuterium; a nitrile group; a halogen group; a substituted or unsubstituted alkyl group having 1 to 10 carbon atoms; a substituted or unsubstituted aryl group having 6 to 30 carbon atoms; a substituted or unsubstituted arylalkyl group having 6 to 30 carbon atoms; a substituted or unsubstituted arylalkenyl group having 6 to 30 carbon atoms; or a substituted or unsubstituted heteroaryl group having 3 to 30 carbon atoms.

In the present specification, An is a substituted or unsubstituted aryl group having 6 to 30 carbon atoms; a substituted or unsubstituted arylalkyl group having 6 to 30 carbon atoms; a substituted or unsubstituted arylalkenyl group having 6 to 30 carbon atoms; or a substituted or unsubstituted heteroaryl group having 3 to 30 carbon atoms.

In the present specification, An is a substituted or unsubstituted aryl group having 6 to 30 carbon atoms.

In the present specification, An is a phenyl group; a naphthyl group; a biphenyl group; a terphenyl group; an anthracene group; a phenanthrene group; a triphenylene group; a fluorene group; or a pyrene group, wherein the phenyl group, the naphthyl group, the biphenyl group, the terphenyl group, the anthracene group, the phenanthrene group, the triphenylene group, the fluorene group or the pyrene group is unsubstituted or substituted with deuterium, a nitrile group, a halogen group, an amine group, a silyl group, a phosphine oxide group, an alkyl group, an aryl group or a heteroaryl group.

In the present specification, An is a phenyl group; a naphthyl group; or a biphenyl group, and the phenyl group, the naphthyl group or the biphenyl group is unsubstituted or substituted with deuterium, a nitrile group, a halogen group, an amine group, a silyl group, a phosphine oxide group, an alkyl group, an aryl group or a heteroaryl group.

In the present specification, An is a phenyl group; a naphthyl group; or a biphenyl group, and the phenyl group, the naphthyl group or the biphenyl group is unsubstituted or substituted with deuterium, a halogen group, an alkyl group having 1 to 10 carbon atoms, an aryl group having 6 to 30 carbon atoms or a heteroaryl group having 3 to 30 carbon atoms.

In the present specification, An is a phenyl group; a naphthyl group; or a biphenyl group, and the phenyl group, the naphthyl group or the biphenyl group is unsubstituted or substituted with deuterium, a halogen group, a methyl group, an ethyl group, a propyl group, a butyl group, a pentyl group, a phenyl group, a naphthyl group, a biphenyl group, an anthracene group, a tert-butyl group or a carbazole group.

In the present specification, An is a phenyl group; a naphthyl group; or a biphenyl group.

In the present specification, Ar2 and Ar3 are the same as or different from each other, and each independently hydrogen; deuterium; a nitrile group; a halogen group; a substituted or unsubstituted alkyl group having 1 to 10 carbon atoms; a substituted or unsubstituted aryl group having 6 to 30 carbon atoms; or a substituted or unsubstituted heteroaryl group having 3 to 30 carbon atoms.

In the present specification, Ar2 and Ar3 are the same as or different from each other, and each independently a substituted or unsubstituted alkyl group having 1 to 10 carbon atoms; a substituted or unsubstituted aryl group having 6 to 30 carbon atoms; or a substituted or unsubstituted heteroaryl group having 3 to 30 carbon atoms.

In the present specification, Ar2 and Ar3 are the same as or different from each other, and each independently a substituted or unsubstituted aryl group having 6 to 30 carbon atoms; or a substituted or unsubstituted heteroaryl group having 3 to 30 carbon atoms.

In the present specification, Ar2 and Ar3 are the same as or different from each other, and each independently a substituted or unsubstituted aryl group having 6 to 20 carbon atoms; or a substituted or unsubstituted heteroaryl group having 3 to 20 carbon atoms.

In the present specification, Ar2 and Ar3 are the same as or different from each other, and each independently a substituted or unsubstituted aryl group having 6 to 15 carbon atoms; or a substituted or unsubstituted heteroaryl group having 3 to 15 carbon atoms.

In the present specification, Ar2 and Ar3 are the same as or different from each other, and each independently a phenyl group; a naphthyl group; a biphenyl group; a terphenyl group; an anthracene group; a phenanthrene group; a triphenylene group; a fluorene group; a spirobifluorene group; or a pyrene group, wherein the phenyl group, the naphthyl group, the biphenyl group, the terphenyl group, the anthracene group, the phenanthrene group, the triphenylene group, the fluorene group, the spirobifluorene group or the pyrene group is unsubstituted or substituted with deuterium, a nitrile group, a halogen group, an amine group, a silyl group, a phosphine oxide group, an alkyl group, an aryl group or a heteroaryl group.

In the present specification, Ar2 and Ar3 are the same as or different from each other, and each independently a phenyl group; a naphthyl group; a biphenyl group; a terphenyl group; a phenanthrene group; a triphenylene group; a fluorene group; or a spirobifluorene group, wherein the phenyl group, the naphthyl group, the biphenyl group, the terphenyl group, the phenanthrene group, the triphenylene group, the fluorene group or the spirobifluorene group is unsubstituted or substituted with deuterium, a nitrile group, a halogen group, an amine group, a silyl group, a phosphine oxide group, an alkyl group, an aryl group or a heteroaryl group.

In the present specification, Ar2 and Ar3 are the same as or different from each other, and each independently a phenyl group; a naphthyl group; a biphenyl group; a terphenyl group; a phenanthrene group; a triphenylene group; a fluorene group; or a spirobifluorene group, wherein the phenyl group, the naphthyl group, the biphenyl group, the terphenyl group, the phenanthrene group, the triphenylene group, the fluorene group or the spirobifluorene group is unsubstituted or substituted with deuterium, a halogen group, a methyl group, an ethyl group, a propyl group, a butyl group, a pentyl group, a phenyl group, a naphthyl group, a biphenyl group, an anthracene group, a tert-butyl group or a carbazole group.

In the present specification, Ar2 and Ar3 are the same as or different from each other, and each independently a carbazole group; a dibenzofuran group; or a dibenzothiophene group, wherein the carbazole group, the dibenzofuran group or the dibenzothiophene group is unsubstituted or substituted with a methyl group, an ethyl group, a propyl group, a butyl group, a phenyl group, a biphenyl group or a naphthyl group.

In the present specification, Ar2 and Ar3 are the same as or different from each other, and each independently a phenyl group; a naphthyl group; a biphenyl group; a terphenyl group; a triphenylene group; a dimethylfluorene group; a diphenylfluorene group; a phenanthrene group; a spirobifluorene group; a carbazole group unsubstituted or substituted with a phenyl group; a dibenzofuran group; or a dibenzothiophene group.

In the present specification, Ar4 is a substituted or unsubstituted alkyl group having 1 to 10 carbon atoms; a substituted or unsubstituted aryl group having 6 to 30 carbon atoms; or a substituted or unsubstituted heteroaryl group having 3 to 30 carbon atoms.

In the present specification, Ar4 is a substituted or unsubstituted aryl group having 6 to 30 carbon atoms; or a substituted or unsubstituted heteroaryl group having 3 to 30 carbon atoms.

In the present specification, Ar4 is a substituted or unsubstituted aryl group having 6 to 20 carbon atoms; or a substituted or unsubstituted heteroaryl group having 3 to 20 carbon atoms.

In the present specification, Ar4 is a substituted or unsubstituted aryl group having 6 to 15 carbon atoms; or a substituted or unsubstituted heteroaryl group having 3 to 15 carbon atoms.

In the present specification, Ar4 is a phenyl group; a naphthyl group; a biphenyl group; a terphenyl group; an anthracene group; a phenanthrene group; a triphenylene group; a fluorene group; a spirobifluorene group; or a pyrene group, wherein the phenyl group, the naphthyl group, the biphenyl group, the terphenyl group, the anthracene group, the phenanthrene group, the triphenylene group, the fluorene group, the spirobifluorene group or the pyrene group is unsubstituted or substituted with deuterium, a nitrile group, a halogen group, an amine group, a silyl group, a phosphine oxide group, an alkyl group, an aryl group or a heteroaryl group.

In the present specification, Ar4 is a phenyl group; a naphthyl group; a biphenyl group; a terphenyl group; an anthracene group; a phenanthrene group; a triphenylene group; a fluorene group; a pyrene group; a carbazole group; a dibenzofuran group; or a dibenzothiophene group, wherein the phenyl group, the naphthyl group, the biphenyl group, the terphenyl group, the anthracene group, the phenanthrene group, the triphenylene group, the fluorene group, the pyrene group, the carbazole group, the dibenzofuran group or the dibenzothiophene group is unsubstituted or substituted with deuterium, a nitrile group, a phenyl group, a biphenyl group, a naphthyl group, a methyl group, an ethyl group or a tert-butyl group.

In the present specification, Ar4 is a carbazole group; a dibenzofuran group; or a dibenzothiophene group, wherein the carbazole group, the dibenzofuran group or the dibenzothiophene group is unsubstituted or substituted with a methyl group, an ethyl group, a propyl group, a butyl group, a phenyl group, a biphenyl group or a naphthyl group.

In the present specification, Ar4 is a phenyl group unsubstituted or substituted with deuterium; a naphthyl group; a biphenyl group; a terphenyl group; an anthracene group; a phenanthrene group; a triphenylene group; a dimethylfluorene group; a diphenylfluorene group; a pyrene group; a carbazole group unsubstituted or substituted with a phenyl group; a dibenzofuran group unsubstituted or substituted with a phenyl group; or a dibenzothiophene group unsubstituted or substituted with a phenyl group.

In the present specification, L1 to L7 are the same as or different from each other, and each independently a direct bond; a substituted or unsubstituted arylene group having 6 to 30 carbon atoms; or a substituted or unsubstituted heteroarylene group having 3 to 30 carbon atoms.

In the present specification, L1 to L7 are the same as or different from each other, and each independently a direct bond; a substituted or unsubstituted arylene group having 6 to 20 carbon atoms; or a substituted or unsubstituted heteroarylene group having 3 to 20 carbon atoms.

In the present specification, L1 to L7 are the same as or different from each other, and each independently a direct bond; a substituted or unsubstituted arylene group having 6 to 15 carbon atoms; or a substituted or unsubstituted heteroarylene group having 3 to 15 carbon atoms.

In the present specification, L1 to L7 are the same as or different from each other, and each independently a direct bond; an arylene group having 6 to 30 carbon atoms unsubstituted or substituted with deuterium, an alkyl group or an aryl group; or a heteroarylene group unsubstituted or substituted with an aryl group, having 3 to 30 carbon atoms and one or more heteroatoms selected from N, O and S.

In the present specification, L1 to L7 are the same as or different from each other, and each independently a direct bond; a phenylene group unsubstituted or substituted with deuterium; a biphenylylene group unsubstituted or substituted with deuterium; a terphenylylene group unsubstituted or substituted with deuterium; a naphthylene group unsubstituted or substituted with deuterium; a divalent fluorene group substituted with an alkyl group or an aryl group; a divalent carbazole group unsubstituted or substituted with an aryl group; a divalent dibenzofuran group; or a divalent dibenzothiophene group.

In the present specification, L1 to L7 are the same as or different from each other, and each independently any one selected from among the following substituents.

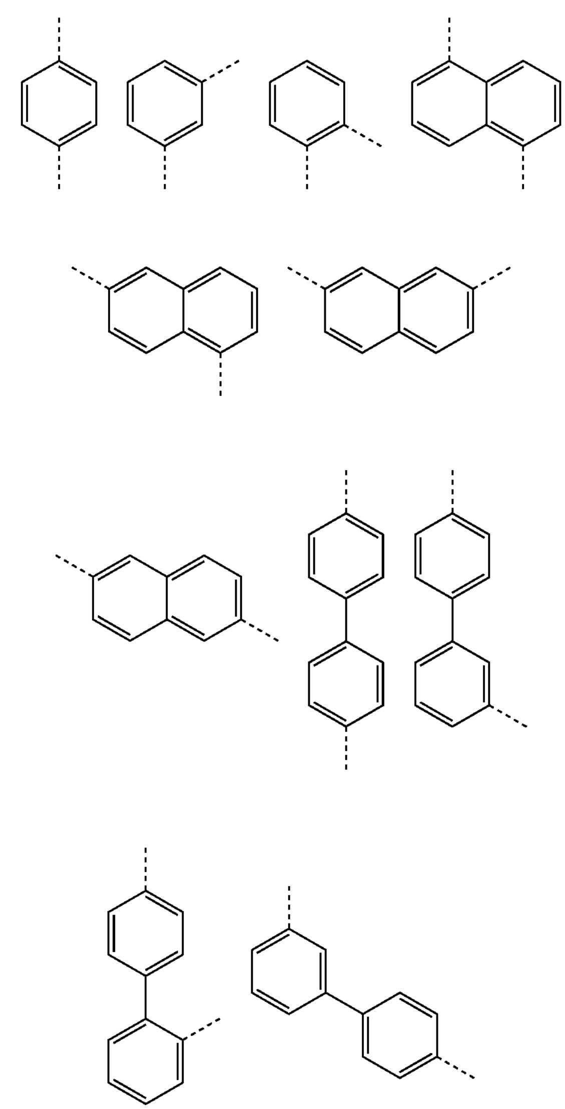

-continued

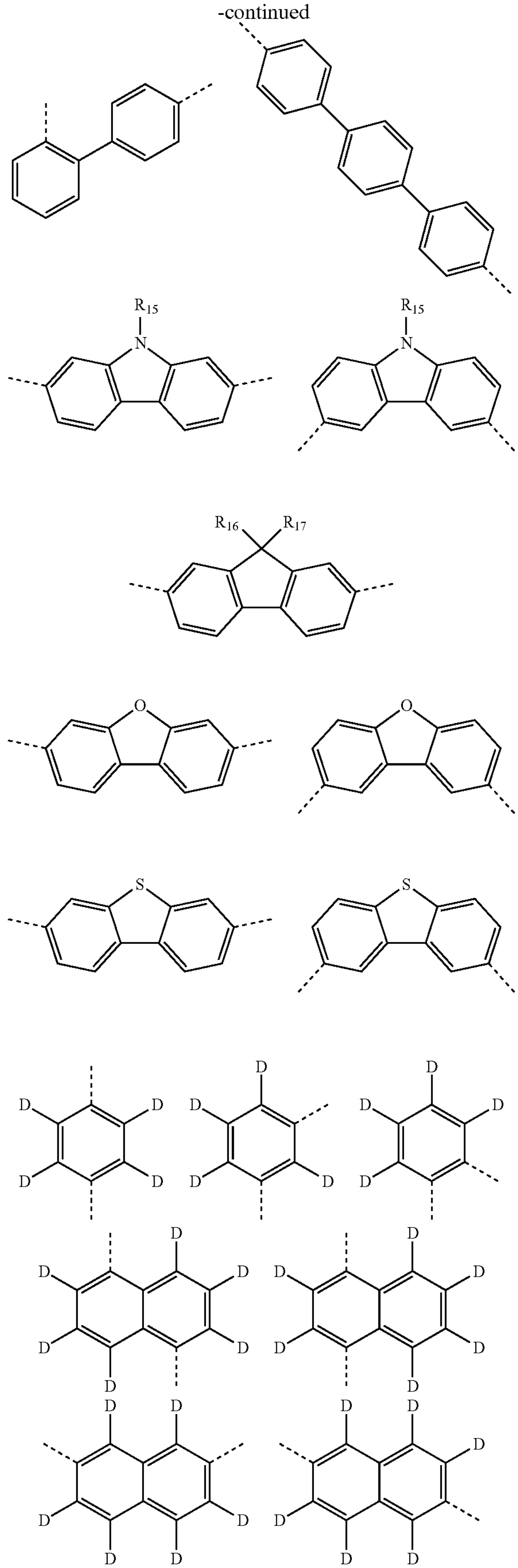

-continued

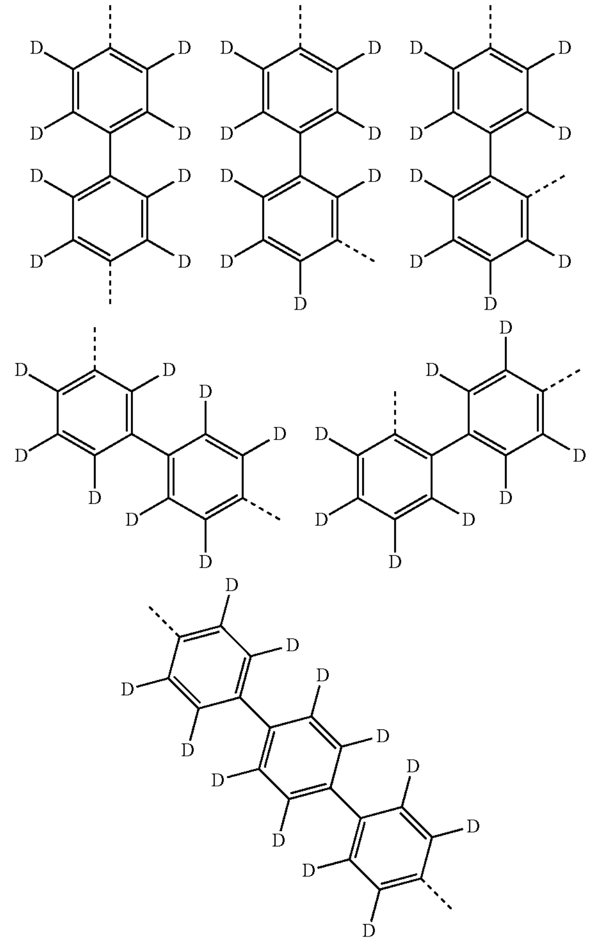

$R_{16}$ and $R_{17}$ are the same as or different from each other, and are each deuterium; a nitrile group; a substituted or unsubstituted alkyl group; a substituted or unsubstituted aryl group; or a substituted or unsubstituted heteroaryl group.

In the present specification, L1 to L4 are the same as or different from each other, and each independently a direct bond; a phenylene group; a biphenylylene group; a naphthylene group; or a divalent carbazole group.

In the present specification, L5 to L7 are the same as or different from each other, and each independently a phenylene group; a naphthylene group; a divalent biphenyl group; or a divalent carbazole group, wherein the phenylene group, the naphthylene group, the divalent biphenyl group or the divalent carbazole group is unsubstituted or substituted with deuterium, a nitrile group, a halogen group, a methyl group, an ethyl group, a propyl group, a butyl group, a phenyl group, a biphenyl group or a naphthyl group.

In the present specification, L5 to L7 are the same as or different from each other, and each independently a phenylene group unsubstituted or substituted with deuterium; a naphthylene group; a divalent carbazole group; or a divalent biphenyl group.

In the present specification, the compound of Chemical Formula 1 may be selected from the following specific examples.

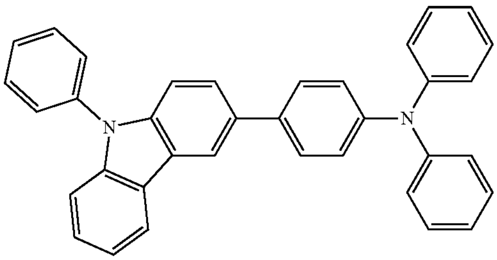
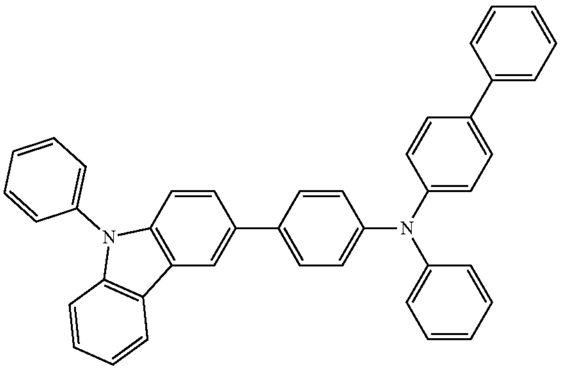
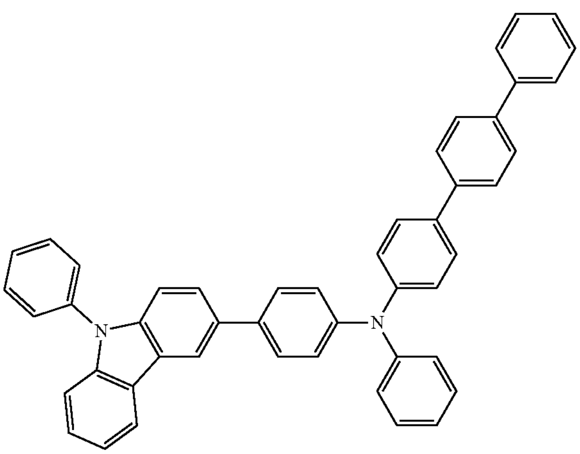
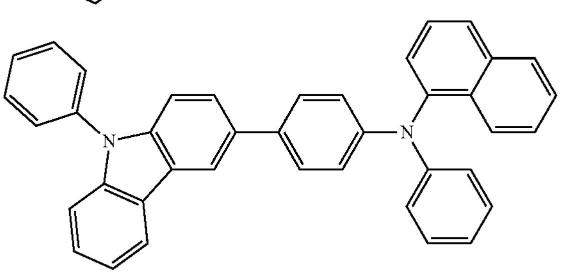
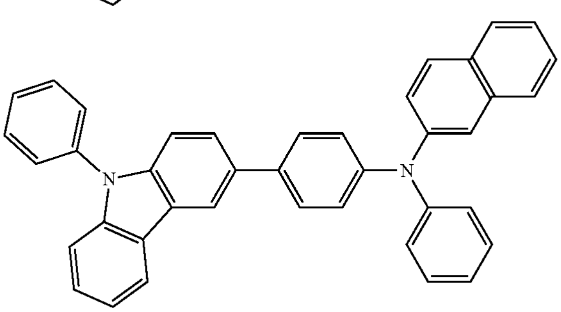
-continued
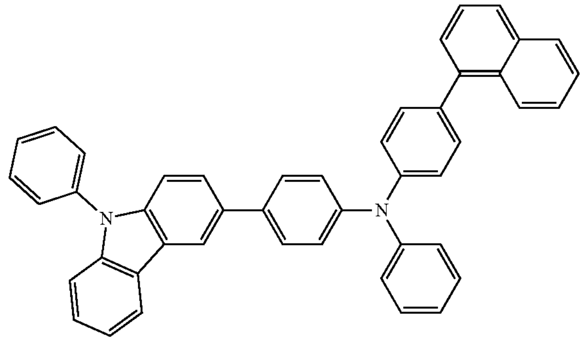
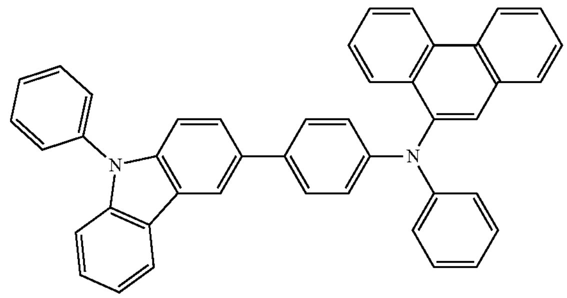
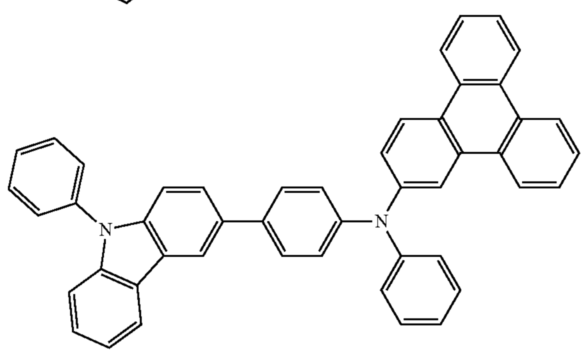
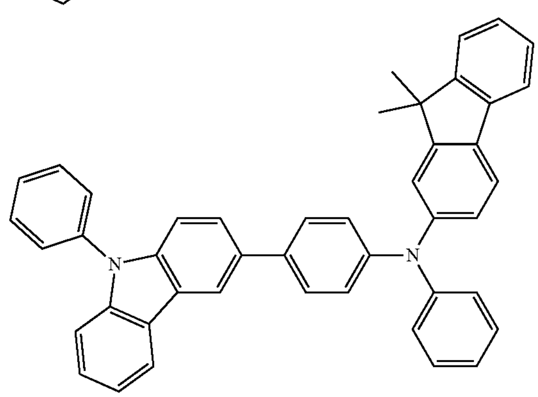
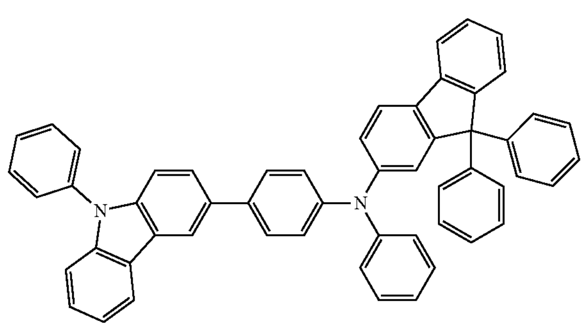

-continued
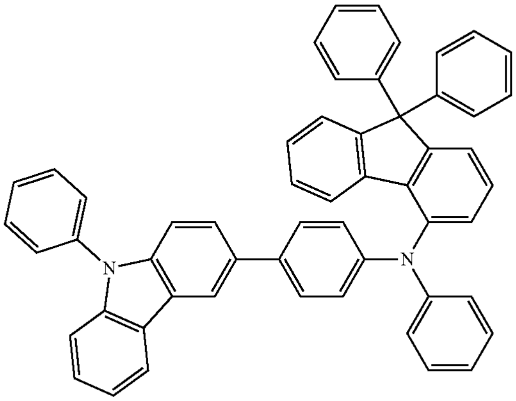
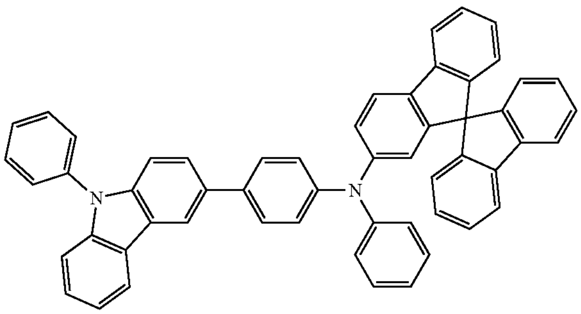
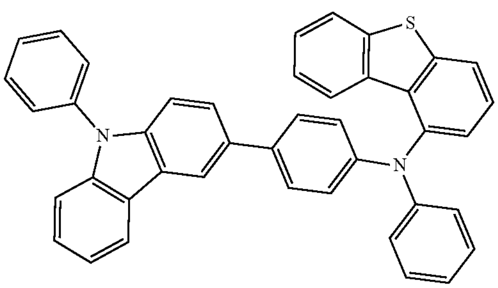
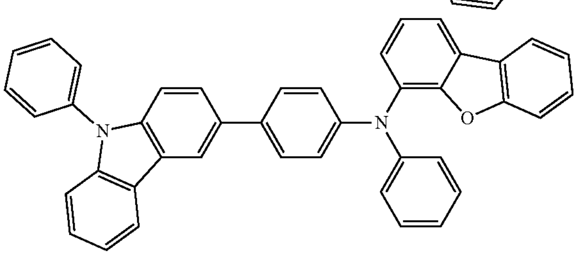
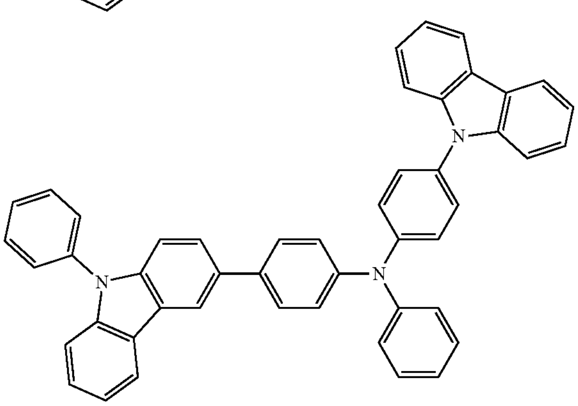
-continued
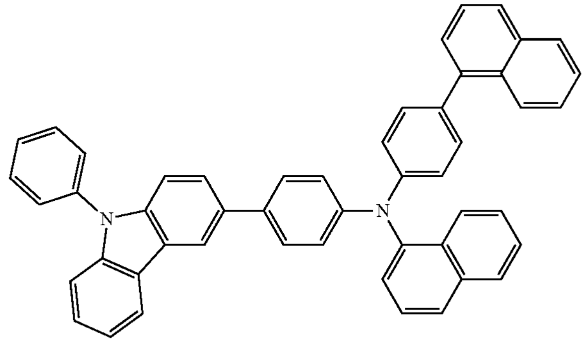
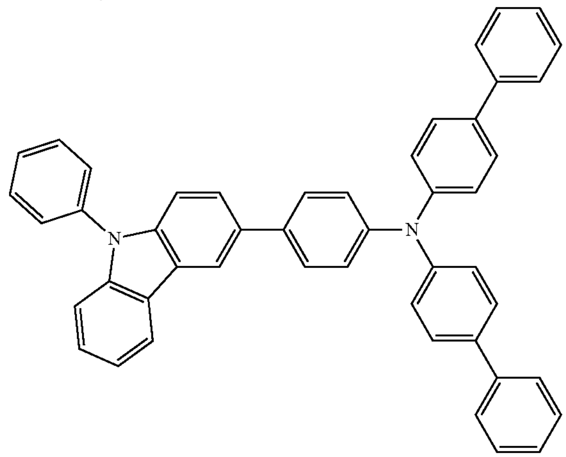
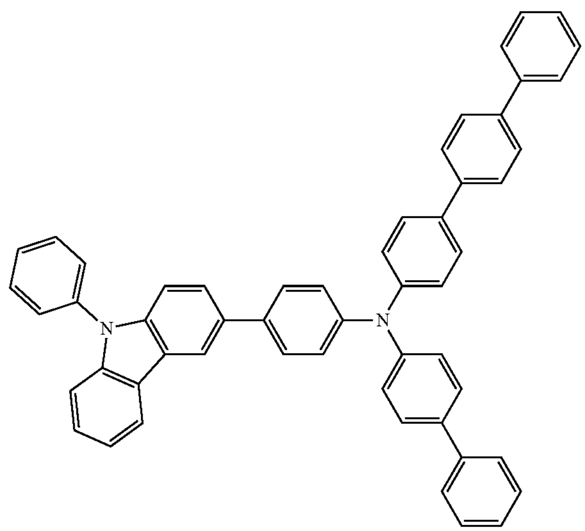
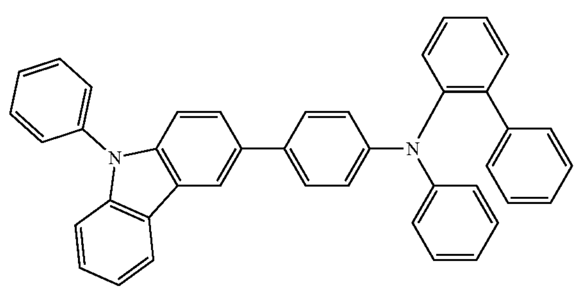

-continued
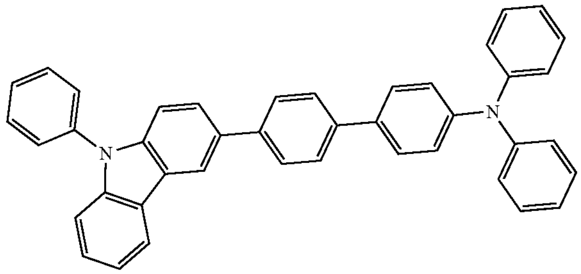
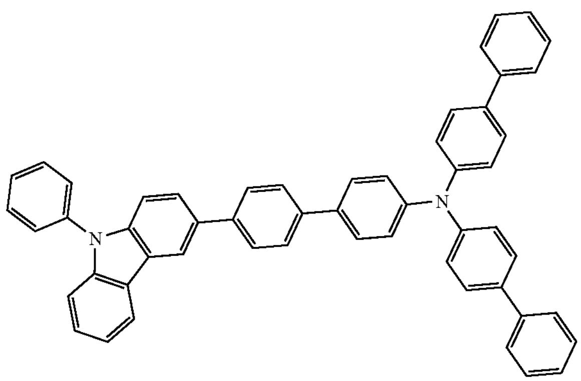
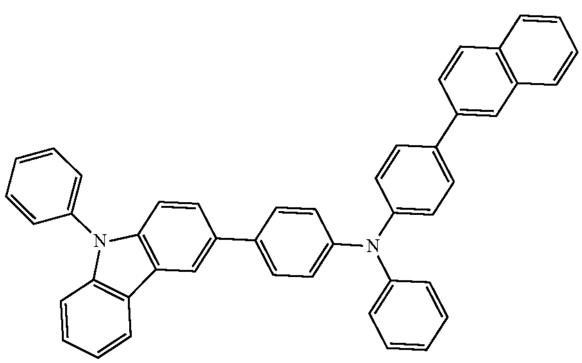
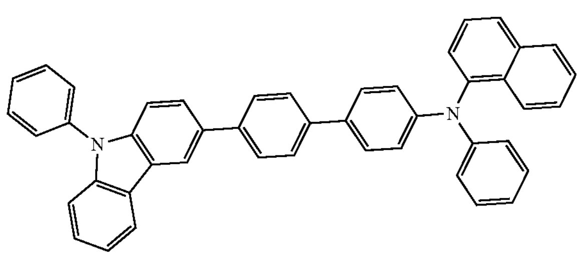
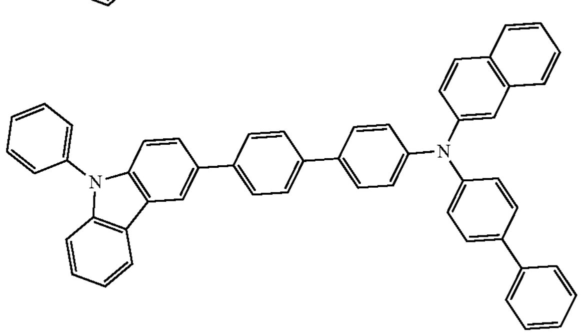
-continued
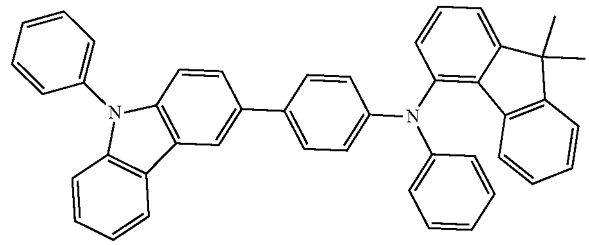
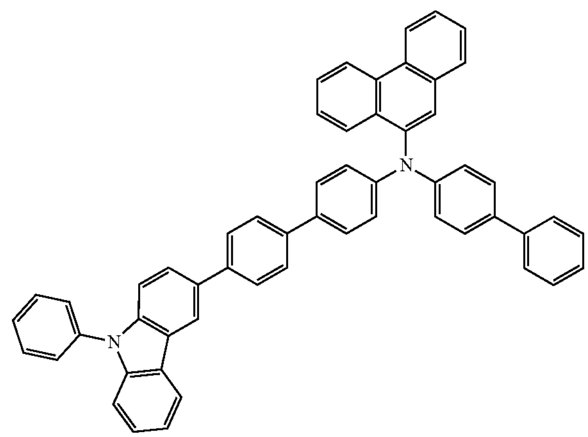
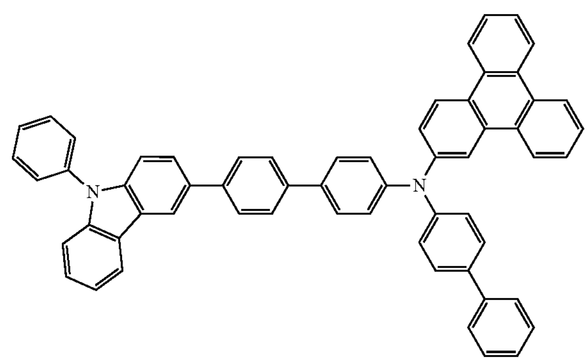
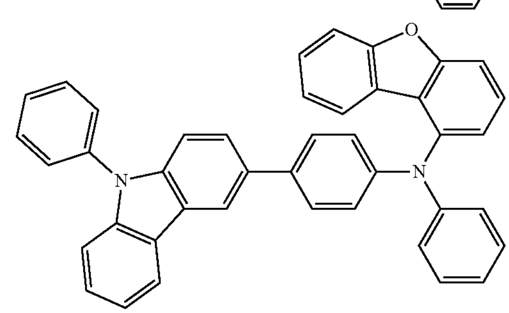
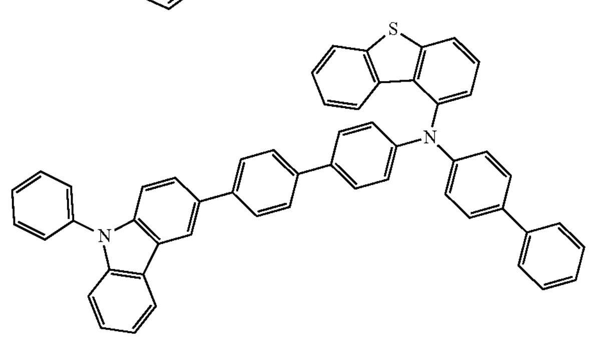

-continued
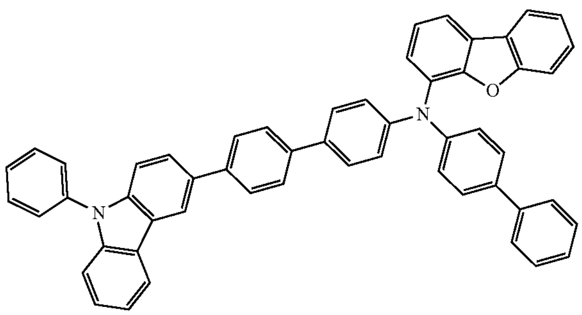
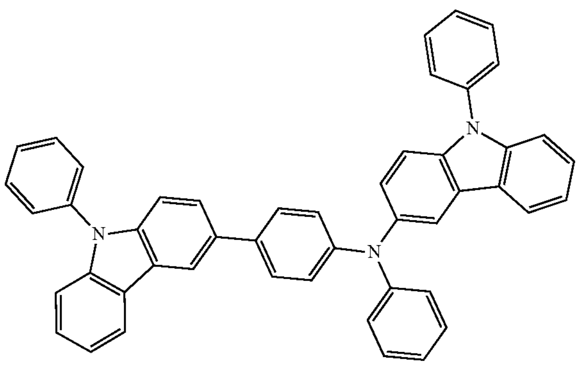
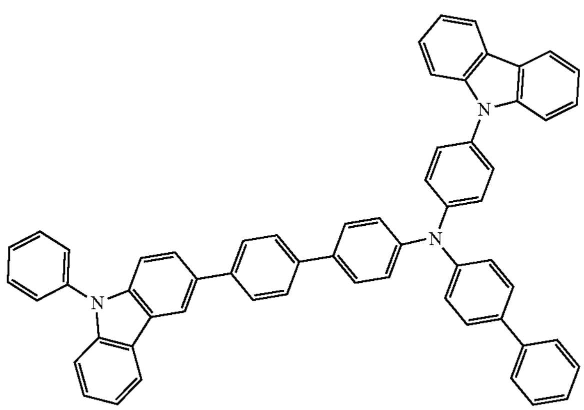
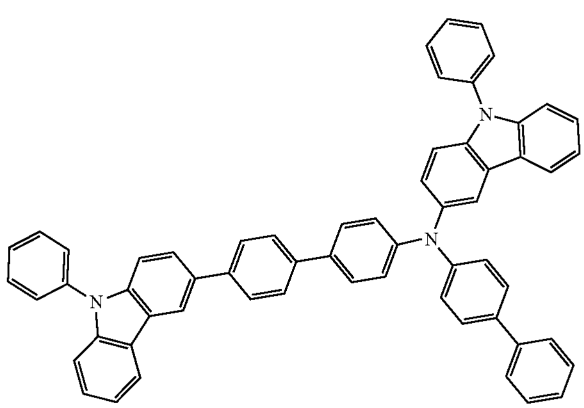
-continued
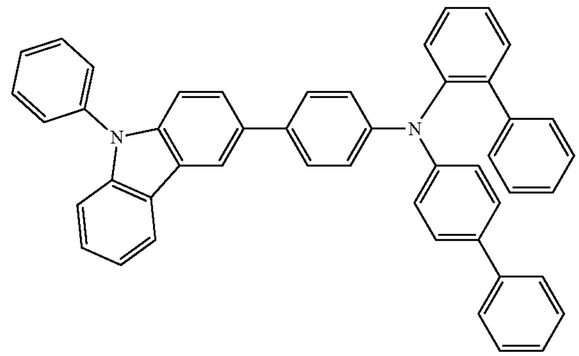
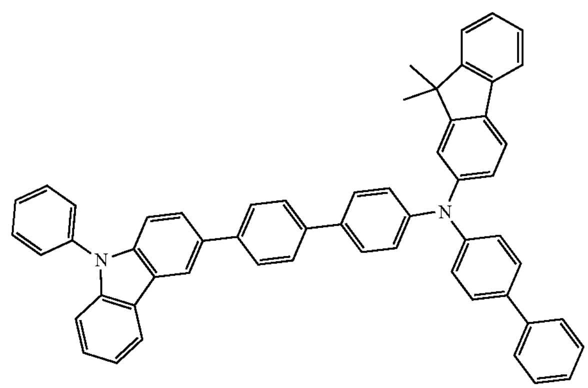
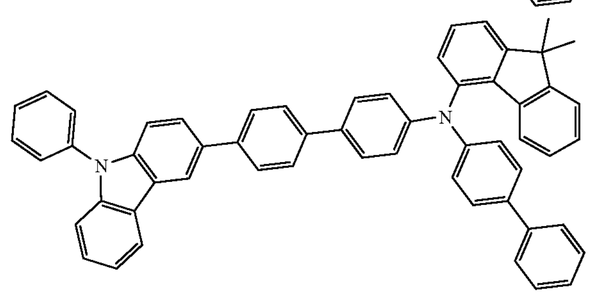
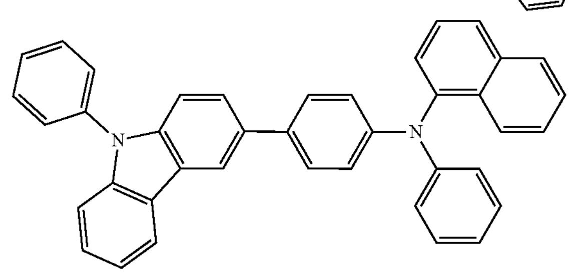
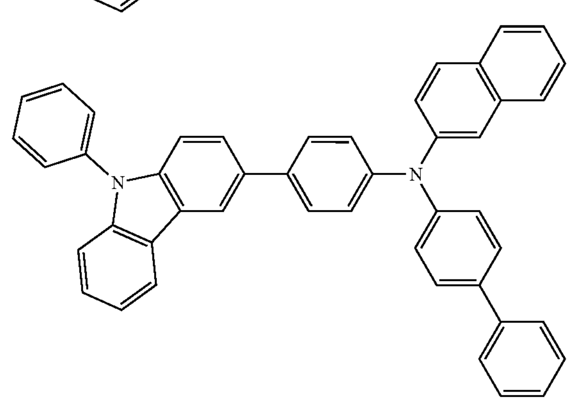

-continued
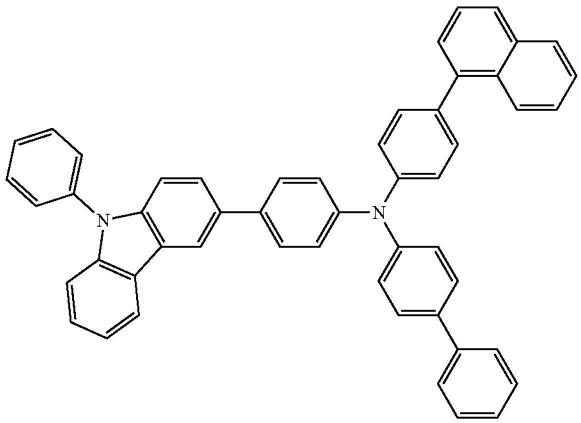
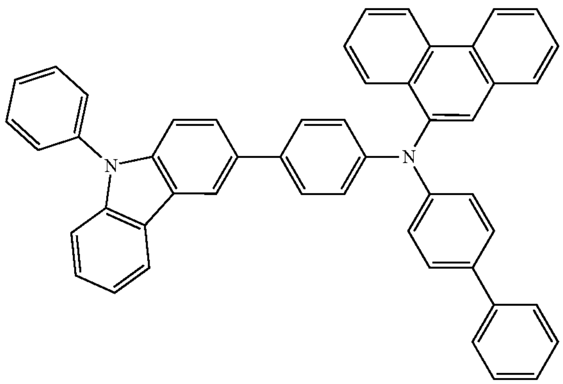
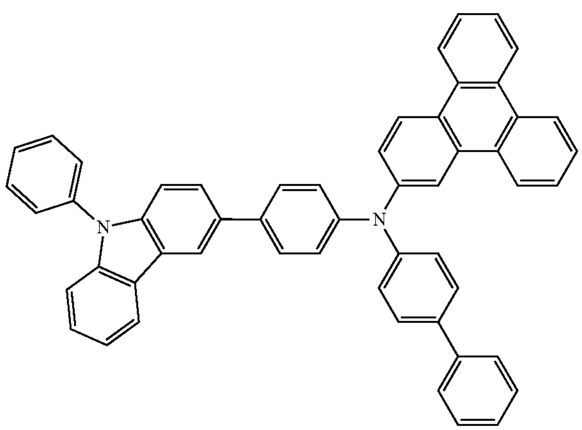
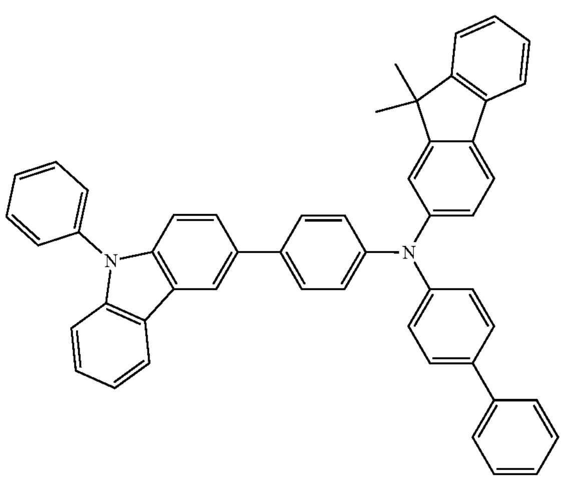
-continued
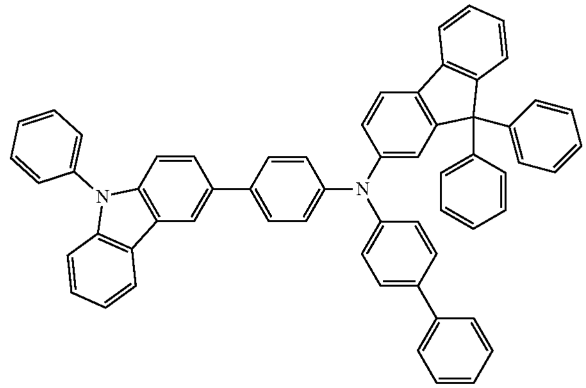
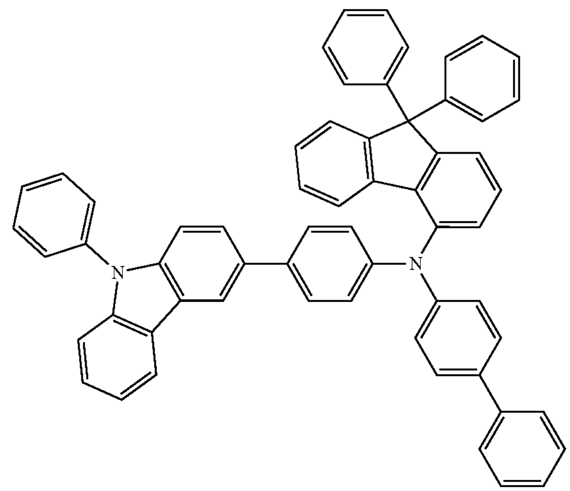
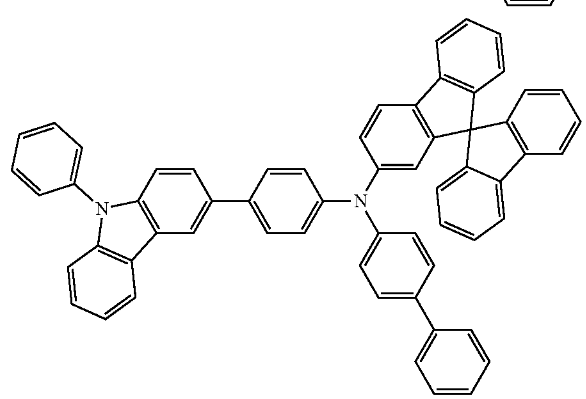
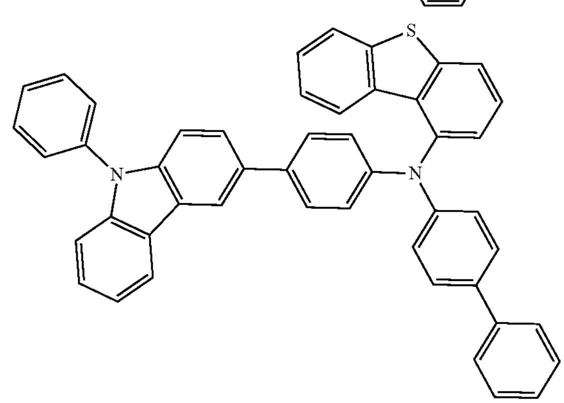

-continued
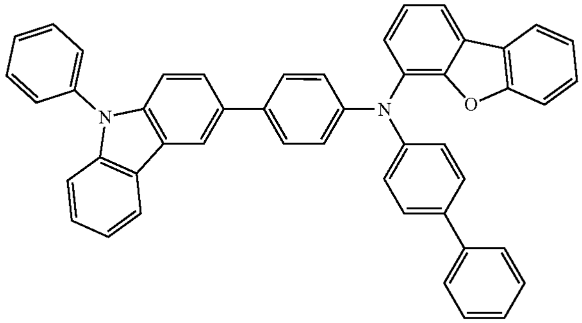
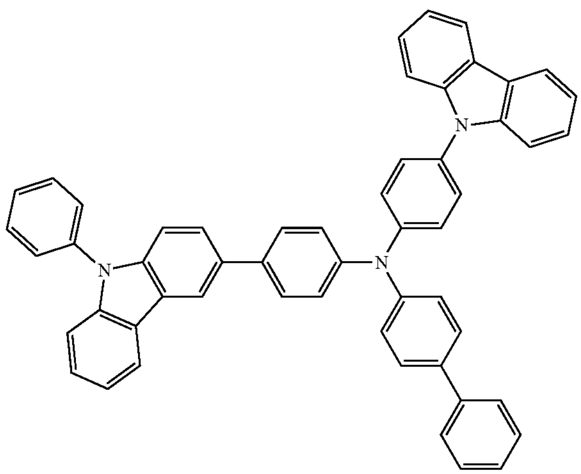
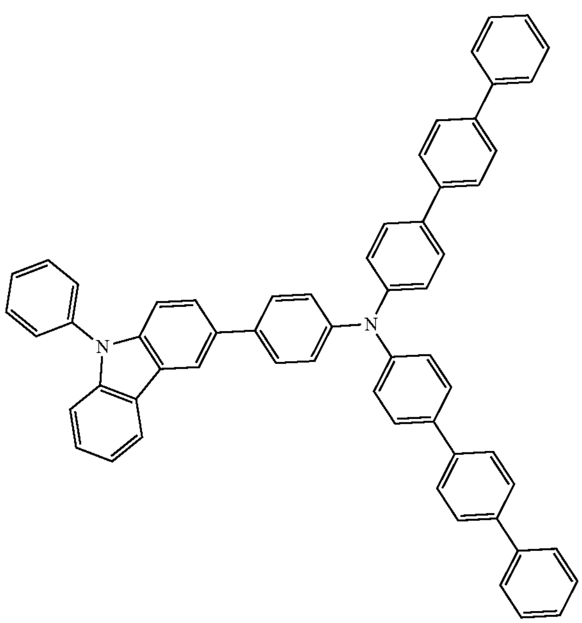
-continued
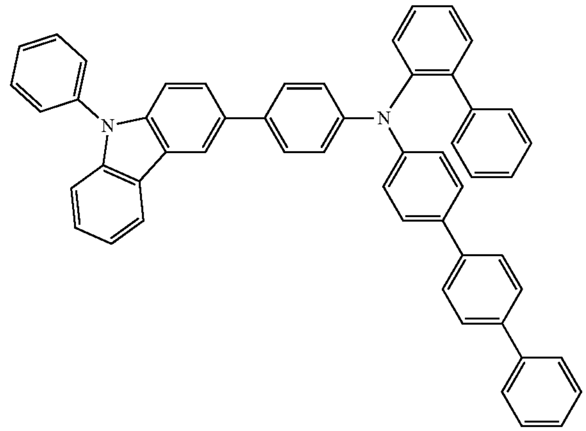
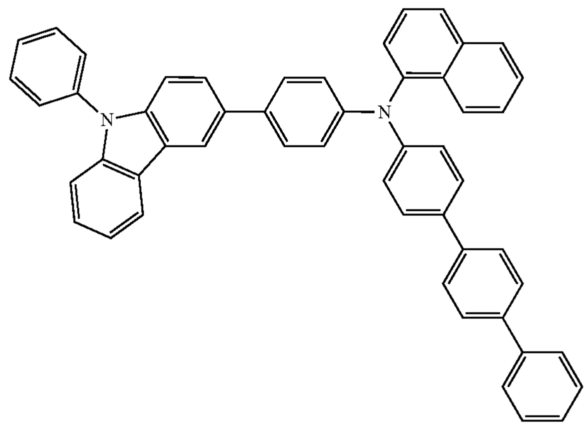
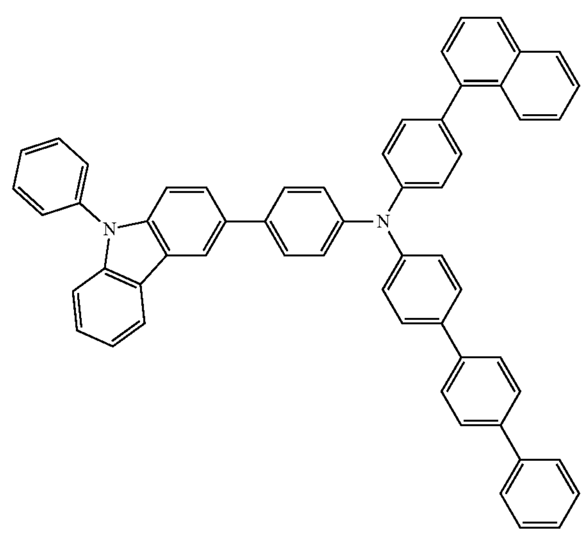

-continued
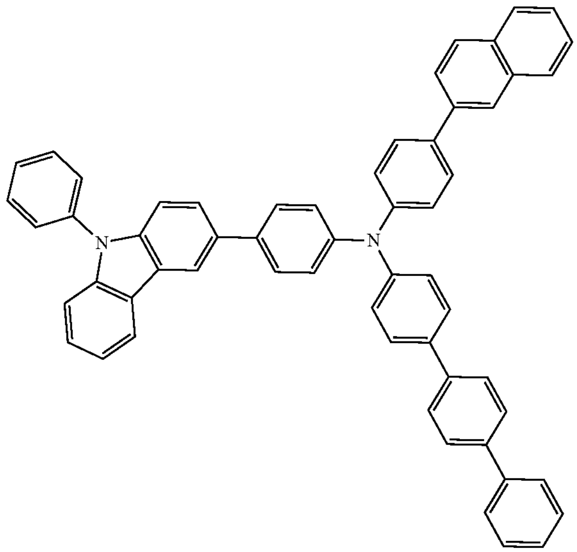
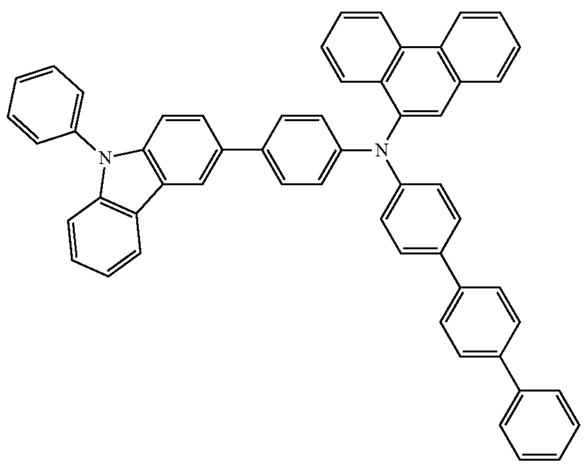
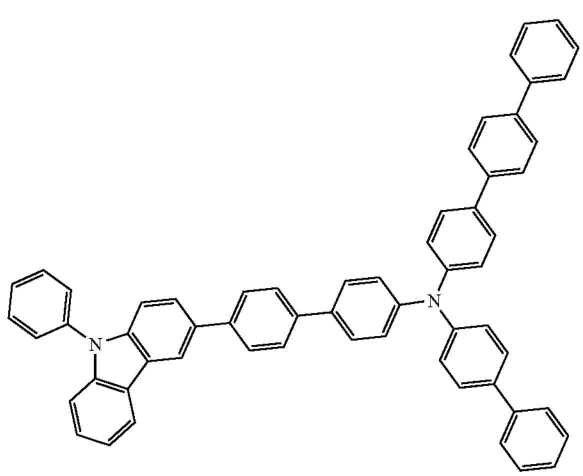
-continued
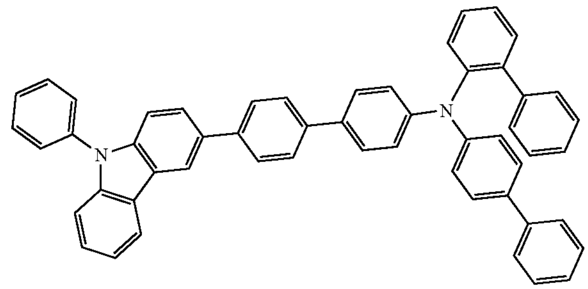
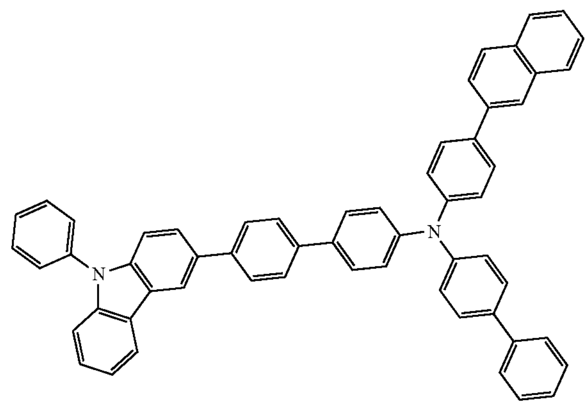
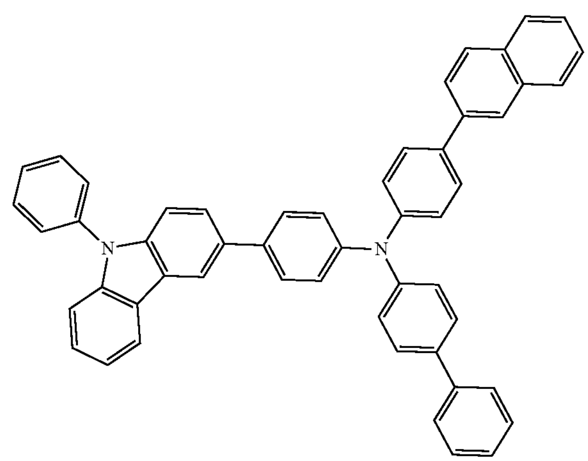
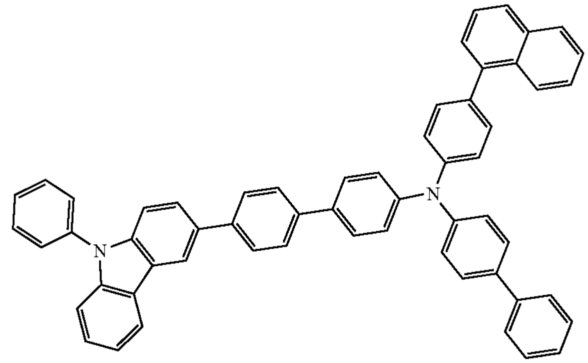

-continued
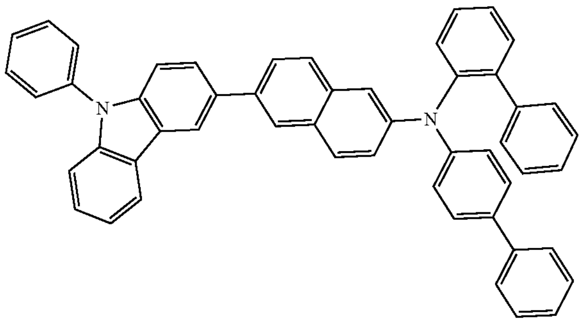
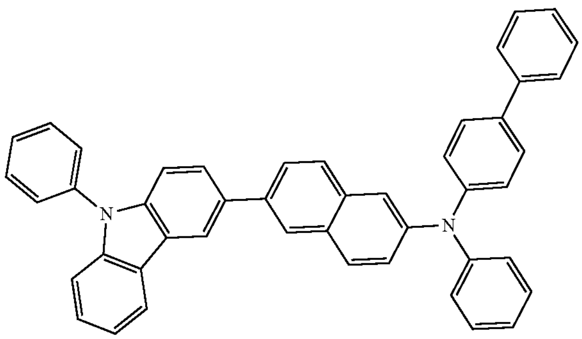
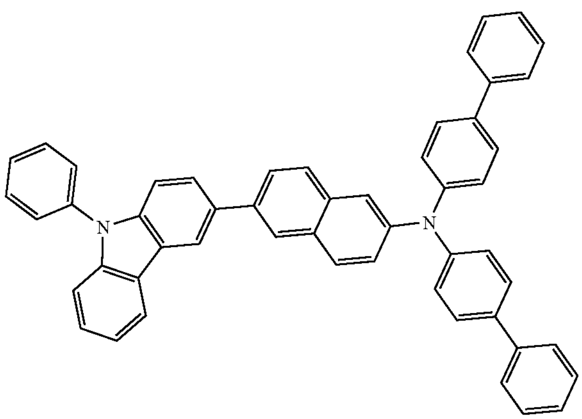 [SMILES: c1ccc(-c2ccc(N(c3ccc(-c4ccccc4)cc3)c3ccc4cc(-c5ccc6c(c5)c5ccccc5n6-c5ccccc5)ccc4c3)cc2)cc1]
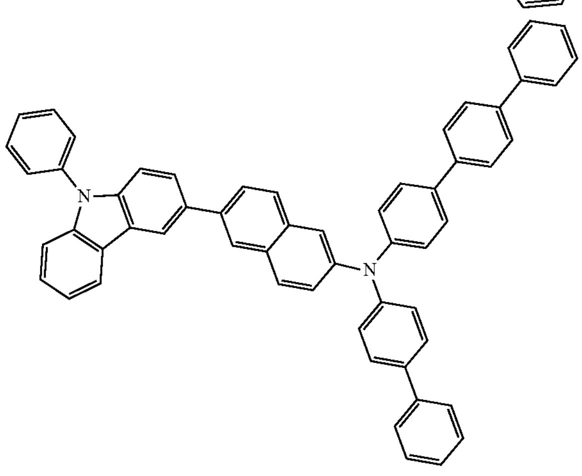
-continued
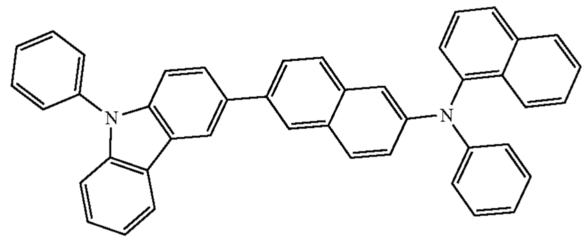
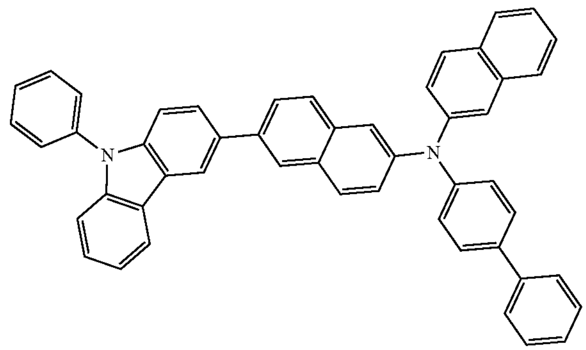
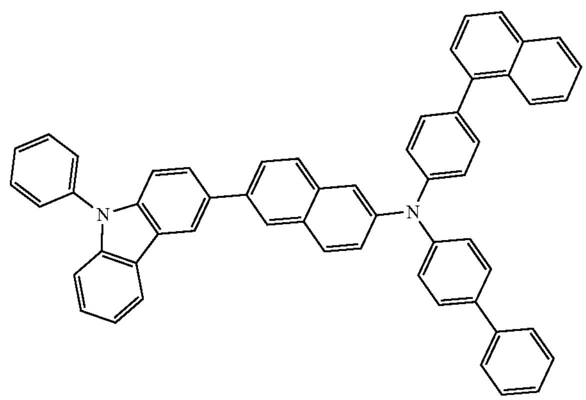
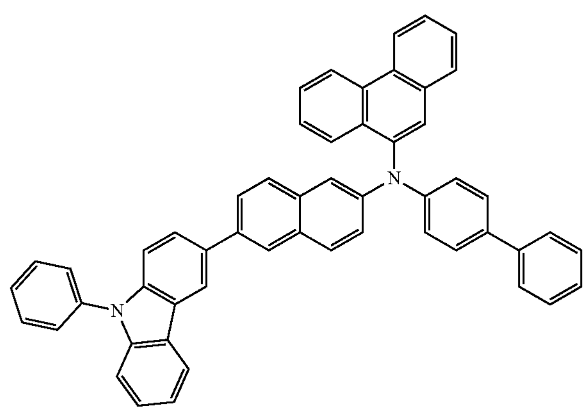

-continued
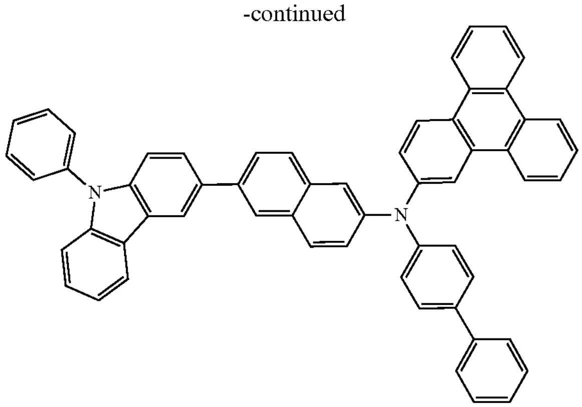
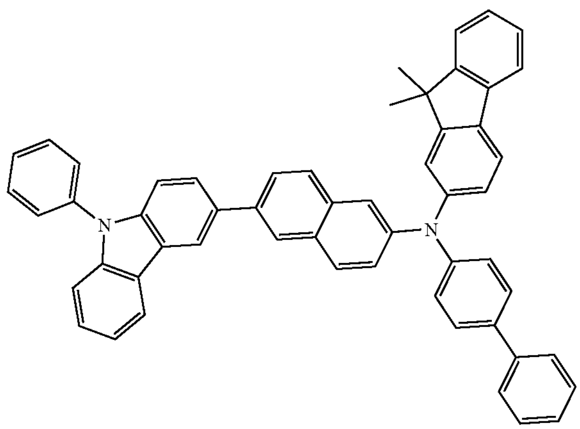
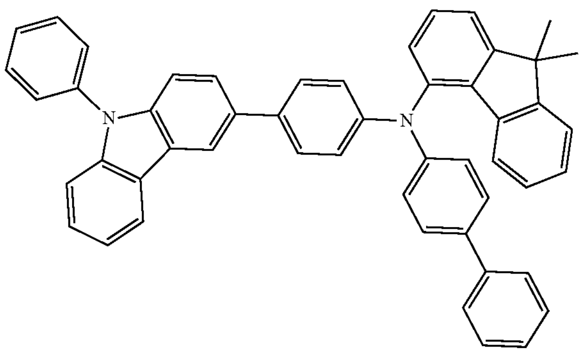
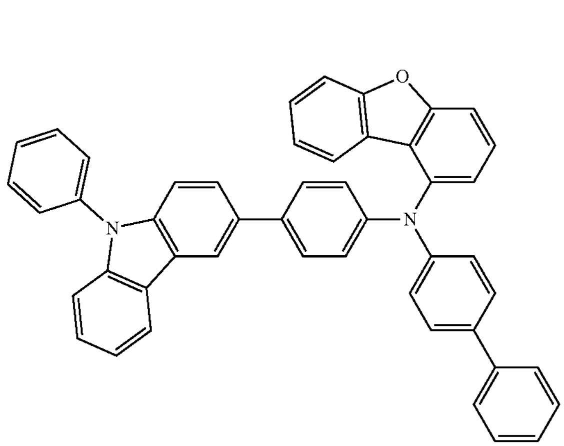
-continued
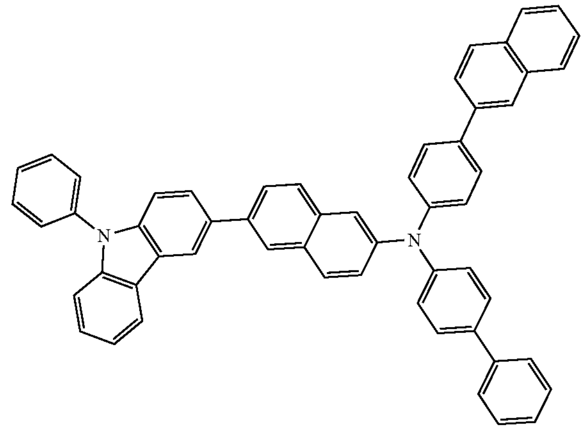
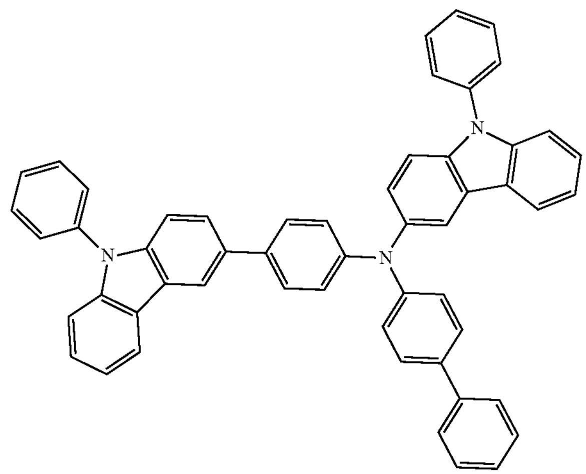
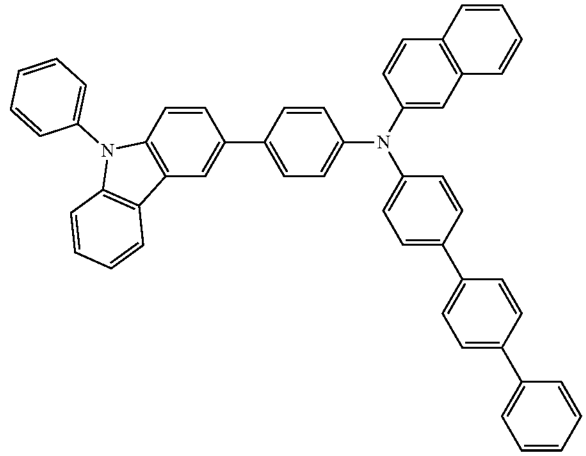

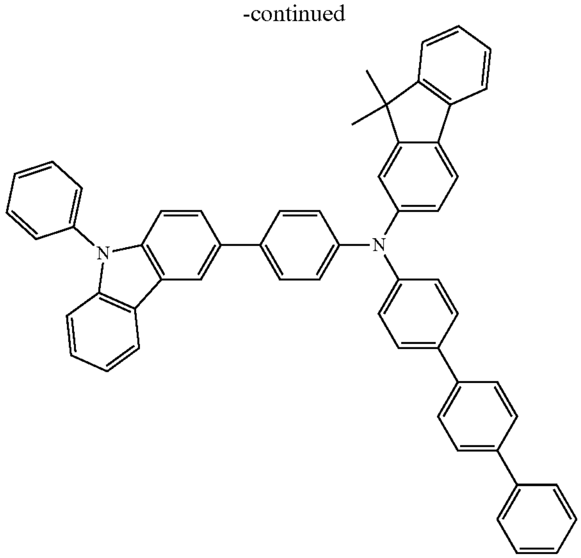
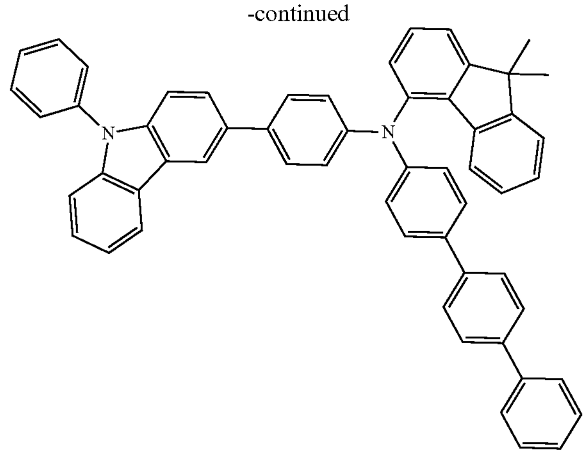
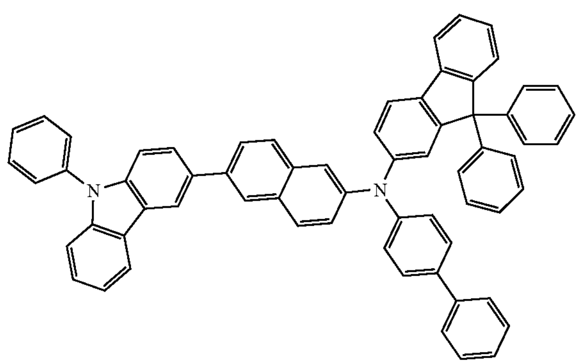
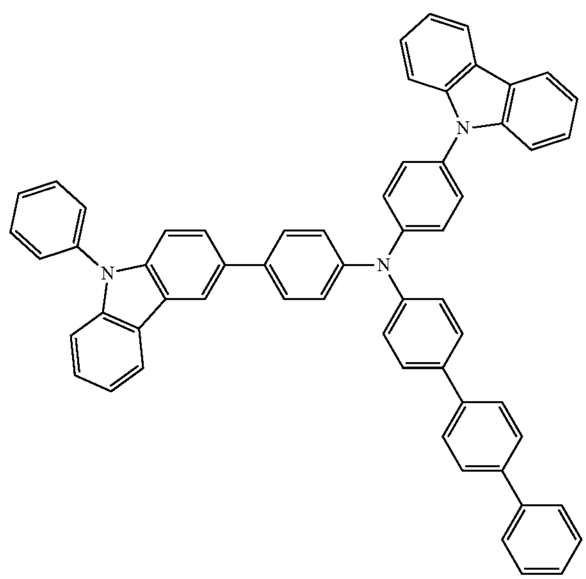
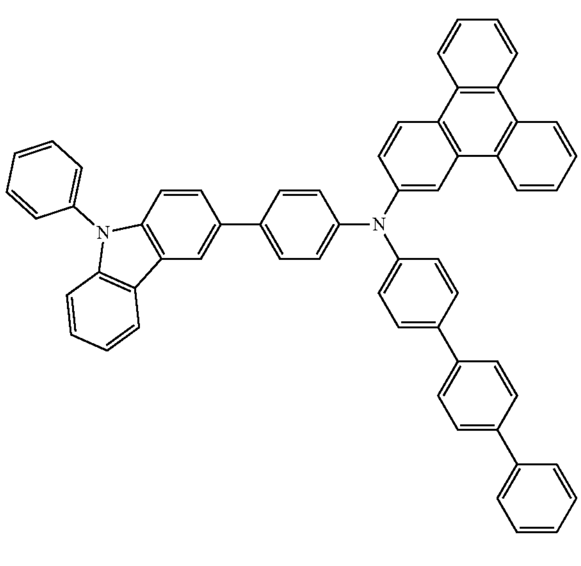
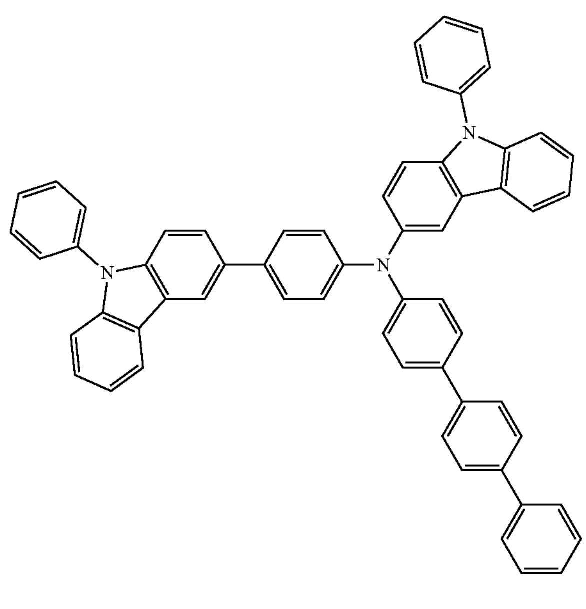

-continued
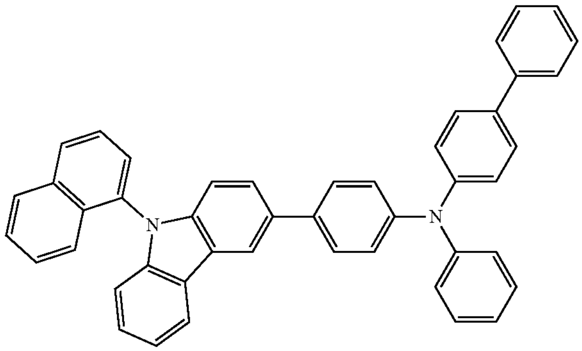
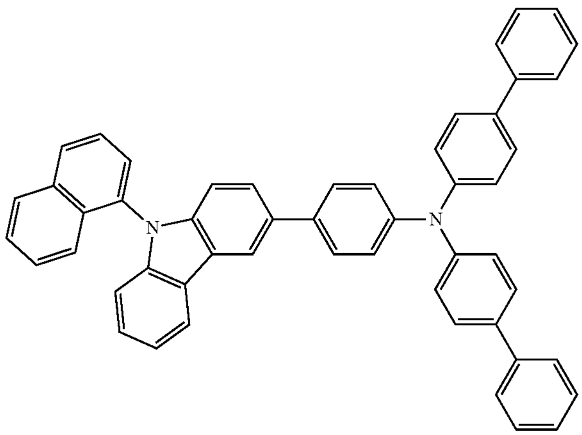
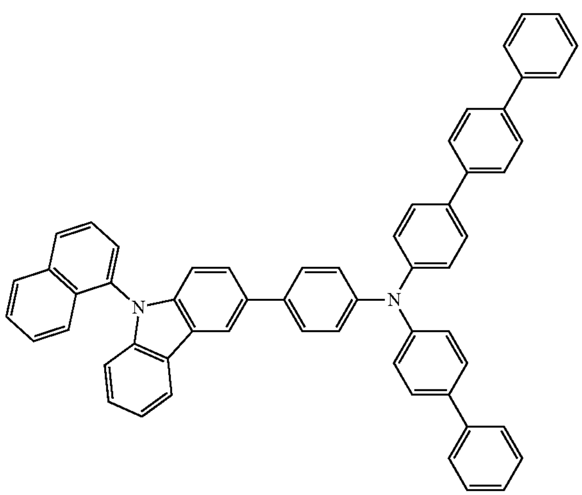
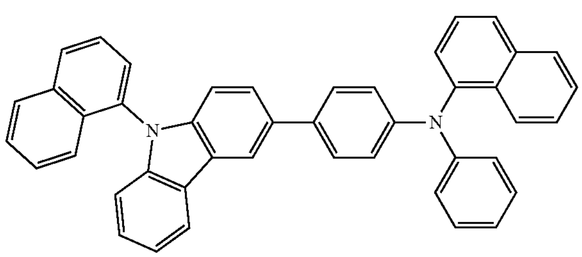
-continued
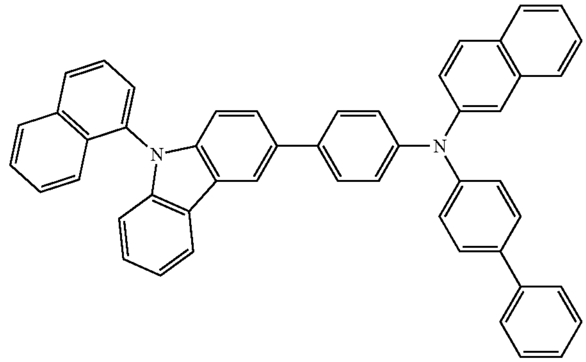
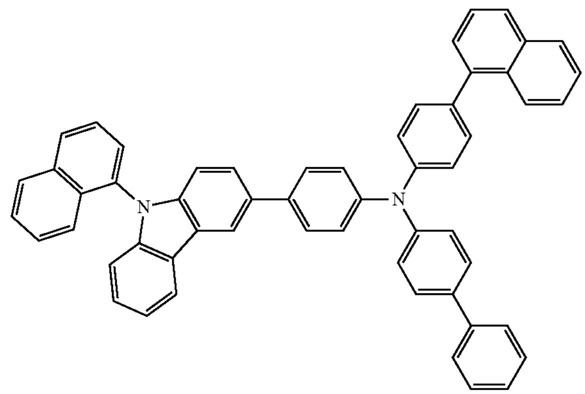
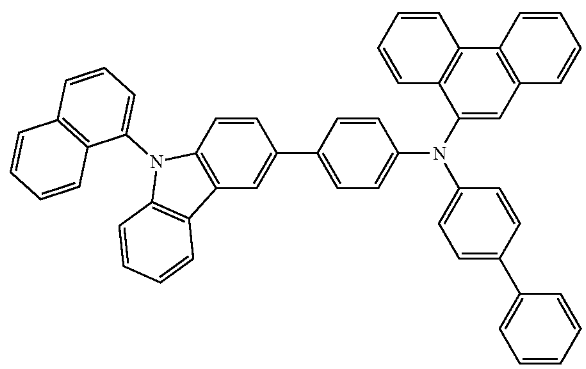
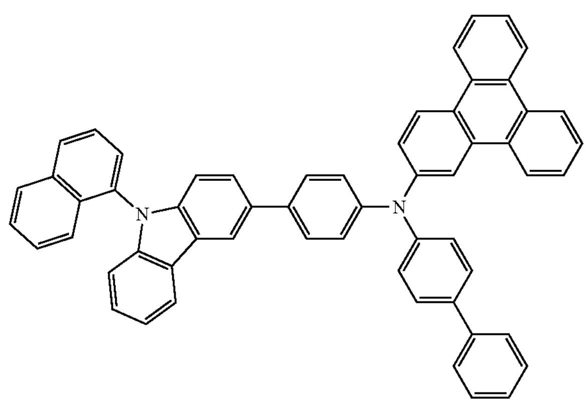

-continued
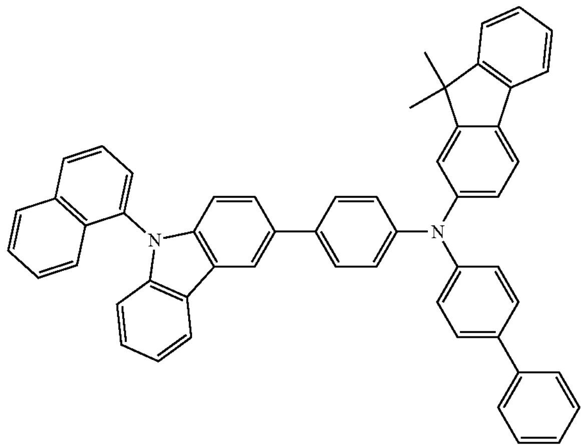
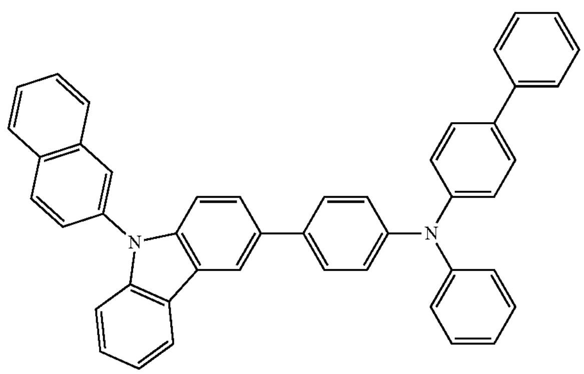
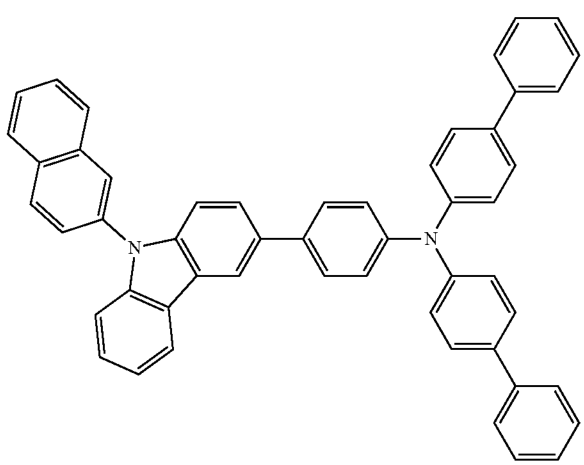
-continued
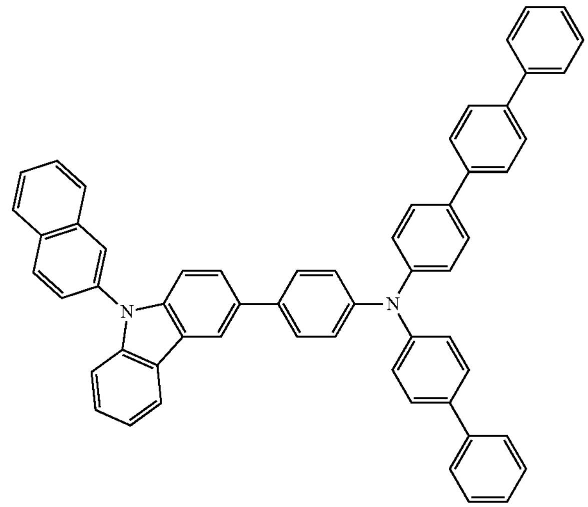
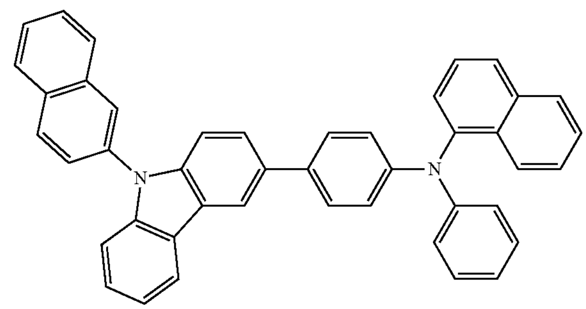
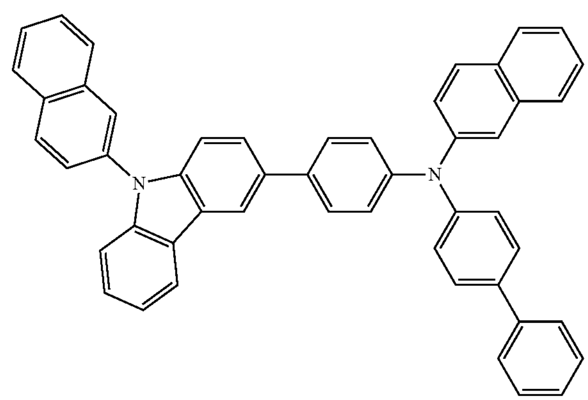
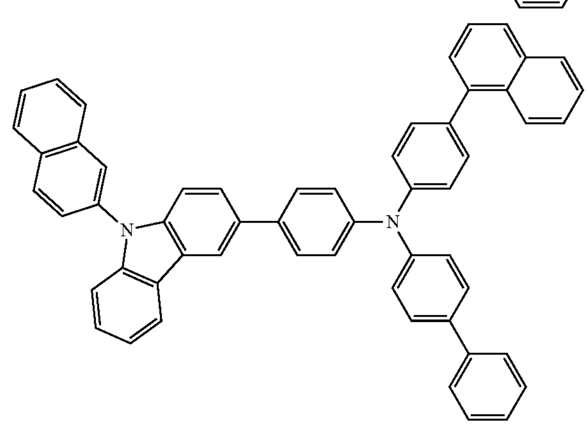

-continued
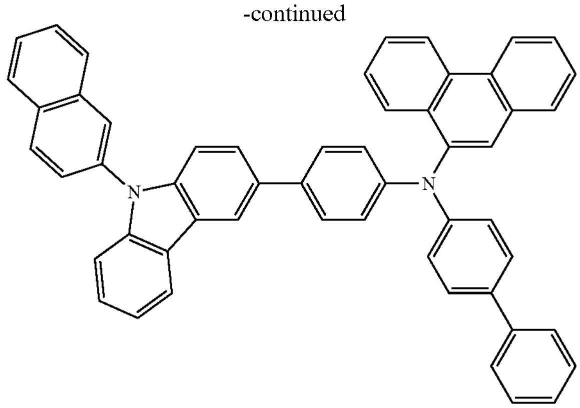
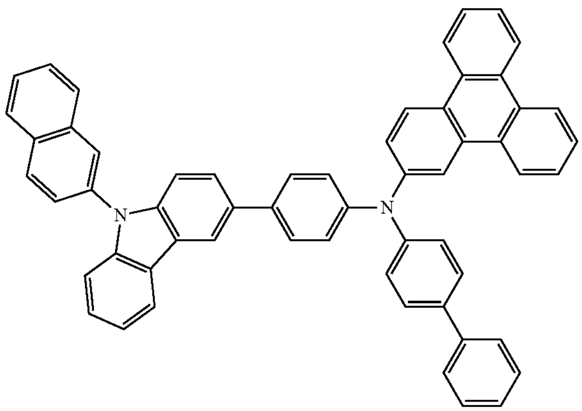
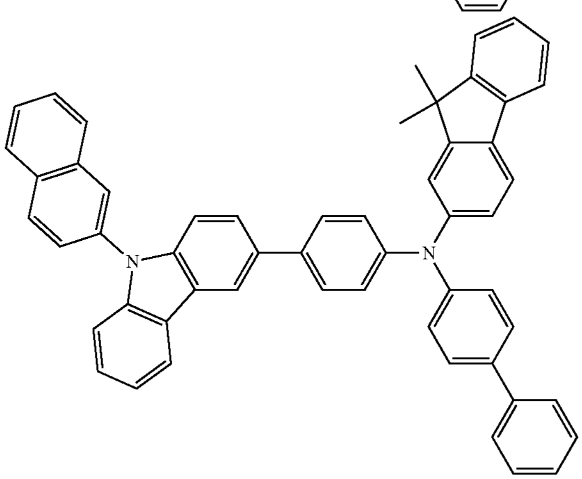
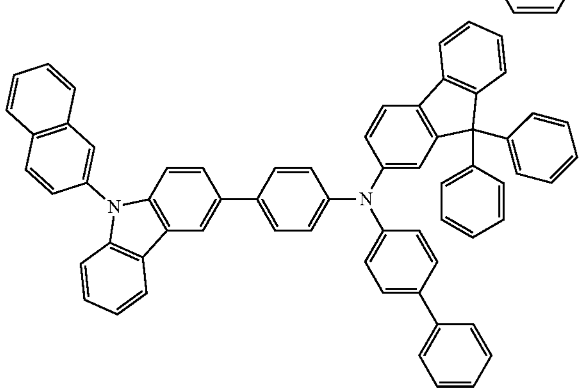
-continued
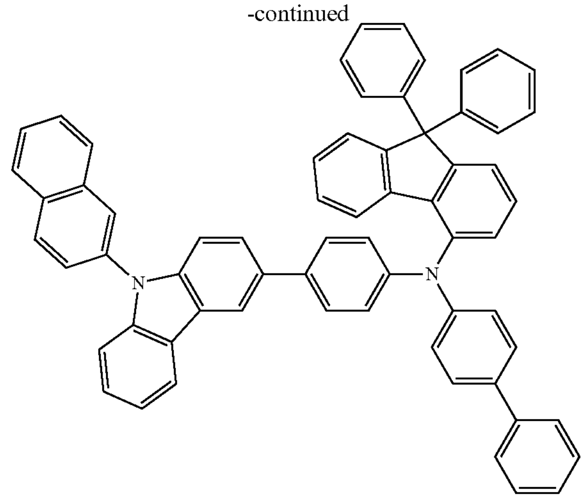
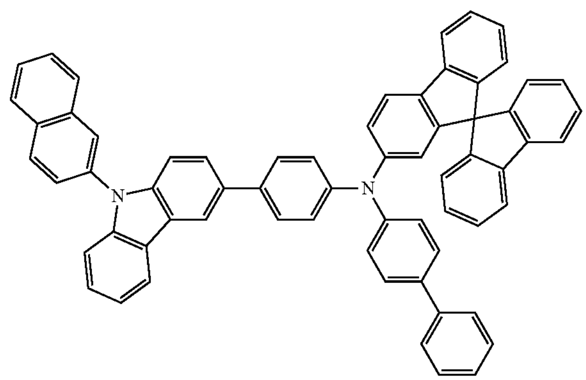
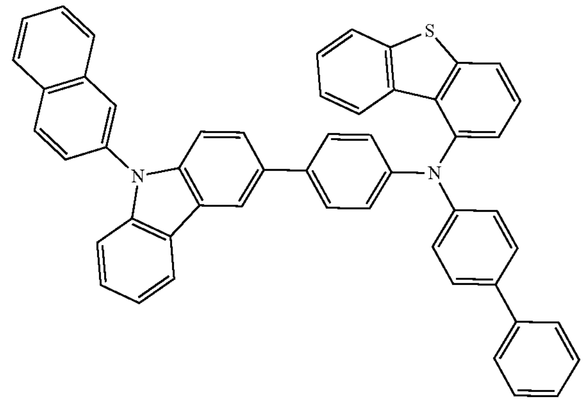
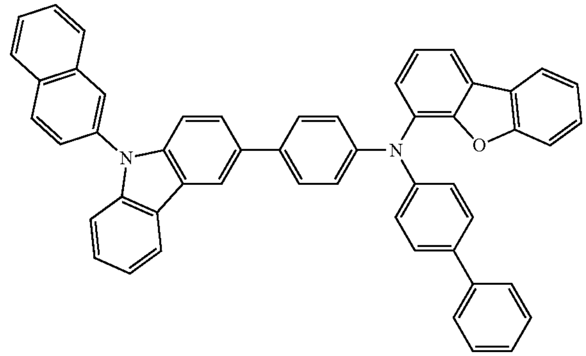

-continued
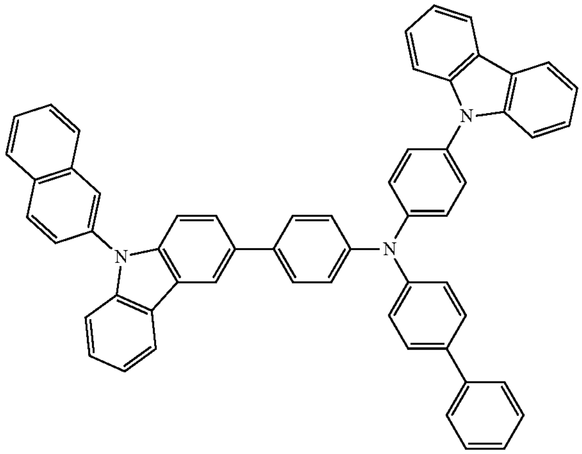
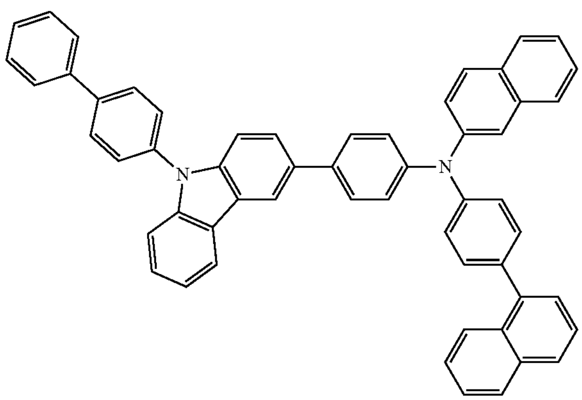
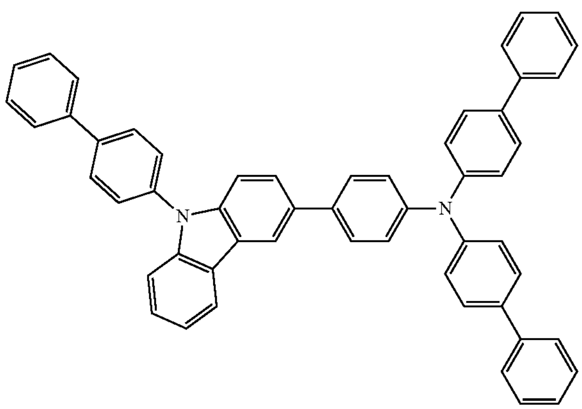
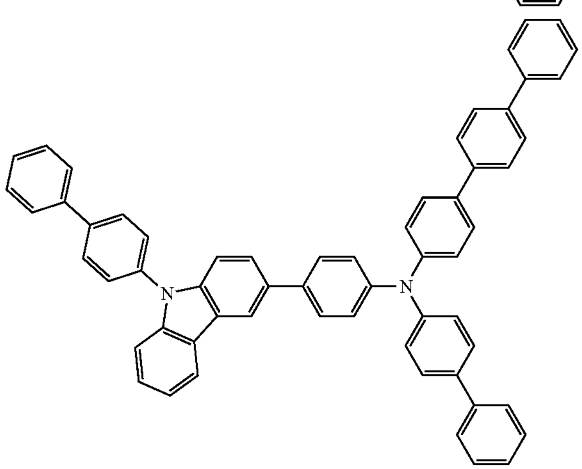
-continued
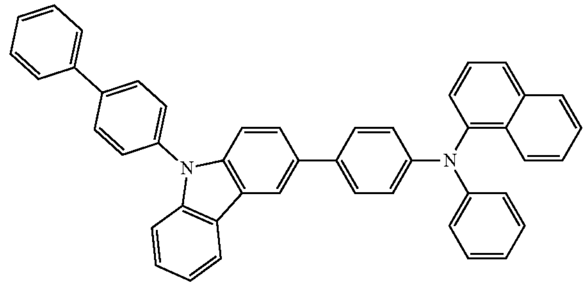
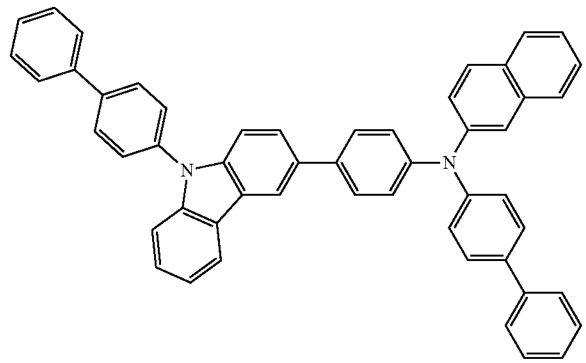
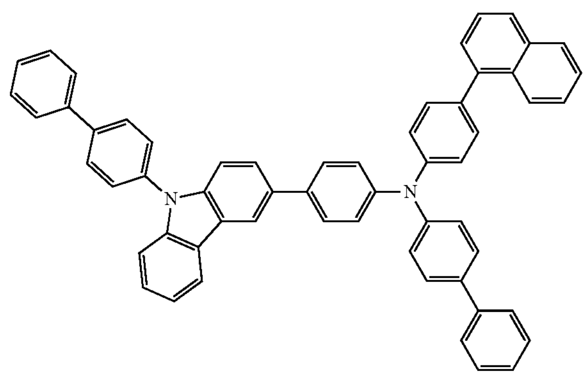
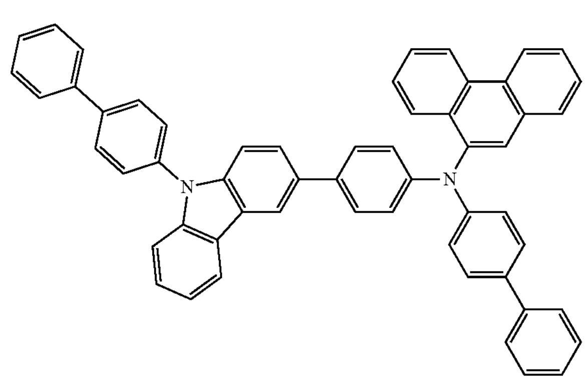

-continued
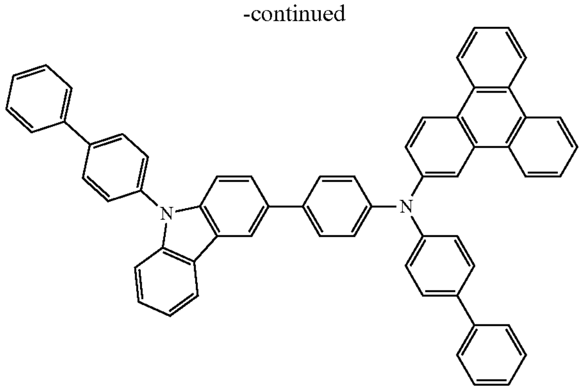
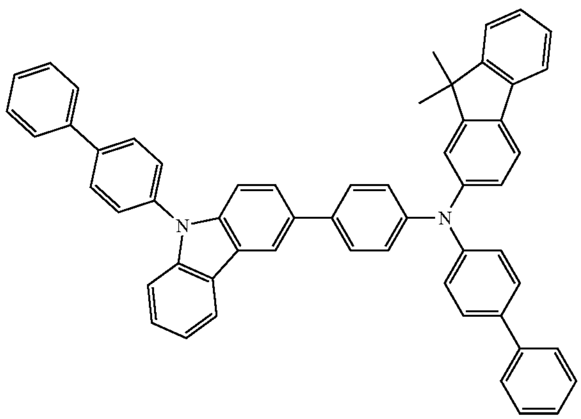
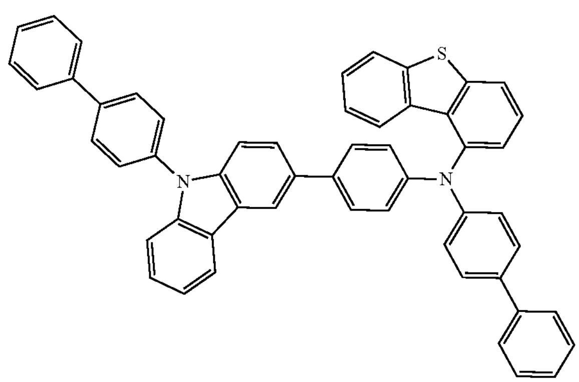
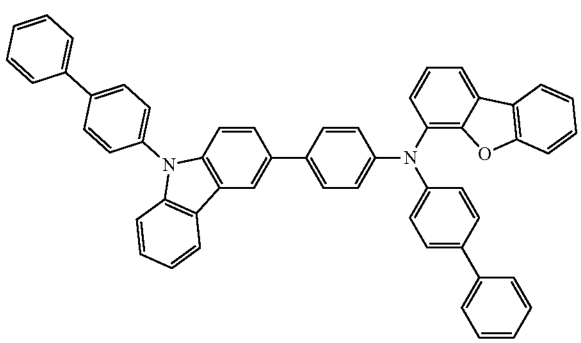
-continued
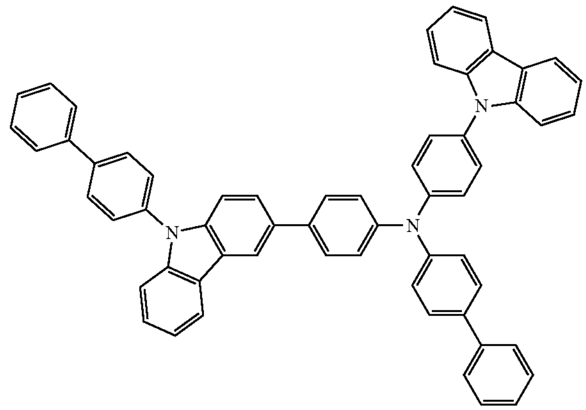
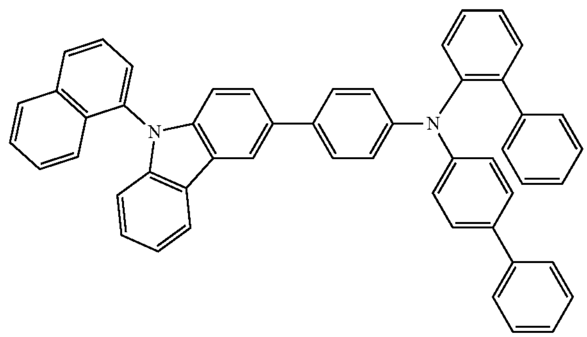
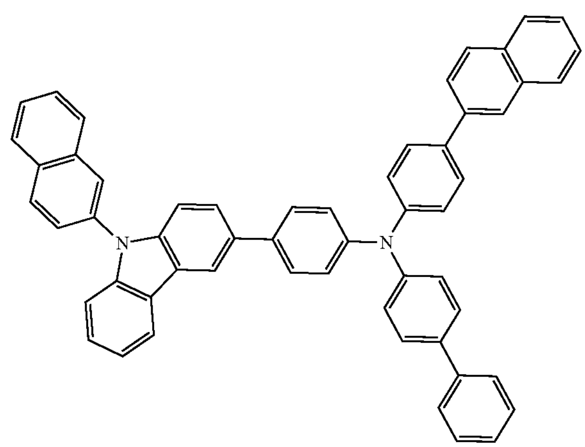
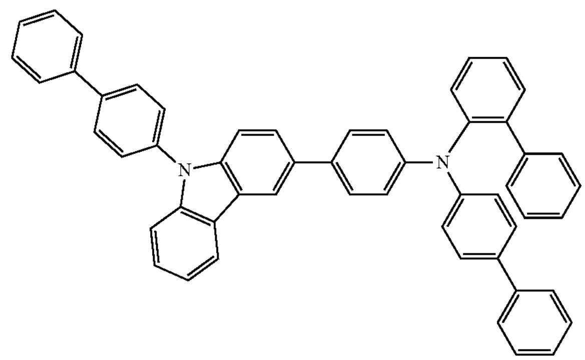

-continued
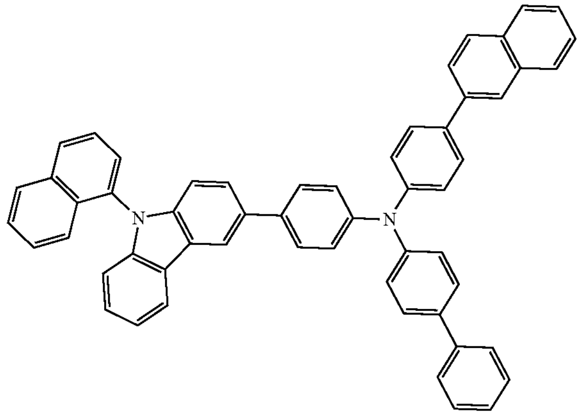
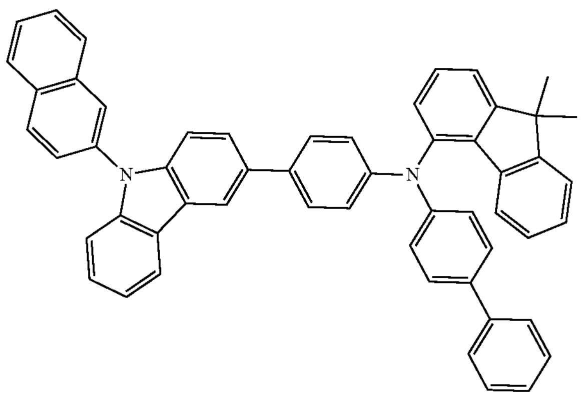
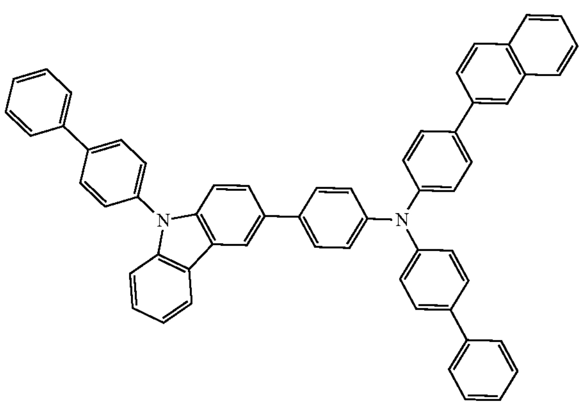
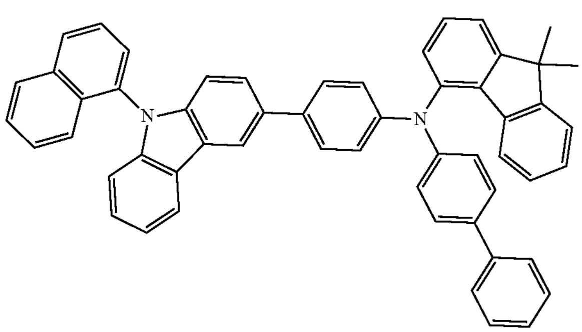
-continued
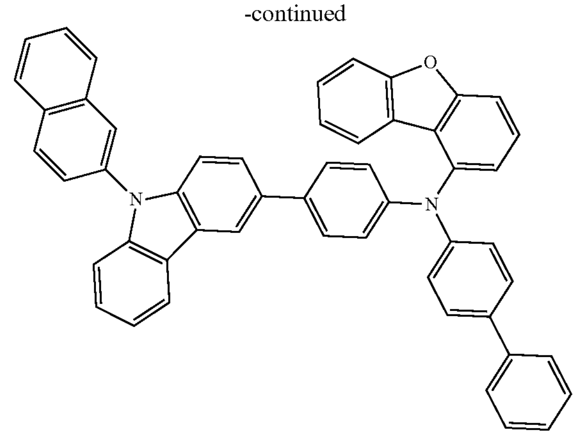
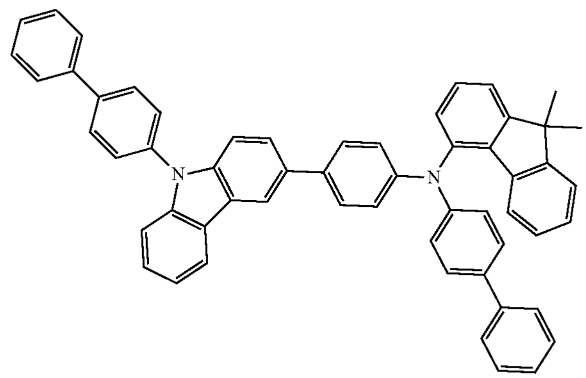
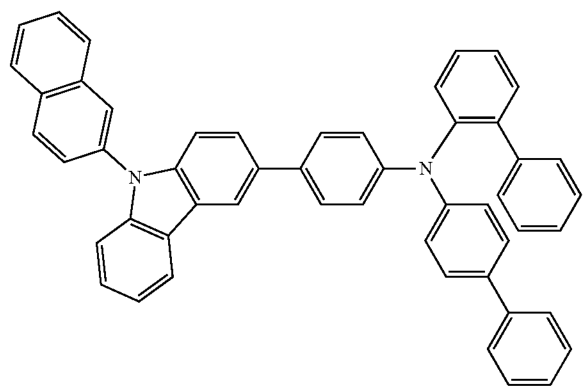
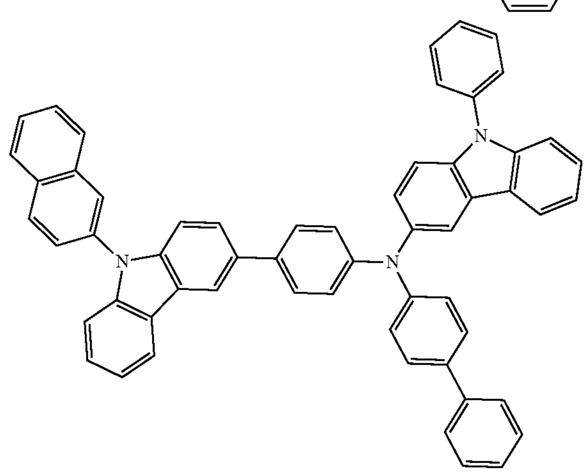

-continued
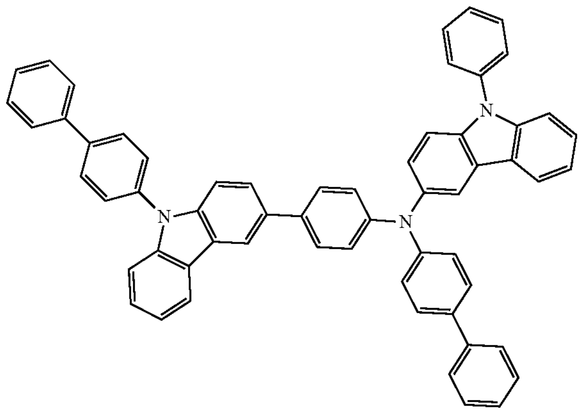
In one embodiment of the present disclosure, the compound of Chemical Formula 2 is any one of the following structural formulae.
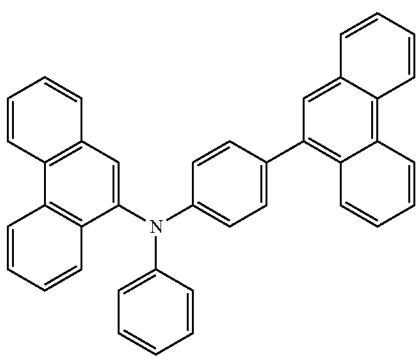
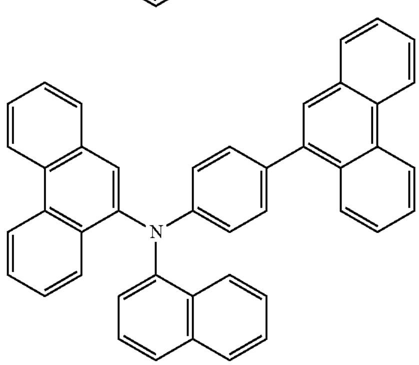
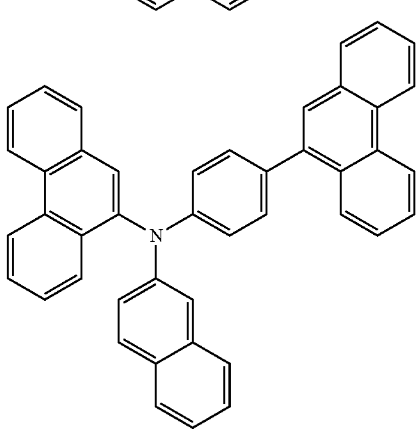
-continued
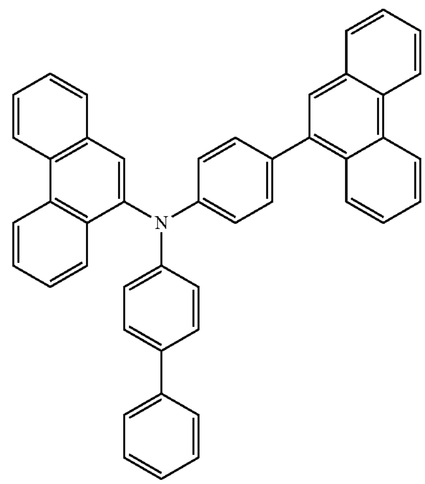
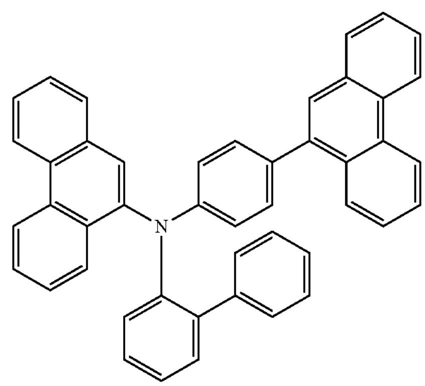
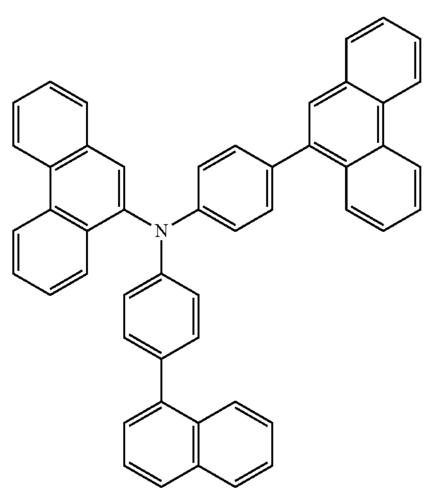

-continued
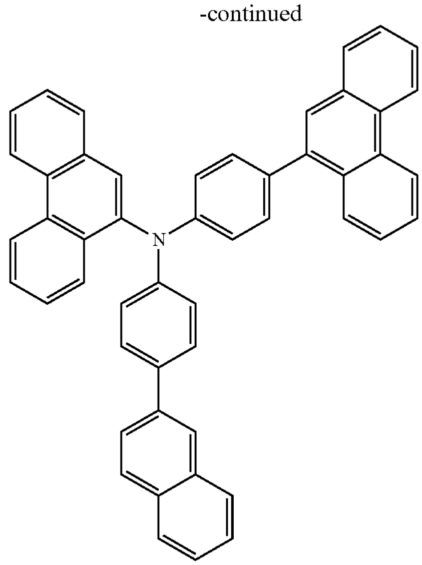
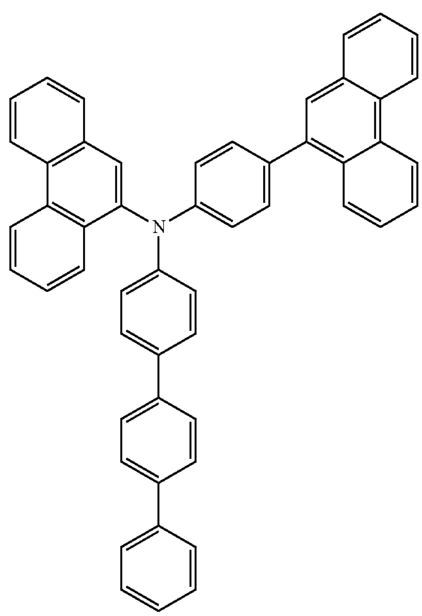
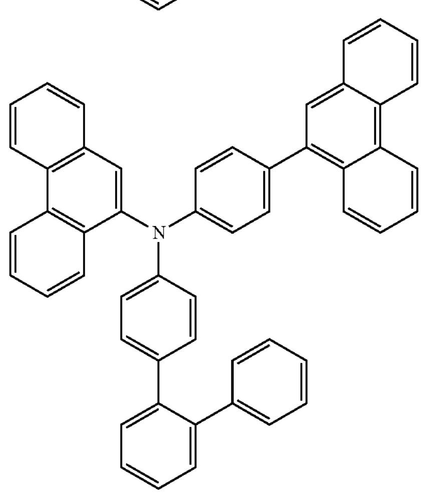
-continued
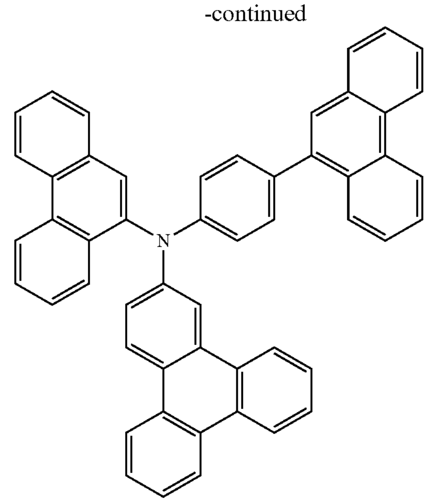
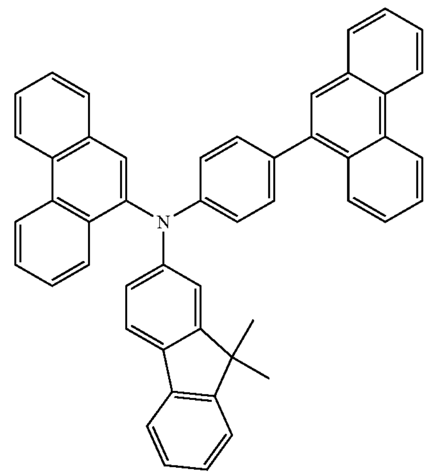
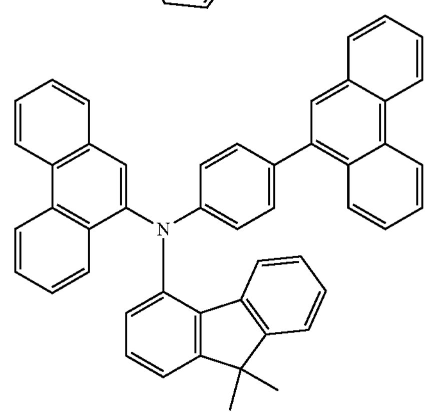
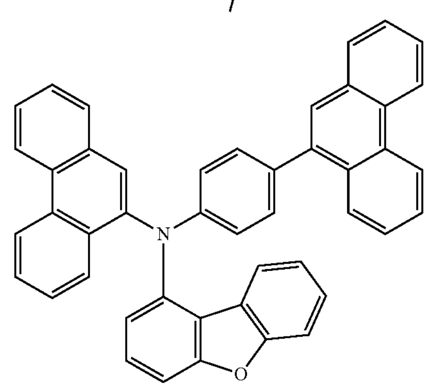

-continued
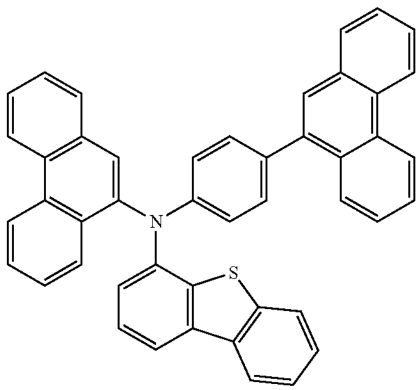
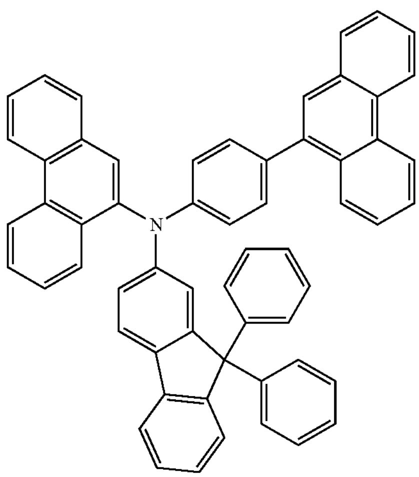
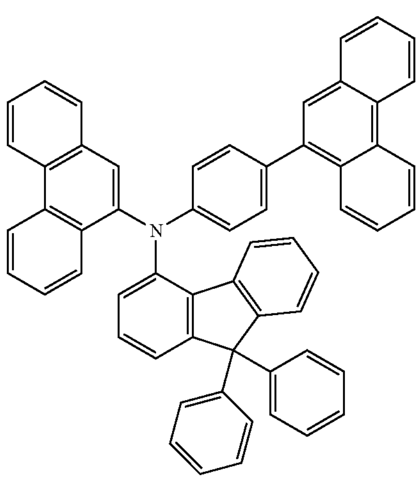
-continued
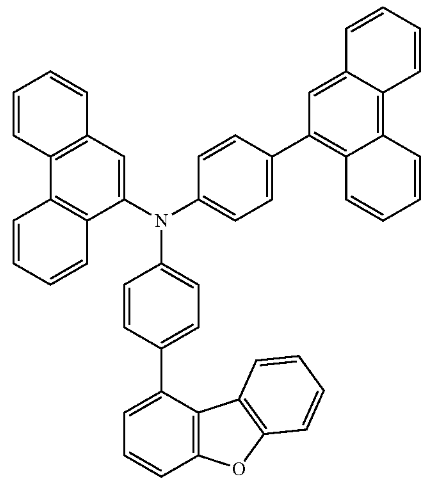
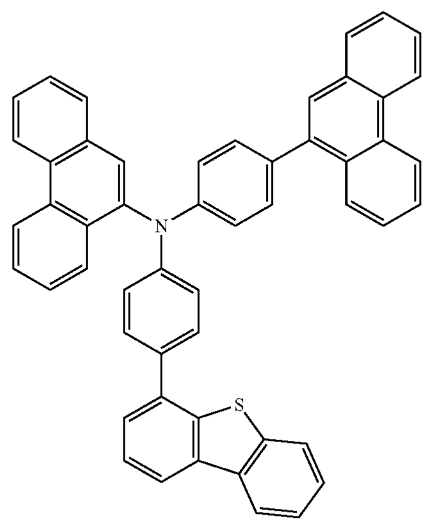
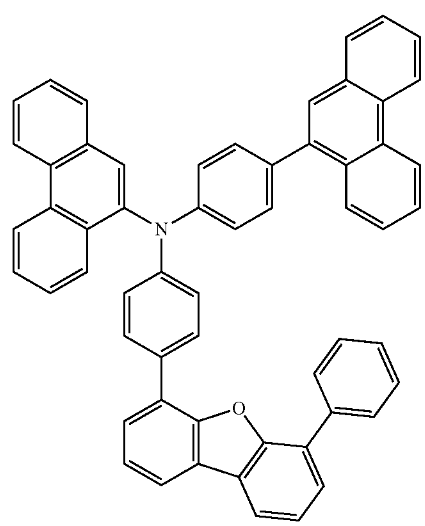

-continued
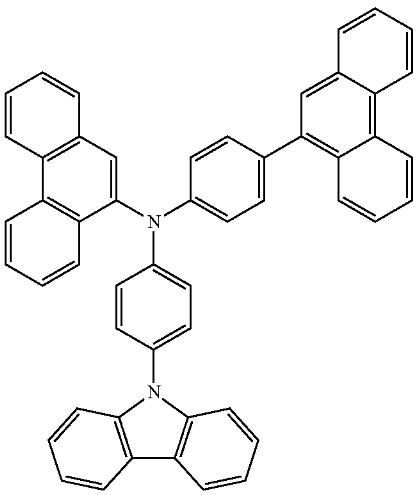
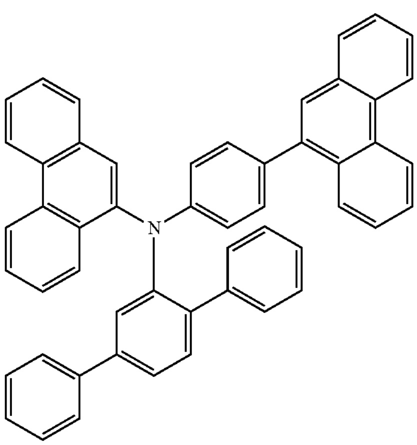
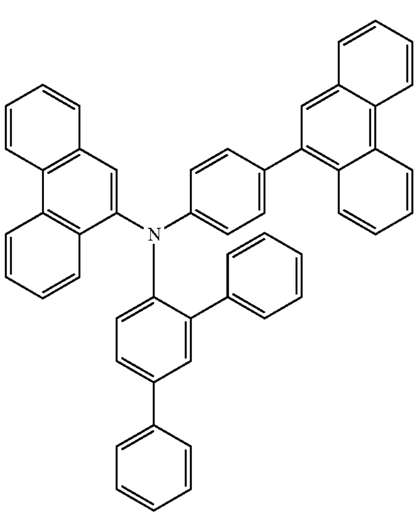
-continued
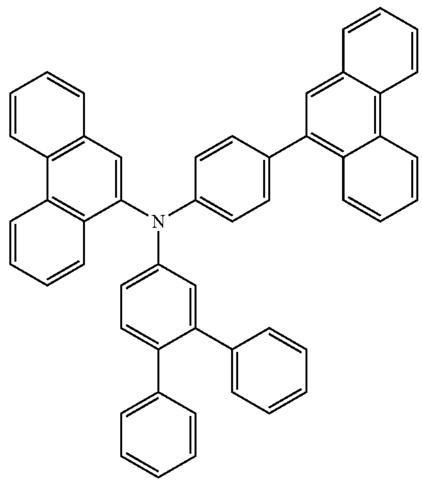
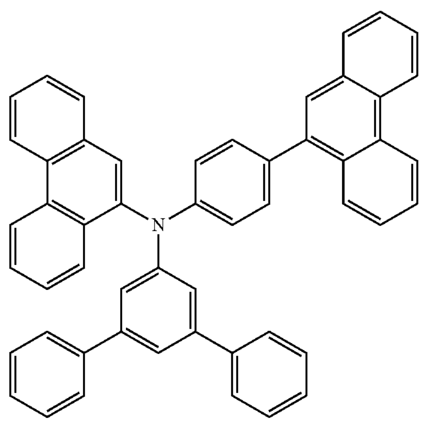
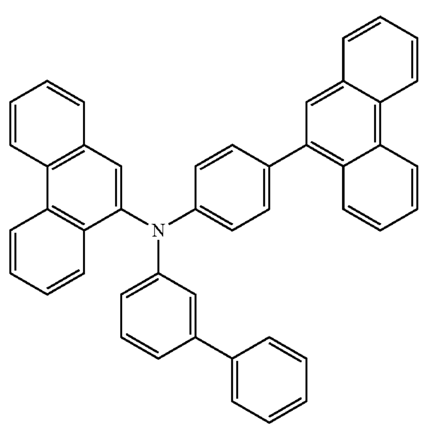
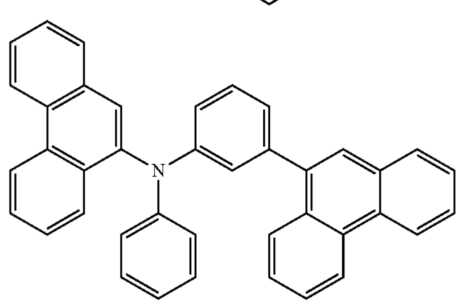

-continued
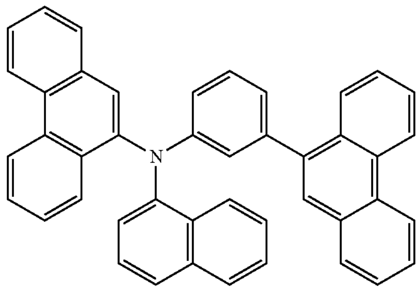
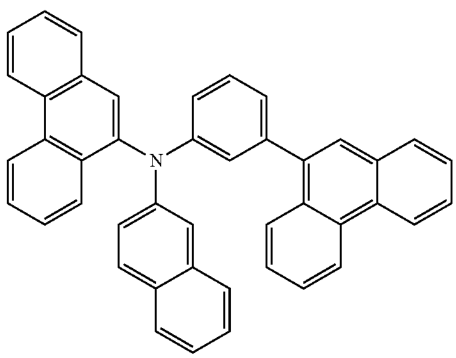
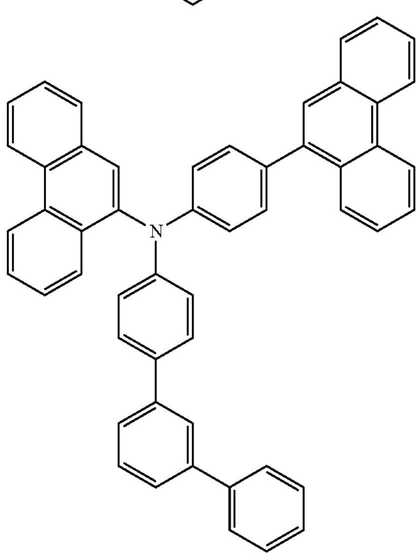
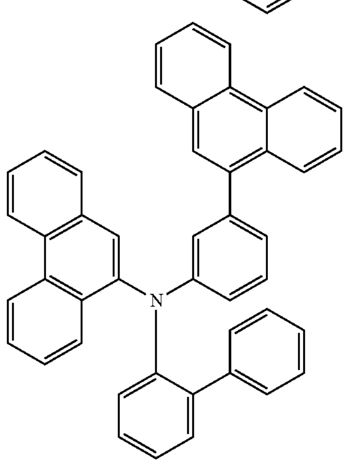
-continued
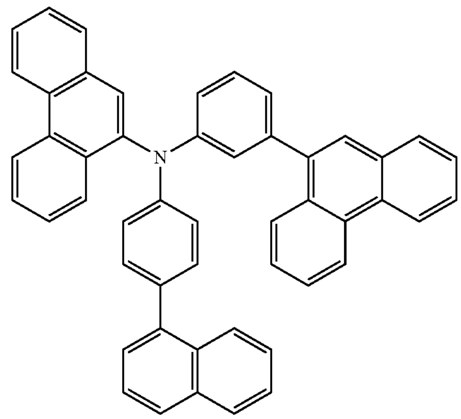
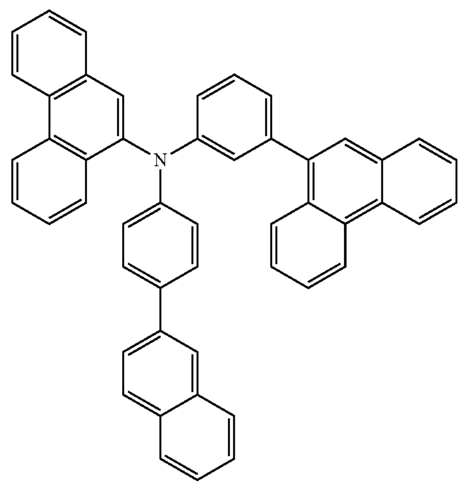
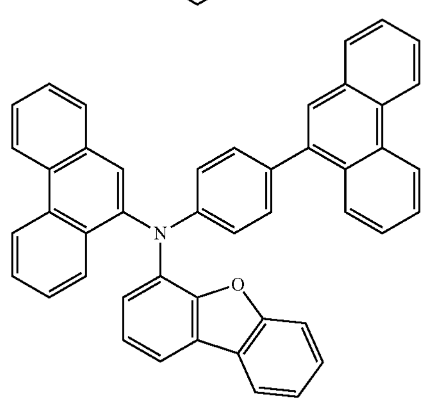
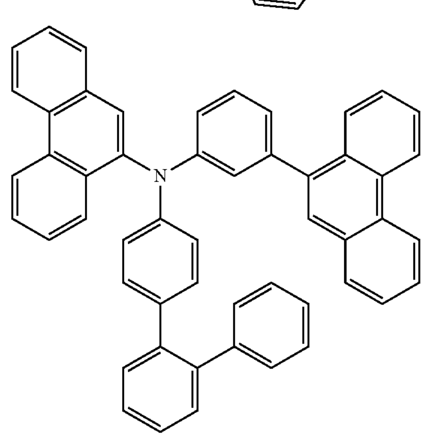

-continued
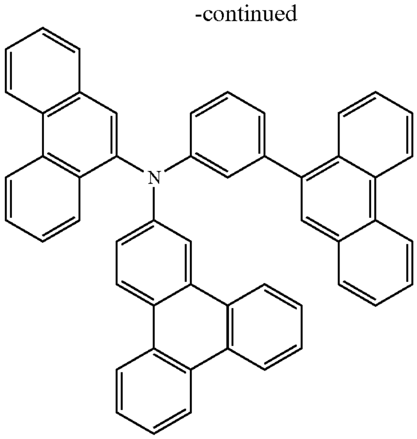
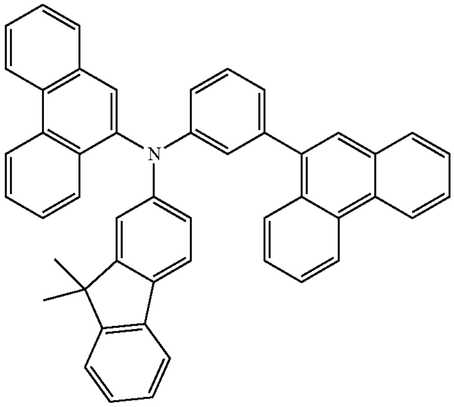
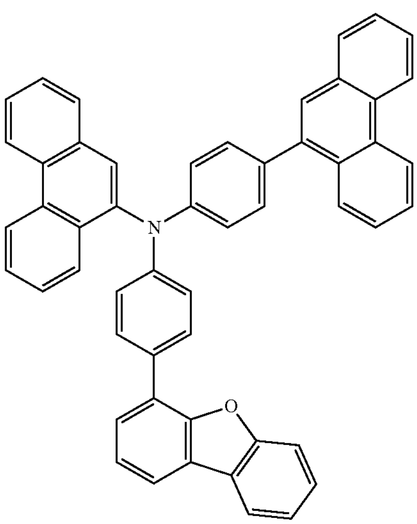
-continued
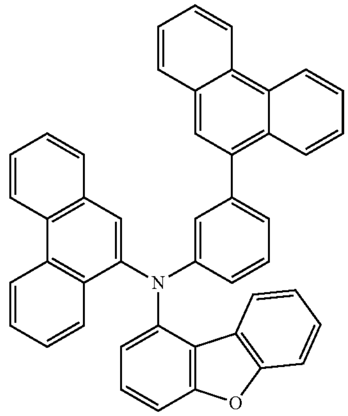
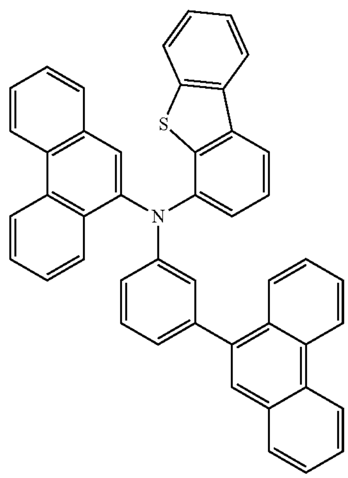
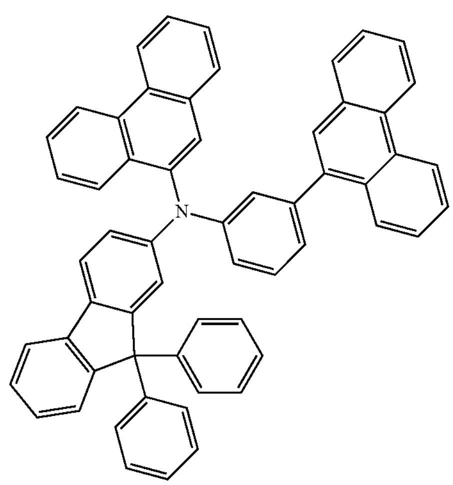

-continued
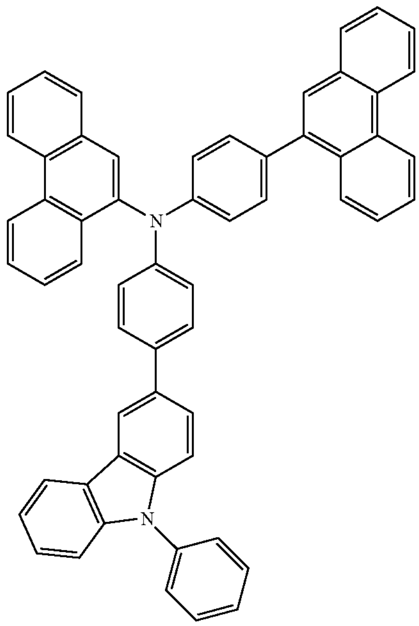
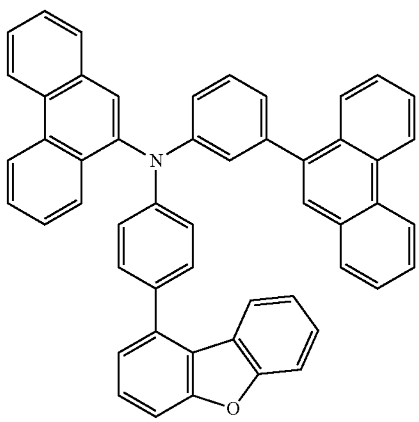
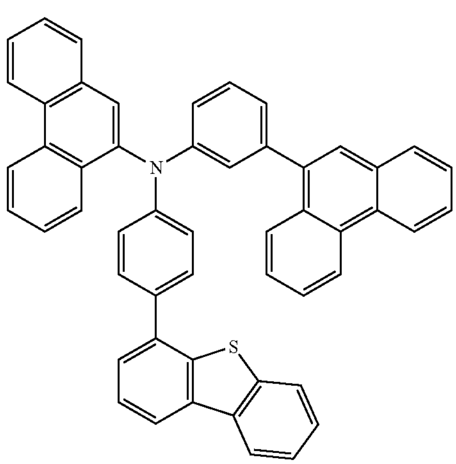
-continued
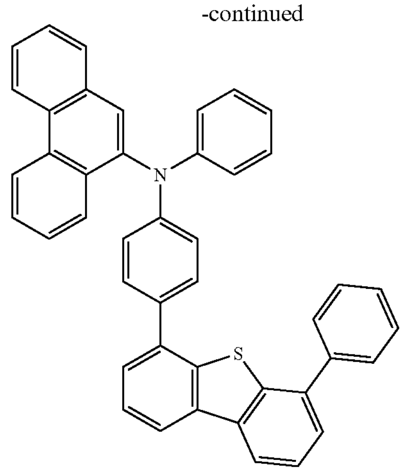
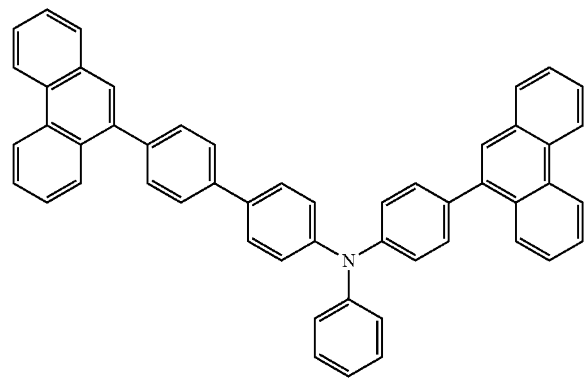
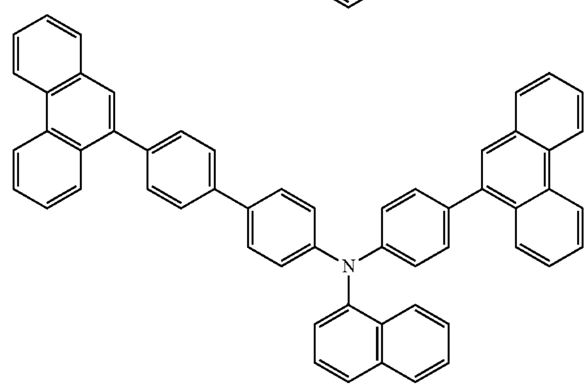
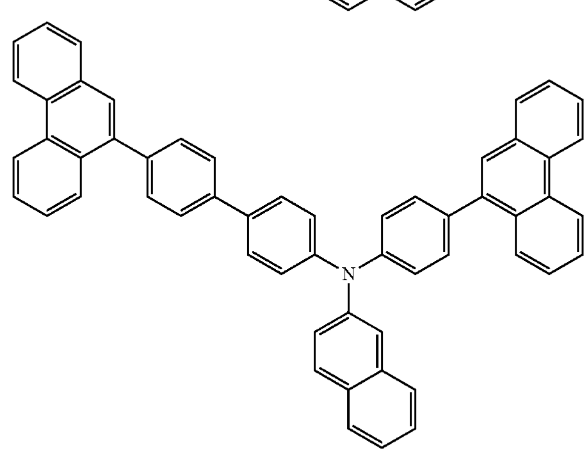

-continued
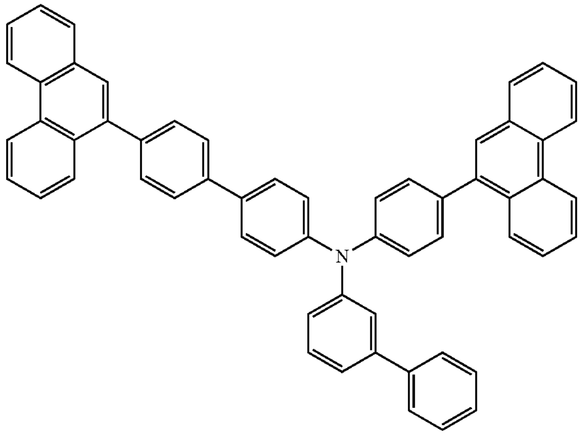
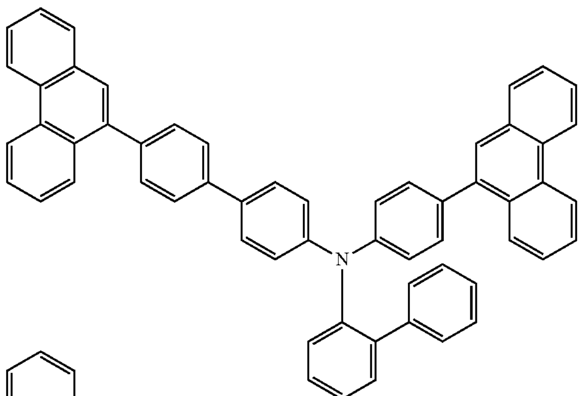
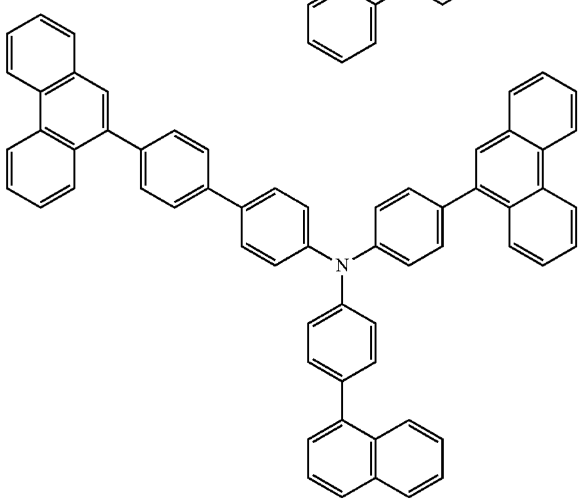
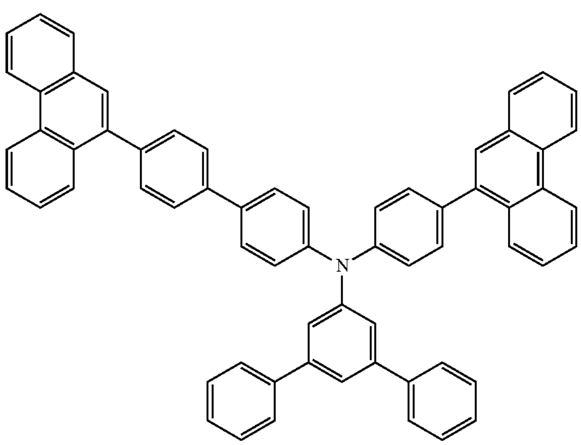
-continued
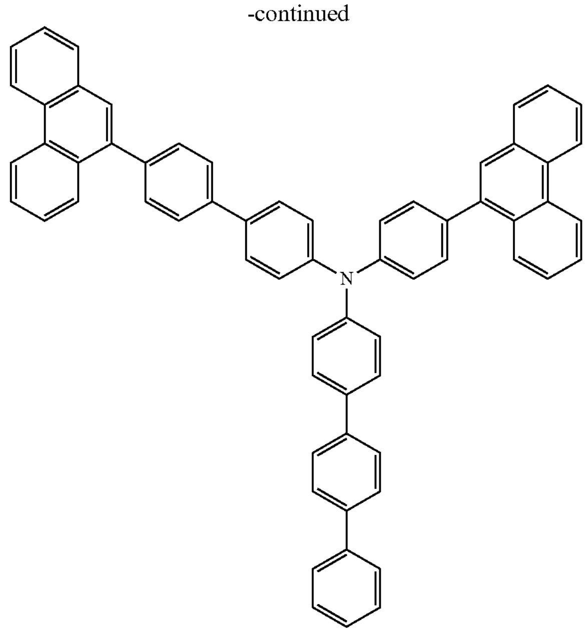
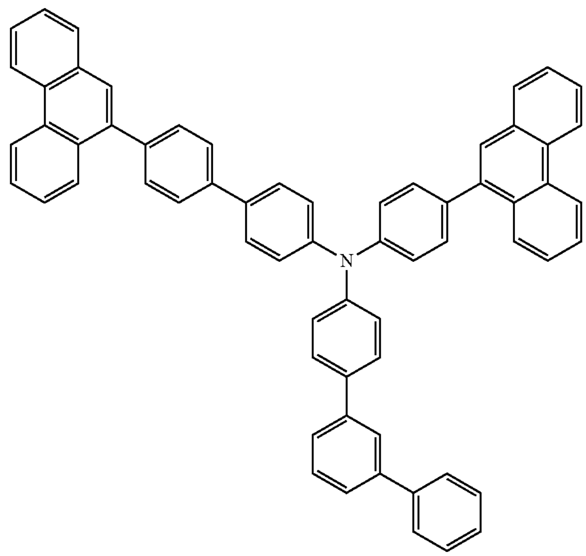
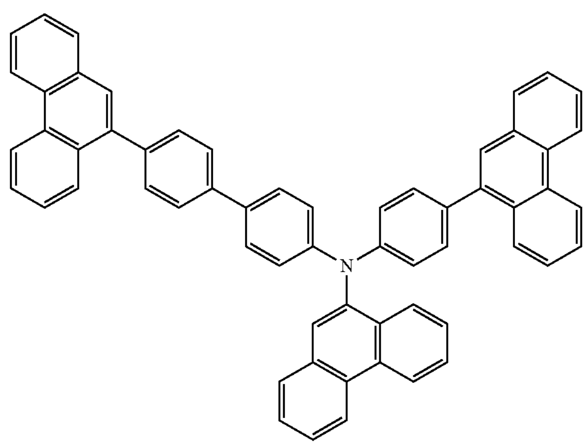

-continued
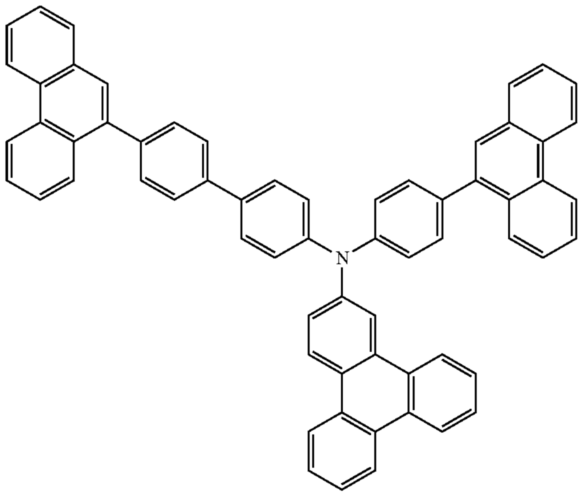
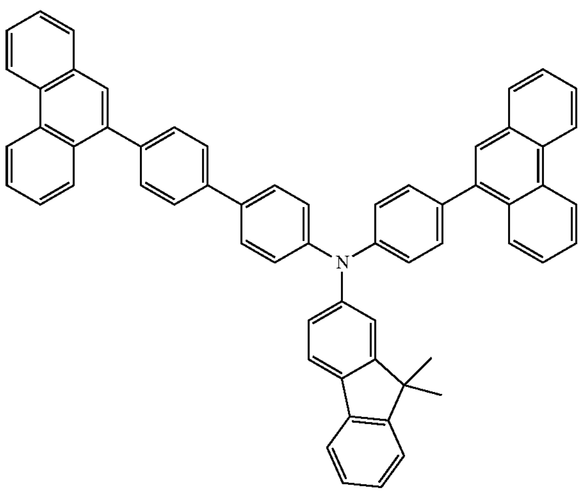
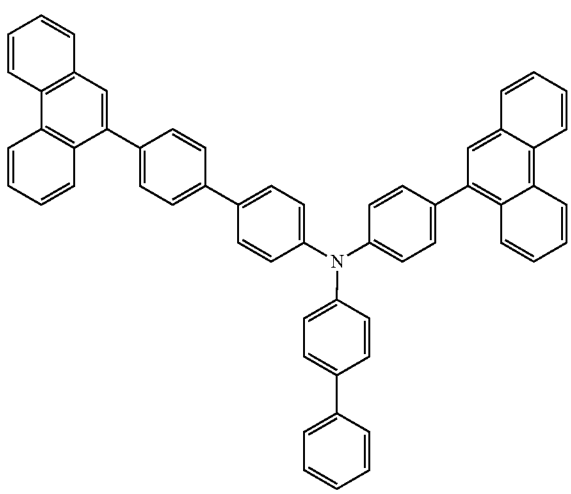
-continued
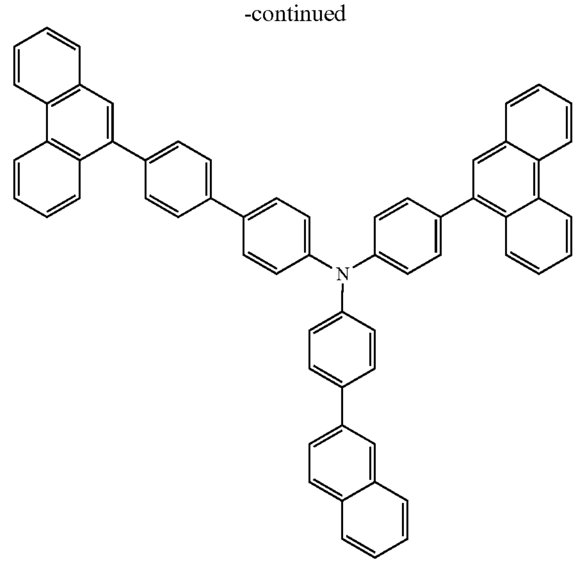
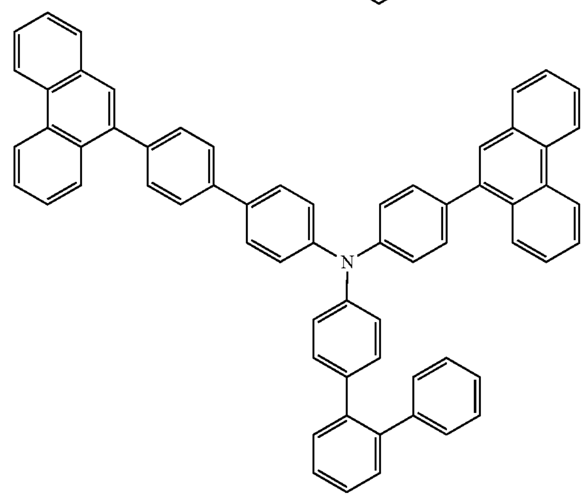
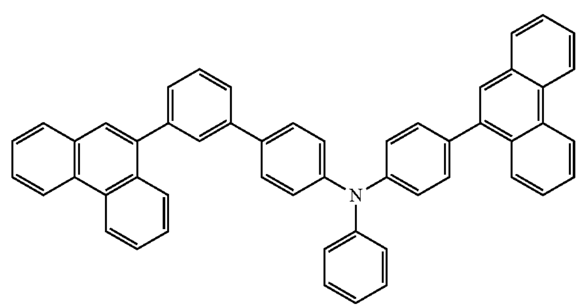
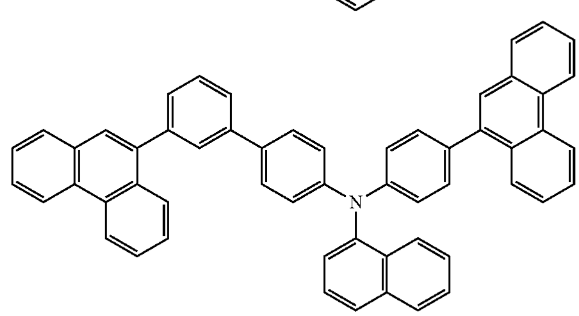

-continued
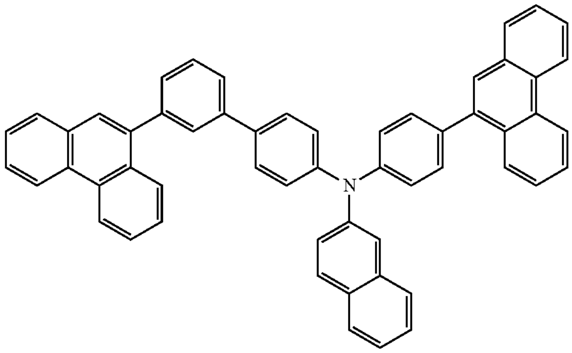
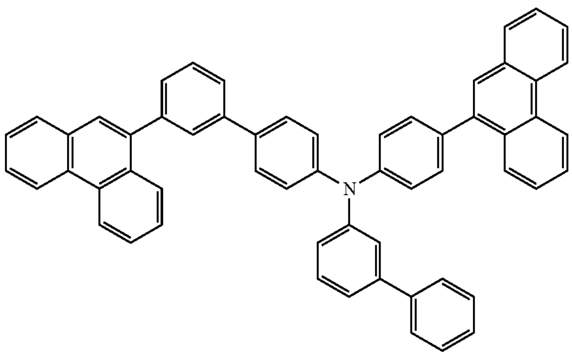
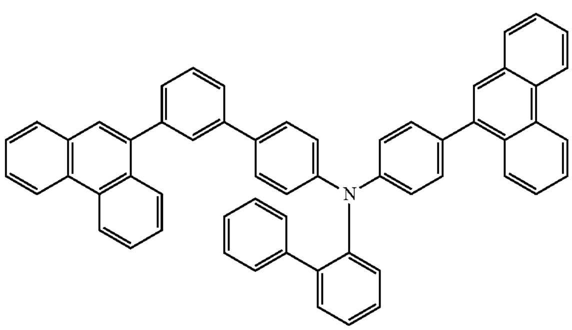
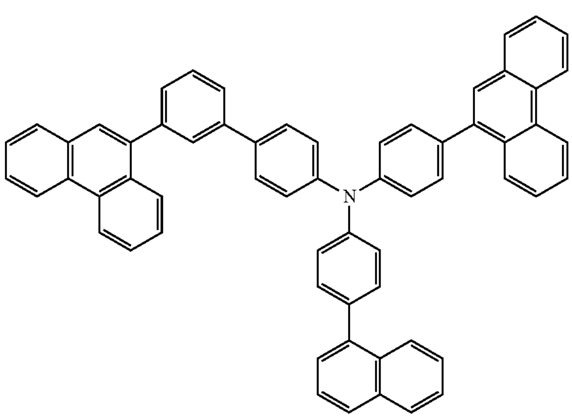
-continued
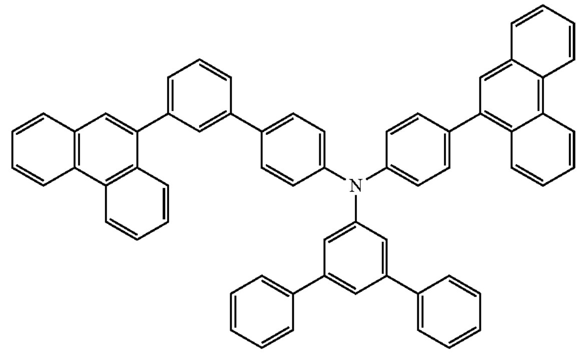
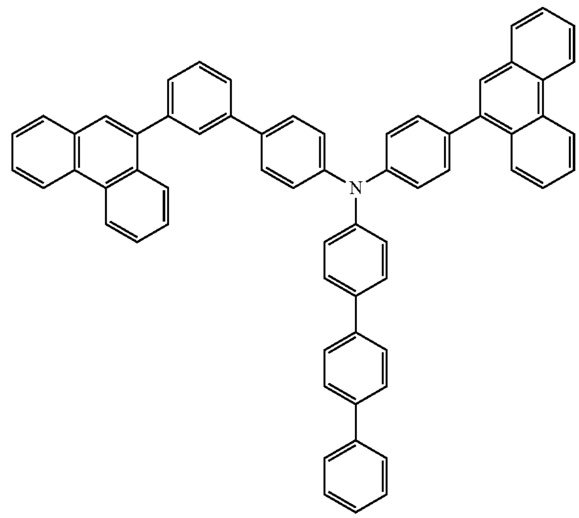
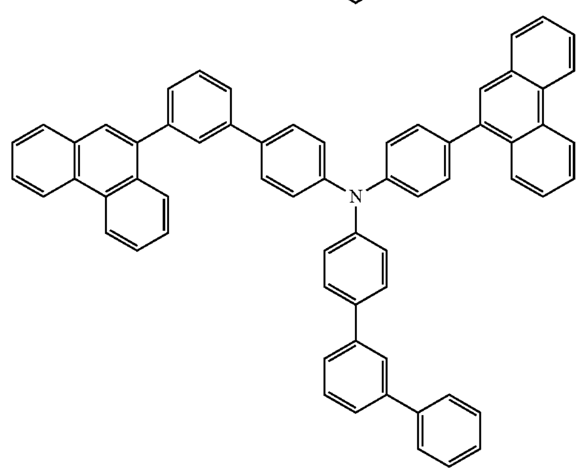
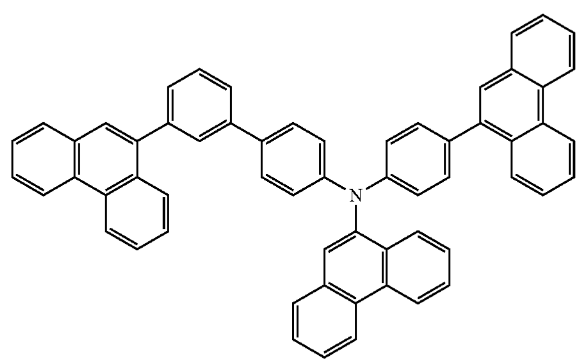

-continued
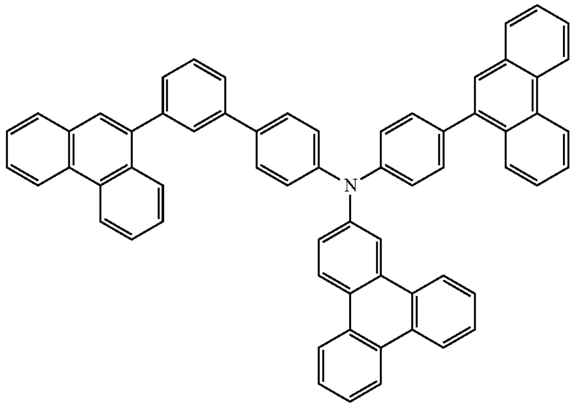
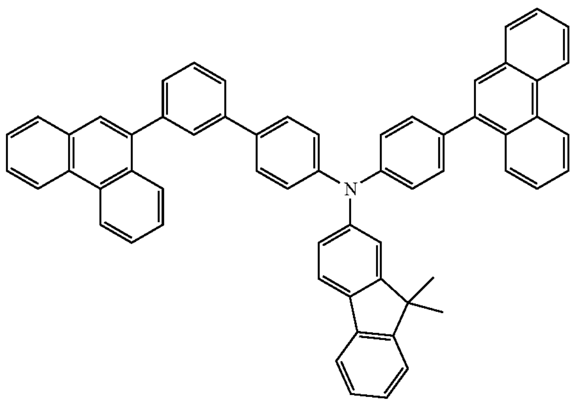
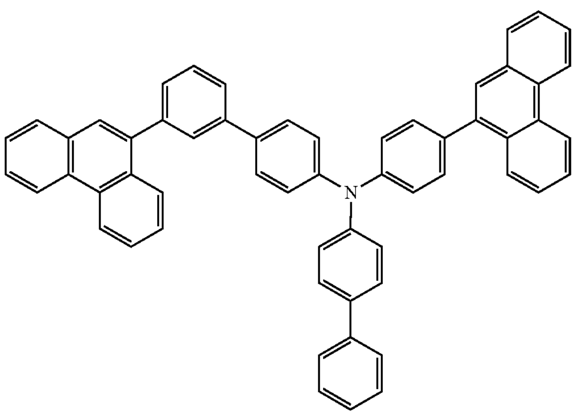
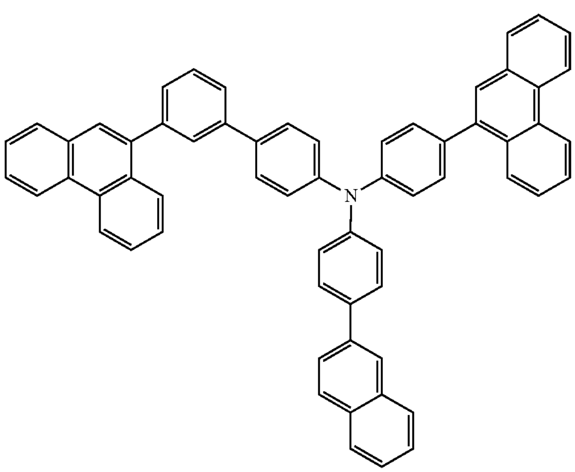
-continued
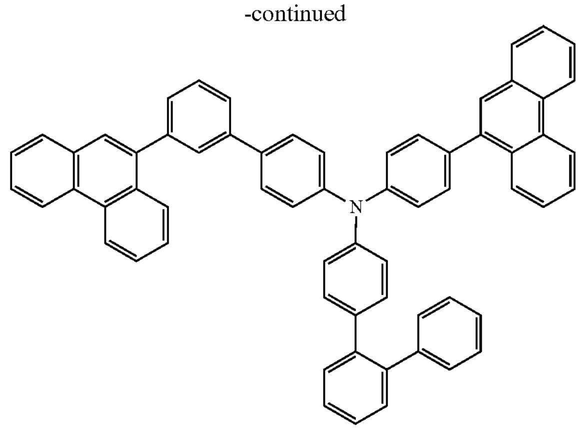
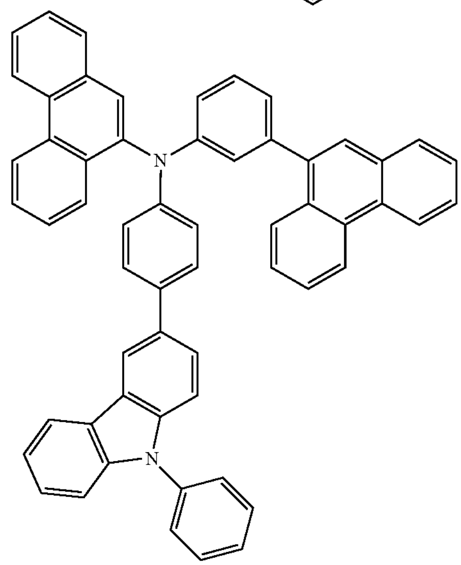
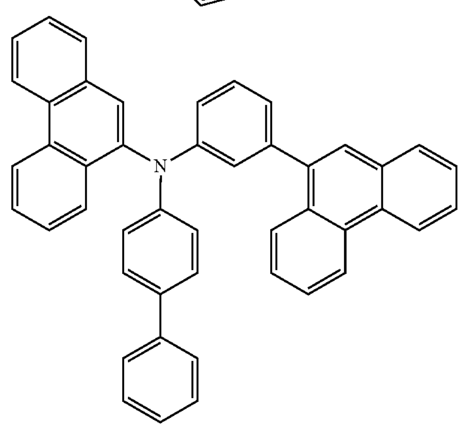
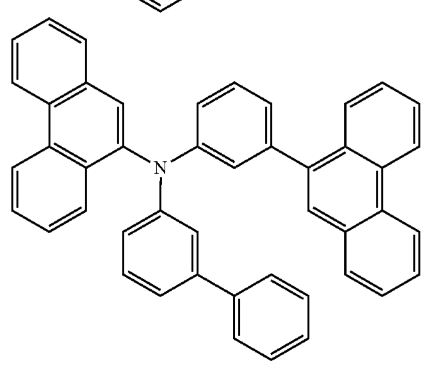

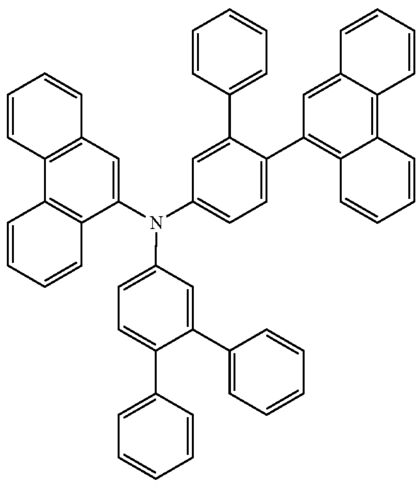
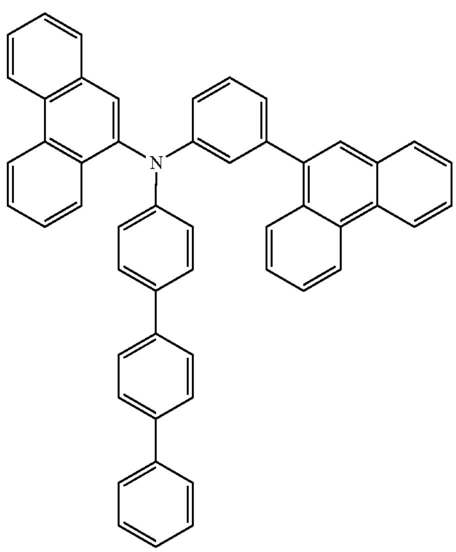
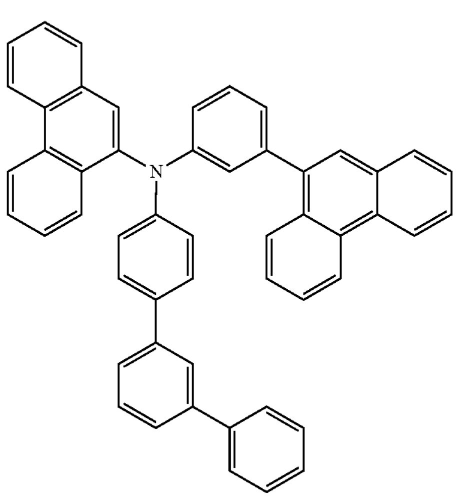
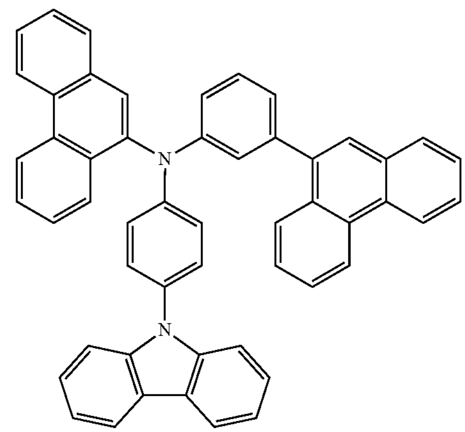
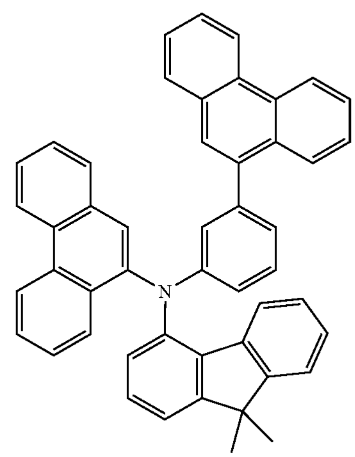
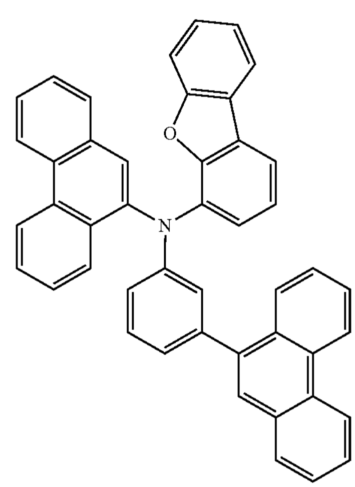

-continued
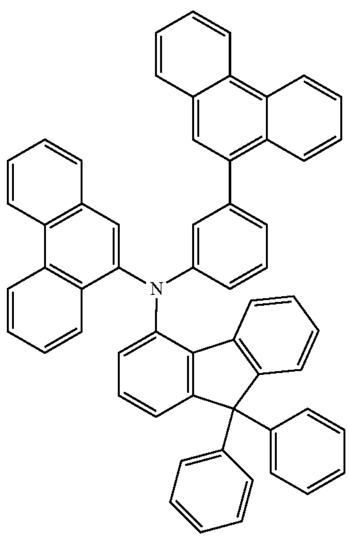
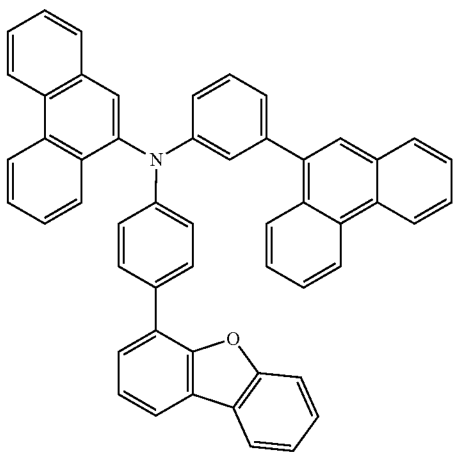
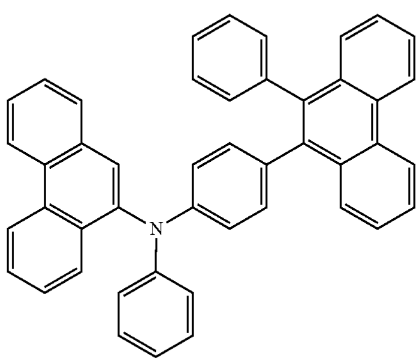
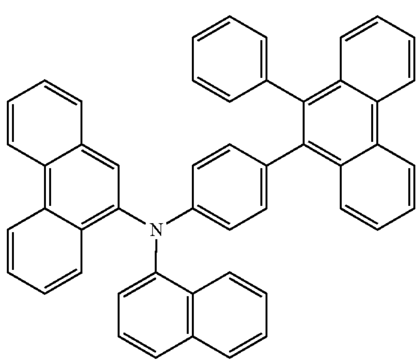
-continued
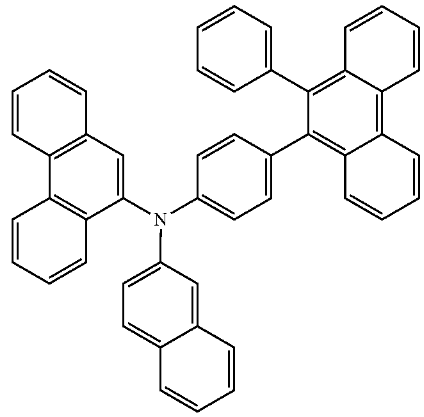
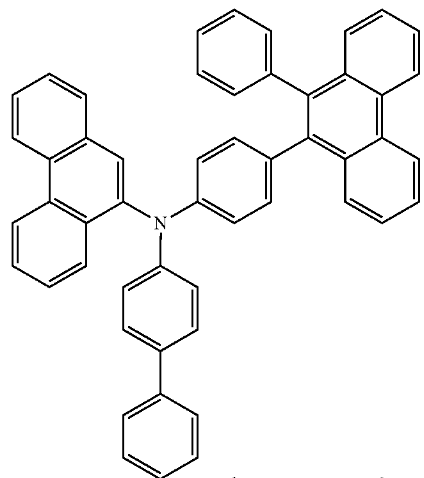
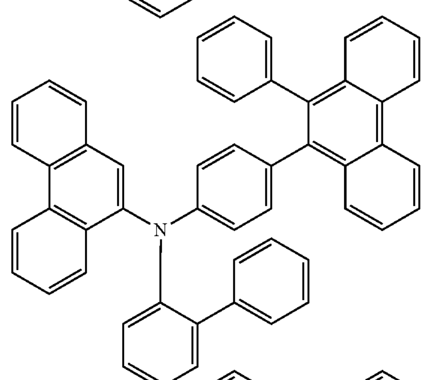
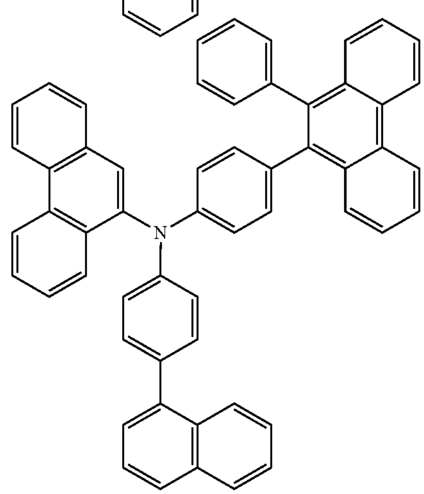

-continued
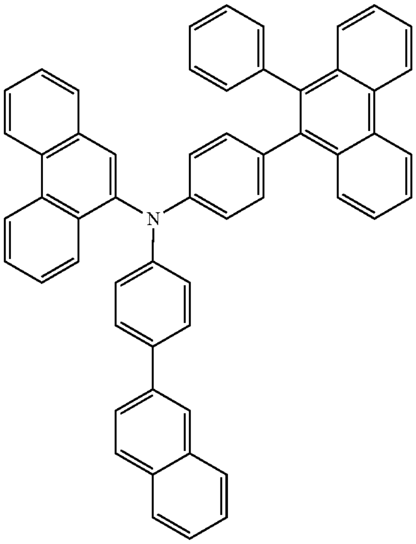
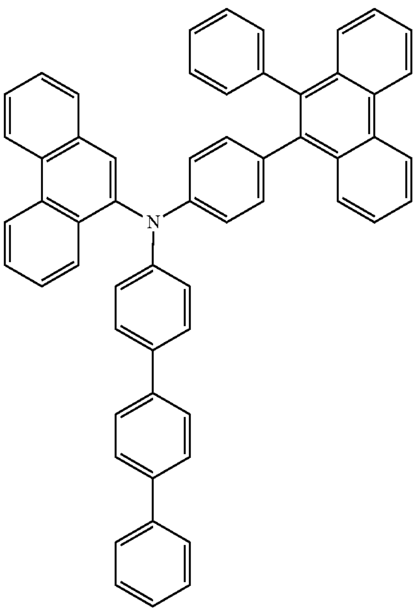
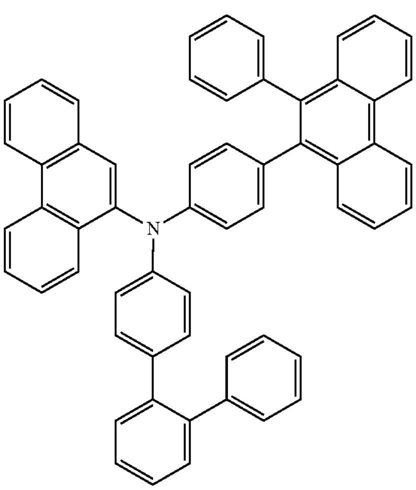
-continued
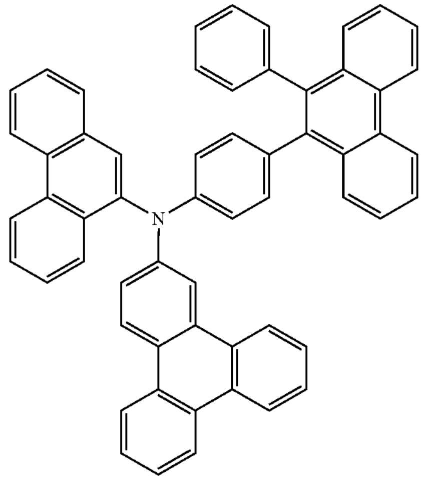
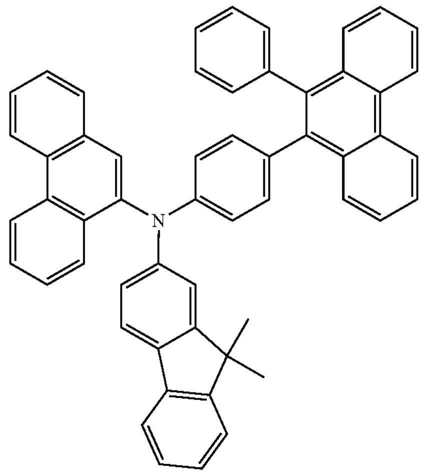
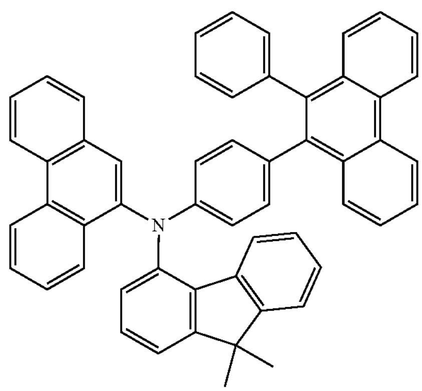
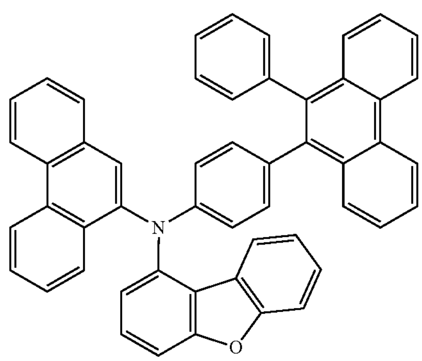

-continued
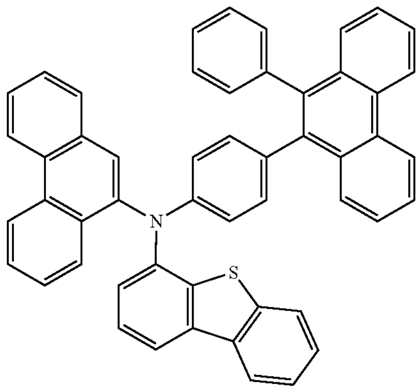
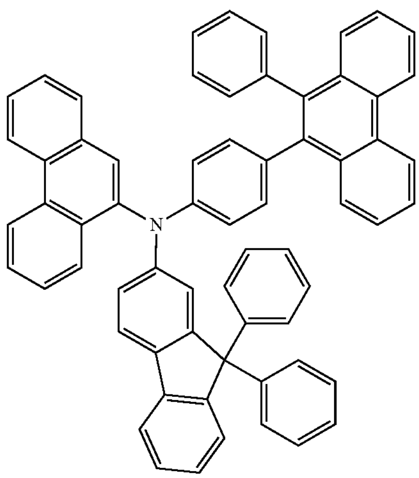
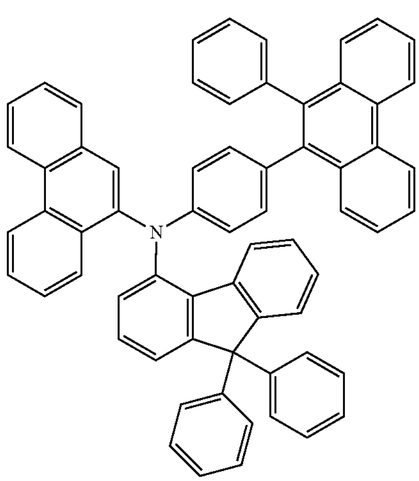
-continued
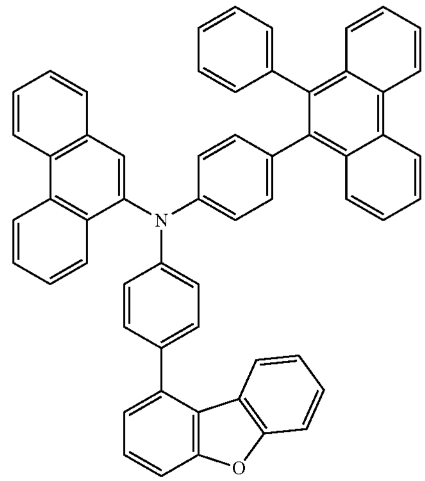
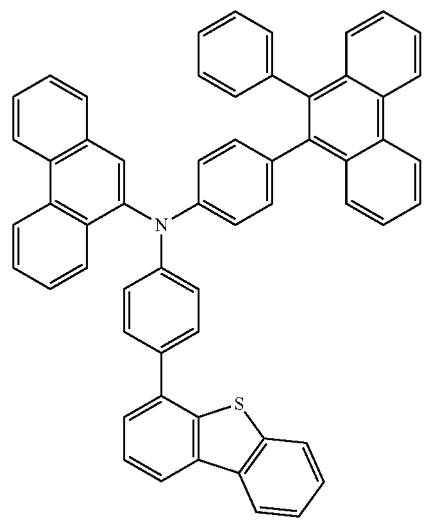
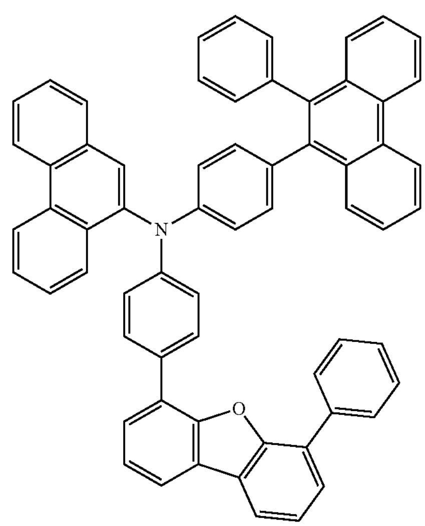

-continued
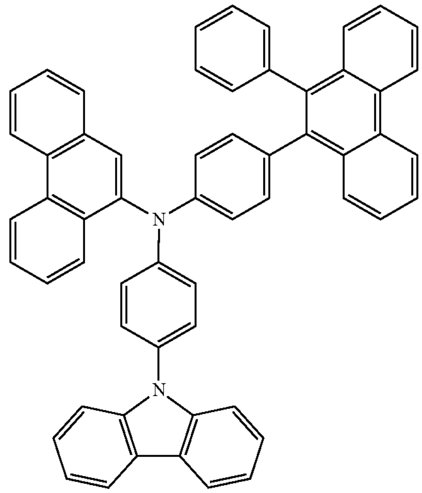
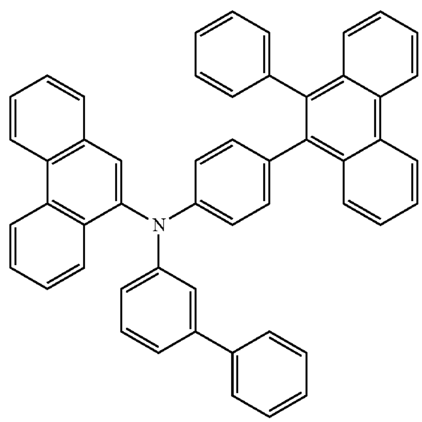
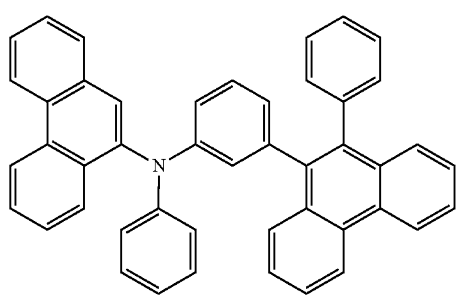
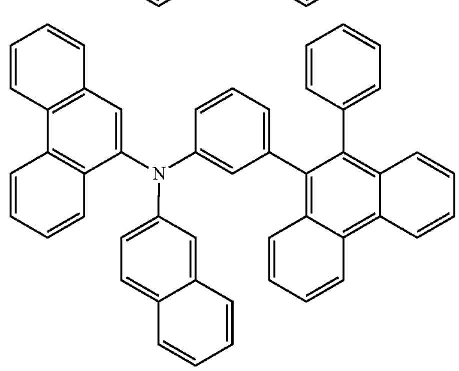
-continued
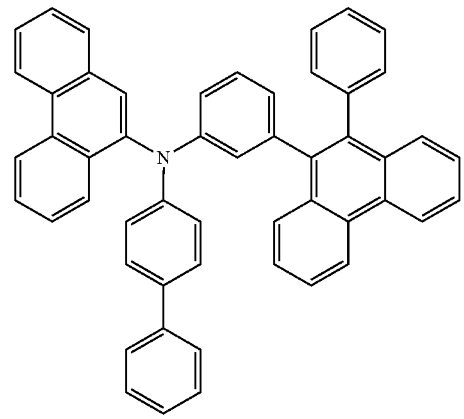
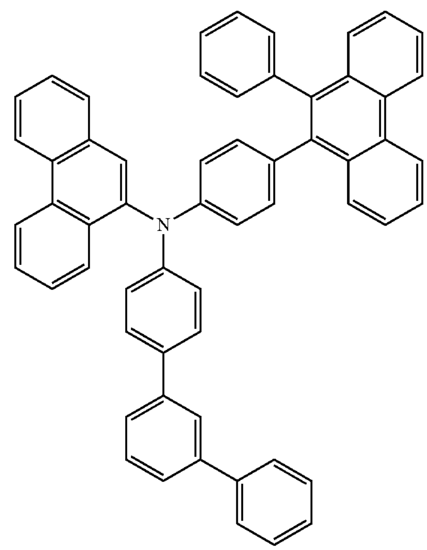
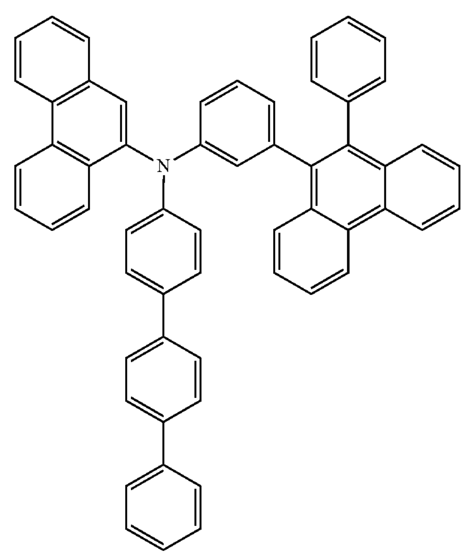

-continued
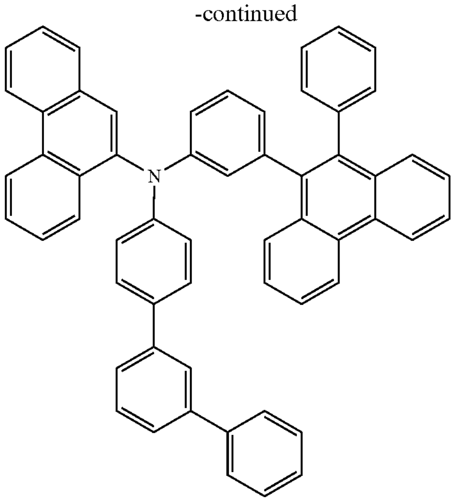
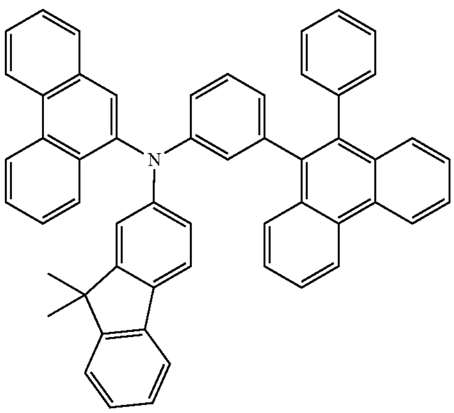
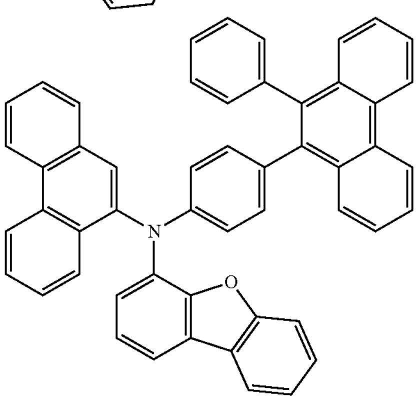
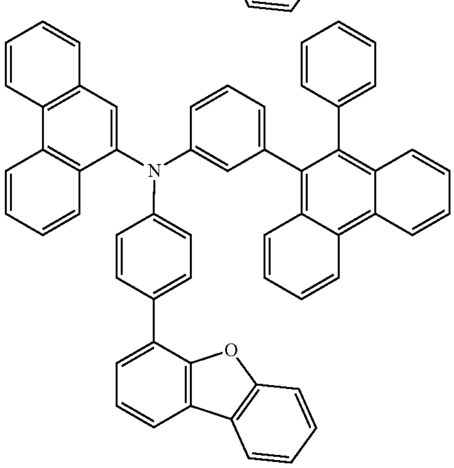
-continued
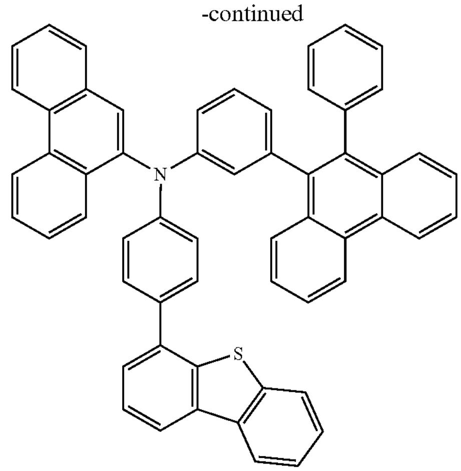
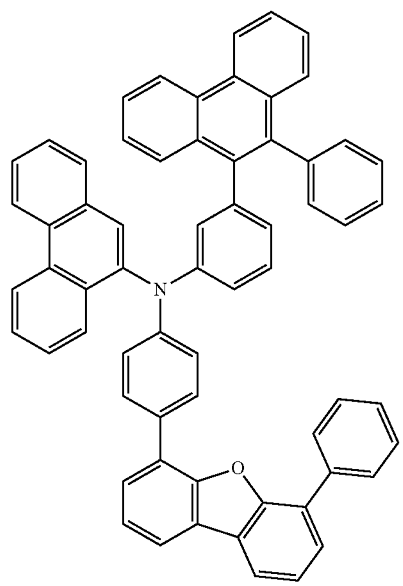
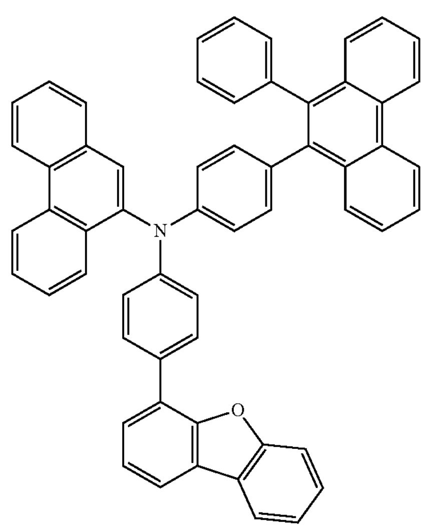

-continued
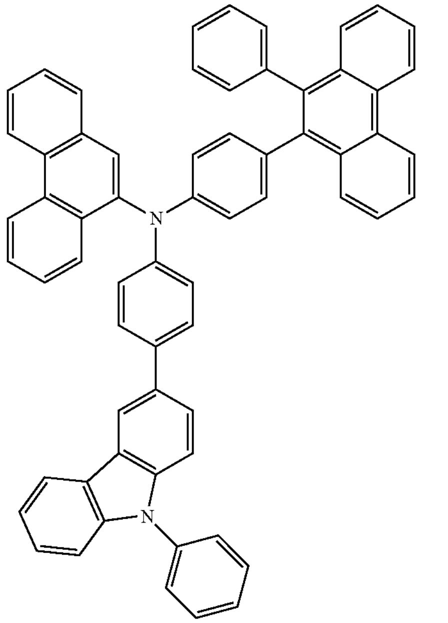
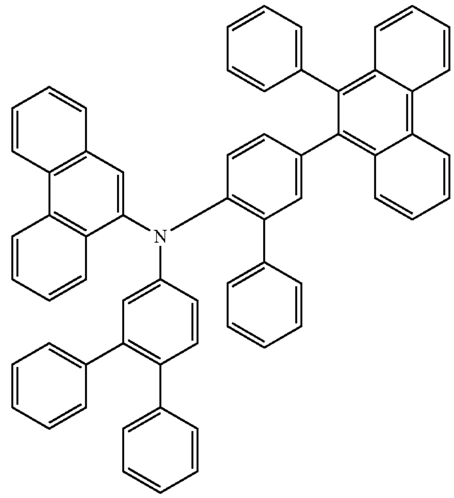
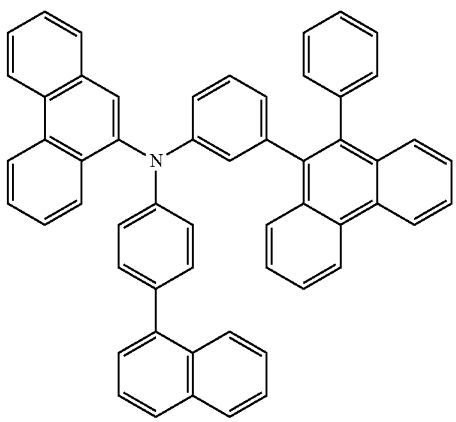
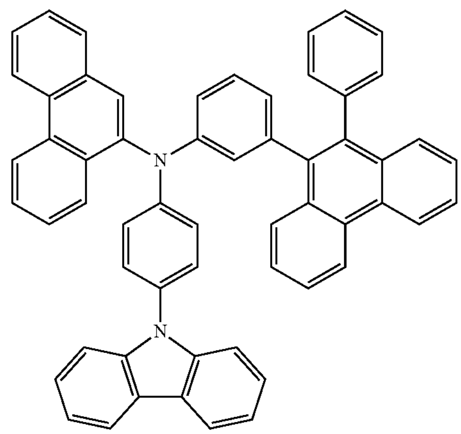
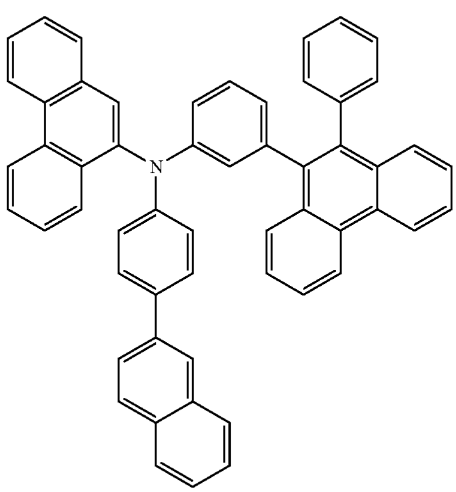
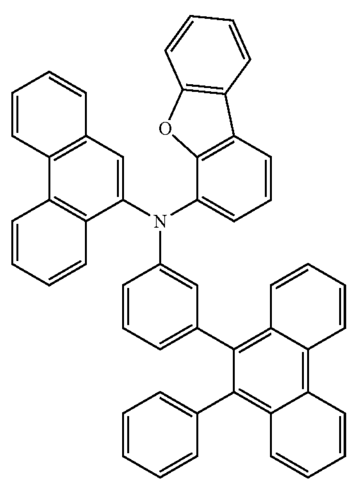
-continued

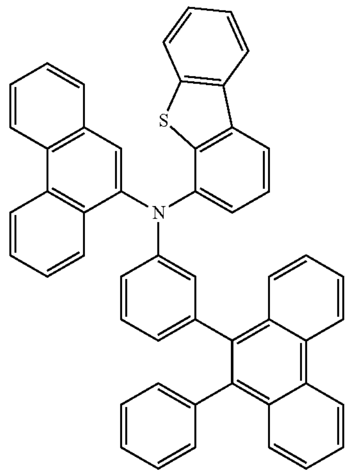
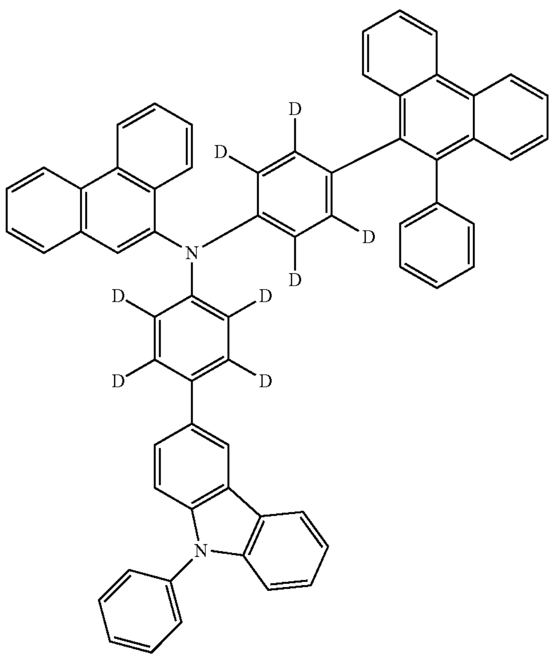
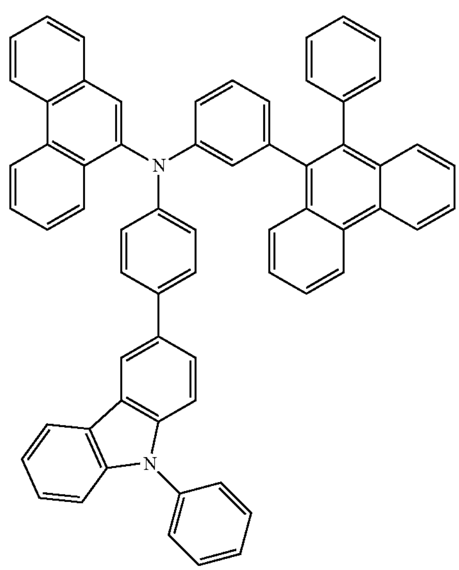
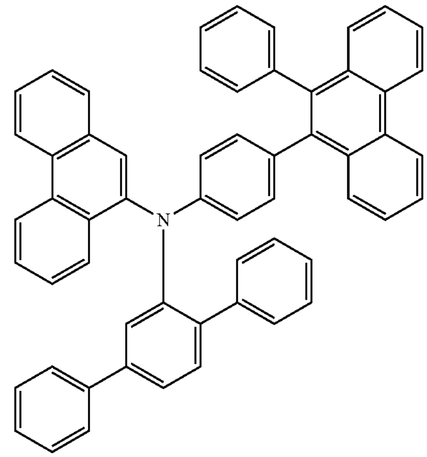
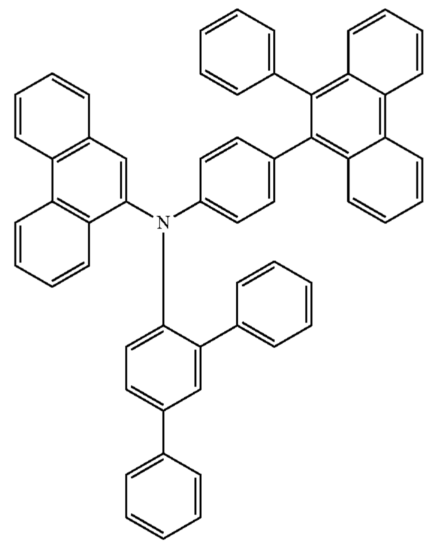
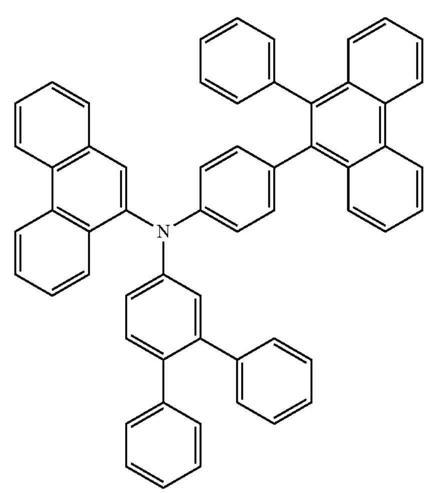

-continued
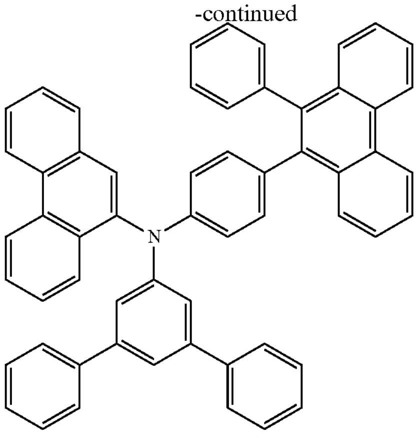
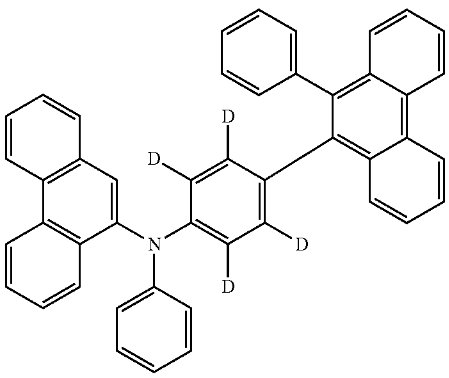
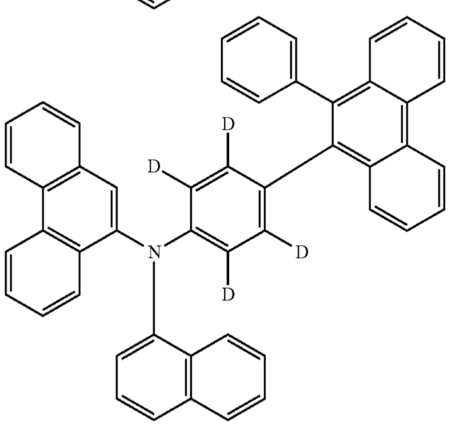
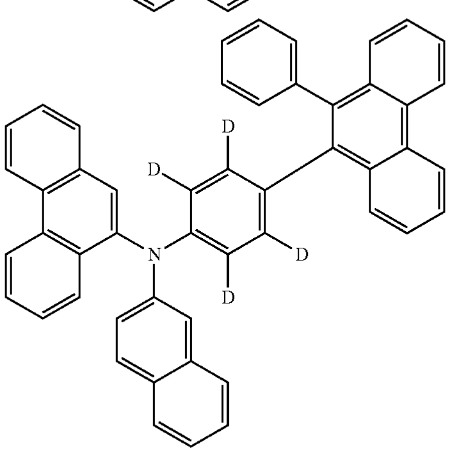
-continued
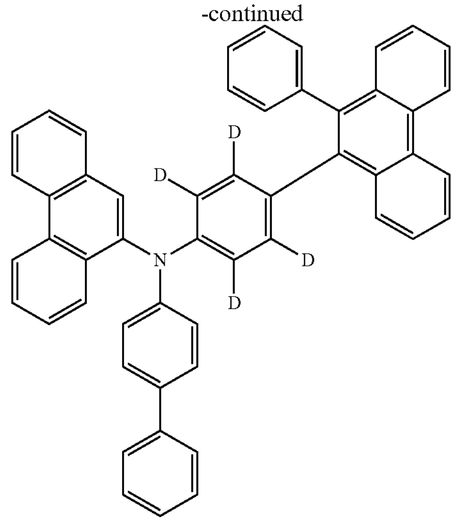
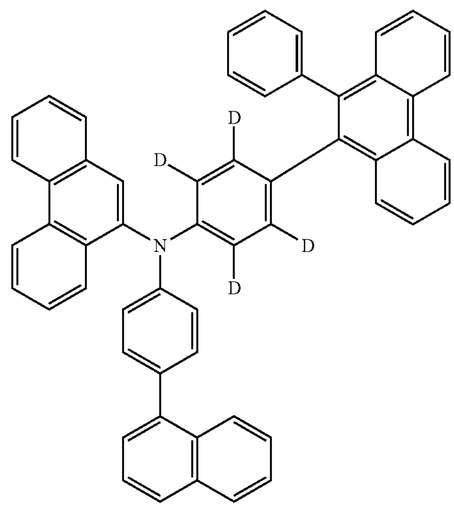
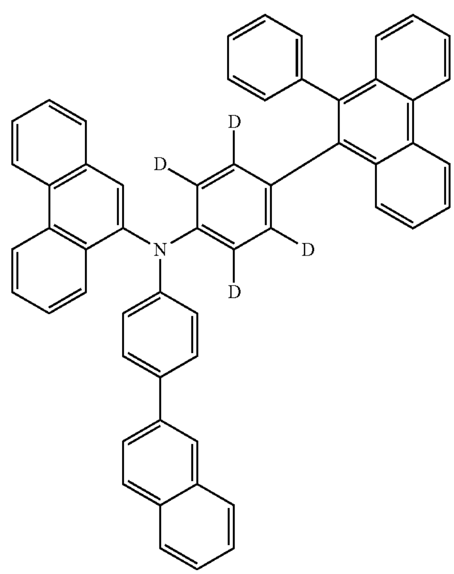

-continued
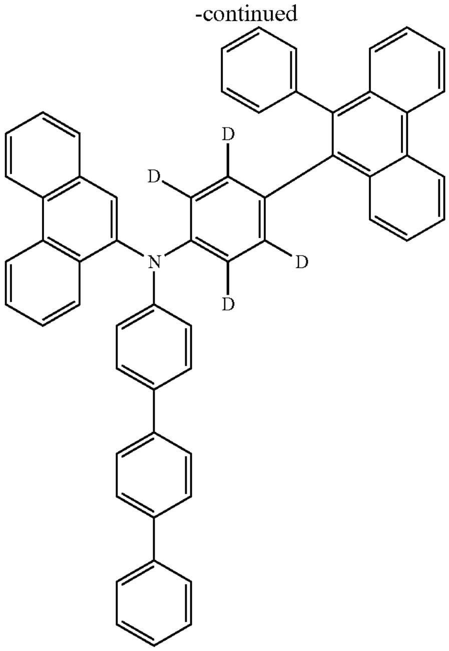
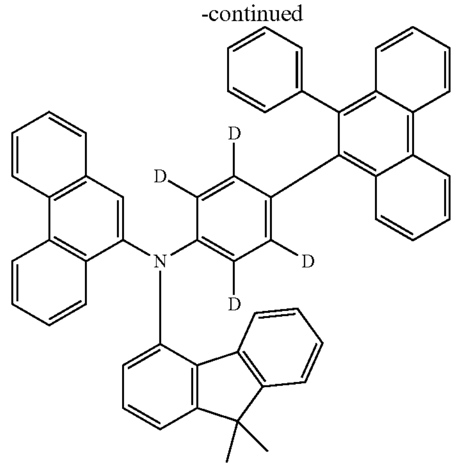
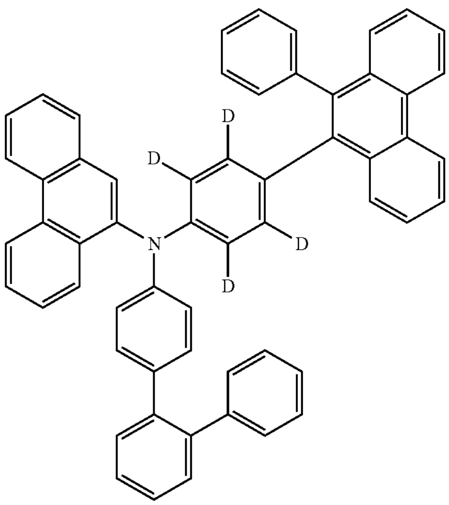
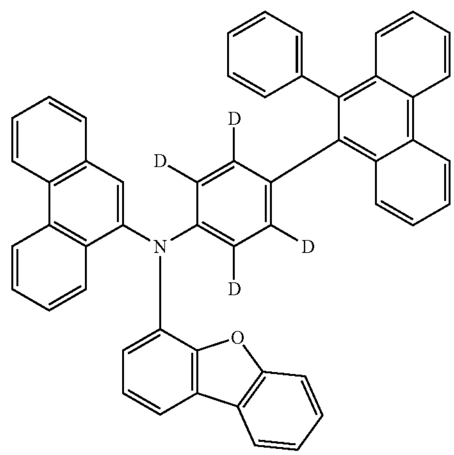
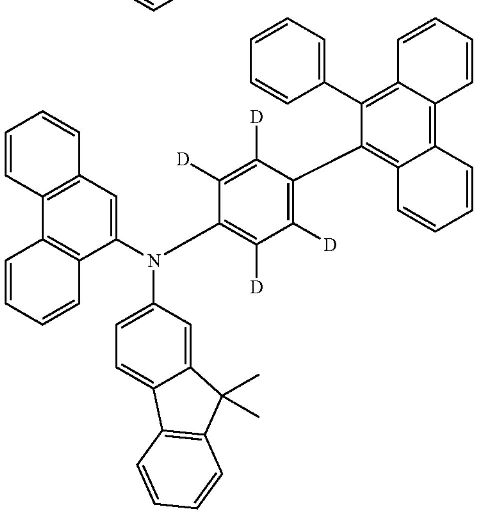
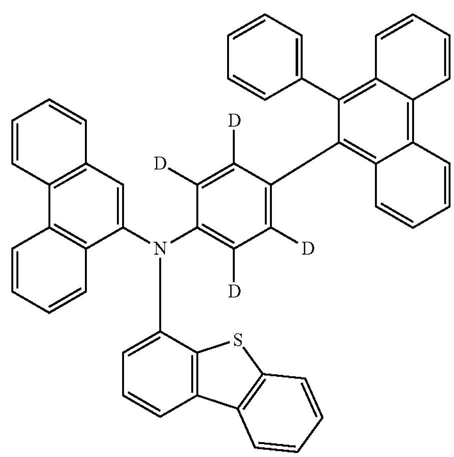

-continued
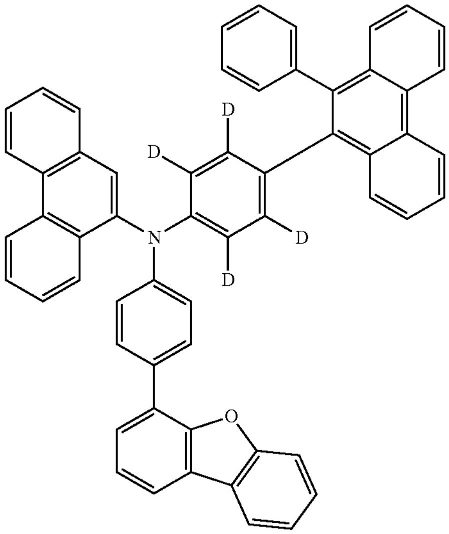
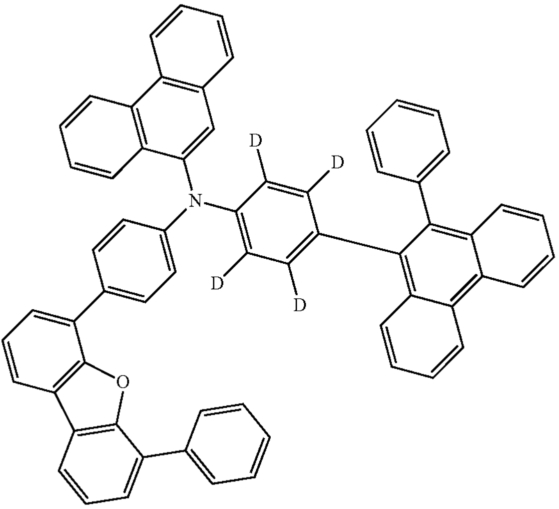
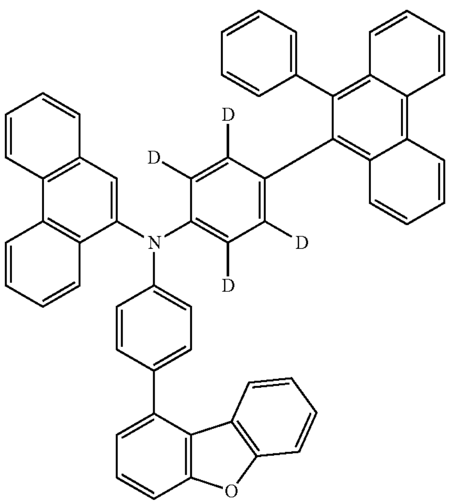
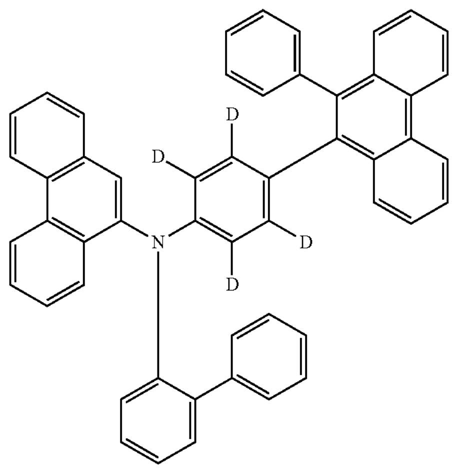
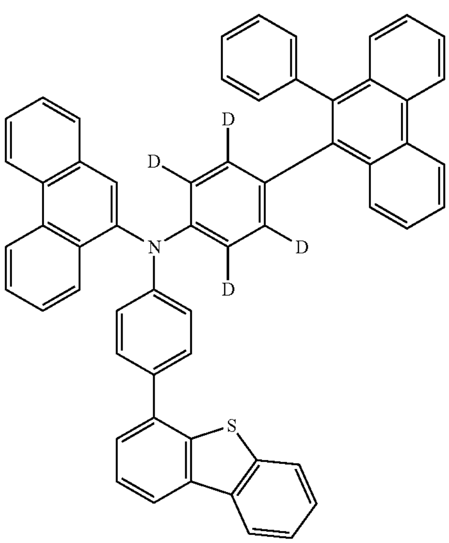
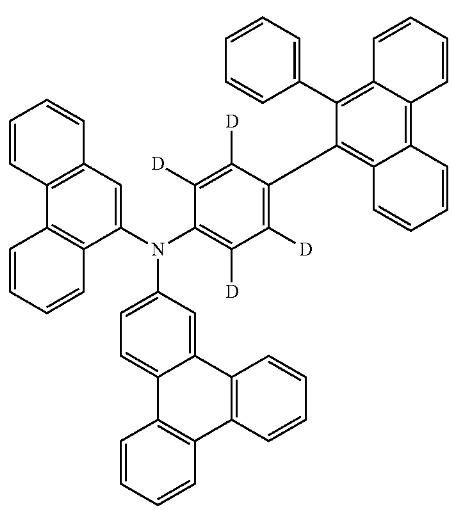

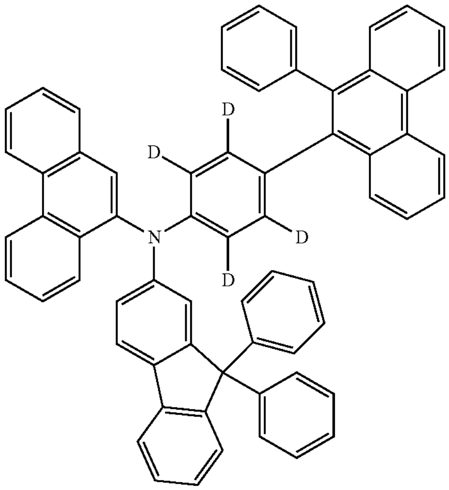
D
D
D
D
N
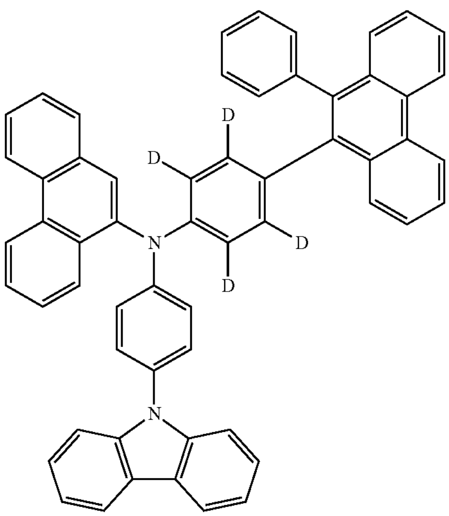
D
D
D
D
N
N
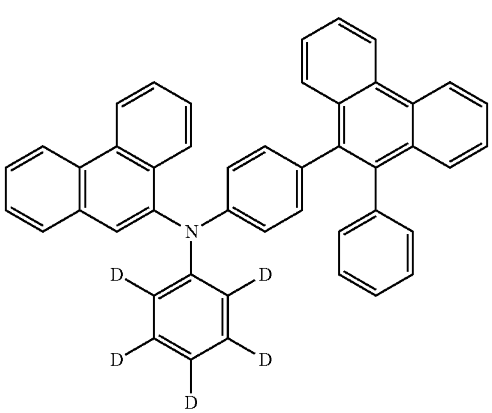
N
D
D
D
D
D
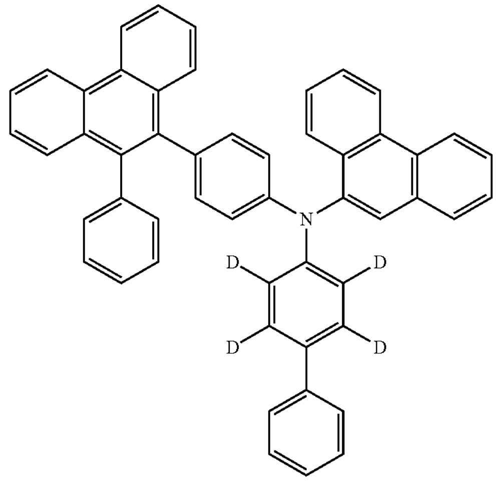
N
D
D
D
D
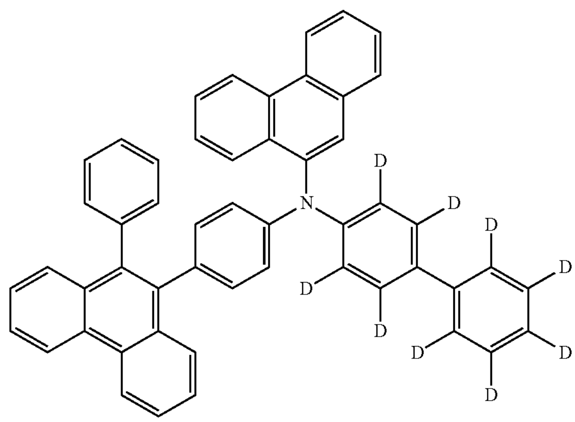
N
D
D
D
D
D
D
D
D
D
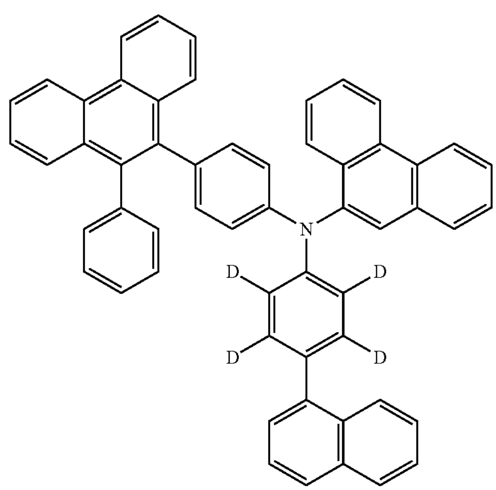
N
D
D
D
D

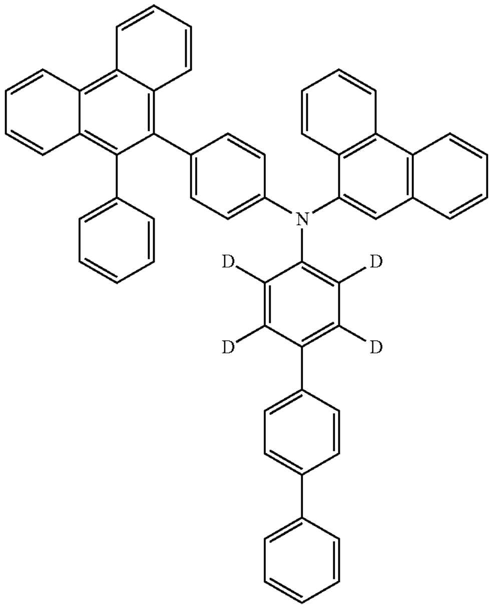
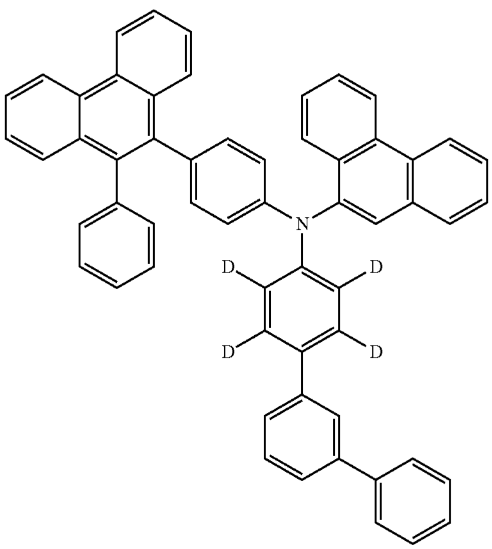
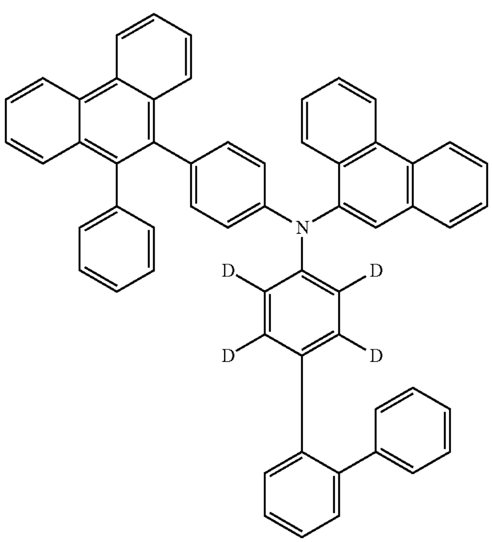
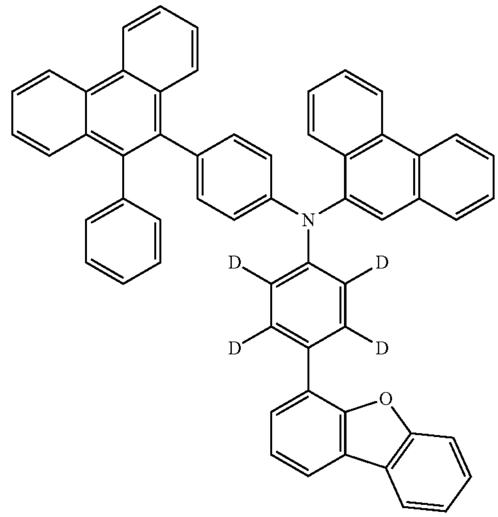
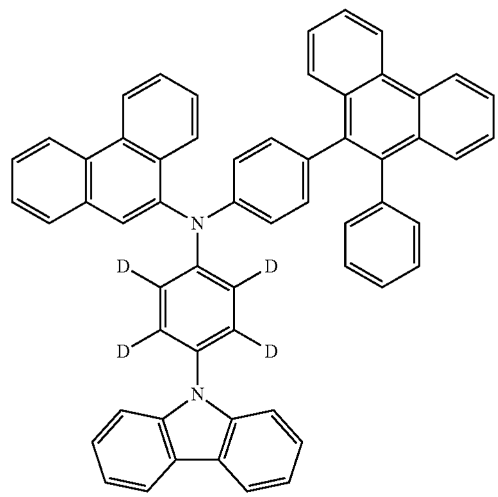
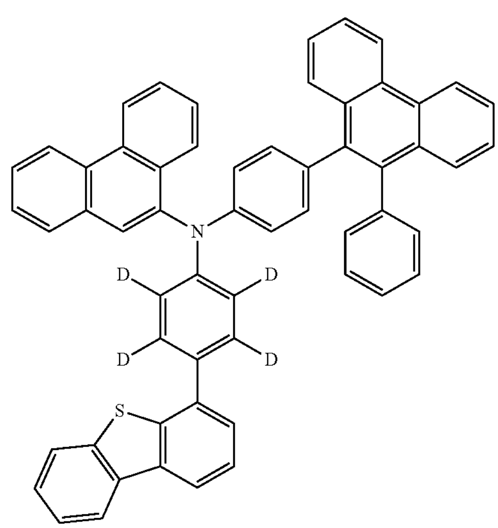

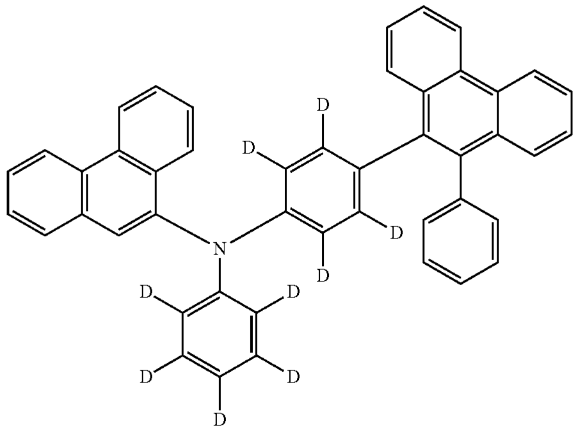
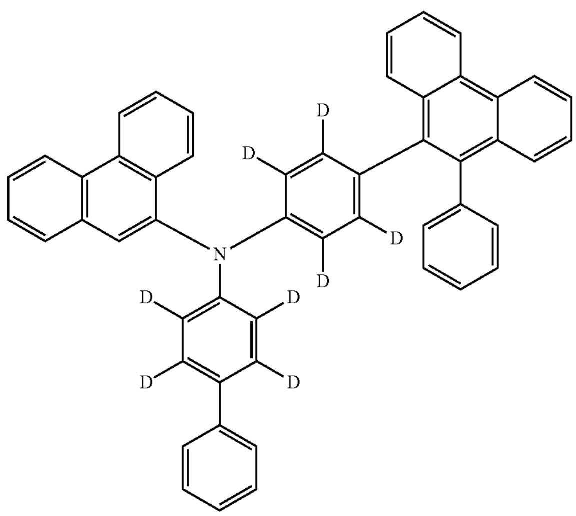
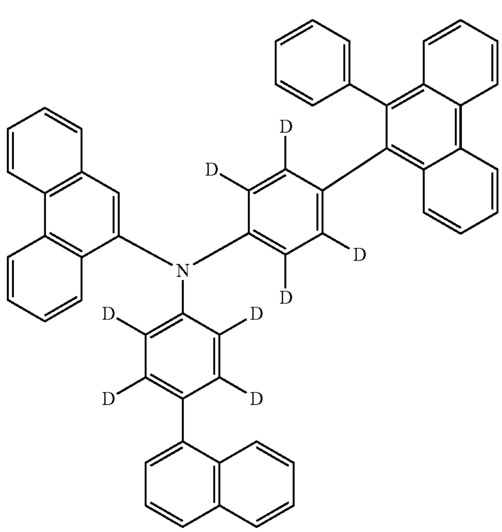
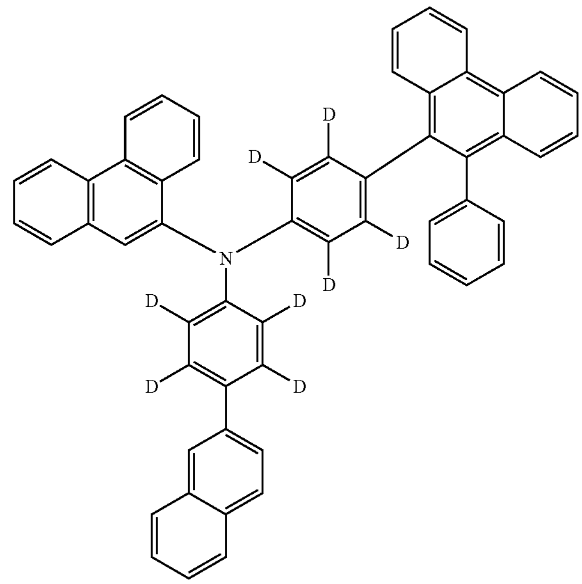
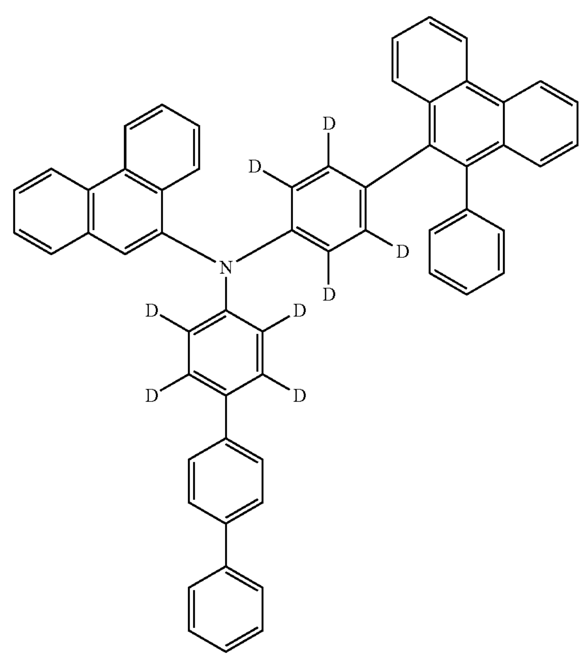

-continued
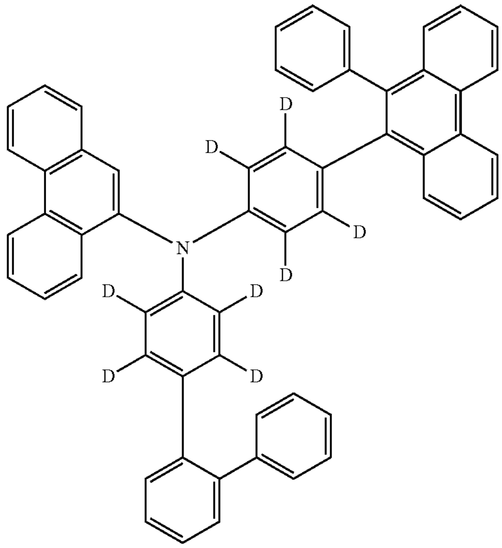
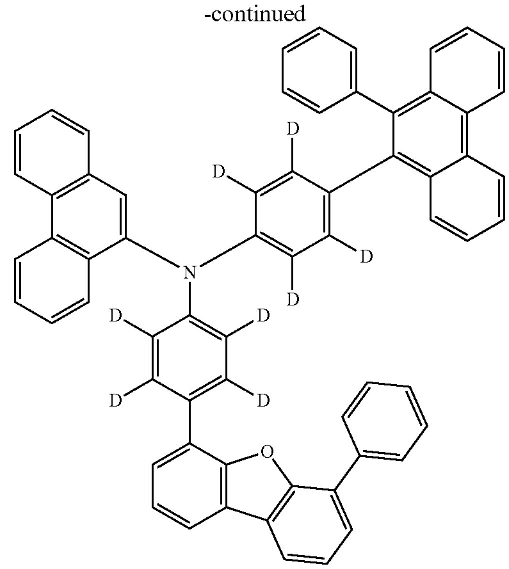
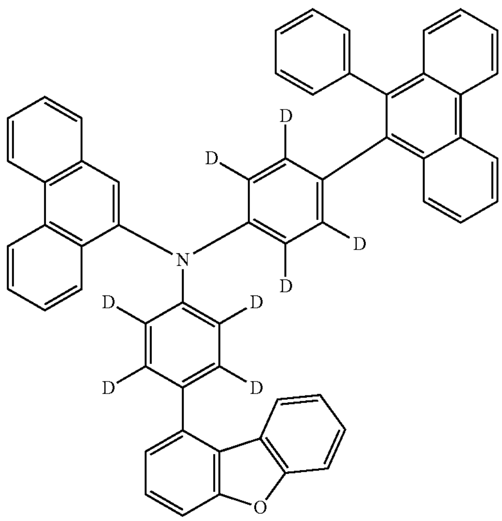
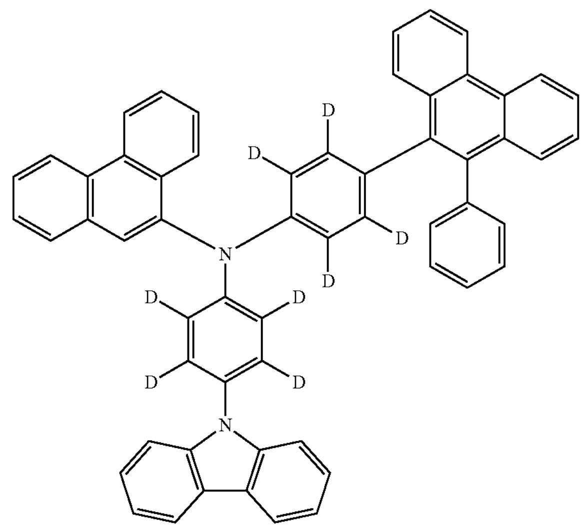
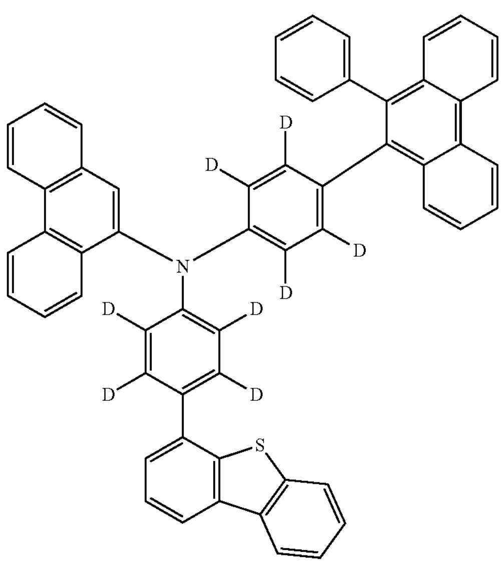
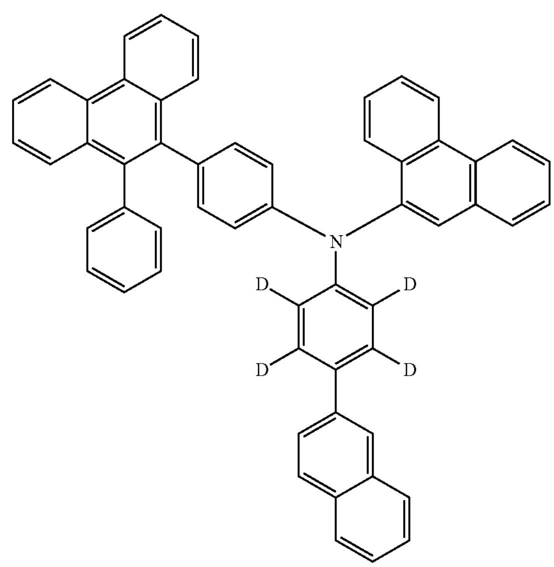
-continued -continued
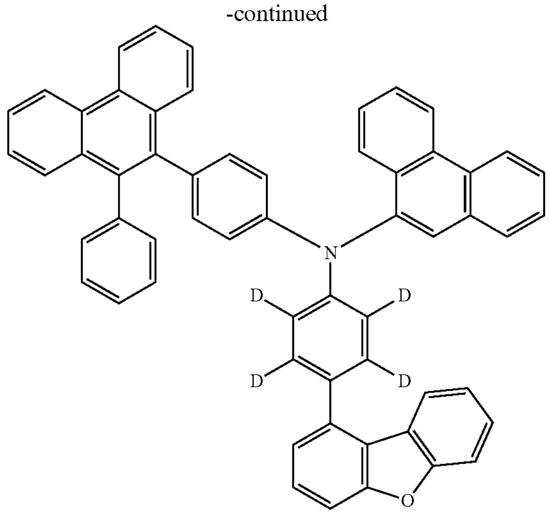
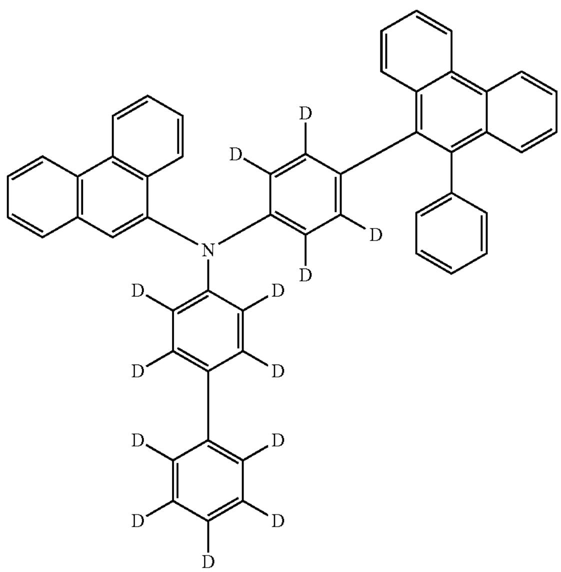
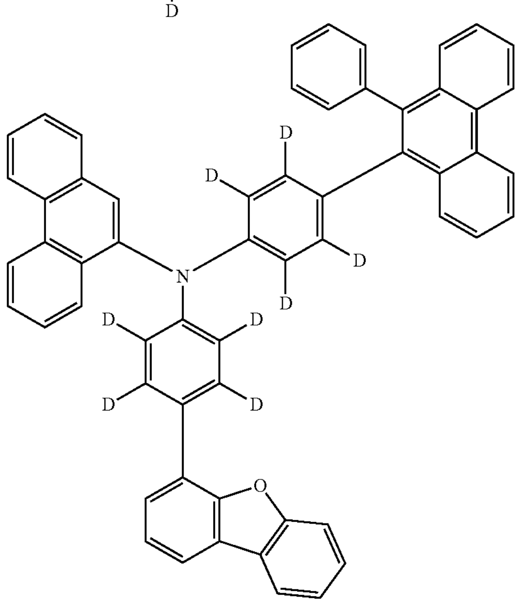
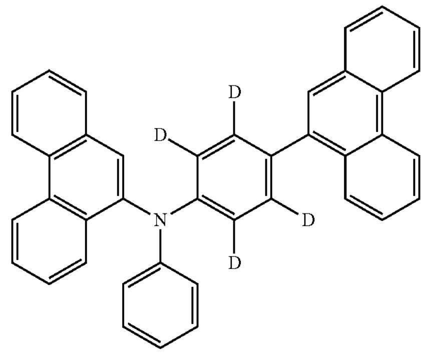
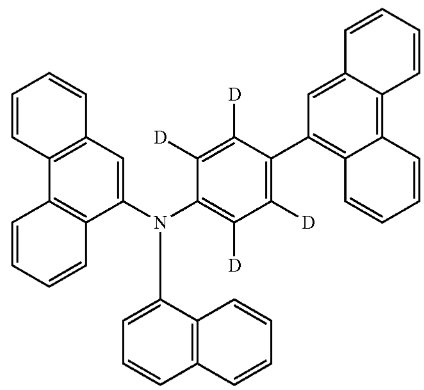
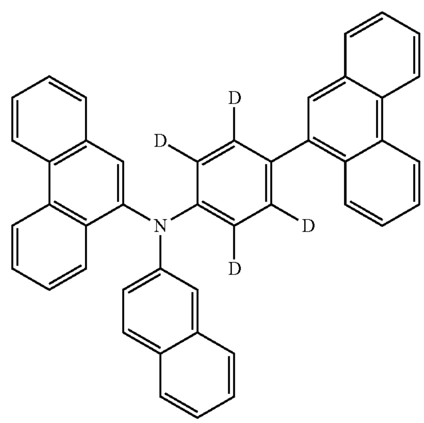
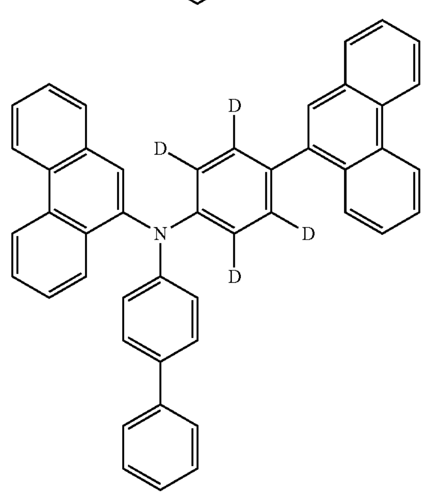

-continued
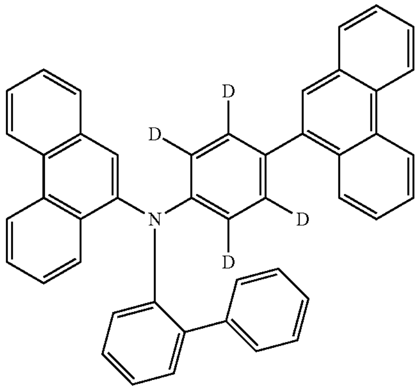
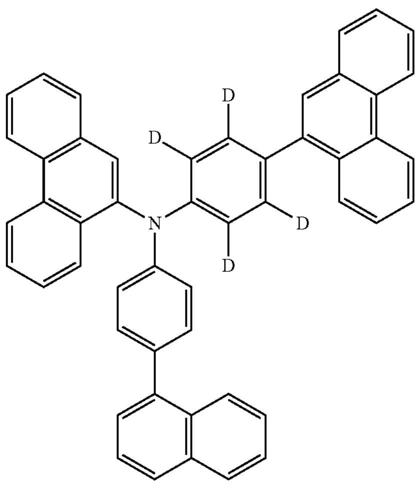
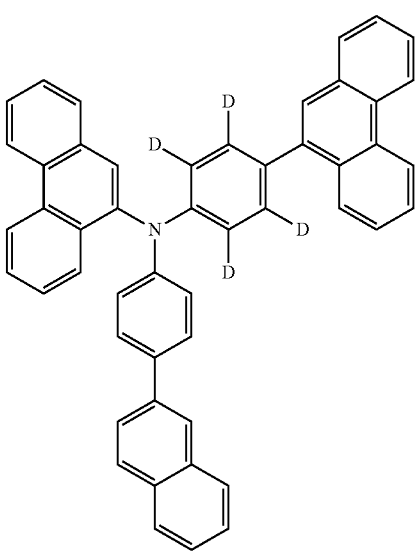
-continued
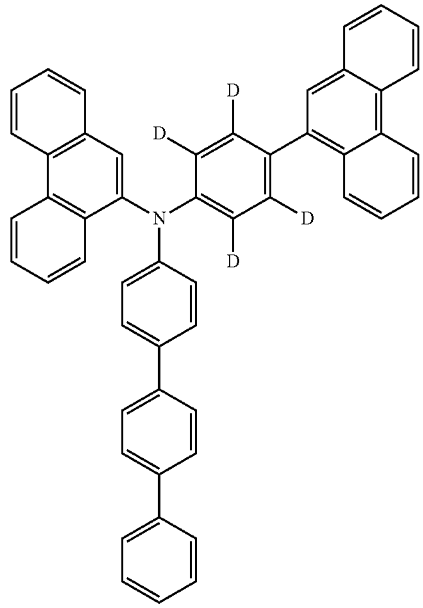
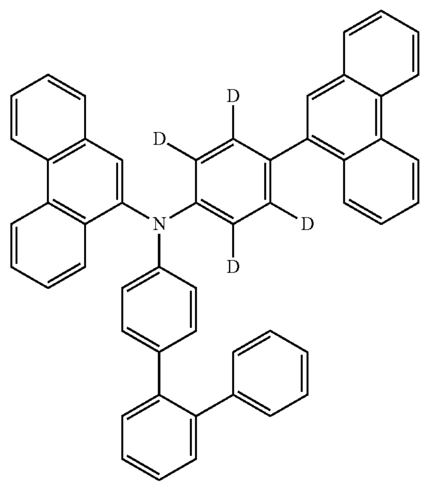
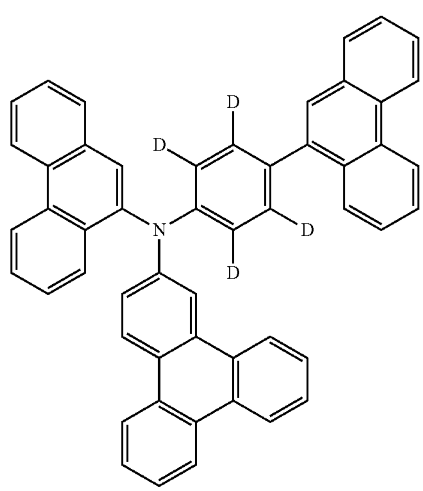

-continued
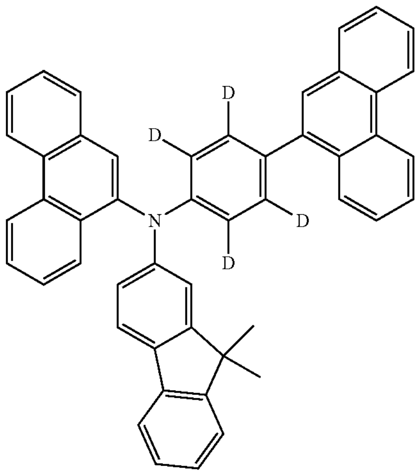
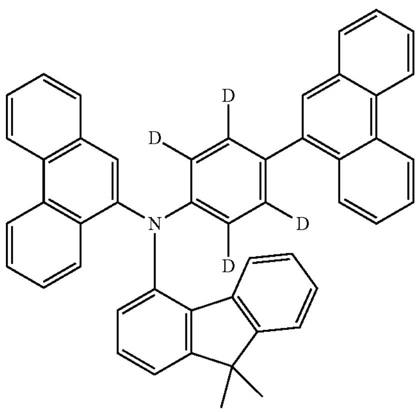
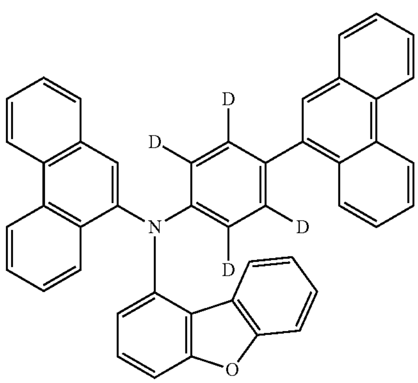
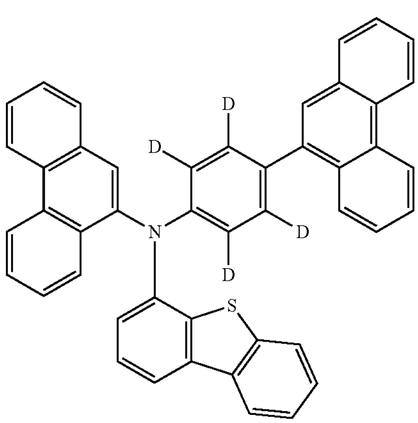
-continued
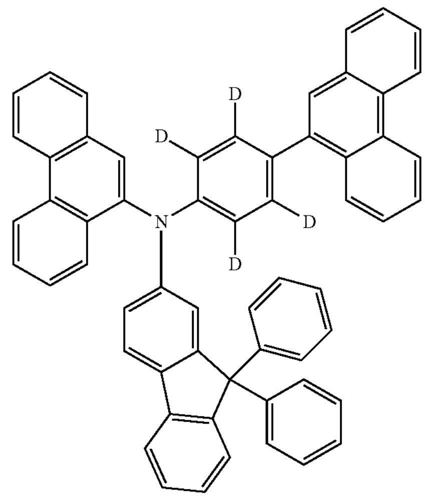
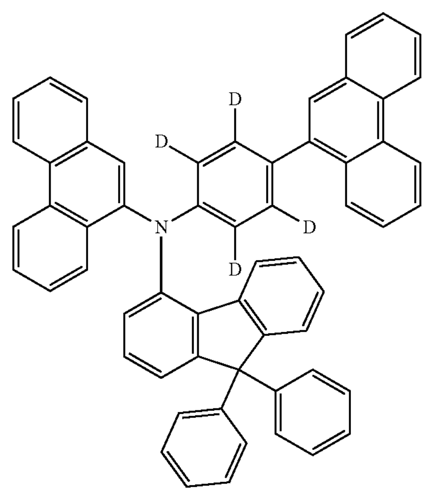
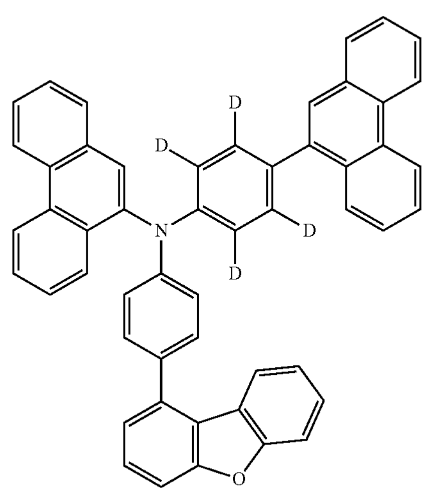

-continued
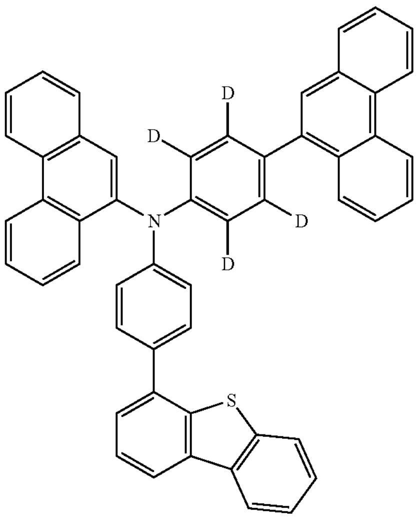
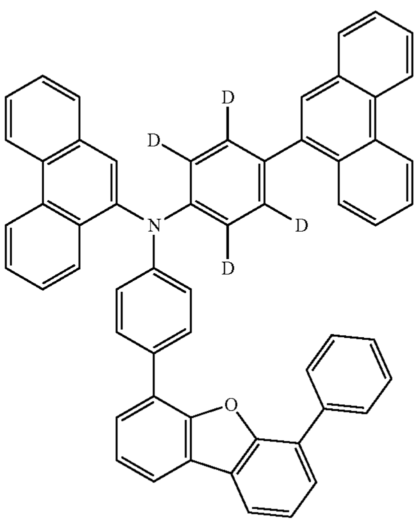
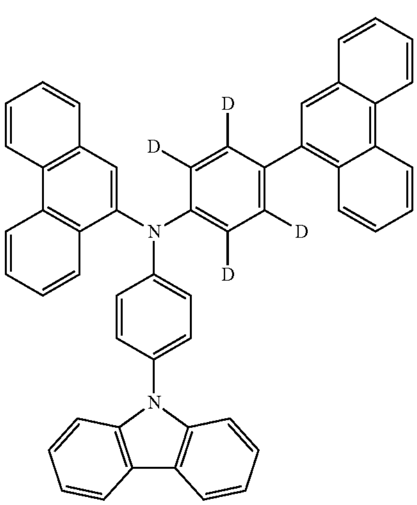
-continued
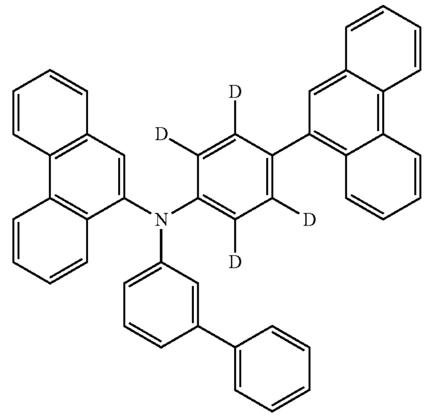
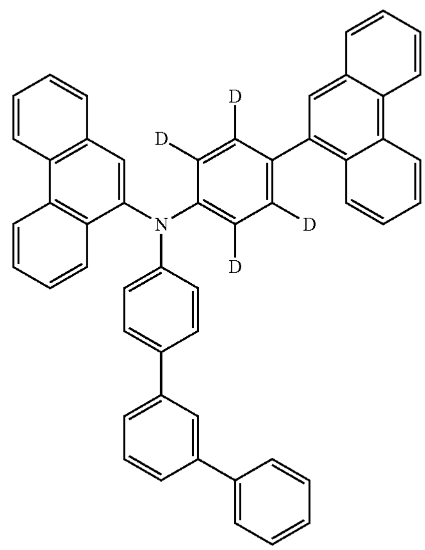
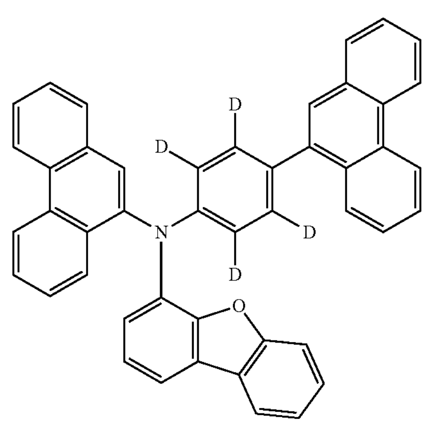

-continued
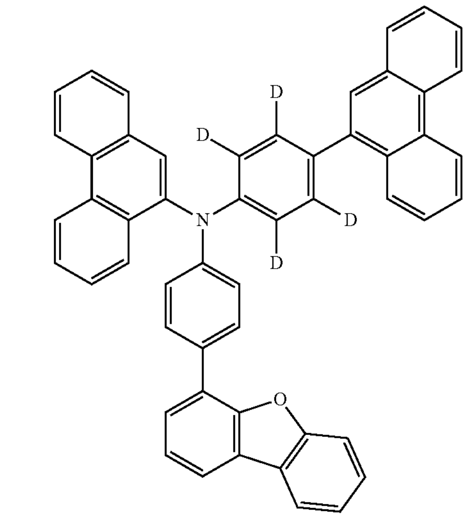
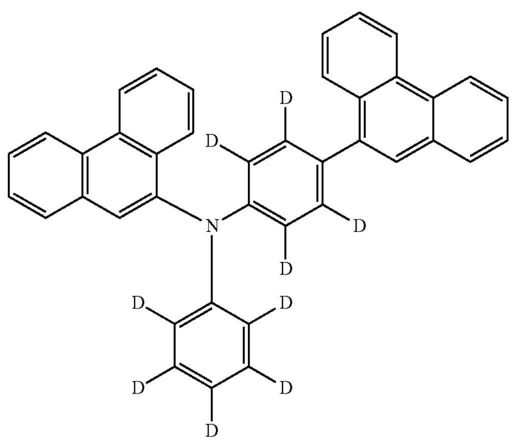
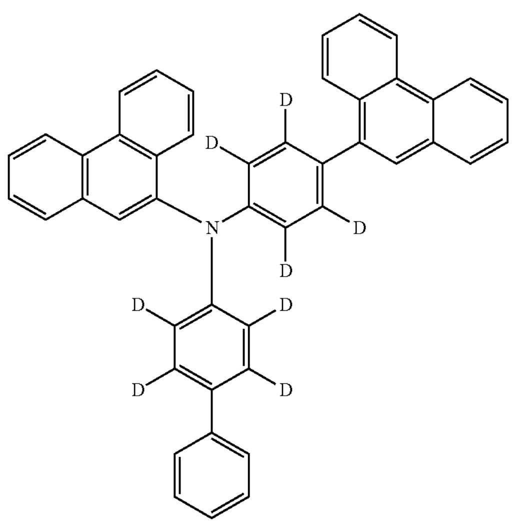
-continued
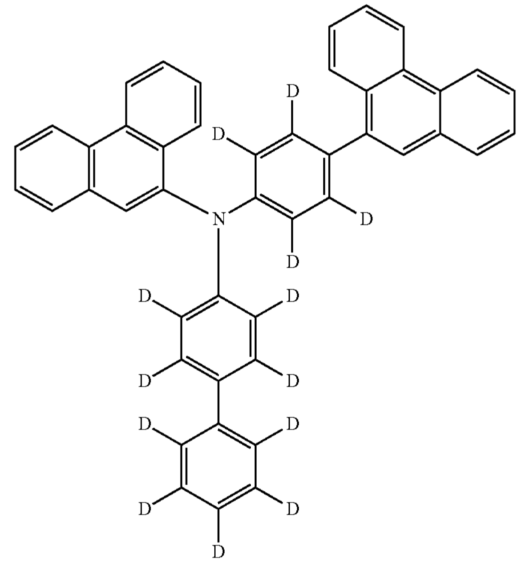
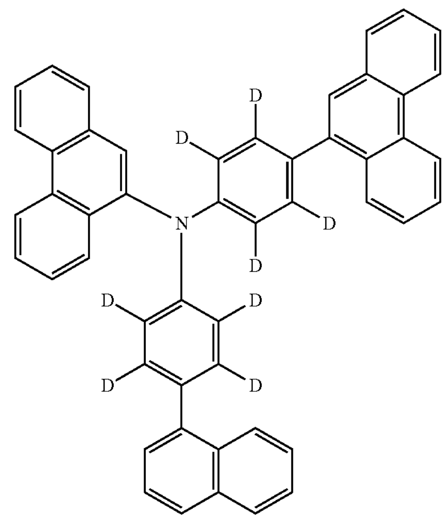
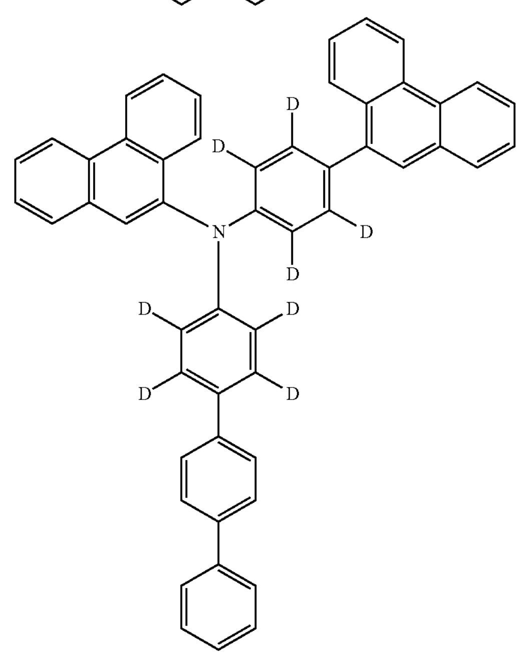

-continued
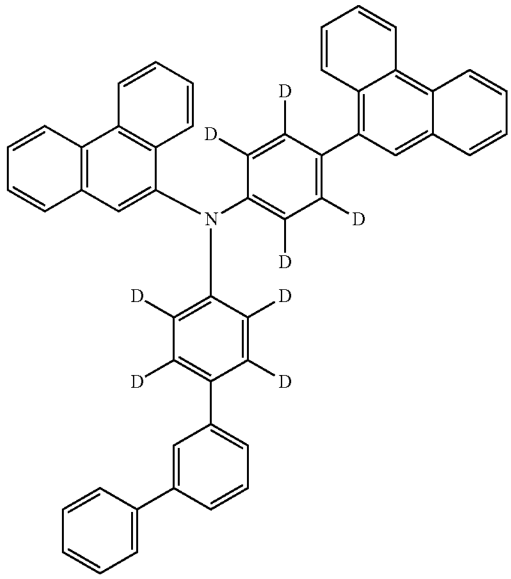
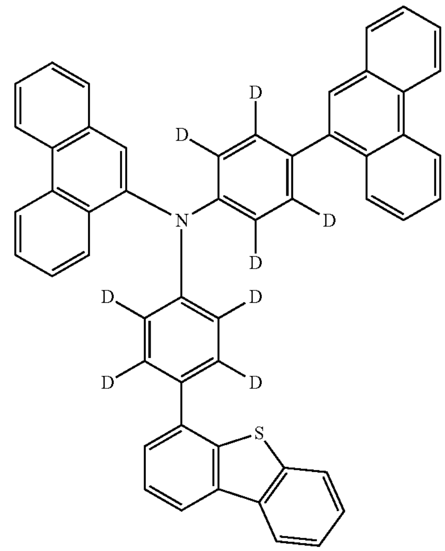
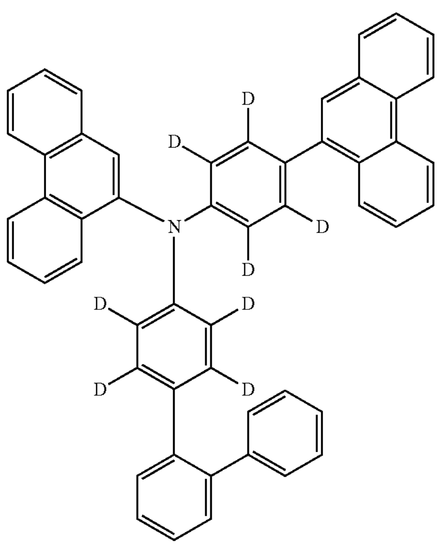
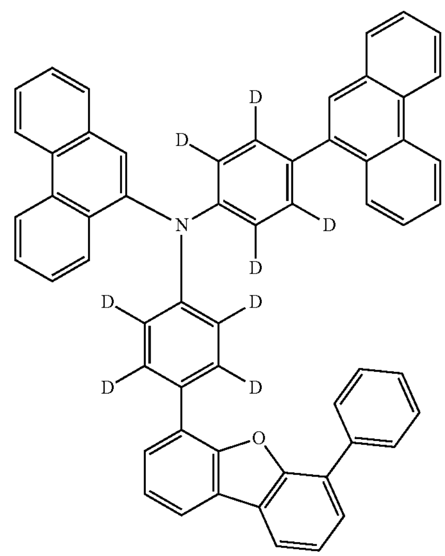
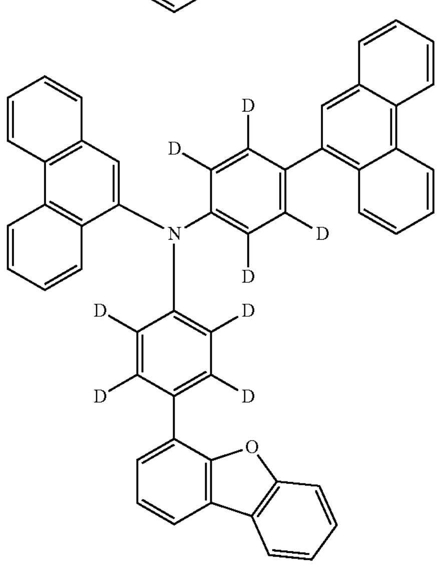
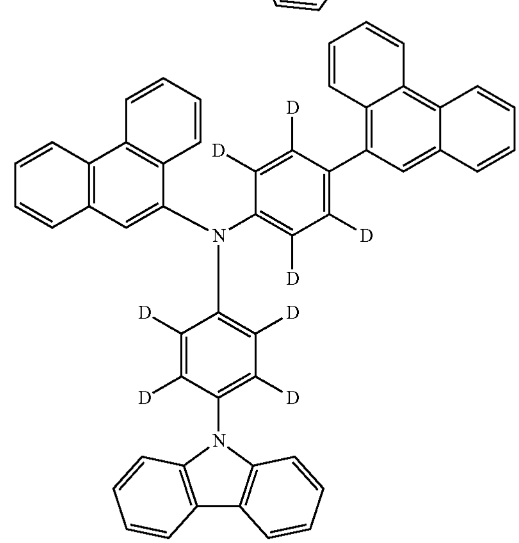

-continued
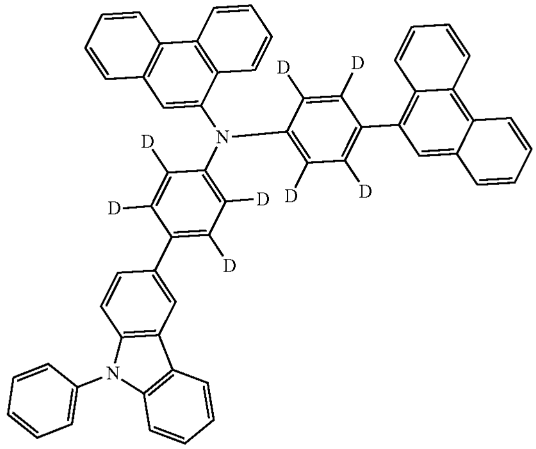
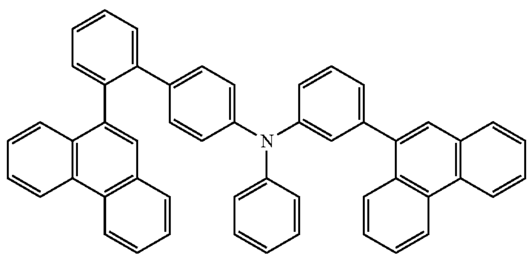
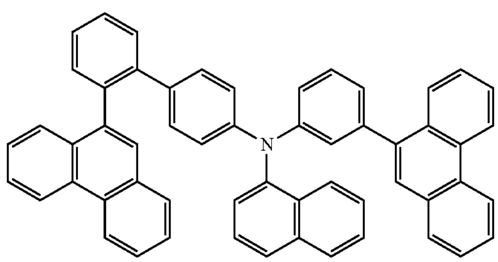
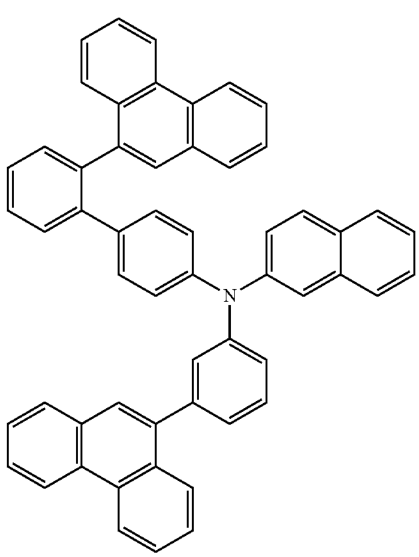
-continued
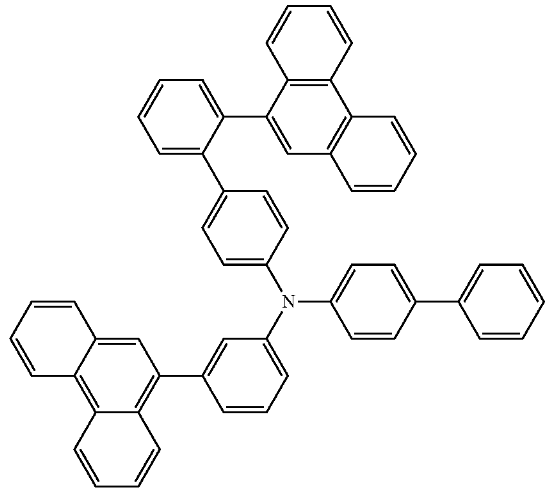
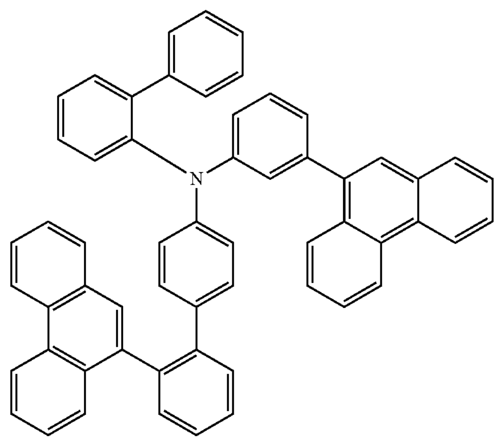
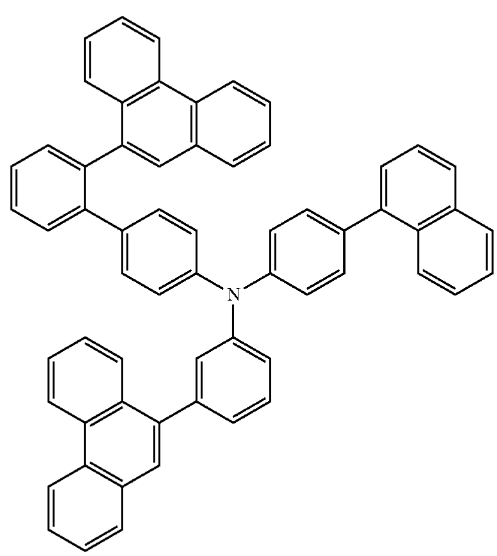

-continued
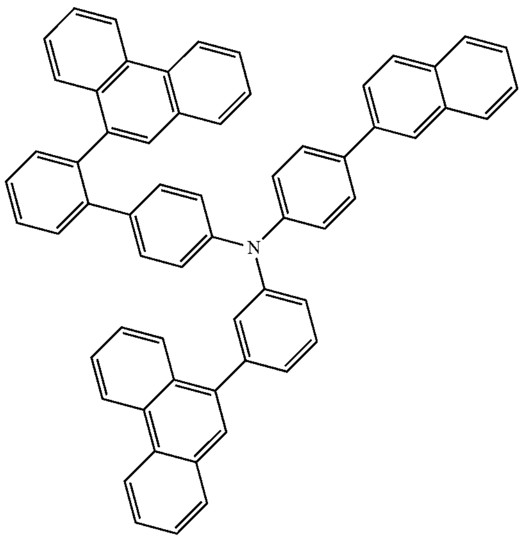
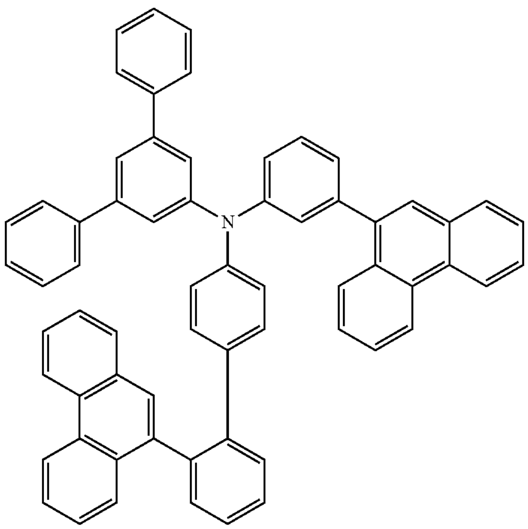
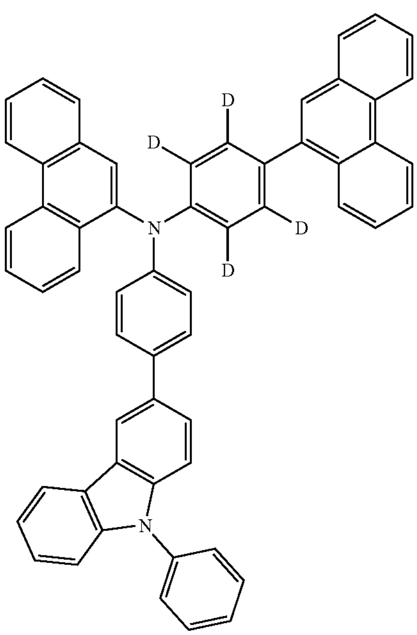
-continued
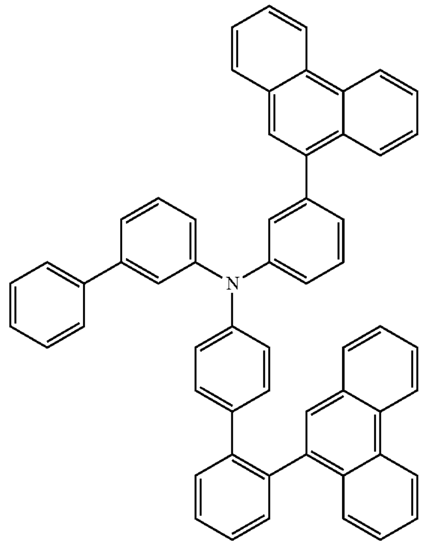
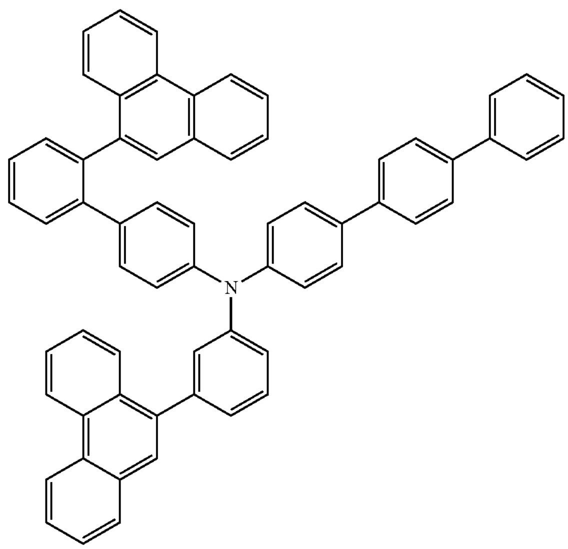
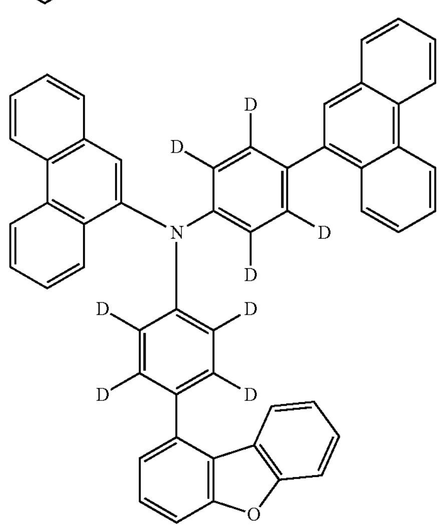

-continued
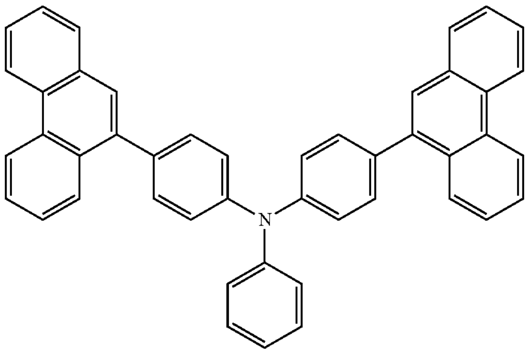
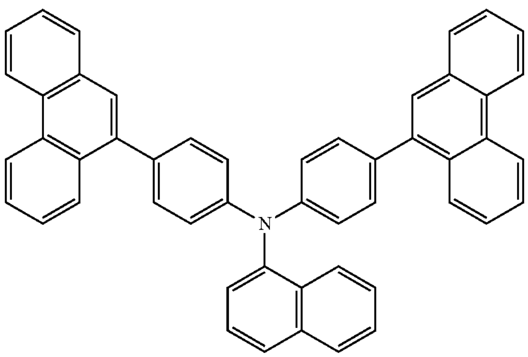
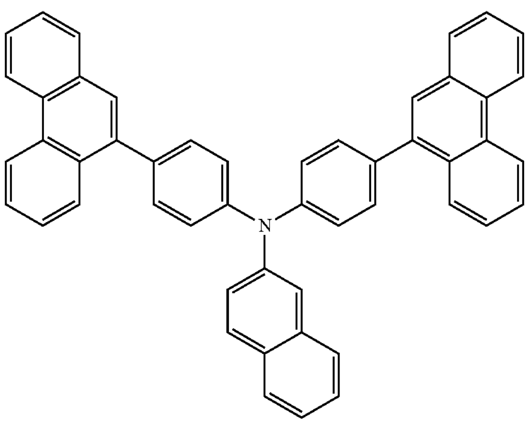
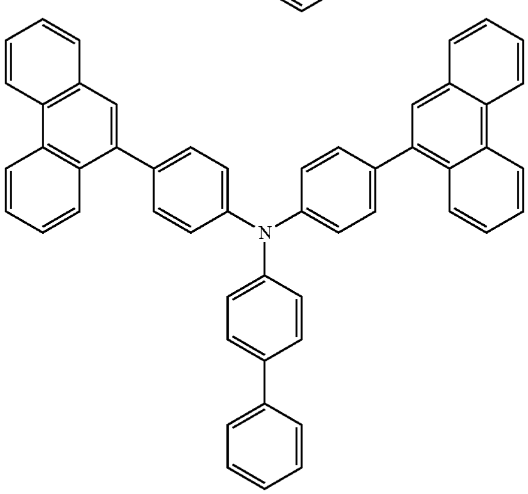
-continued
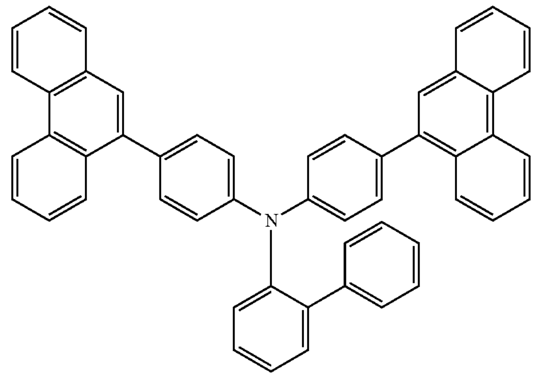
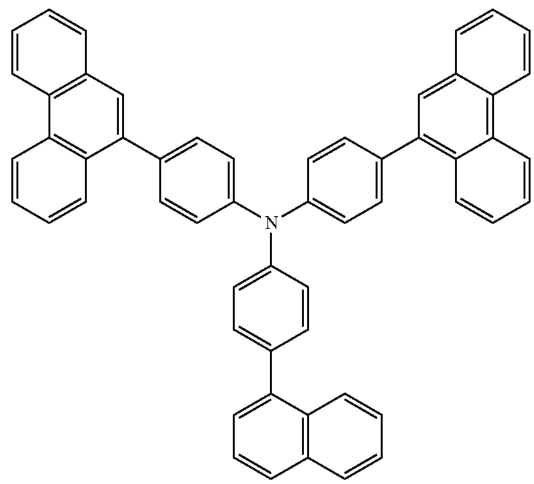
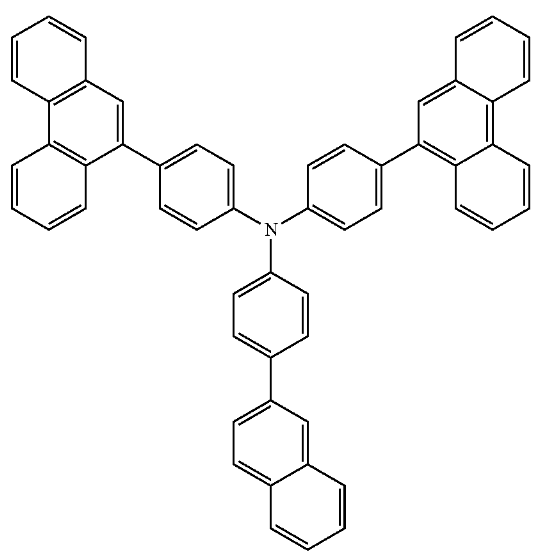

-continued
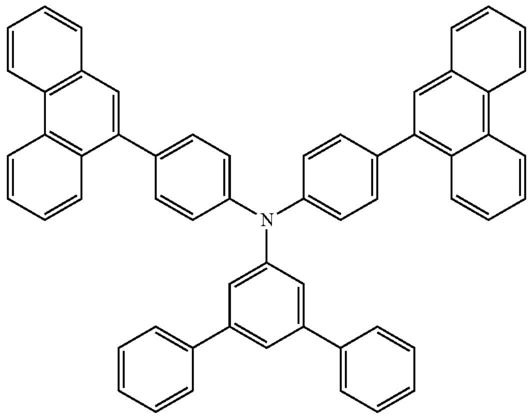
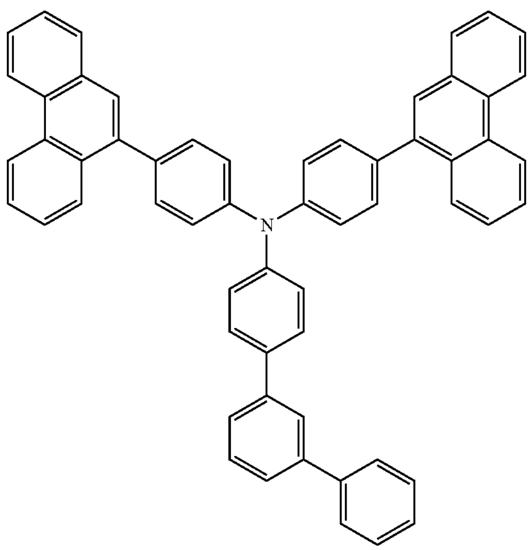
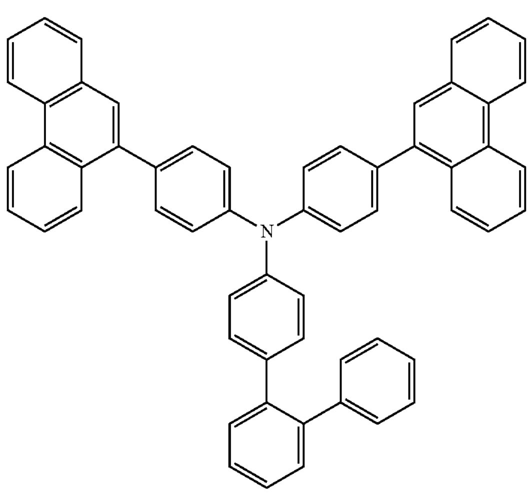
-continued
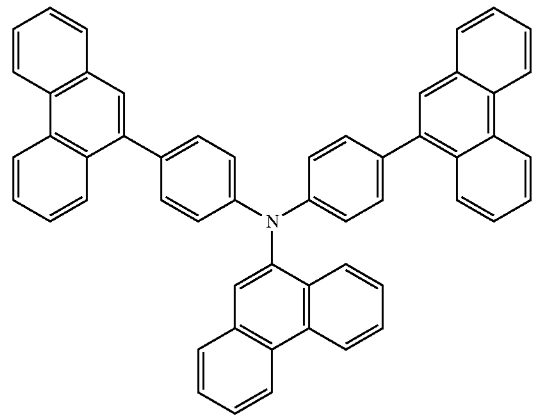
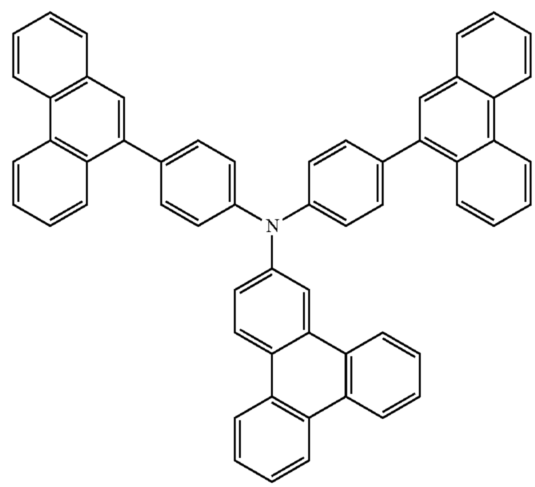
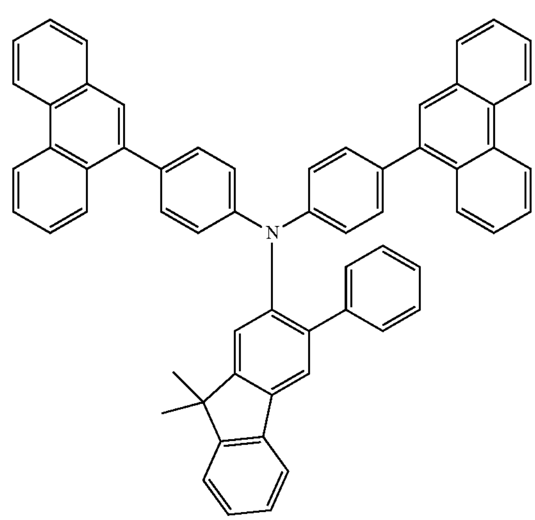

-continued
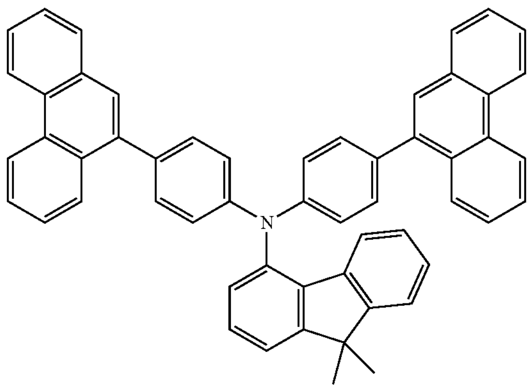
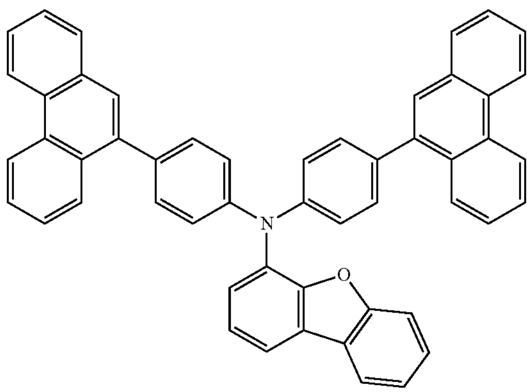
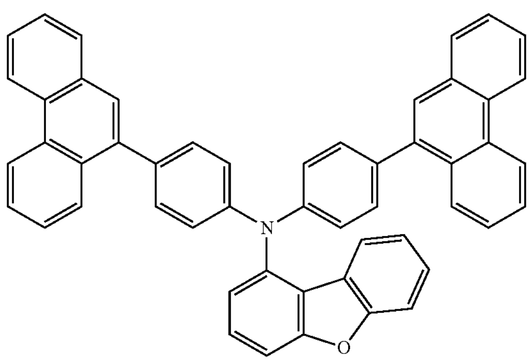
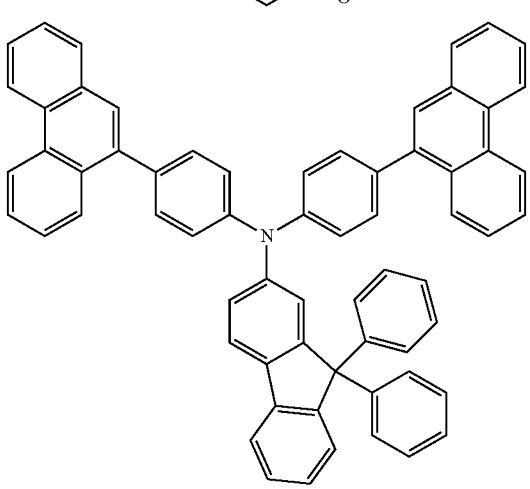
-continued
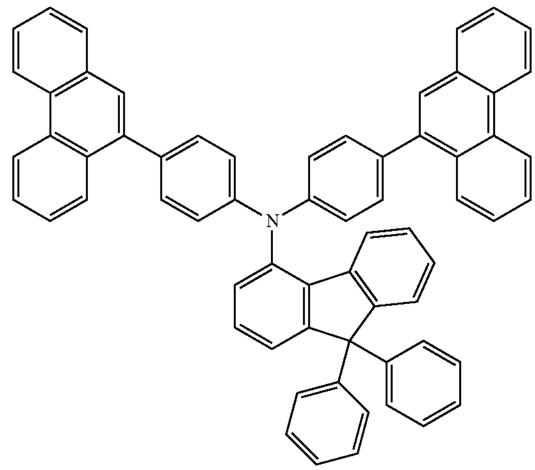
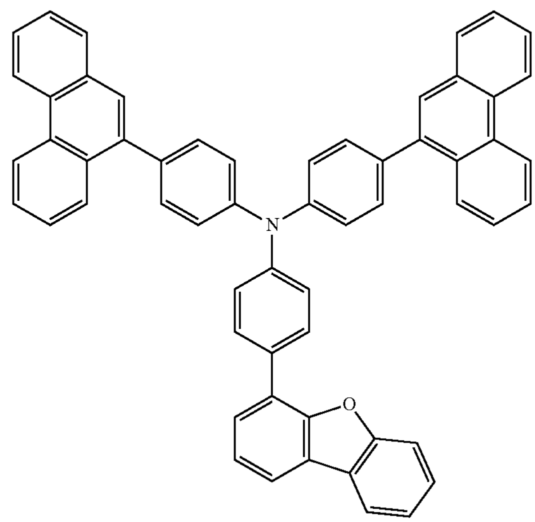
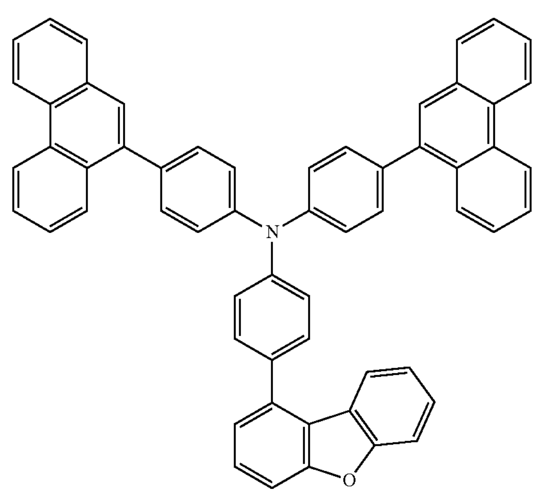

-continued
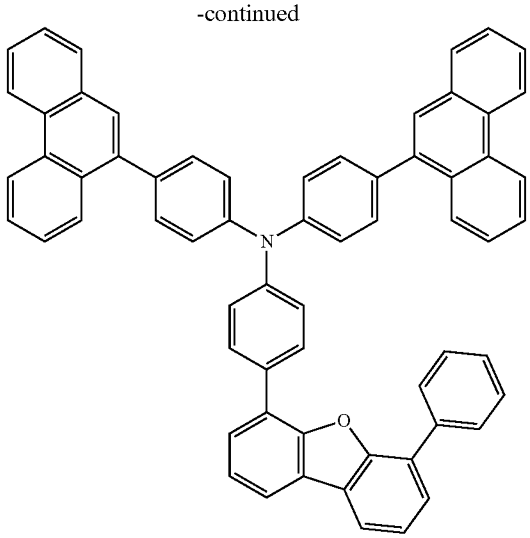
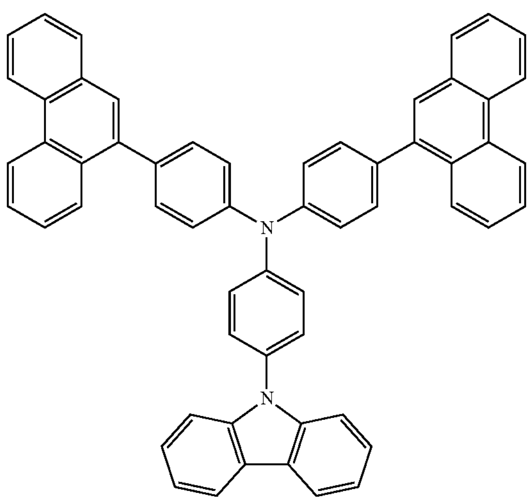
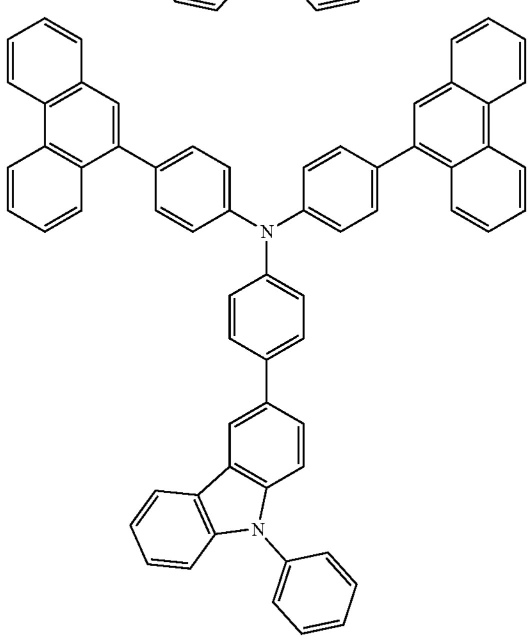
-continued
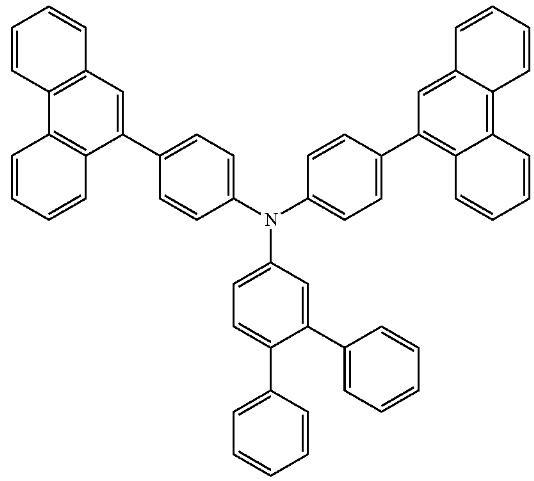
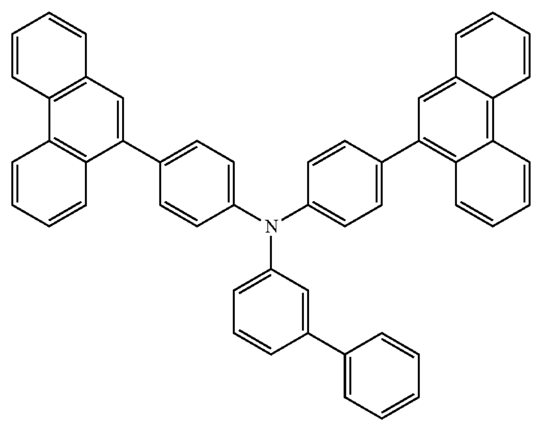
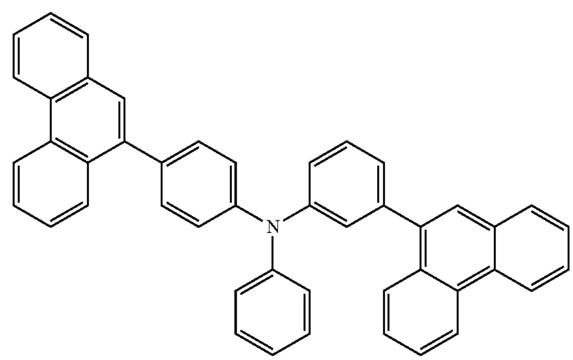
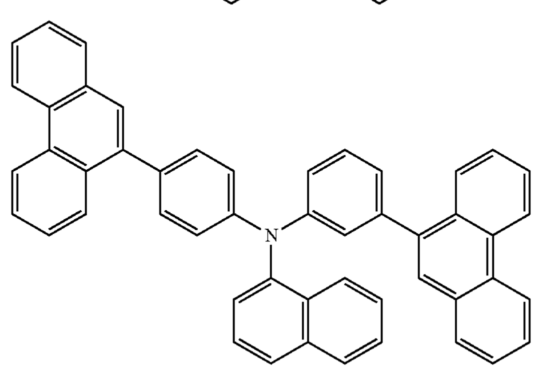

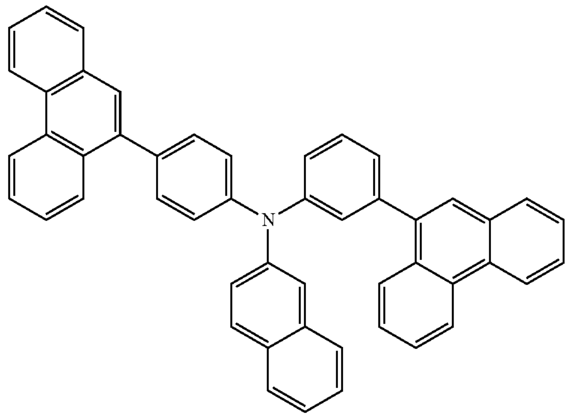
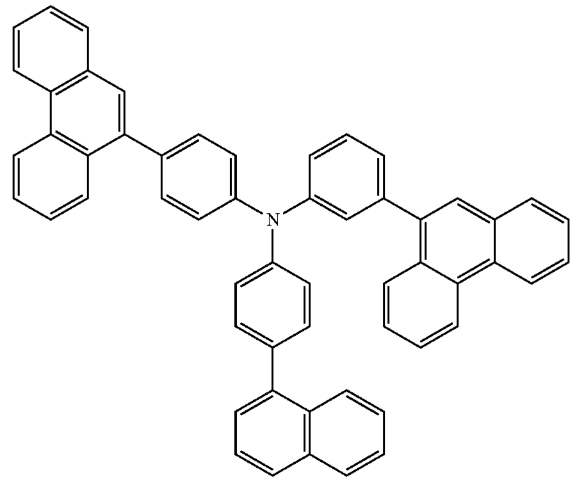
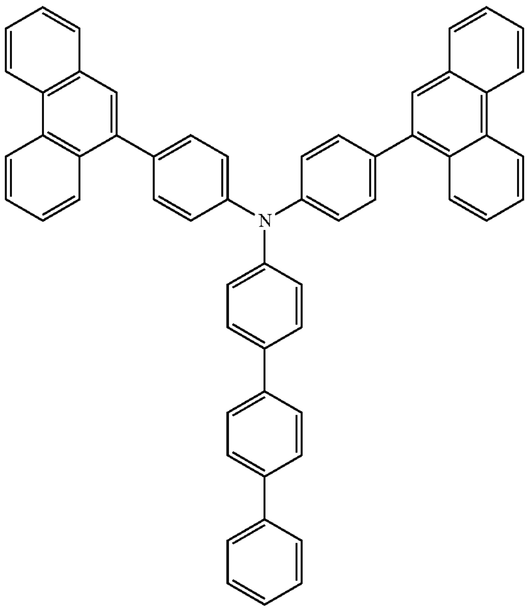
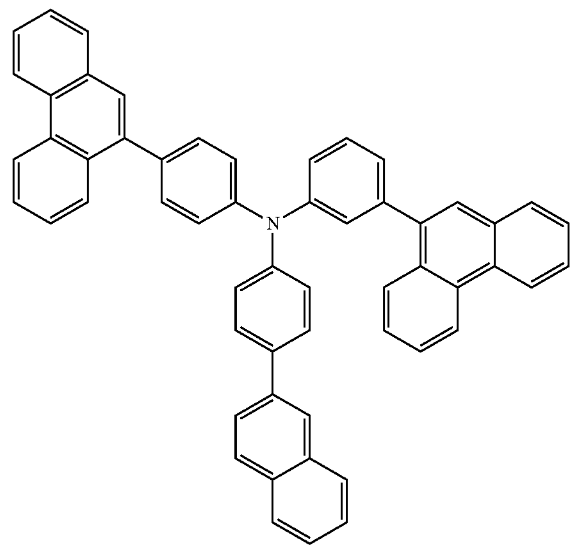
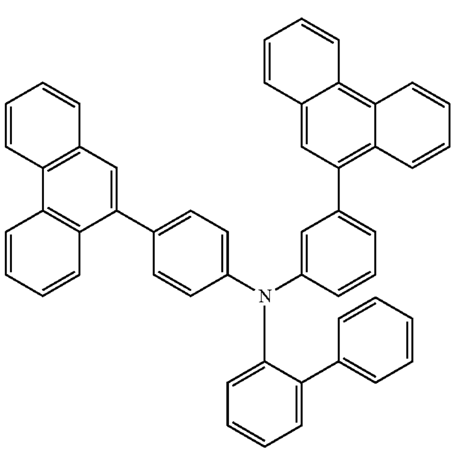
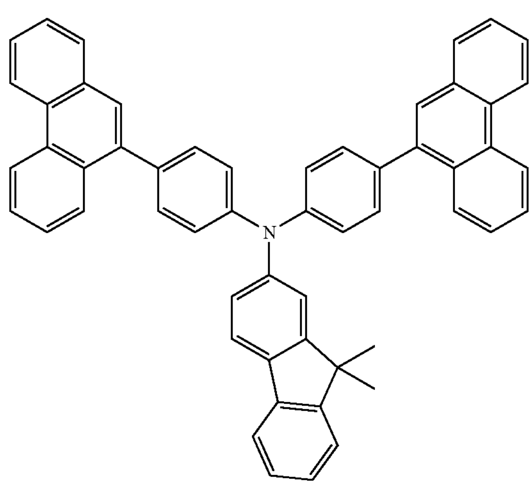
N

-continued
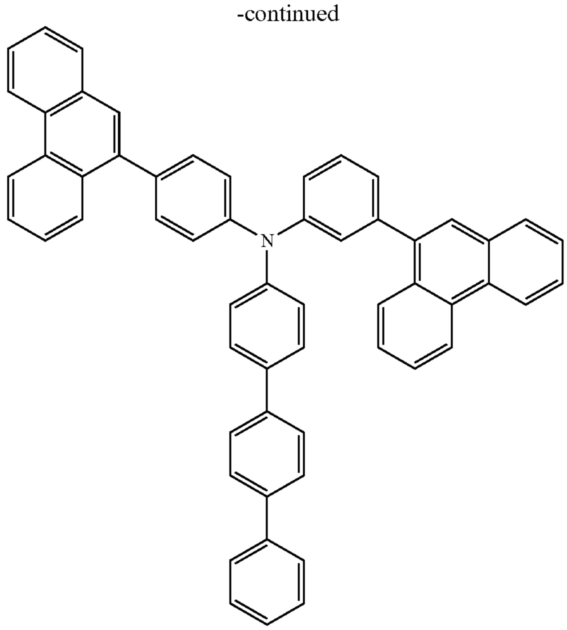
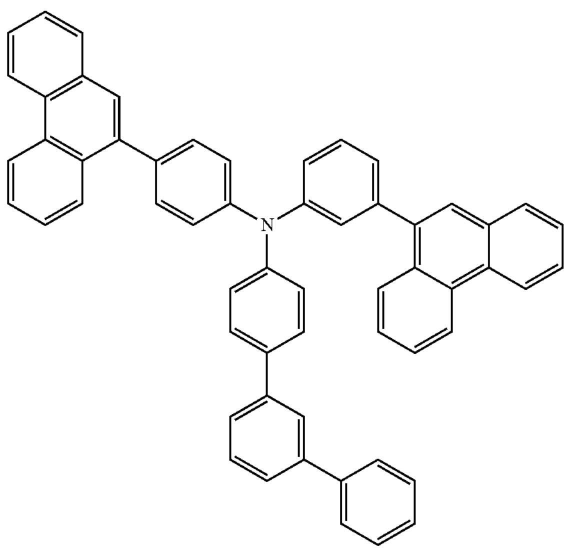
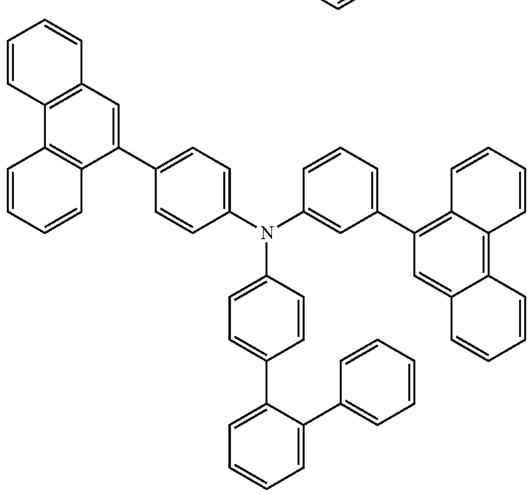
-continued
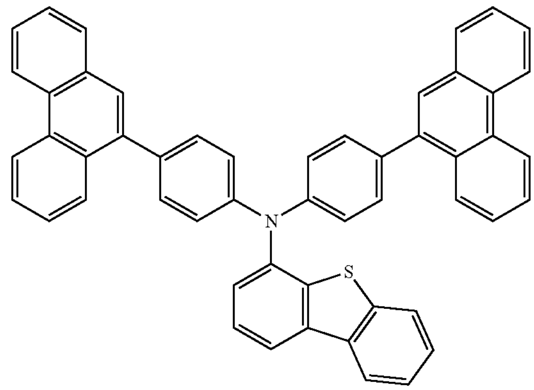
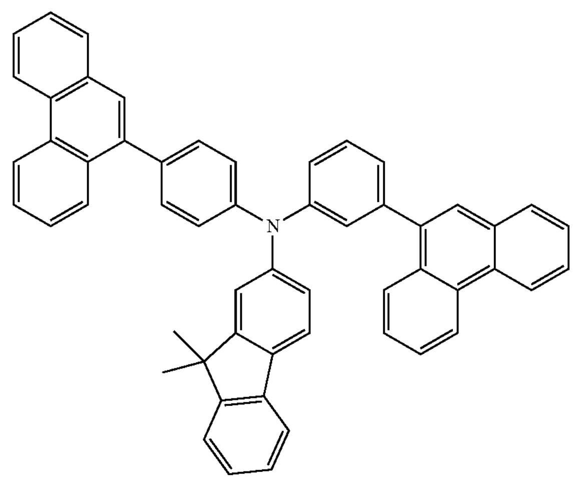
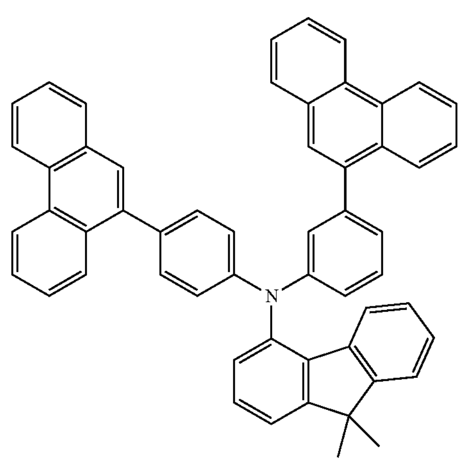

-continued
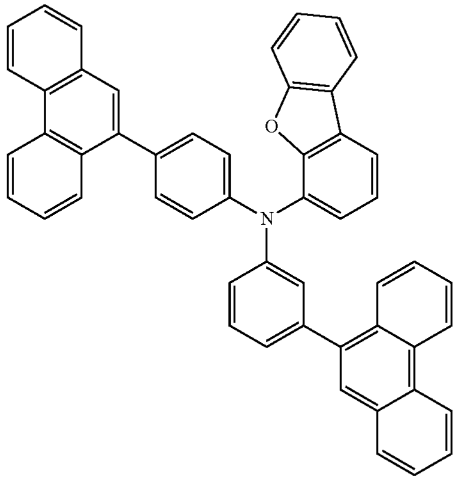
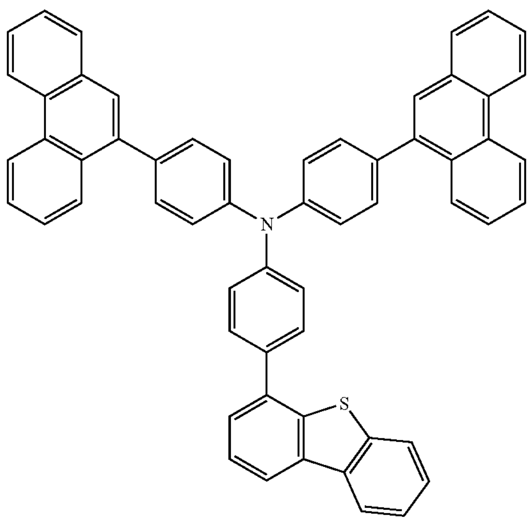
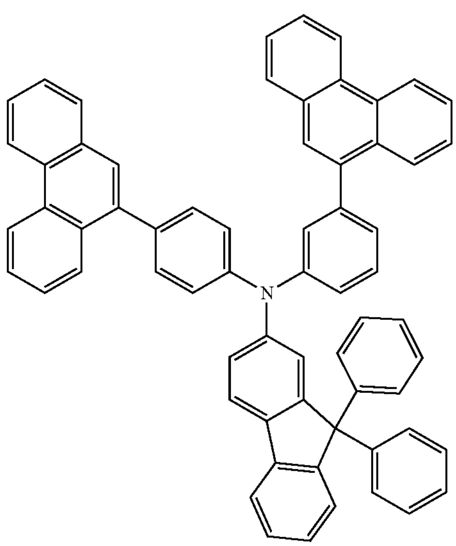
-continued
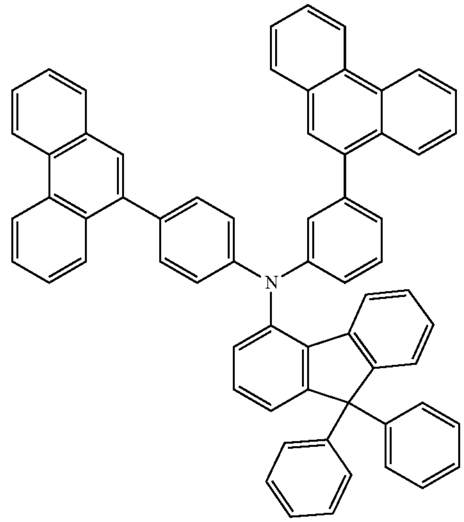
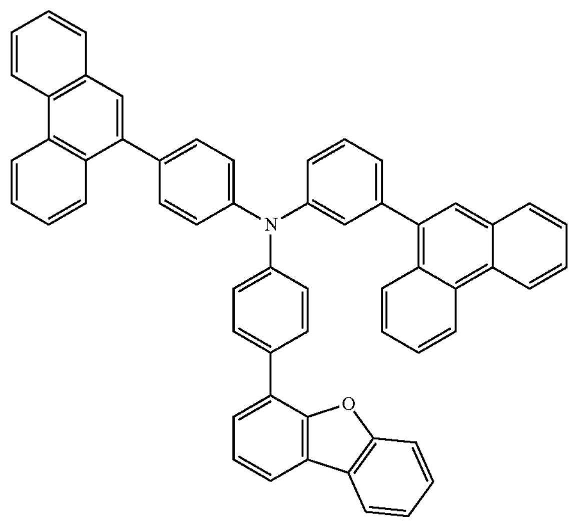
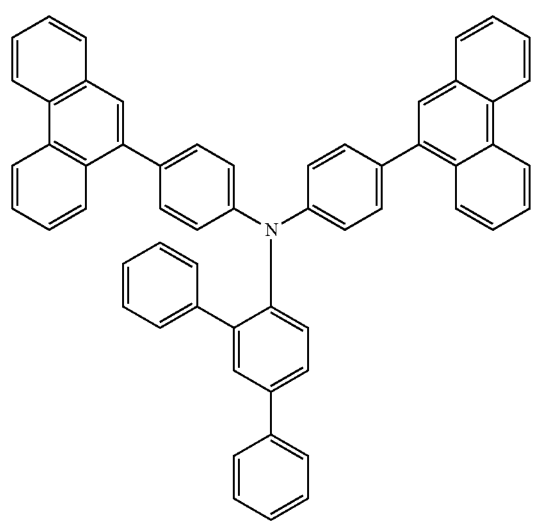

-continued
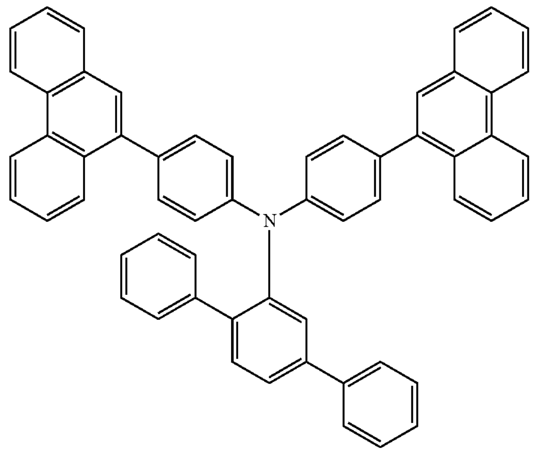
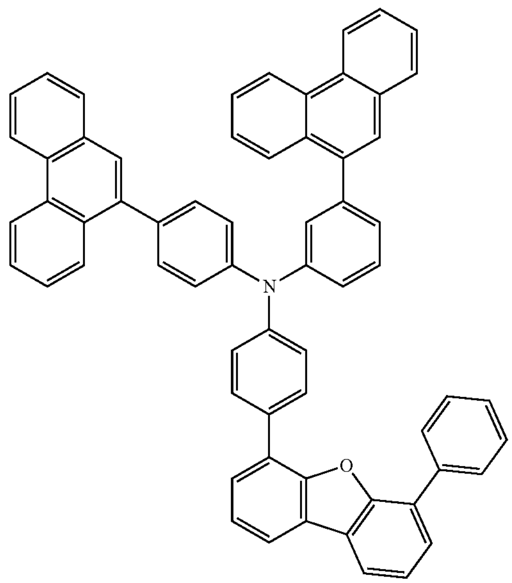
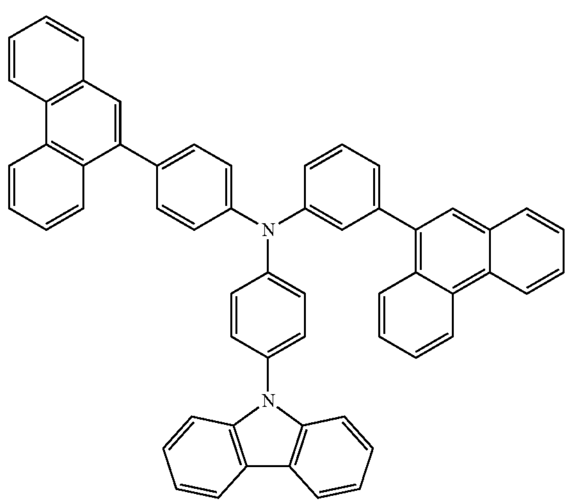
-continued
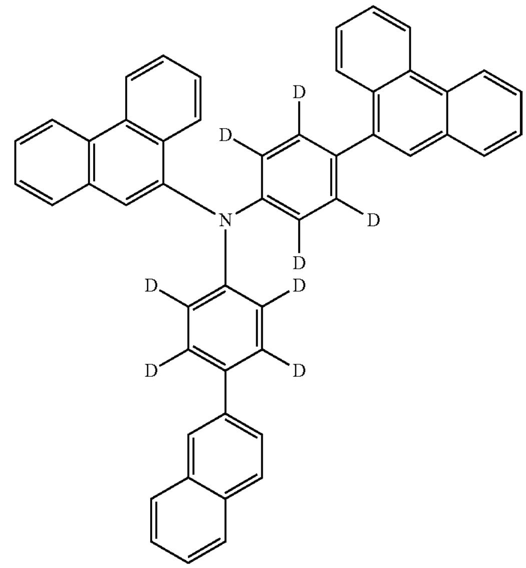
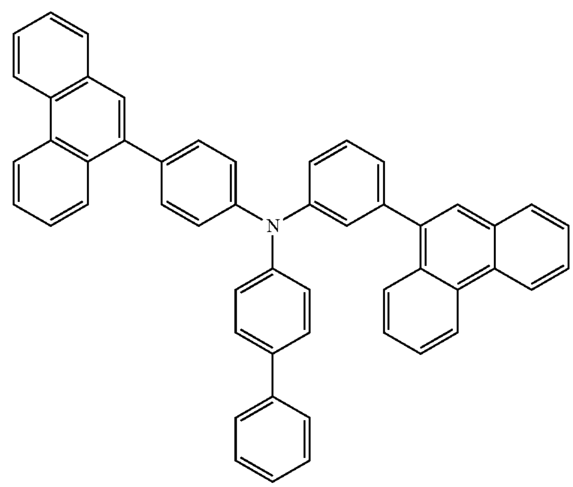
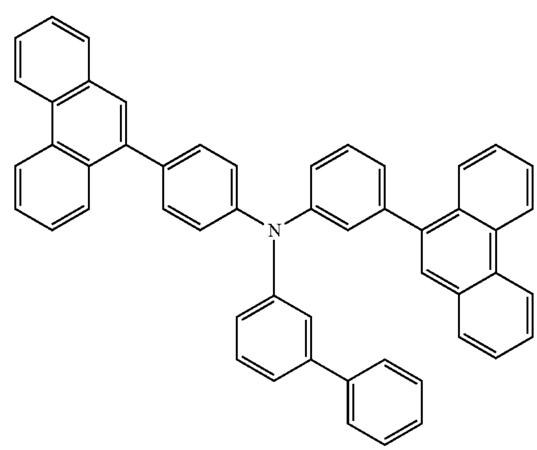

-continued
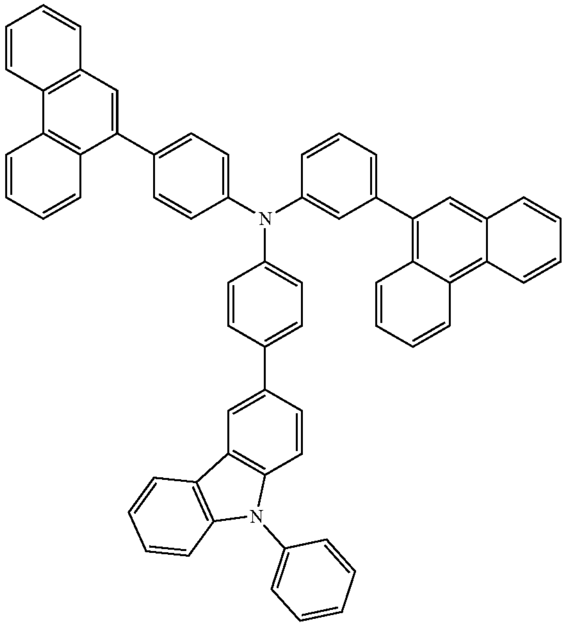
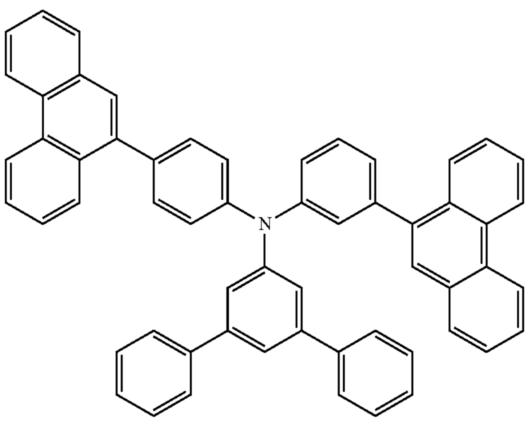
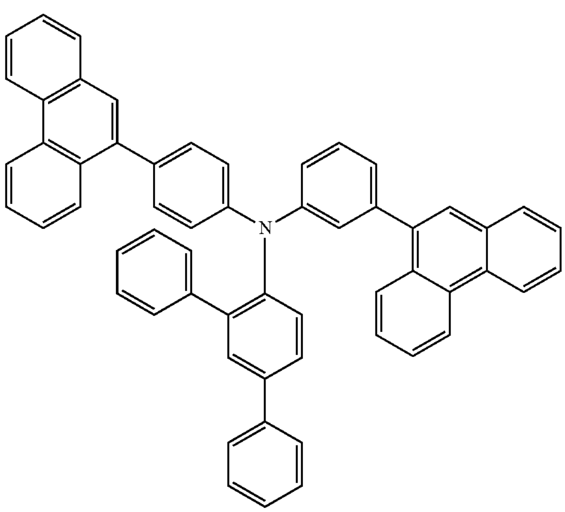
-continued
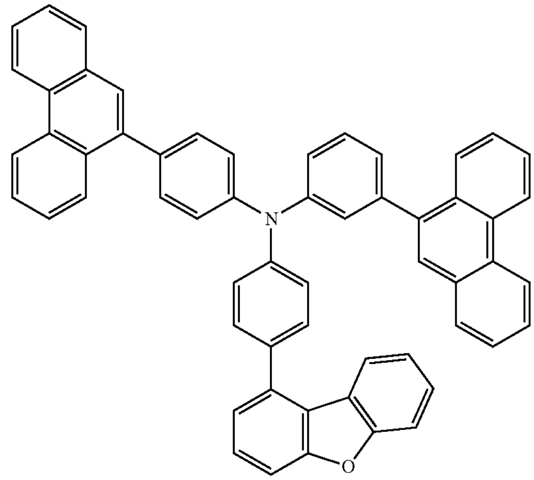
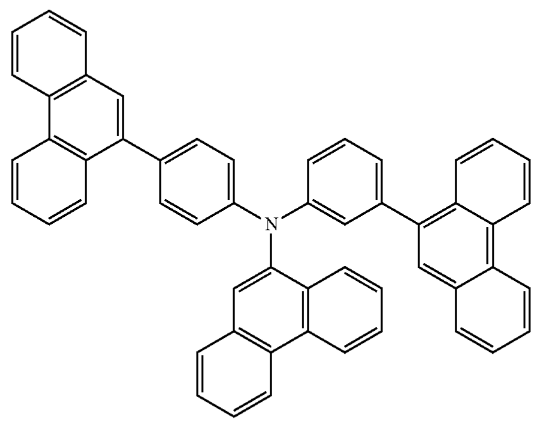
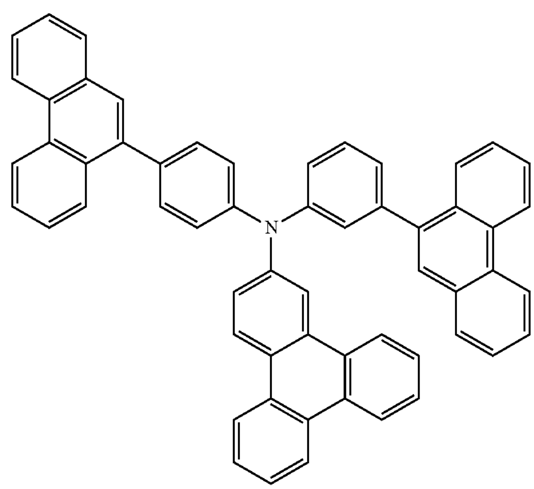

-continued
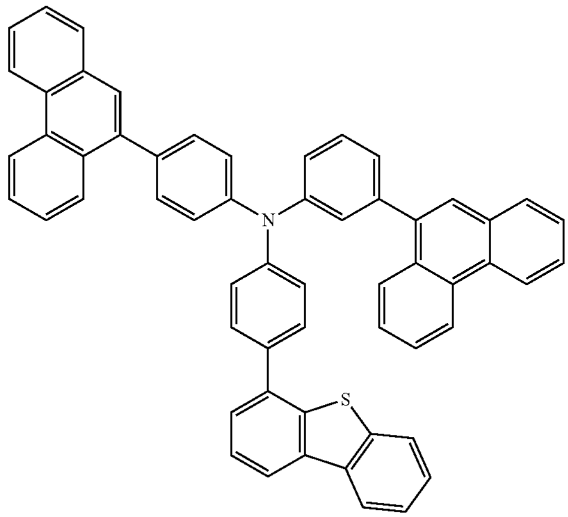
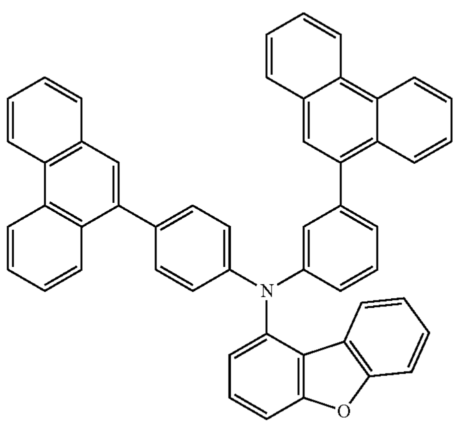
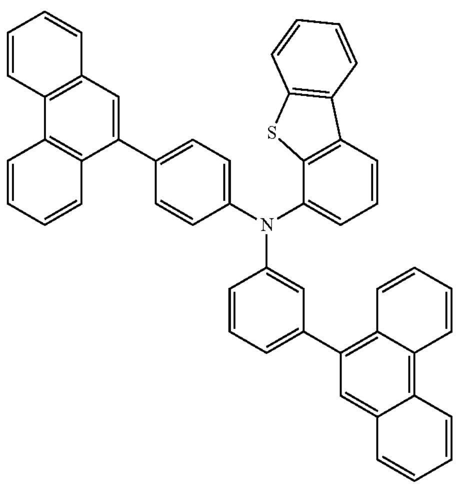
-continued
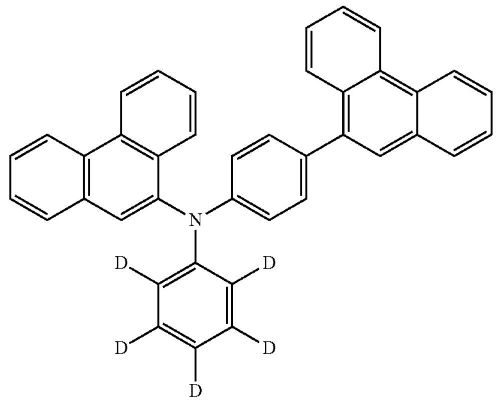
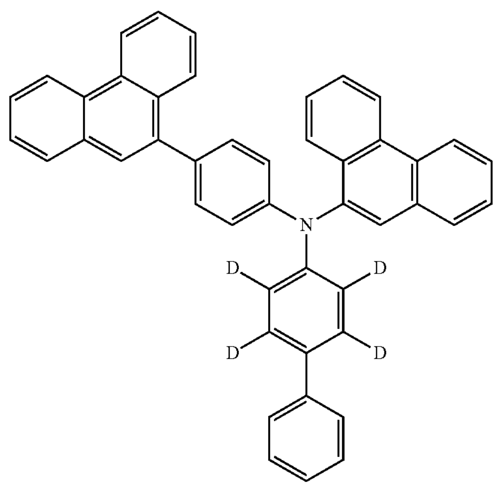
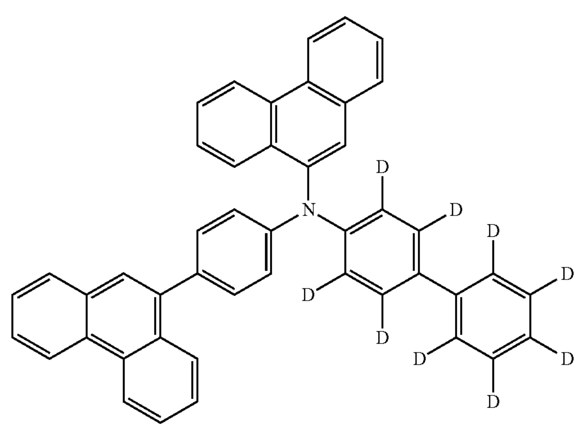

-continued
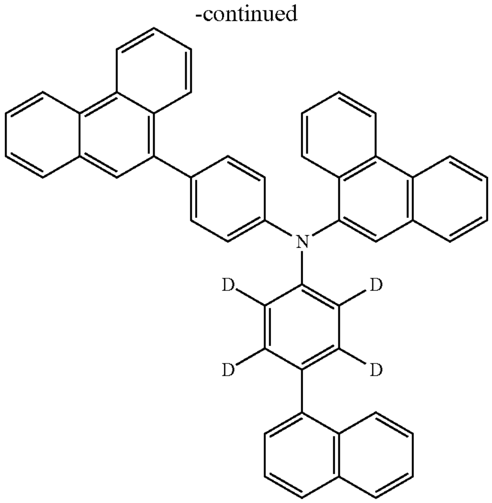
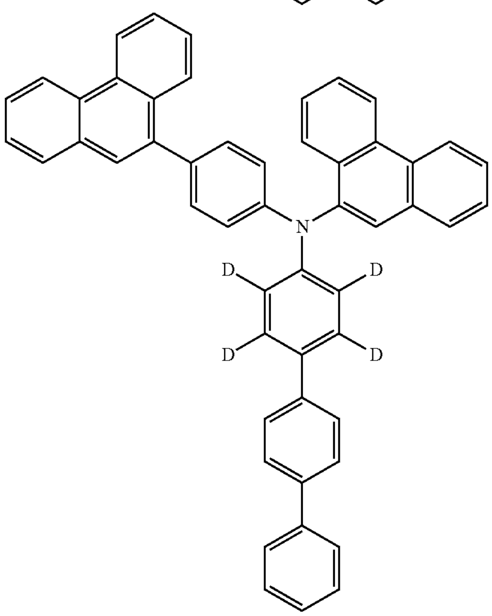
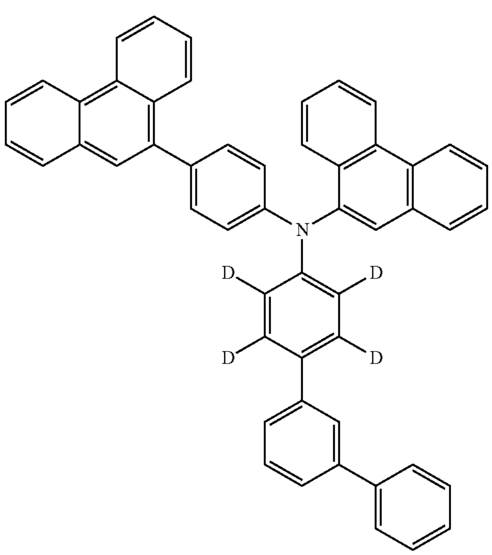
-continued
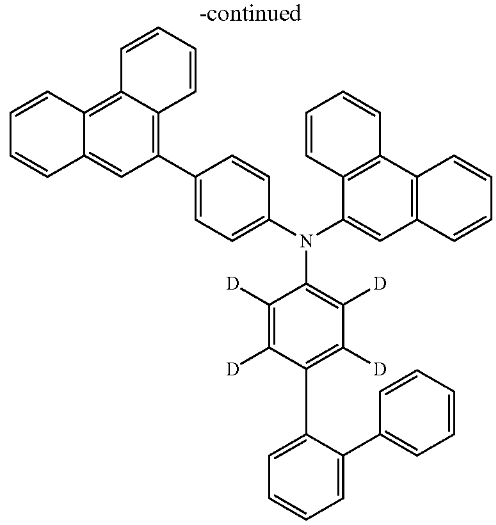
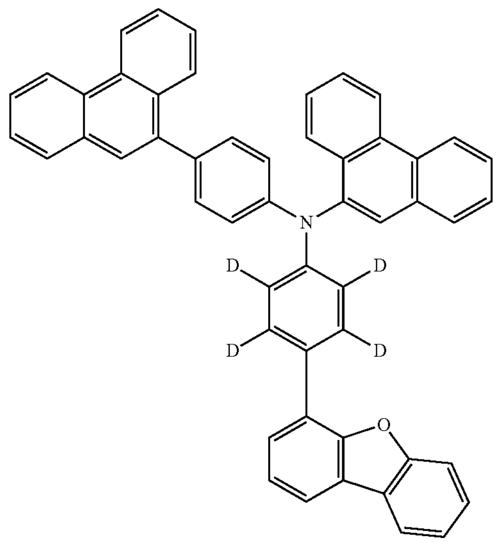
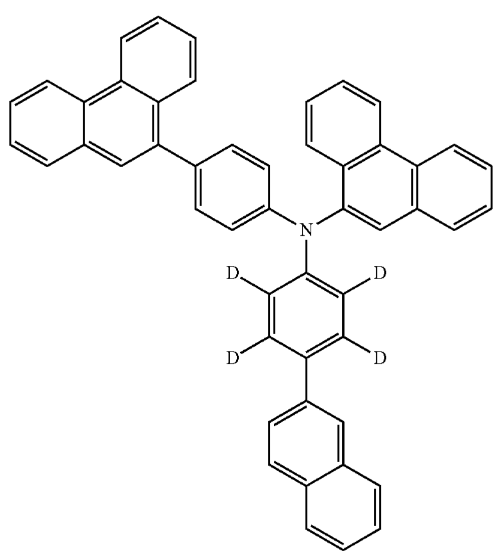

-continued
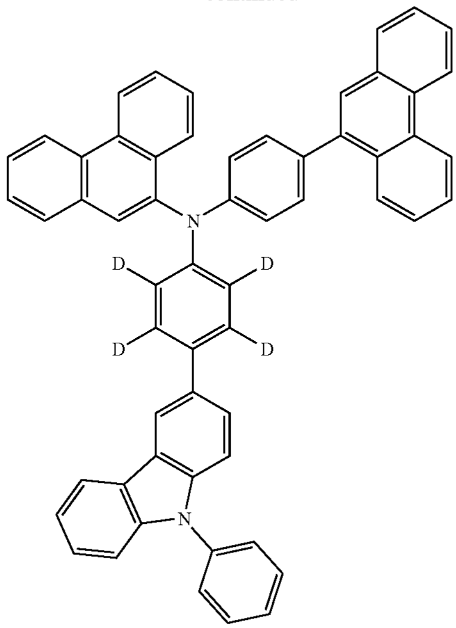
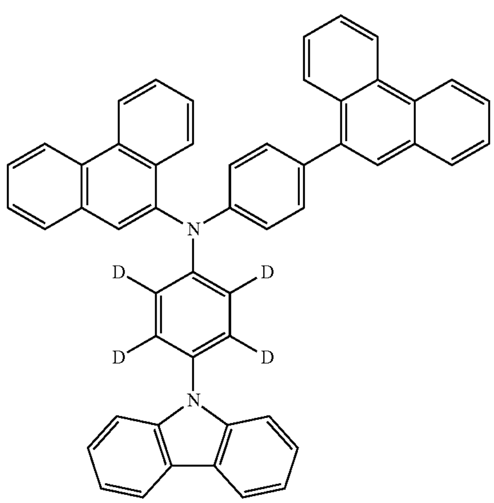
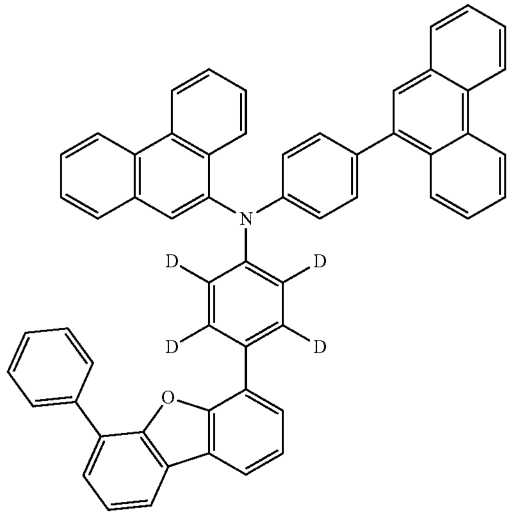
-continued
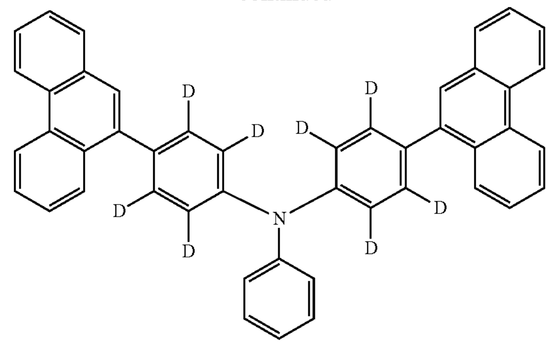
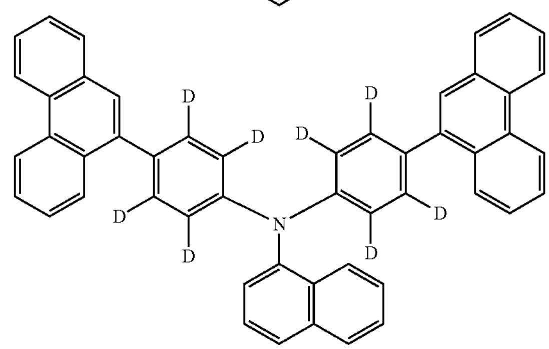
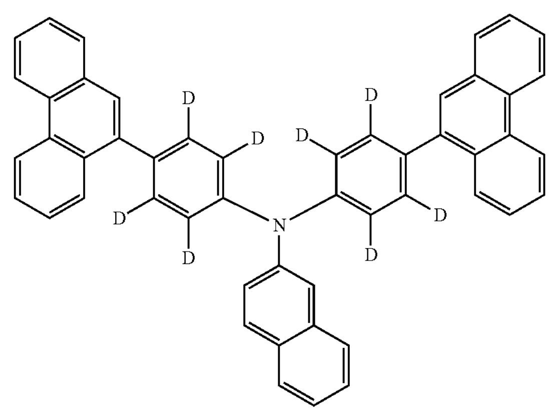
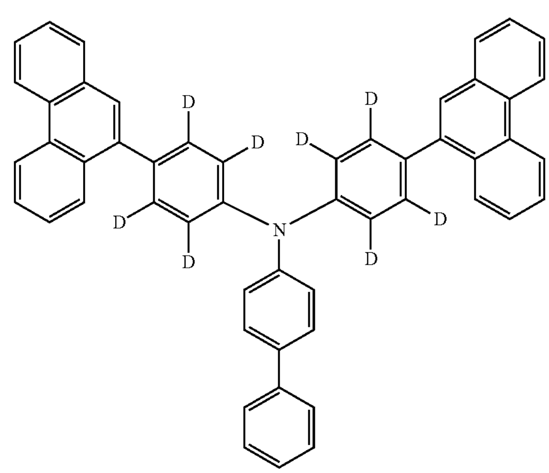

-continued
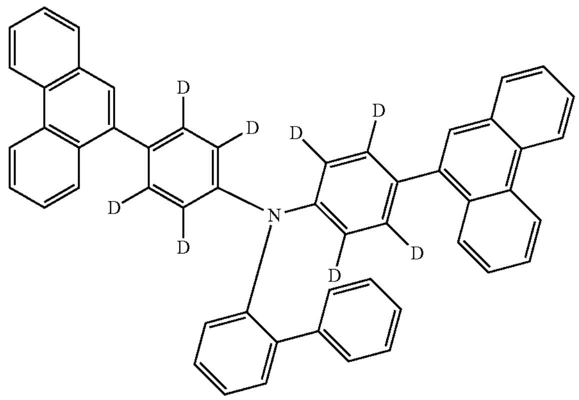
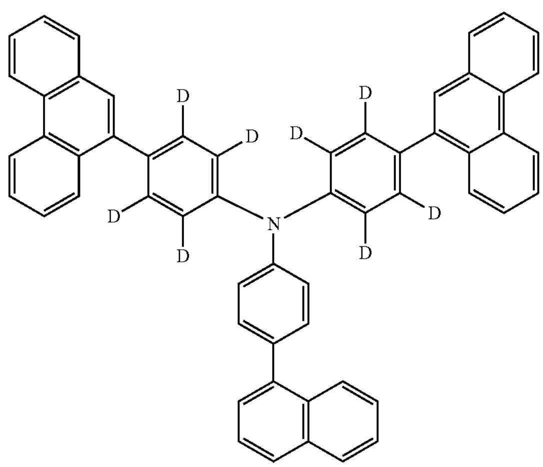
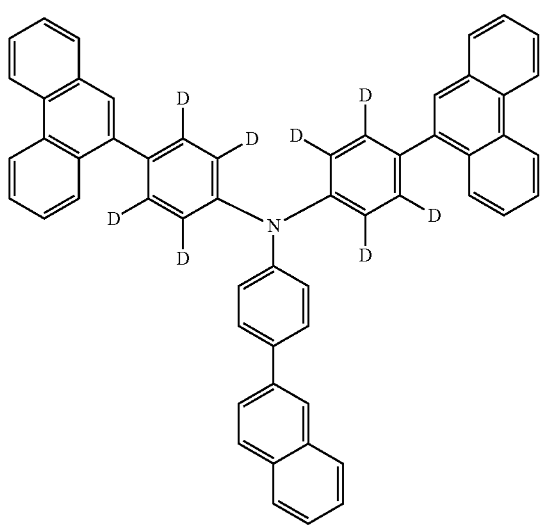
-continued
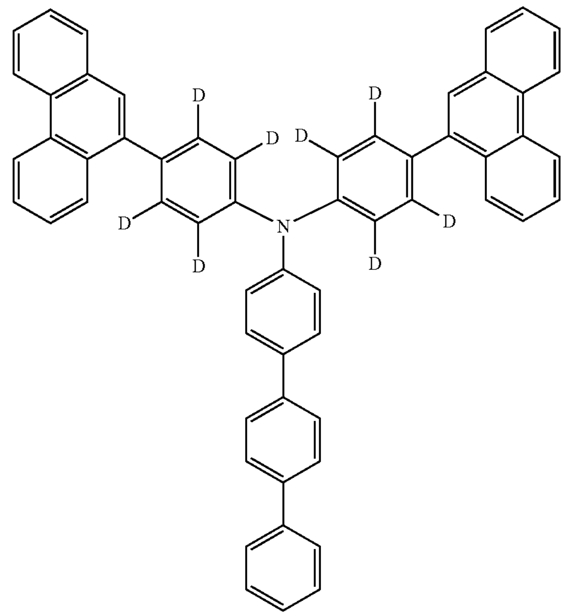
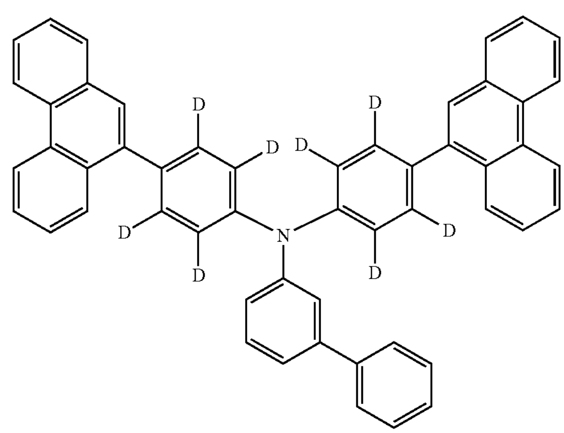
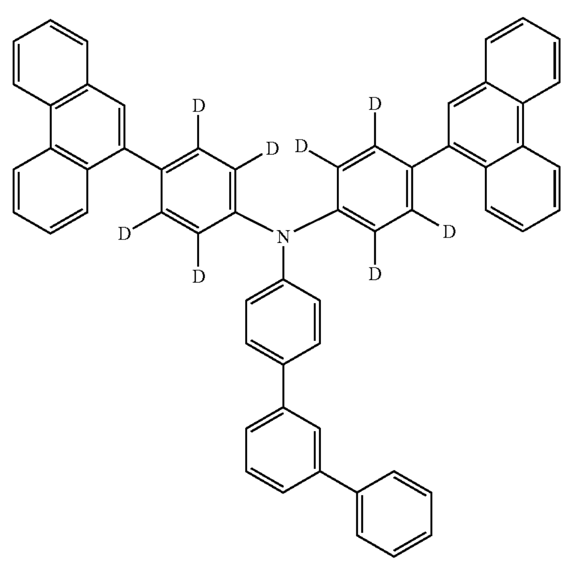

-continued
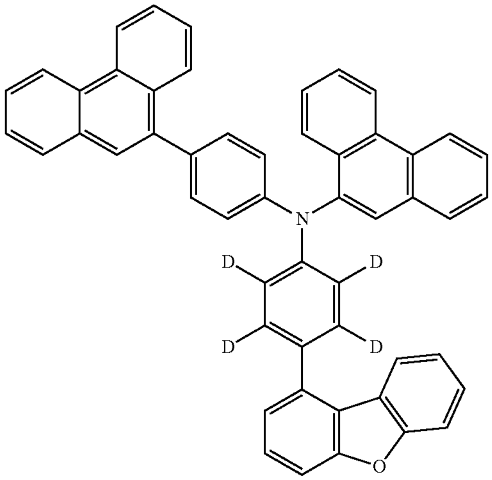 [SMILES: [2H]c1c([2H])c(N(c2ccc(-c3cc4ccccc4c4ccccc34)cc2)c2cc3ccccc3c3ccccc23)c([2H])c([2H])c1-c1cccc2oc3ccccc3c12]
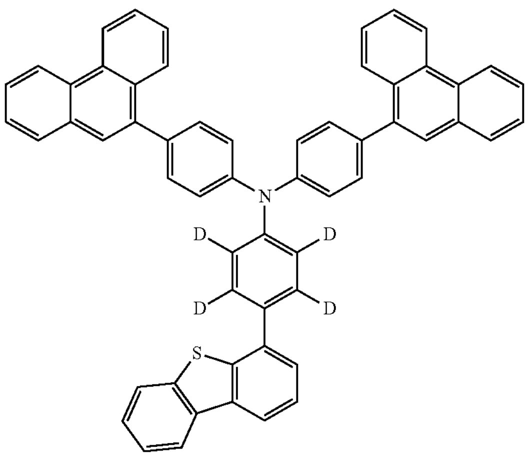
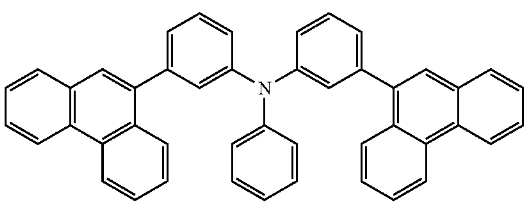
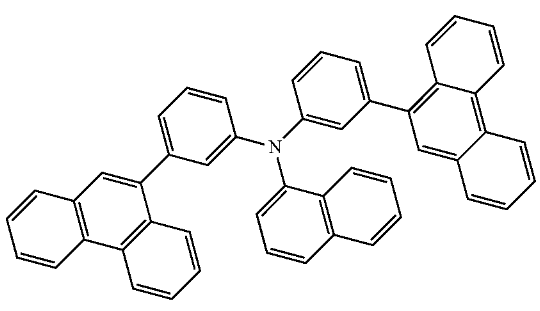
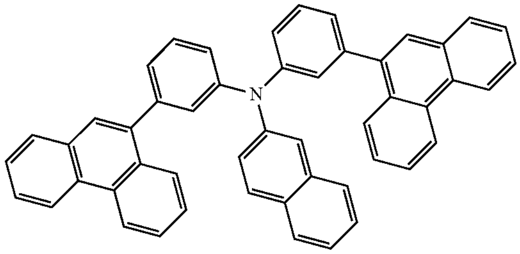
-continued
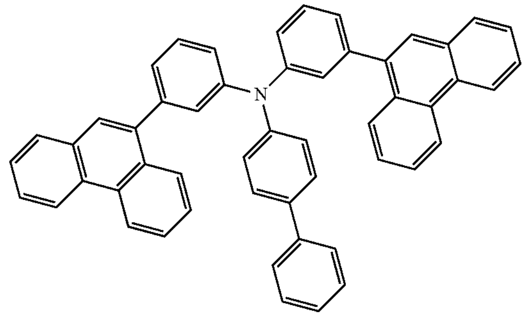
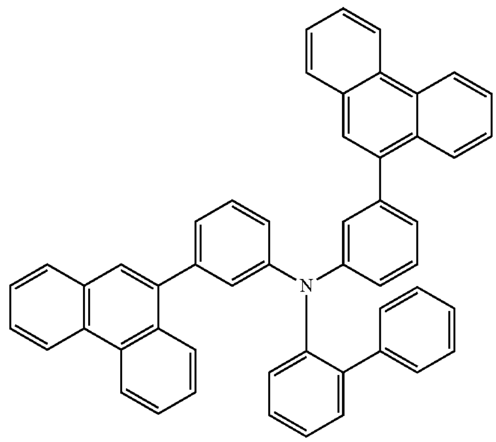
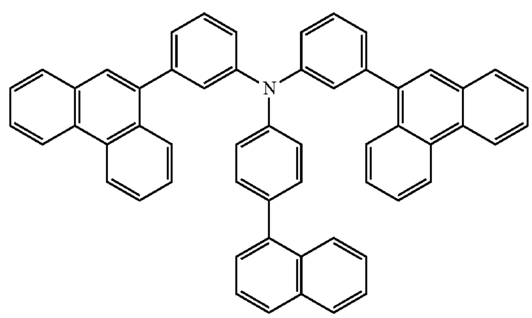
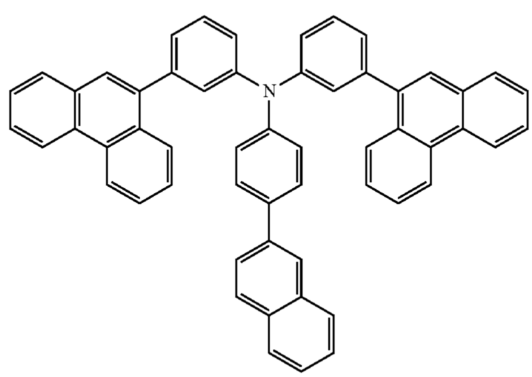

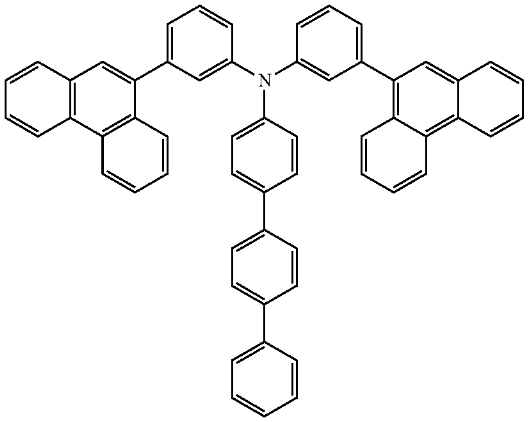
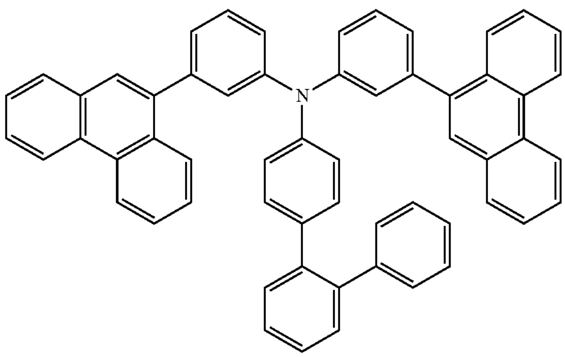
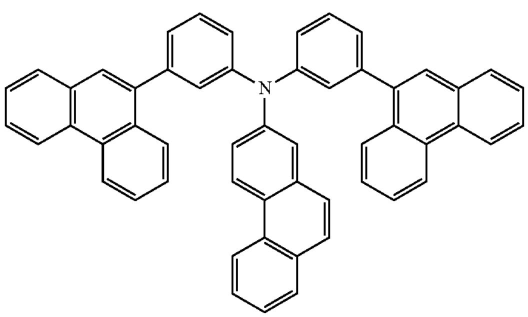
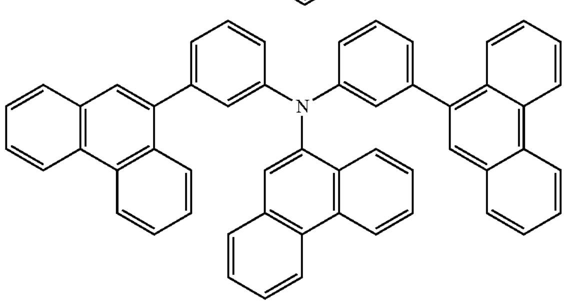
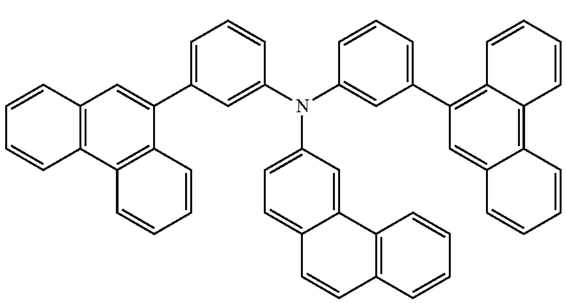
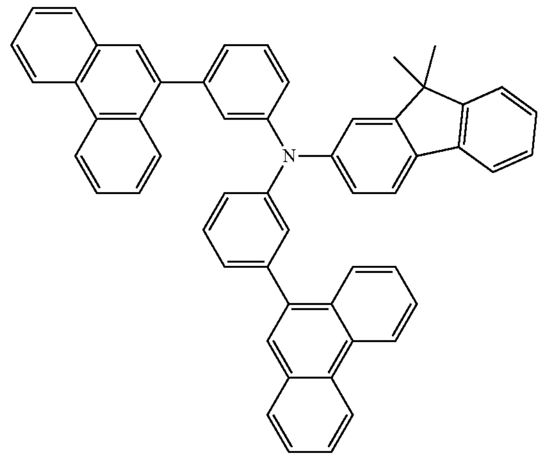
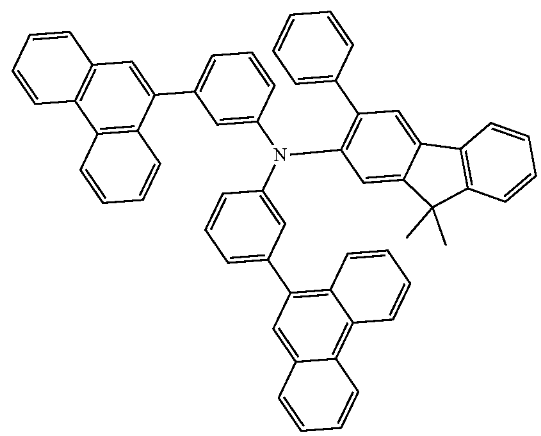
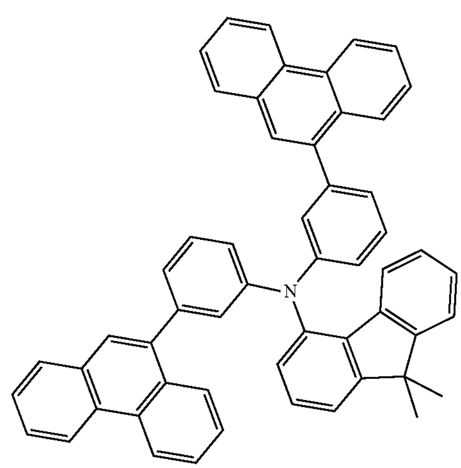

-continued
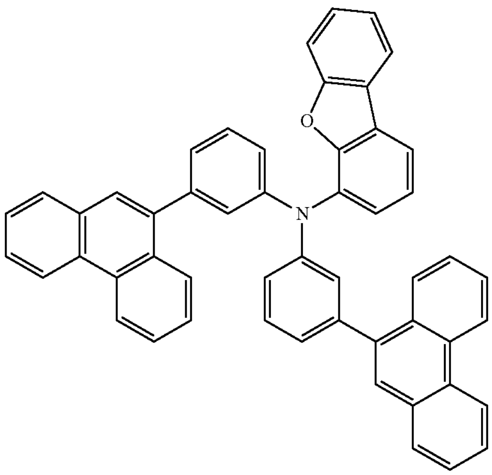
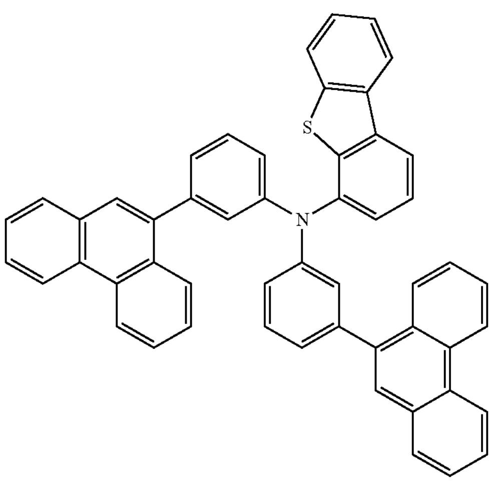
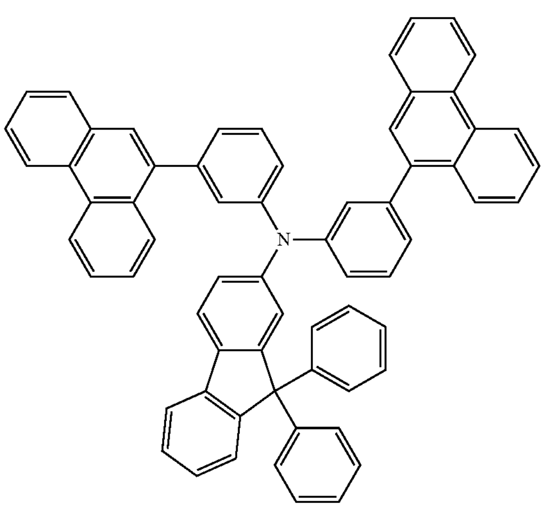
-continued
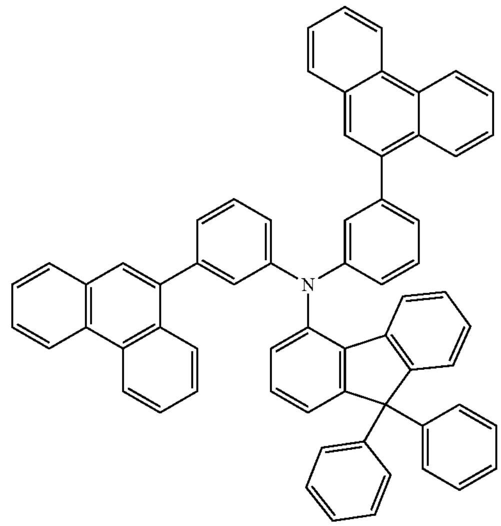
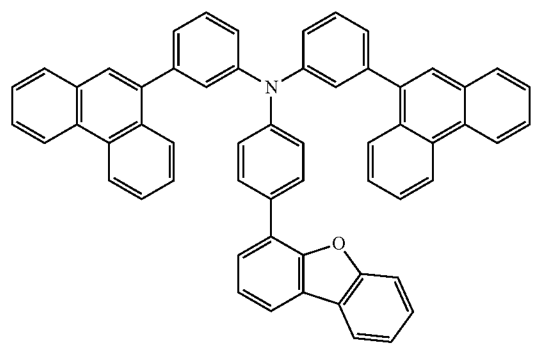
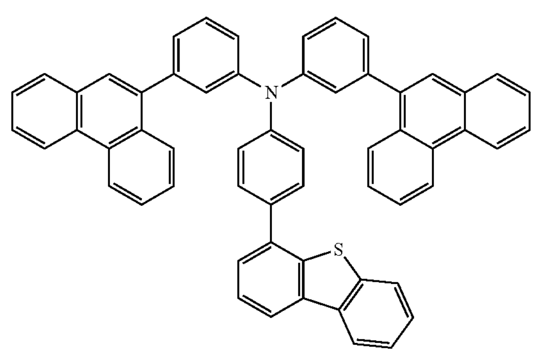

-continued
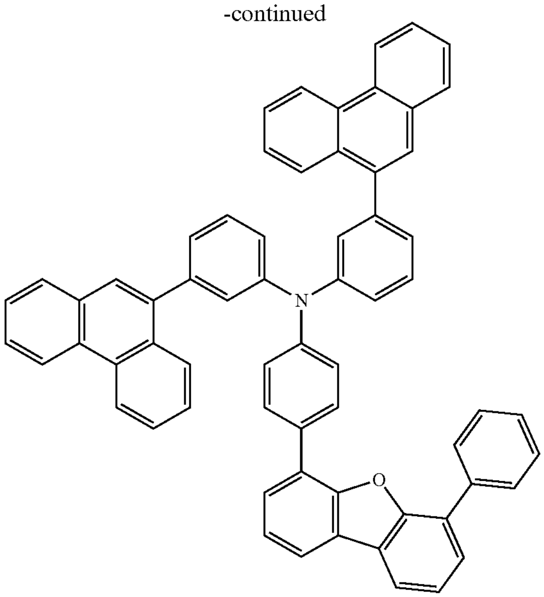
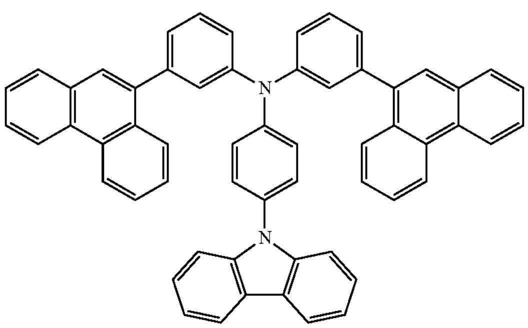
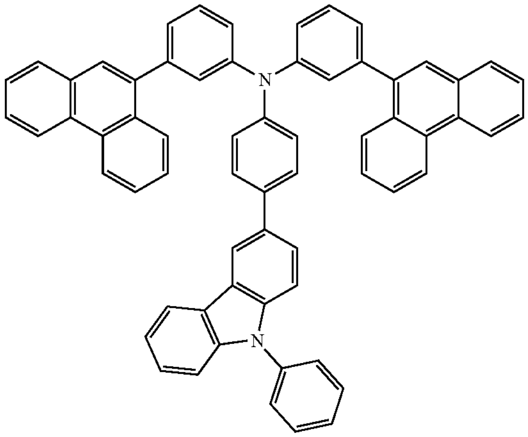
-continued
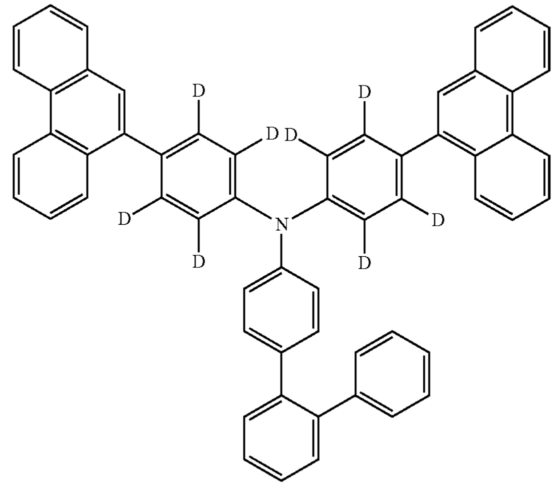
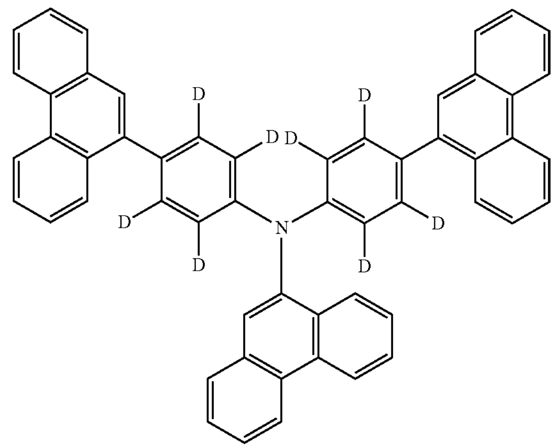
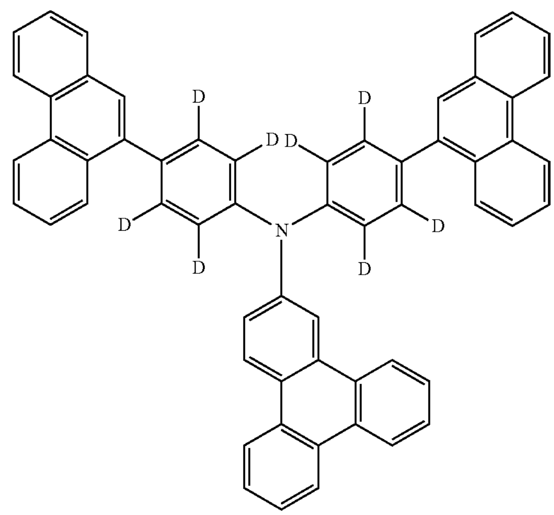

-continued
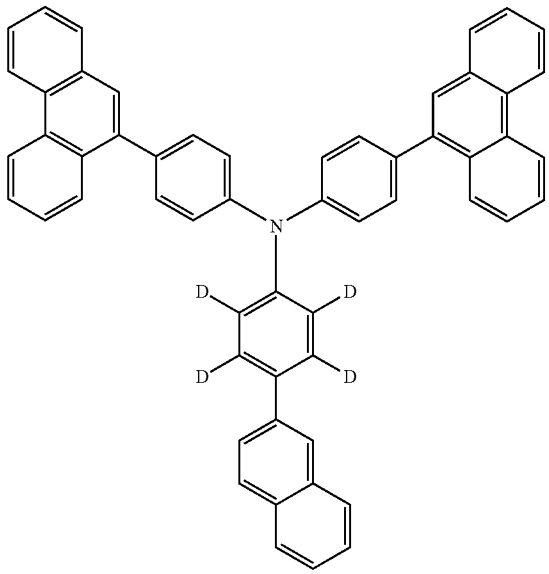
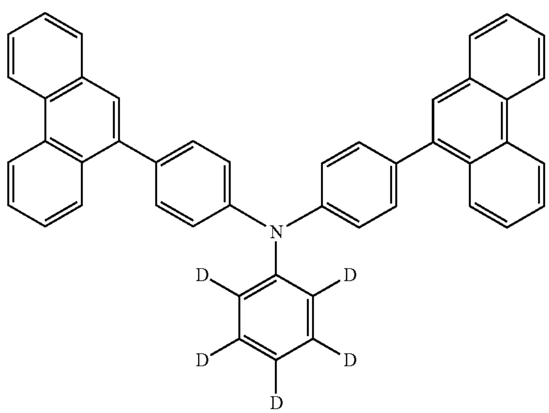
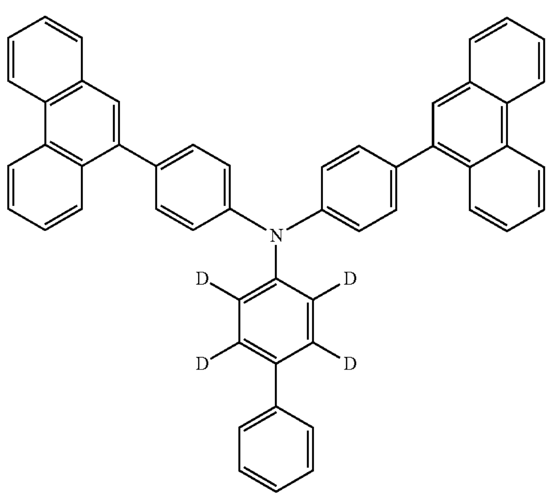
-continued
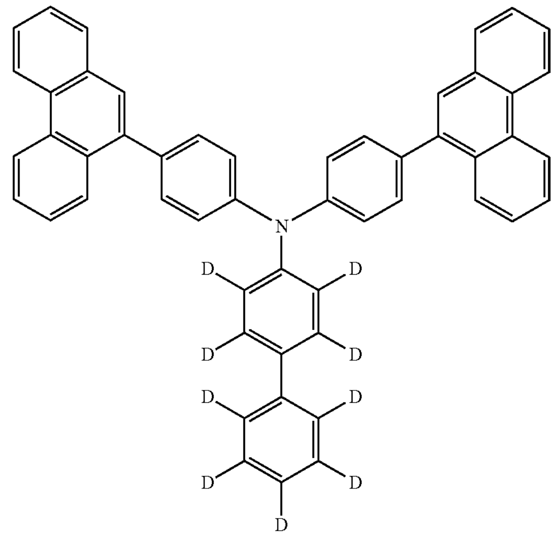
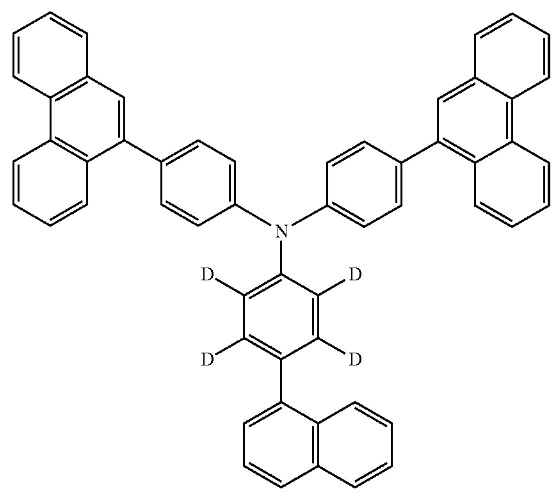
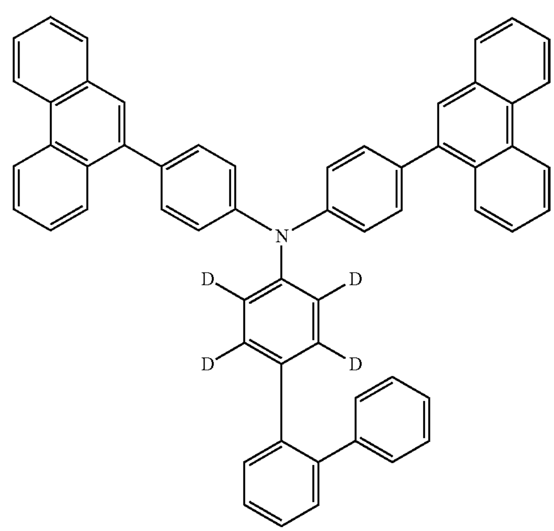

-continued
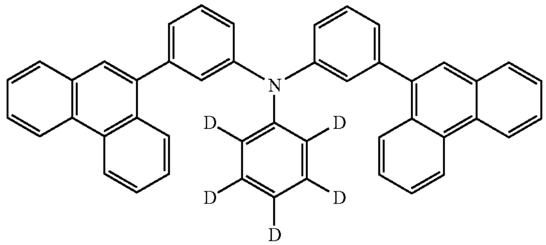
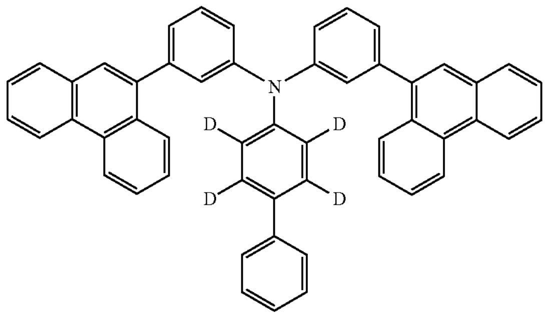
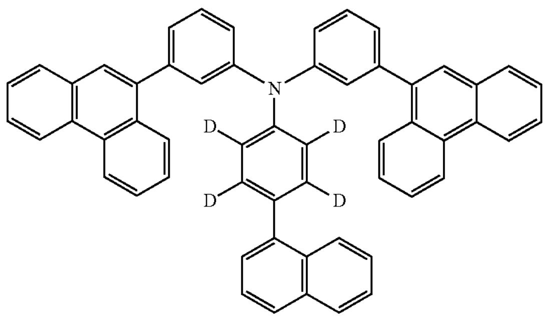
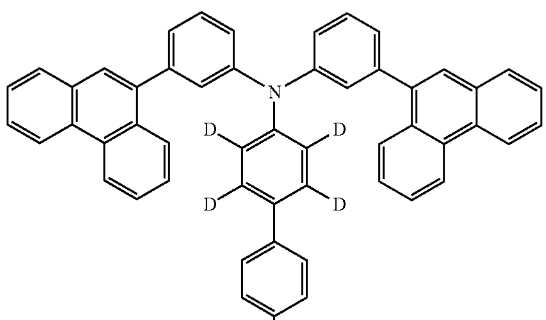
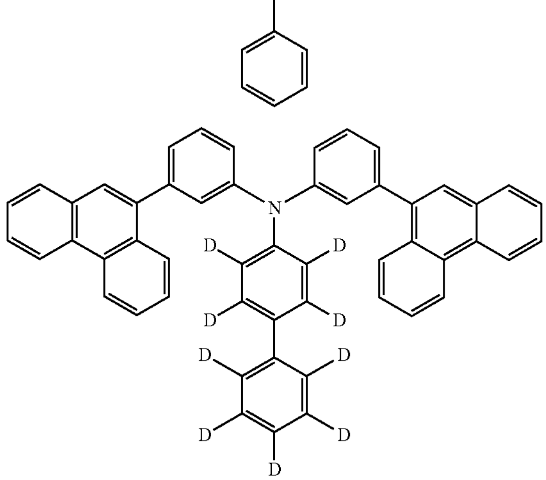
-continued
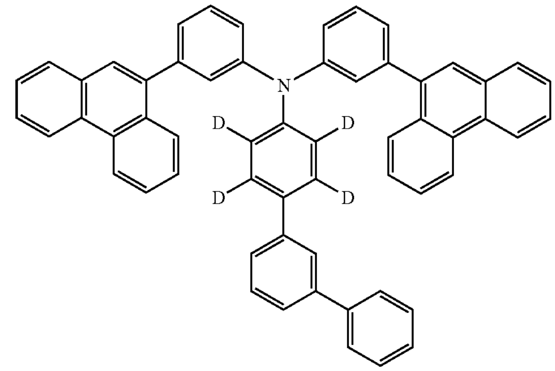
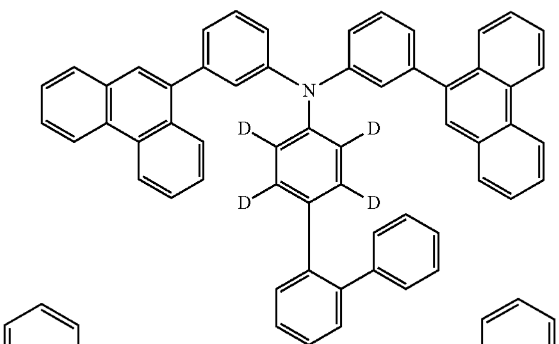
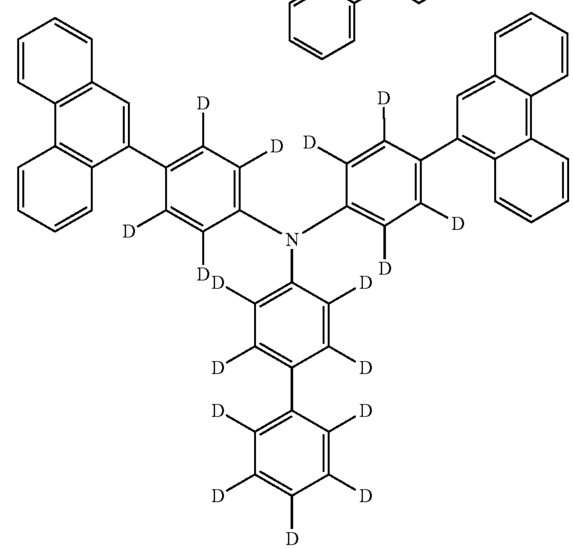
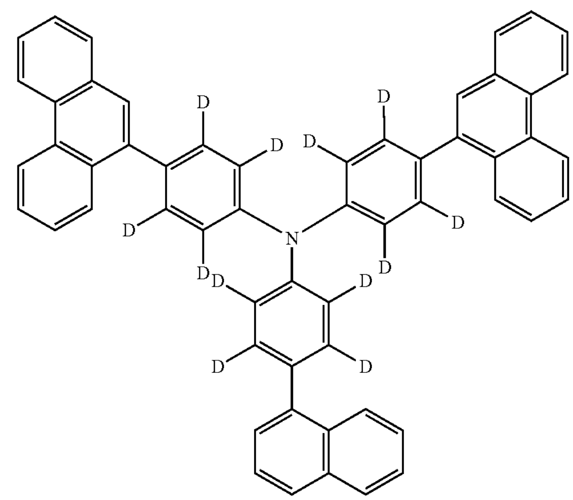

-continued
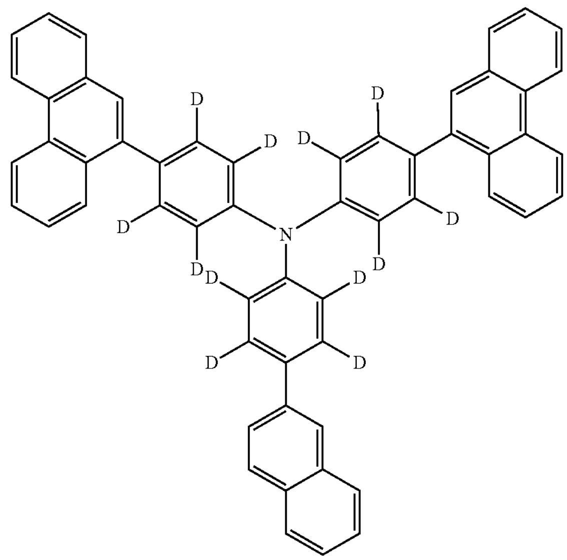
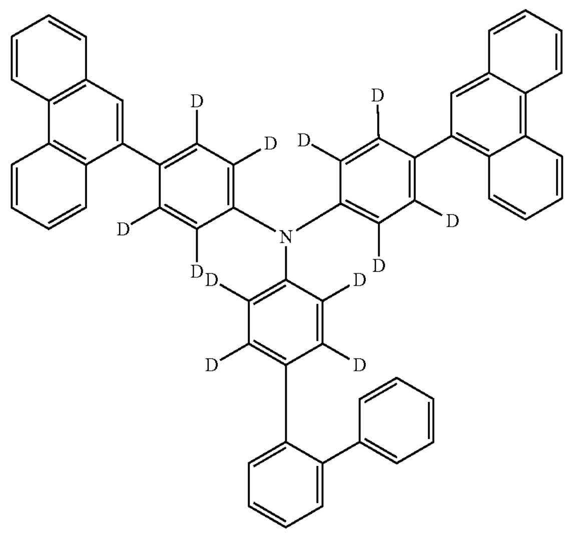
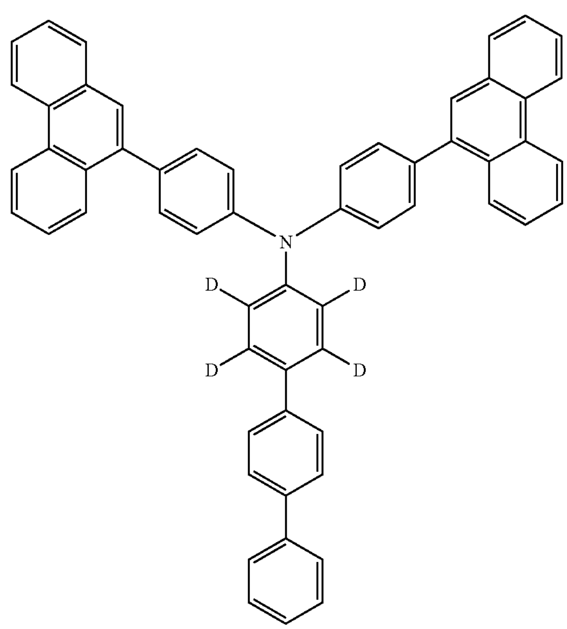
-continued
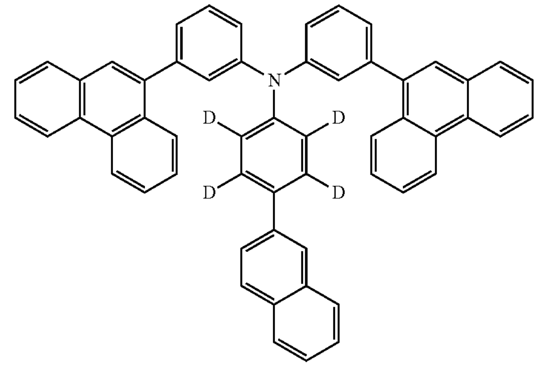
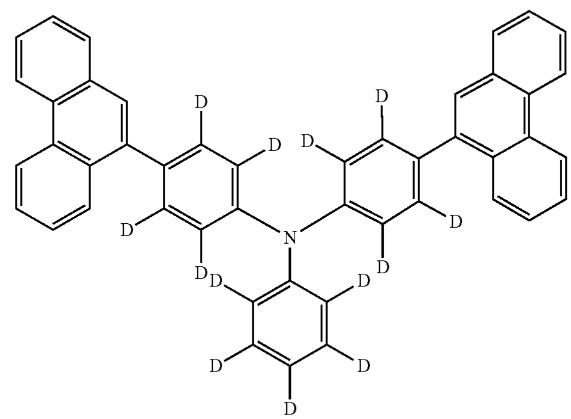
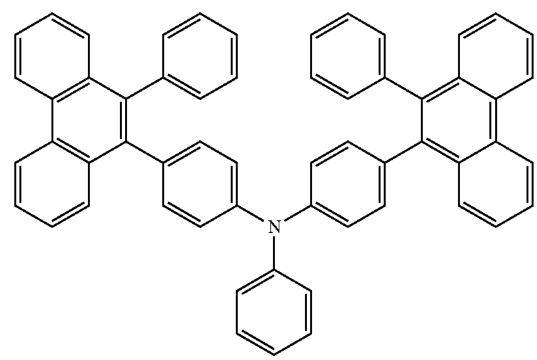
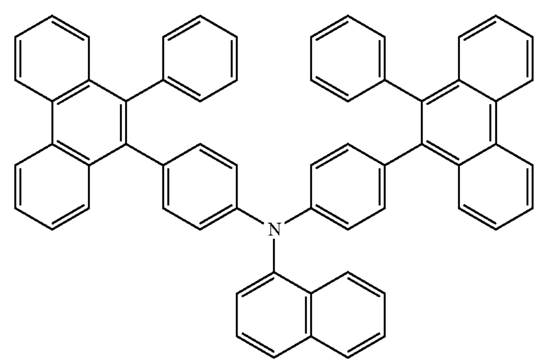

-continued
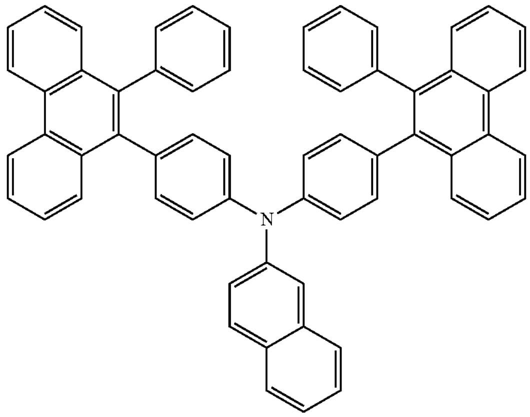
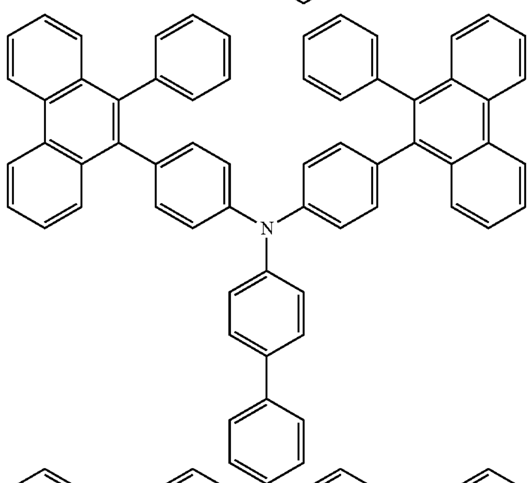
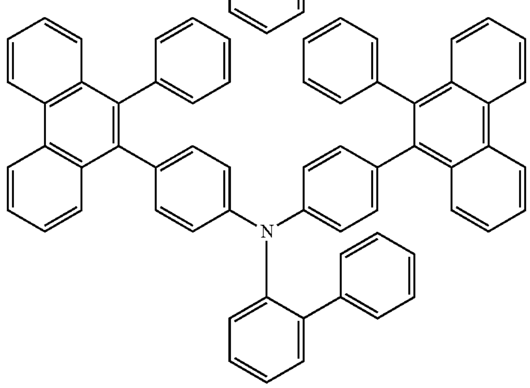
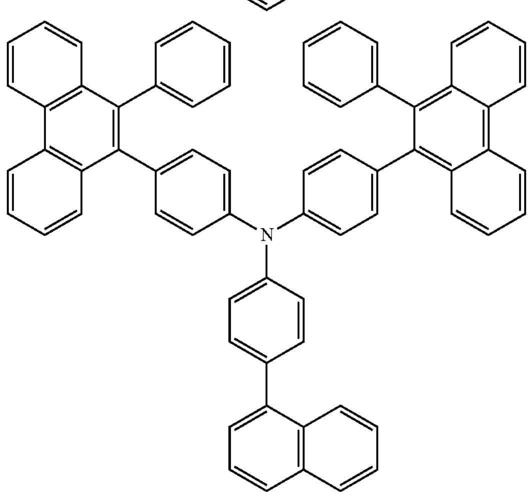
-continued
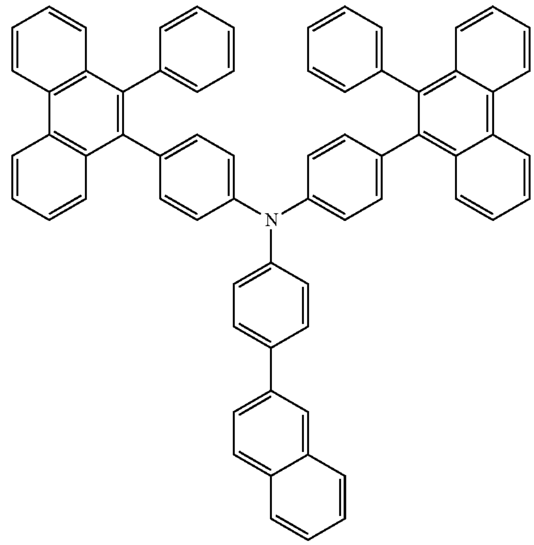
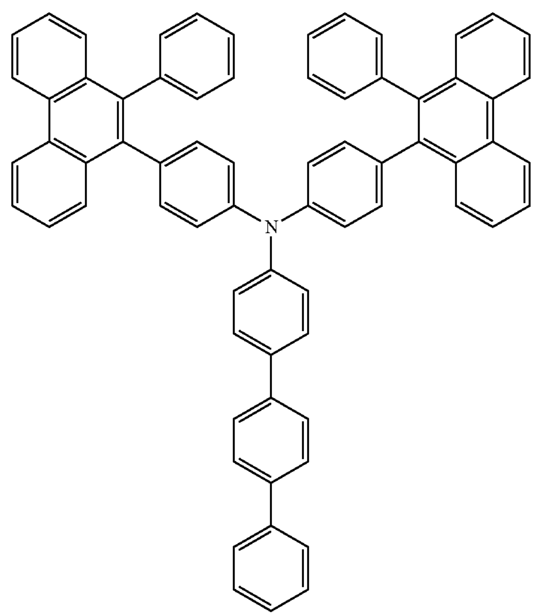
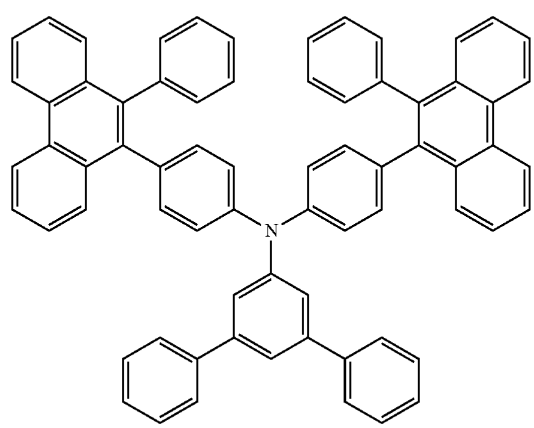

-continued
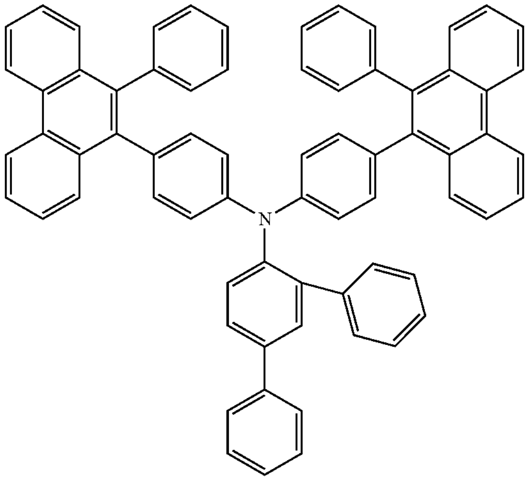
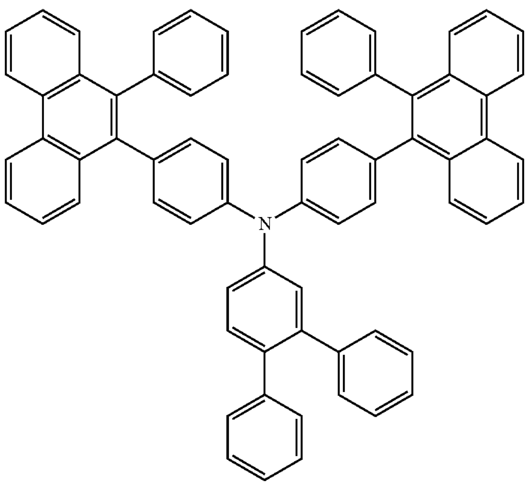
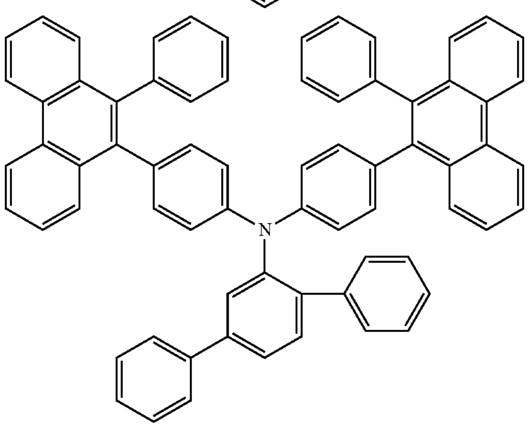
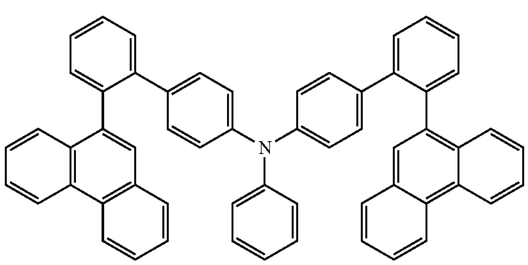
-continued
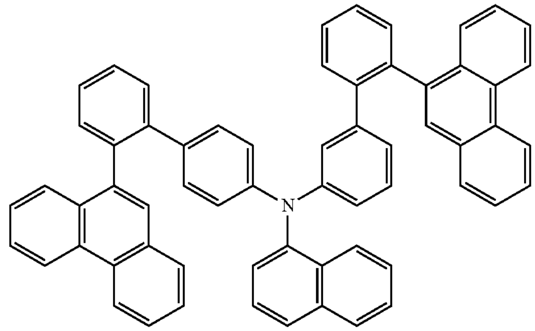
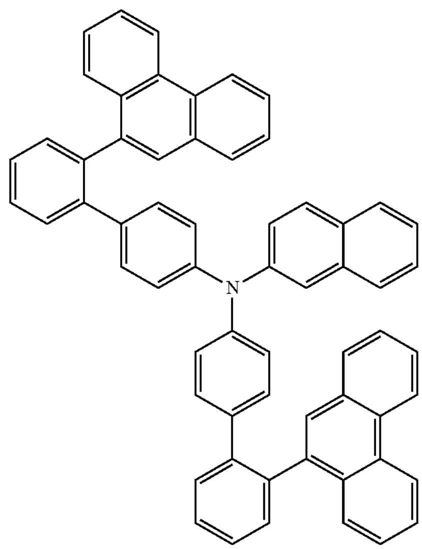
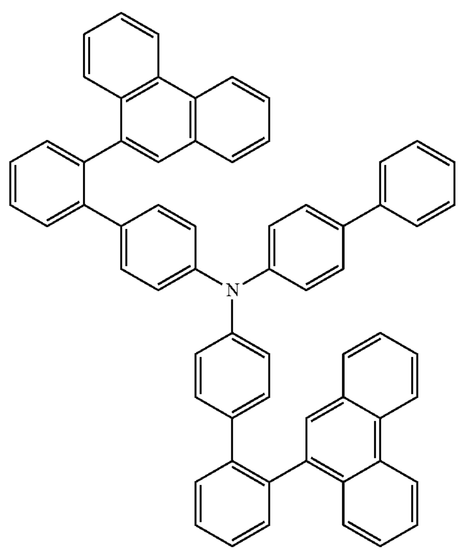

-continued
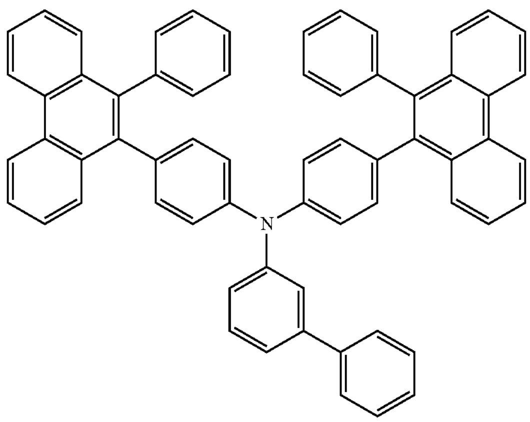
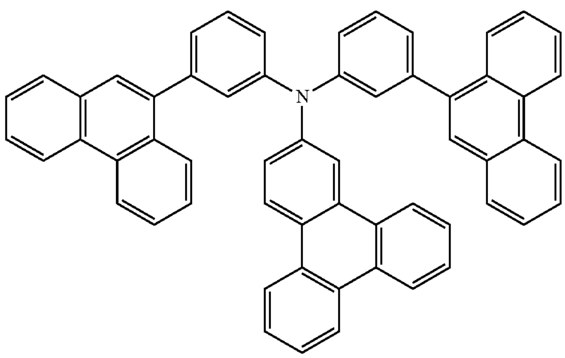
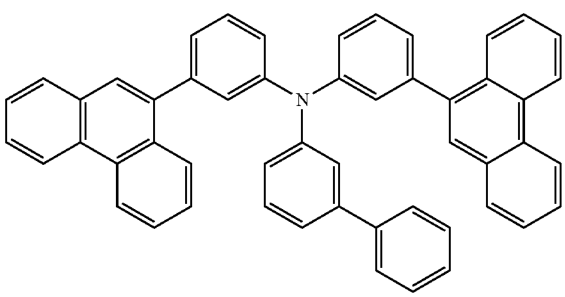
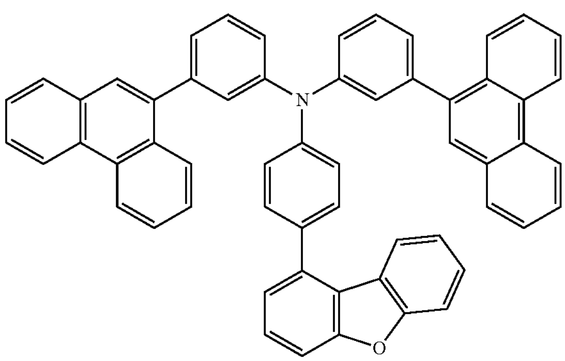
-continued
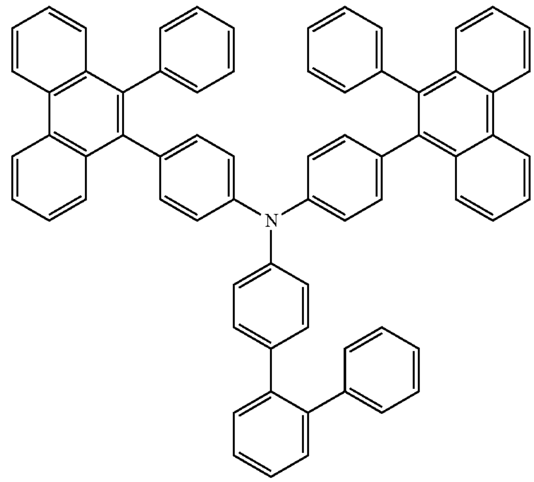
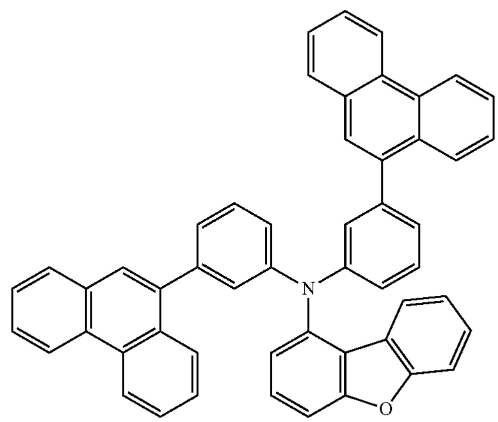
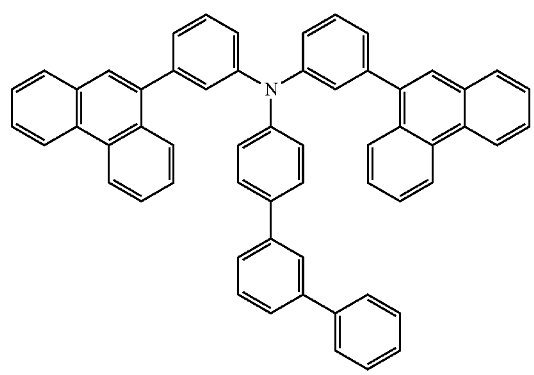
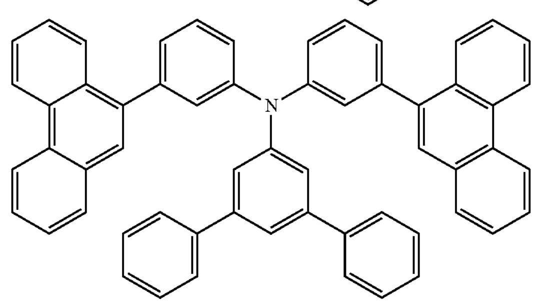

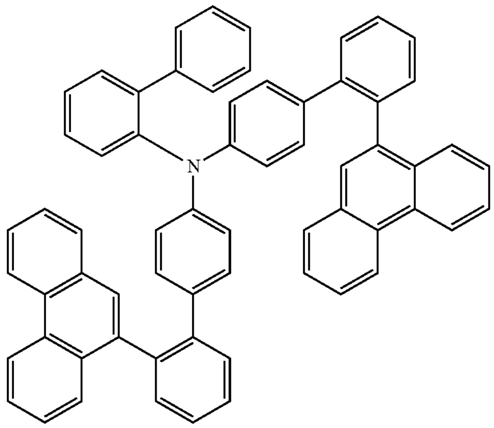
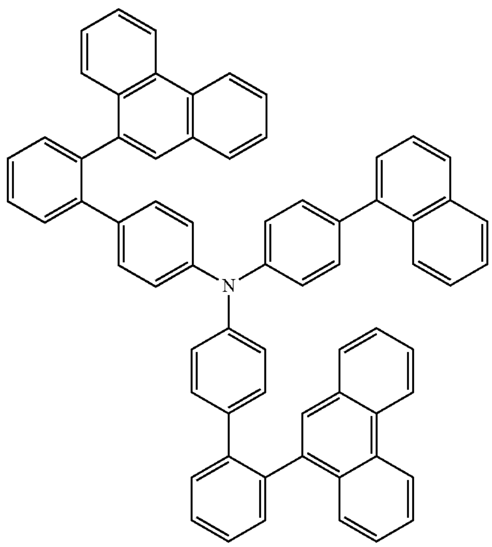
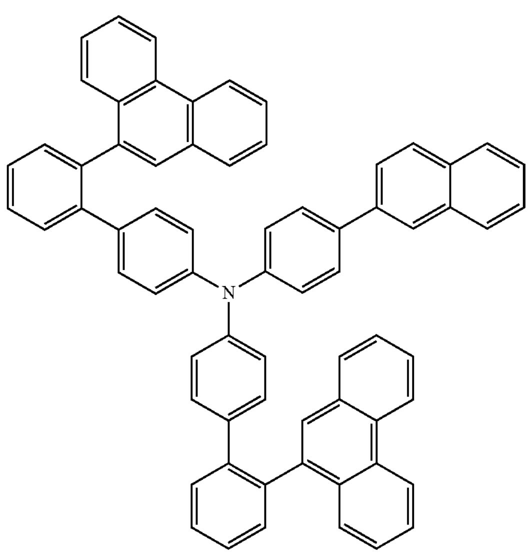
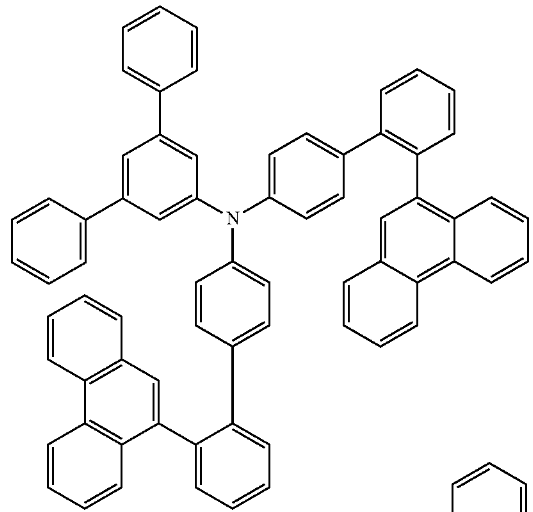
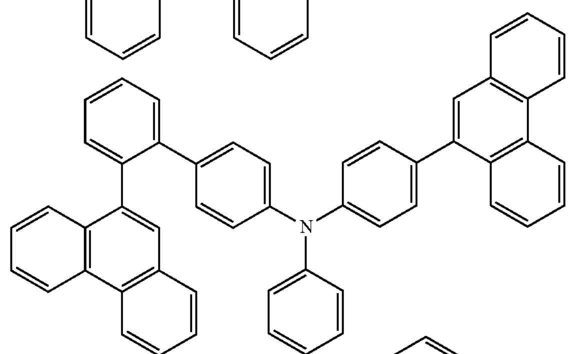
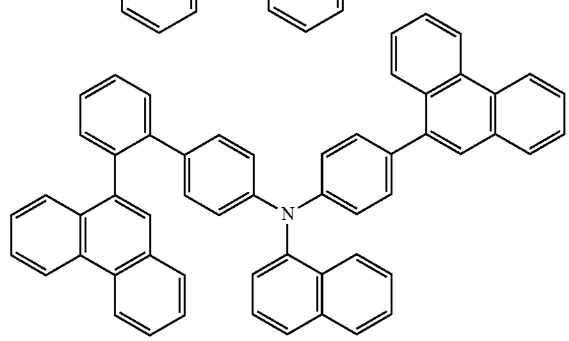
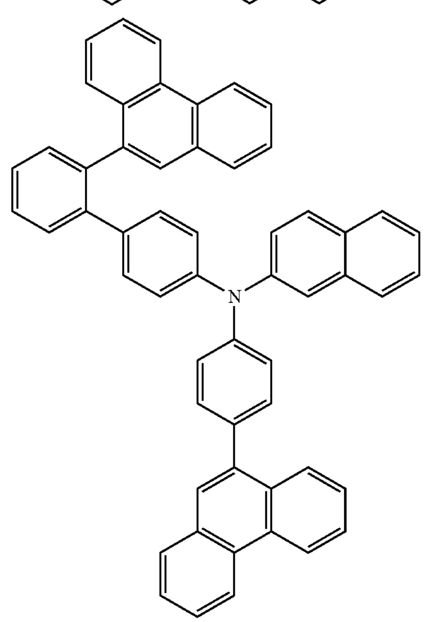

-continued
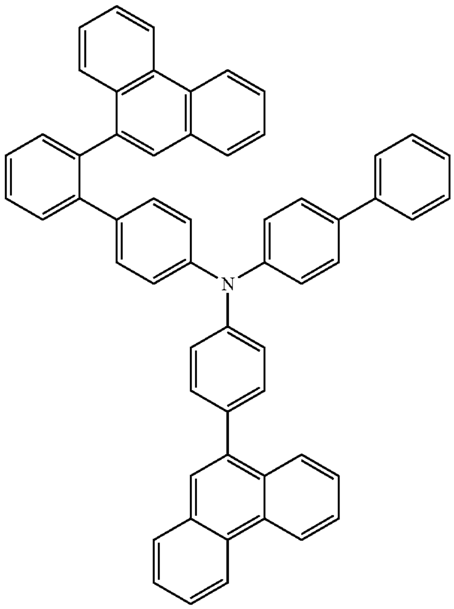
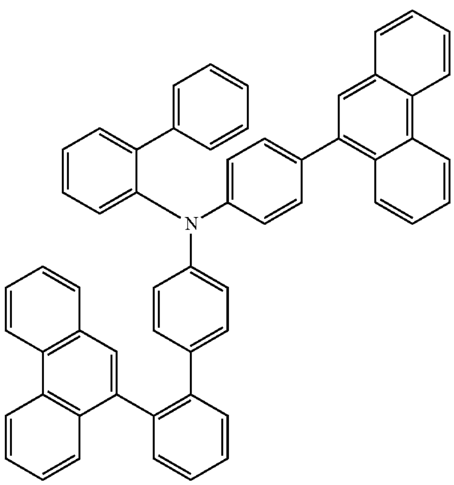
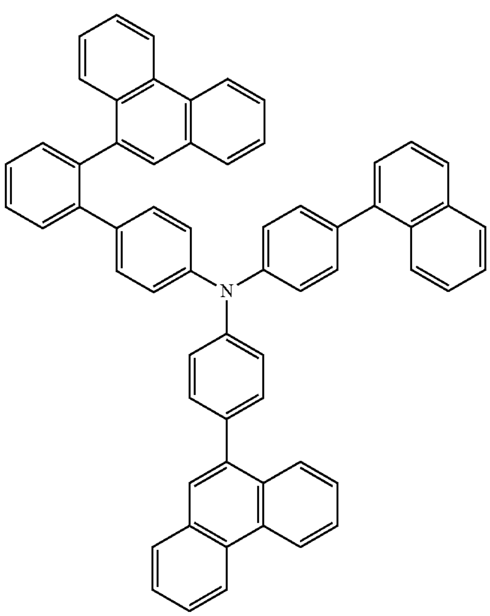
-continued
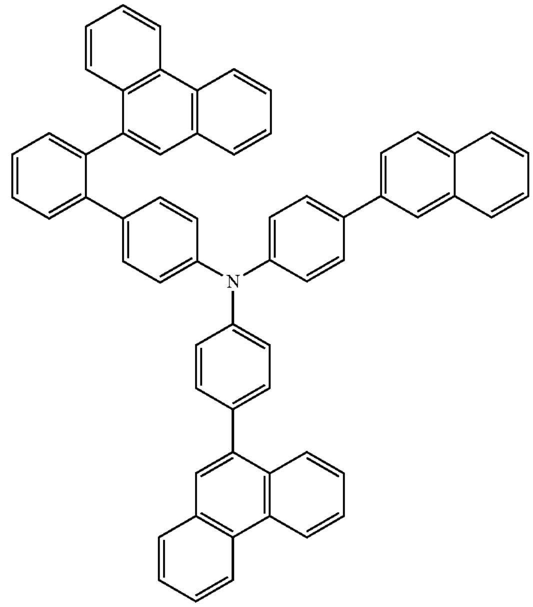
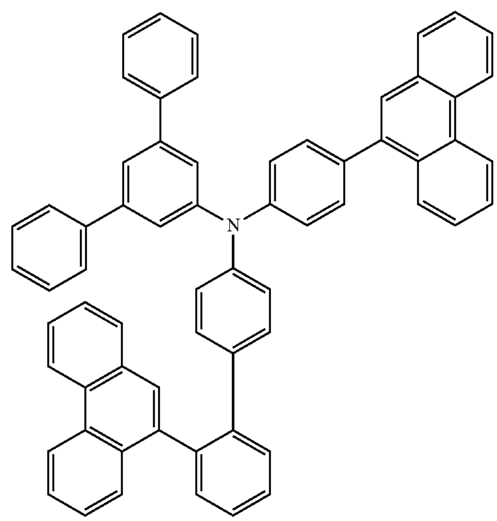
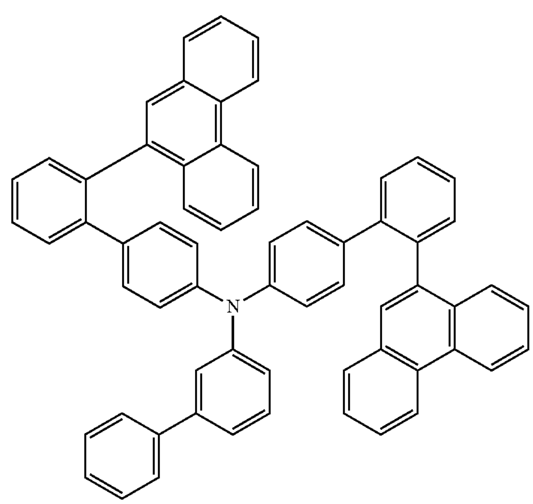

-continued

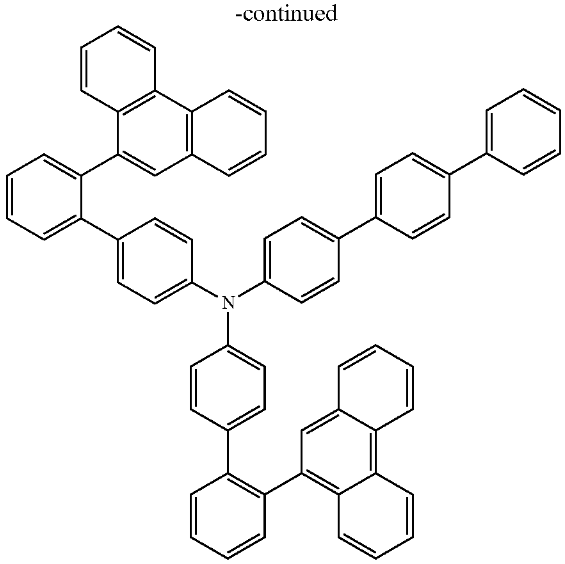

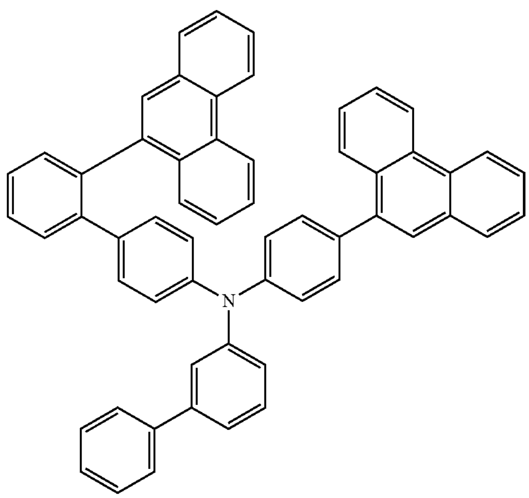

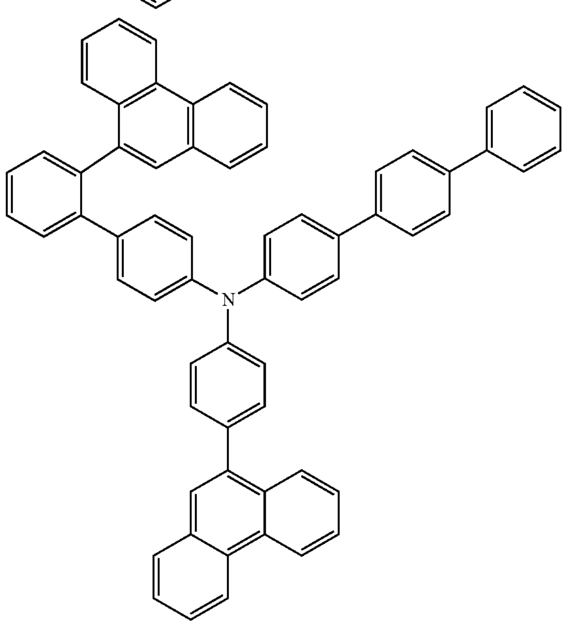

-continued

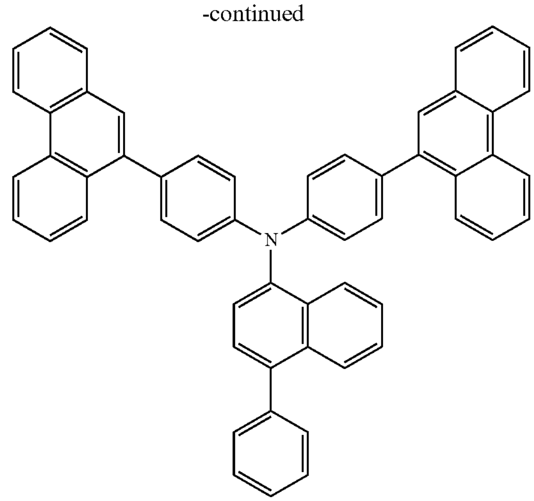

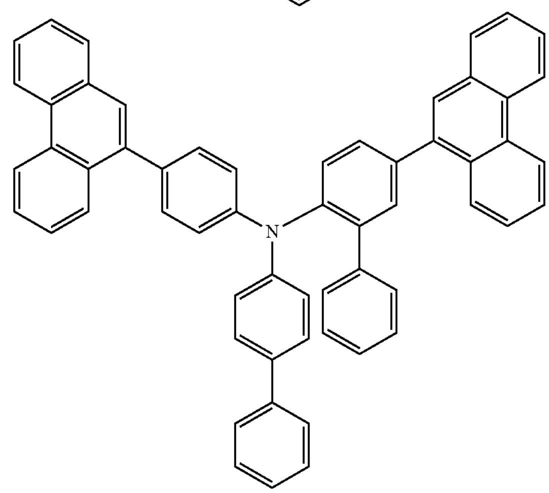

In the specification of the present disclosure, the first organic material layer includes a hole injection layer, a hole transfer layer, or a hole injection and transfer layer, and the hole injection layer, the hole transfer layer, or the hole injection and transfer layer includes the compound of Chemical Formula 1.

In the specification of the present disclosure, the first organic material layer includes a hole transfer layer, and the hole transfer layer includes the compound of Chemical Formula 1.

In the organic light emitting device of the present disclosure, the second organic material layer includes an electron blocking layer, and the electron blocking layer includes the compound of Chemical Formula 2.

In the specification of the present disclosure, the organic material layer includes one or more light emitting layers.

In the specification of the present disclosure, the organic material layer includes a light emitting layer.

For example, the organic light emitting device of the present disclosure may have structures as illustrated in FIG. 1 and FIG. 2, however, the structure is not limited thereto.

FIG. 1 illustrates a structure of the organic light emitting device in which a first electrode (2), a hole transfer layer (3), an electron blocking layer (4), a light emitting layer (5) and a second electrode (6) are consecutively stacked on a substrate (1).

FIG. 2 illustrates a structure of the organic light emitting device in which a first electrode (2), a hole injection layer (7), a hole transfer layer (3), an electron blocking layer (4), a light emitting layer (5), a hole blocking layer (8), an electron injection and transfer layer (9) and a second electrode (6) are consecutively stacked on a substrate (1).

In the specification of the present disclosure, the organic light emitting device includes a structure in which a second electrode/a light emitting layer/an electron blocking layer/a hole transfer layer/a first electrode are consecutively stacked.

In the specification of the present disclosure, the organic light emitting device includes a structure in which a second electrode/an electron transfer layer/a light emitting layer/an electron blocking layer/a hole transfer layer/a first electrode are consecutively stacked.

In the specification of the present disclosure, the organic light emitting device includes a structure in which a second electrode/an electron transfer layer/a light emitting layer/an electron blocking layer/a hole transfer layer/a hole injection layer/a first electrode are consecutively stacked.

In the specification of the present disclosure, the organic light emitting device includes a structure in which a second electrode/a light emitting layer/an electron blocking layer/a hole transfer layer/a hole injection layer/a first electrode are consecutively stacked.

In the specification of the present disclosure, the organic light emitting device includes a structure in which a second electrode/an electron injection layer/an electron transfer layer/a light emitting layer/an electron blocking layer/a hole transfer layer/a first electrode are consecutively stacked.

In the specification of the present disclosure, the organic light emitting device includes a structure in which a second electrode/an electron injection layer/an electron transfer layer/a light emitting layer/an electron blocking layer/a hole transfer layer/a hole injection layer/a first electrode are consecutively stacked.

In the specification of the present disclosure, the organic light emitting device includes a structure in which a second electrode/an electron injection layer/an electron transfer layer/a hole blocking layer/a light emitting layer/an electron blocking layer/a hole transfer layer/a hole injection layer/a first electrode are consecutively stacked.

The organic light emitting device of the present specification may be manufactured using materials and methods known in the art, except that the hole transfer layer is formed using the compound of Chemical Formula 1 and the electron blocking layer is formed using the compound of Chemical Formula 2.

For example, the organic light emitting device according to the present disclosure may be manufactured by forming an anode on a substrate by depositing a metal, a metal oxide having conductivity, or an alloy thereof using a physical vapor deposition (PVD) method such as sputtering or e-beam evaporation, forming an organic material layer including a hole injection layer, a hole transfer layer, a light emitting layer and an electron transfer layer, a first organic material layer including the compound of Chemical Formula 1 and a second organic material layer including the compound of Chemical Formula 2, and then depositing a material capable of being used as a cathode thereon. In addition to such a method, the organic light emitting device may also be manufactured by consecutively depositing a cathode material, an organic material layer and an anode material on a substrate.

As the anode material, materials having large work function are normally preferred so that hole injection to an organic material layer is smooth. Specific examples of the anode material capable of being used in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methyl compound), poly[3,4-(ethylene-1,2-dioxy)compound] (PEDT), polypyrrole and polyaniline, but are not limited thereto.

As the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection material is a material that may favorably receive holes from an anode at a low voltage, and the highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and poly compound-based conductive polymers, and the like, but are not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof include 8-hydroxy-quinoline aluminum complexes ($Alq_3$); carbazole-based compounds; dimerized styryl compounds; BAlq; 10-hydroxybenzoquinoline-metal compounds; benzoxazole, benzothiazole and benzimidazole-based compounds; poly(p-phenylenevinylene) (PPV)-based polymers; spiro compounds; polyfluorene; rubrene, and the like, but are not limited thereto.

The light emitting layer may include a host material and a dopant material. The host material may include fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like may be included, and as the heteroring-containing compound, heterocyclic compounds, dibenzofuran derivatives, ladder-type furan compounds, pyrimidine derivatives and the like may be included, however, the host material is not limited thereto.

The dopant material may include aromatic heterocyclic compounds, styrylamine compounds, boron complexes, fluoranthene compounds, metal complexes and the like. Specifically, the aromatic heterocyclic compound is a fused aromatic ring derivative having a substituted or unsubstituted arylamino group, and arylamino group-including pyrene, anthracene, chrysene, peryflanthene and the like may be included. As the styrylamine compound, compounds in which substituted or unsubstituted arylamine is substituted with at least one arylvinyl group may be used, and one, two or more substituents selected from the group consisting of an aryl group, a silyl group, an alkyl group, a cycloalkyl group and an arylamino group substituted or unsubstituted. Specifically, styrylamine, styryldiamine, styryltriamine, styryltetraamine and the like may be included, however, the styrylamine compound is not limited thereto. In addition, as the metal complex, iridium complexes, platinum complexes and the like may be included, however, the metal complex is not limited thereto.

The electron transfer layer is a layer receiving electrons from an electron injection layer and transferring the electrons to a light emitting layer, and as the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto. The electron transfer layer may be used together with any desired cathode material as used in the art. Particularly, examples of the suitable cathode material may include common materials having low work function and having an aluminum layer or a silver layer following. Specifically, cesium, barium, calcium, ytterbium and samarium are included, and in each case, an aluminum layer or a silver layer follows.

The electron injection layer is a layer injecting electrons from an electrode, and compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato) gallium, bis(10-hydroxybenzo[h]quinolinato)beryllium, bis (10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer blocking holes from reaching a cathode, and may be generally formed under the same condition as the hole injection layer. Specific examples thereof may include oxadiazole derivatives, triazole derivatives, phenanthroline derivatives, BCP, aluminum complexes and the like, but are not limited thereto.

The organic light emitting device of the present disclosure may be manufactured using common organic light emitting device manufacturing methods and materials, except that the organic material layer is formed including the hole transfer layer using the compound of Chemical Formula 1 described above and the electron blocking layer using the compound of Chemical Formula 2 described above.

Synthesis Example 1. Synthesis of Compound 1-1

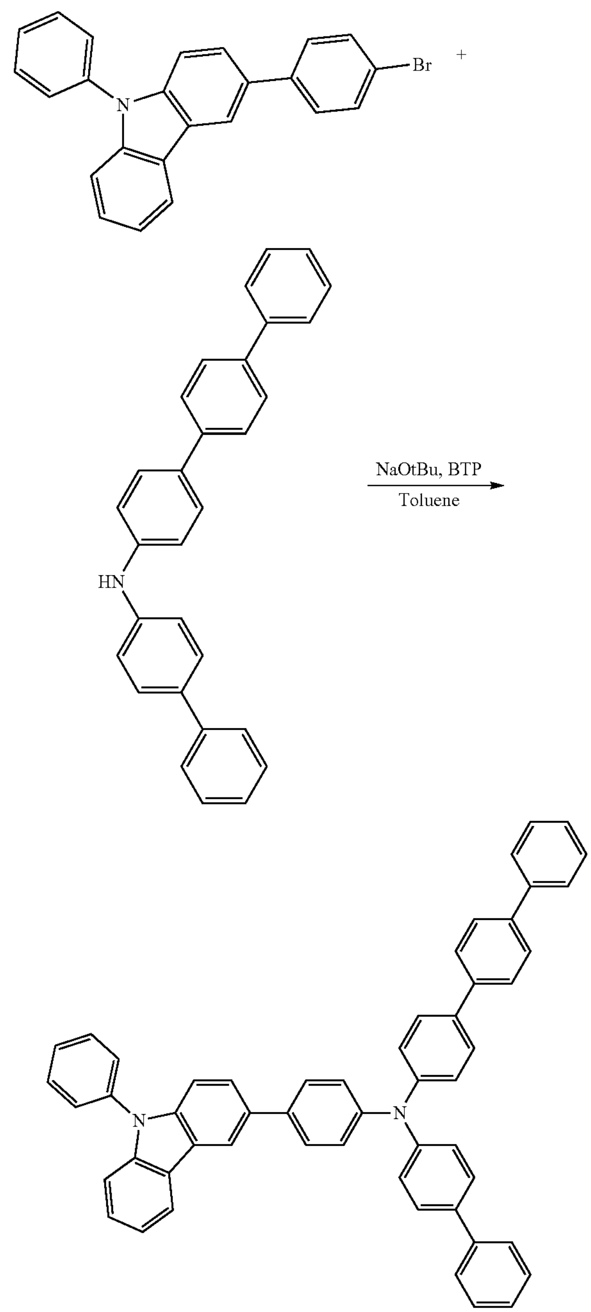

1-1

After adding toluene (200 ml) to 3-(4-bromophenyl)-9-phenyl-9H-carbazole (20.0 g, 50.21 mmol), N-([1,1'-biphenyl]-4-yl)-[1,1',4',1"-terphenyl]-4-amine (20.36 g, 51.22 mmol) and sodium tert-butoxide (6.76 g, 70.29 mmol), the result was stirred for 10 minutes while heating. To the mixture, bis(tri-tert-butylphosphine)palladium (BTP, 0.08 g, 0.15 mmol) dissolved in toluene (10 ml) was added, and the result was stirred for 1 hour while heating. After the reaction was terminated and the result was filtered, the layers were separated using toluene and water. After removing the solvent, the result was recrystallized with ethyl acetate to obtain Compound 1-1 (29.5 g, 82.18% yield). (MS[M+H]+=715)

Synthesis Example 2. Synthesis of Compound 1-2

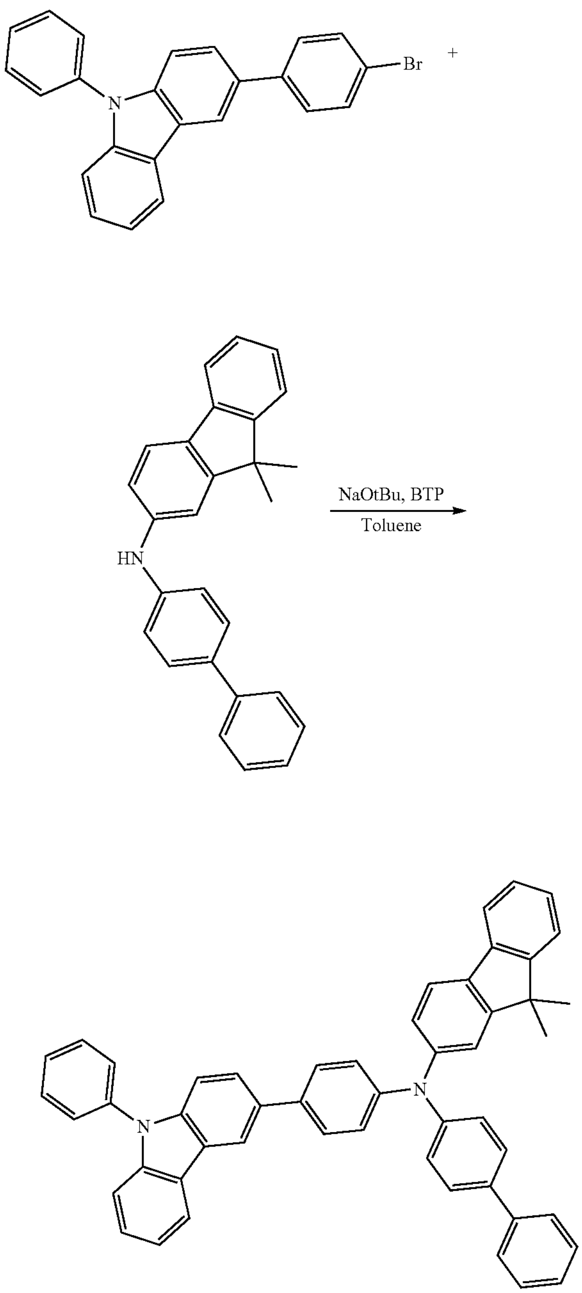

1-2

Compound 1-2 (27.5 g, 80.68% yield) was obtained in the same manner as in Synthesis Example 1 except that 3-(4-bromophenyl)-9-phenyl-9H-carbazole (20.0 g, 50.21 mmol) and N-([1,1'-biphenyl]-4-yl)-9,9-dimethyl-9H-fluoren-2-amine (18.52 g, 51.22 mmol) were used as starting materials. (MS[M+H]+=679)

Synthesis Example 3. Synthesis of Compound 1-3

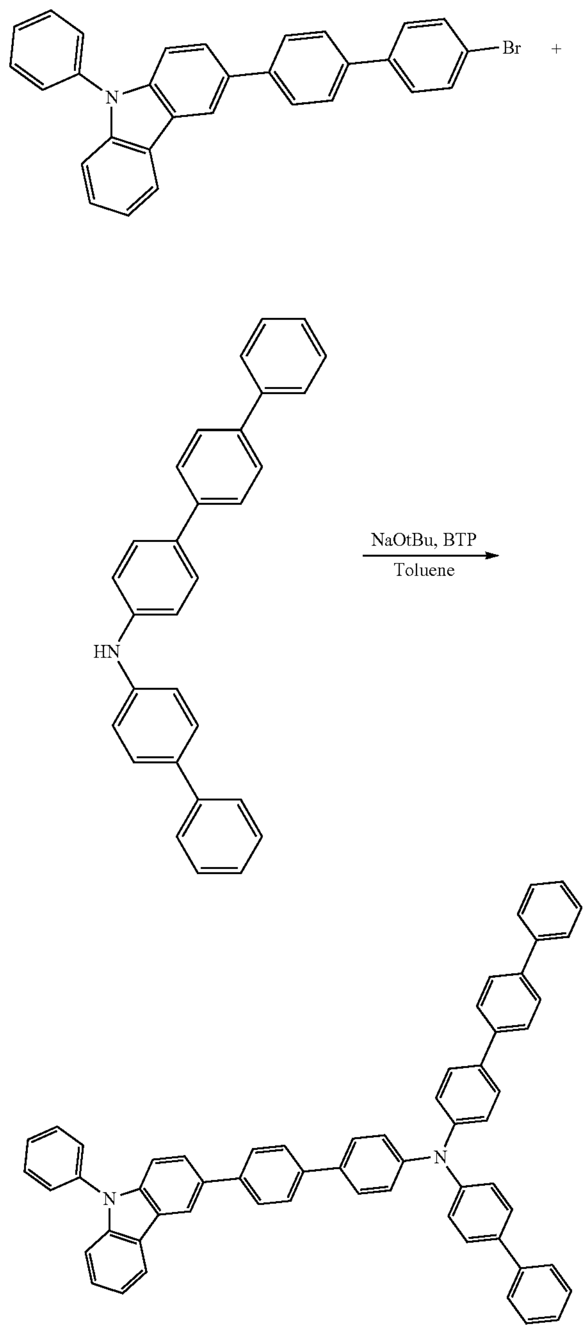

1-3

Compound 1-3 (27.8 g, 83.36% yield) was obtained in the same manner as in Synthesis Example 1 except that 3-(4'-bromo-[1,1'-biphenyl]-4-yl)-9-phenyl-9H-carbazole (20.0 g, 42.16 mmol) and N-([1,1'-biphenyl]-4-yl)-[1,1',4',1"-terphenyl]-4-amine (17.09 g, 43.00 mmol) were used as starting materials. (MS[M+H]+=791)

Synthesis Example 4. Synthesis of Compound 1-4

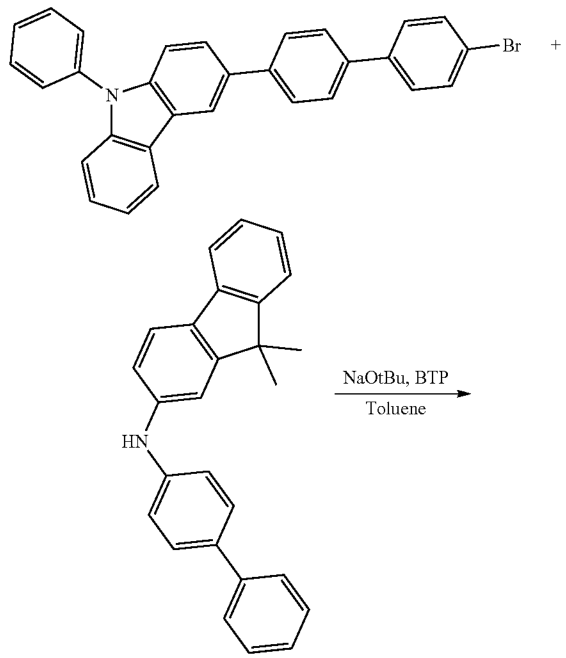

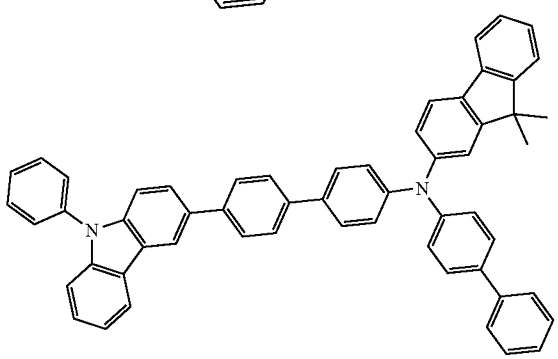

1-4

Compound 1-4 (26.2 g, 82.31% yield) was obtained in the same manner as in Synthesis Example 1 except that 3-(4'-bromo-[1,1'-biphenyl]-4-yl)-9-phenyl-9H-carbazole (20.0 g, 42.16 mmol) and N-([1,1'-biphenyl]-4-yl)-9,9-dimethyl-9H-fluoren-2-amine (15.54 g, 43.00 mmol) were used as starting materials. (MS[M+H]+=755)

Synthesis Example 5. Synthesis of Compound 1-5

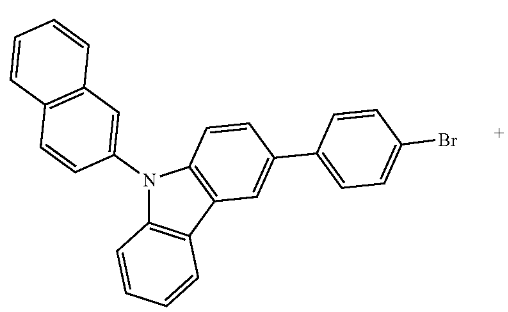

-continued

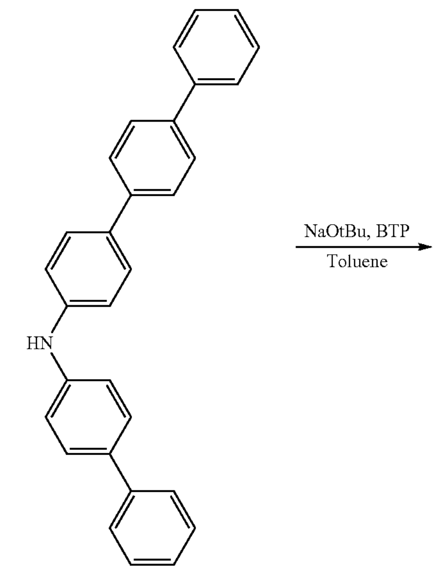

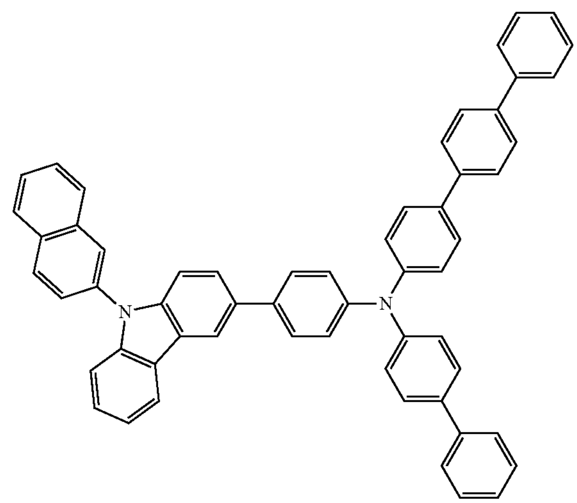

1-5

Compound 1-5 (28.4 g, 83.22% yield) were obtained in the same manner as in Synthesis Example 1 except that 3-(4-bromophenyl)-9-(naphthalen-2-yl)-9H-carbazole (20.0 g, 44.61 mmol) and N-([1,1'-biphenyl]-4-yl)-[1,1',4',1"-terphenyl]-4-amine (18.09 g, 45.50 mmol) were used as starting materials. (MS[M+H]+=765)

Synthesis Example 6. Synthesis of Compound 2-1

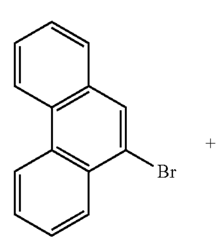

-continued

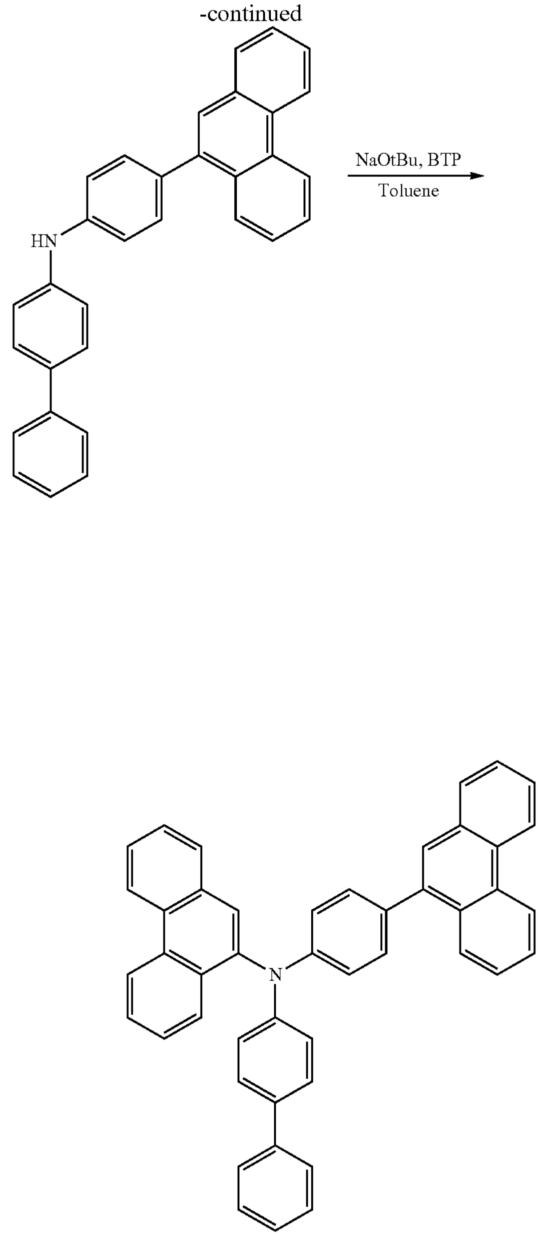

2-1

After adding toluene (200 ml) to 9-bromophenanthrene (15.0 g, 58.34 mmol), N-(4-(phenanthren-9-yl)phenyl)-[1.1'-biphenyl]-4-amine (25.08 g, 59.50 mmol) and sodium tert-butoxide (7.85 g, 81.68 mmol), the result was stirred for 10 minutes while heating. To the mixture, bis(tri-tert-butylphosphine)palladium (BTP, 0.09 g, 0.18 mmol) dissolved in toluene (10 ml) was added, and the result was stirred for 1 hour while heating. After the reaction was terminated and the result was filtered, the layers were separated using toluene and water. After removing the solvent, the result was recrystallized with ethyl acetate to obtain Compound 2-1 (25.5 g, 73.12% yield). (MS[M+H]+=598)

Synthesis Example 7. Synthesis of Compound 2-2

Step 1) Synthesis of Compound 2-2-A

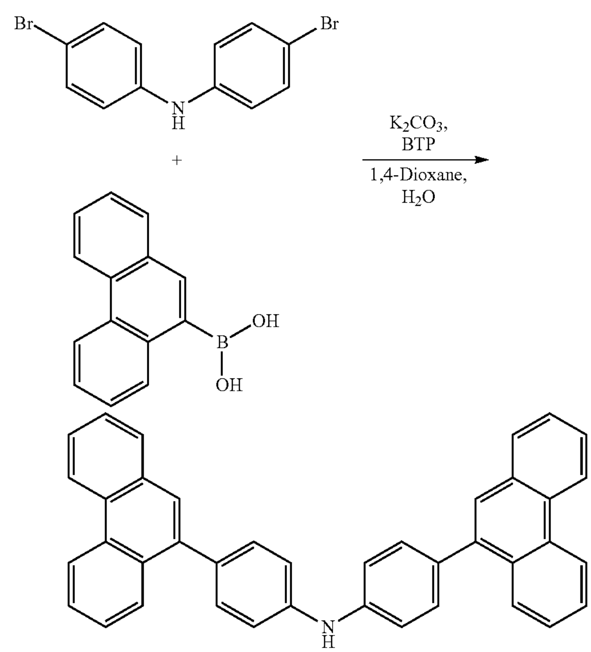

2-2-A

After dissolving bis(4-bromophenyl)amine (50.0 g, 152.90 mmol) and phenanthren-9-ylboronic acid (72.30 g, 321.08 mmol) in 1,4-dioxane (600 ml), a potassium carbonate (105.66 g, 764.50 mmol:water 300 ml) solution was added thereto, and the result was stirred for 10 minutes while heating. To the solution, bis(tri-tert-butylphosphine)palladium (BTP, 0.23 g, 0.46 mmol) dissolved in 1,4-dioxane (10 ml) was added, and the result was stirred for 1 hour while heating. After the reaction was terminated and the result was filtered, the layers were separated using chloroform and water. After removing the solvent, the result was recrystallized with ethyl acetate to obtain Compound 2-2-A (65.0 g, 81.49% yield).

Step 2) Synthesis of Compound 2-2

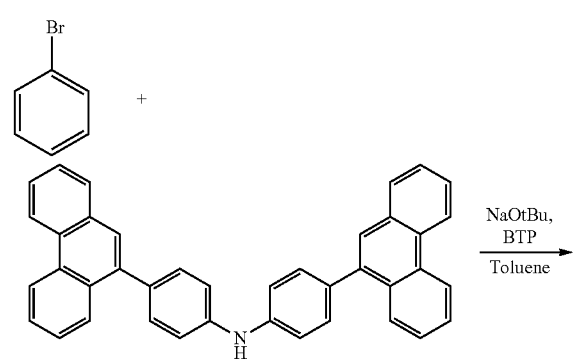

2-2-A

-continued

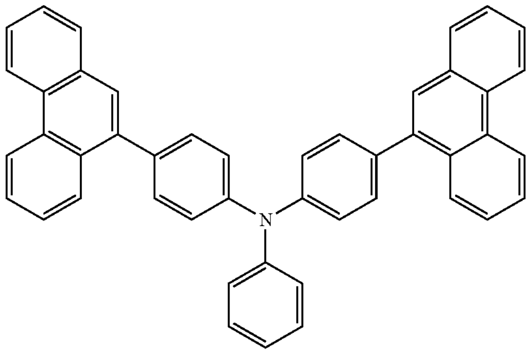

2-2

After adding toluene (250 ml) to bromobenzene (10.00 g, 63.69 mmol), Compound 2-2-A (33.89 g, 64.96 mmol) obtained in Step 1 of Synthesis Example 7 and sodium tert-butoxide (8.57 g, 89.17 mmol), the result was stirred for 10 minutes while heating. To the mixture, bis(tri-tert-butylphosphine)palladium (BTP, 0.11 g, 0.21 mmol) dissolved in toluene (10 ml) was added, and the result was stirred for 1 hour while heating. After the reaction was terminated and the result was filtered, the layers were separated using toluene and water. After removing the solvent, the result was recrystallized with ethyl acetate to obtain Compound 2-2 (30.5 g, 80.11% yield). (MS[M+H]+=598)

Synthesis Example 8. Synthesis of Compound 2-3

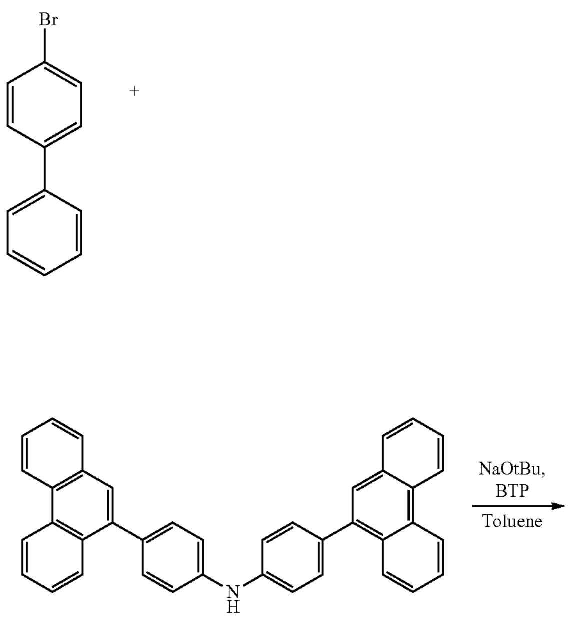

2-2-A

-continued

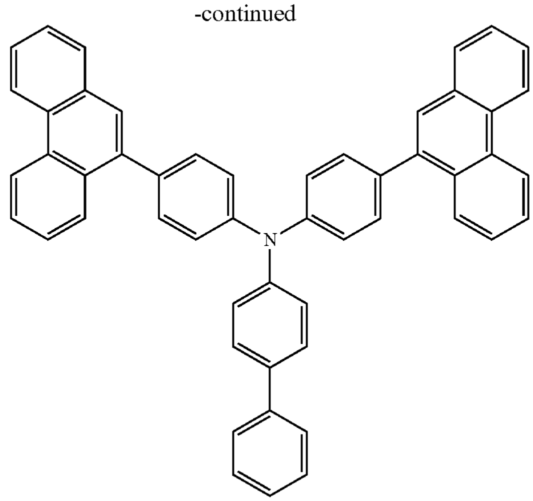

2-3

Compound 2-3 (35.8 g, 82.56% yield) was obtained in the same manner as in Step 2 of Synthesis Example 7 except that 4-bromo-1,1'-biphenyl (15.0 g, 64.35 mmol) and Compound 2-2-A (34.24 g, 65.63 mmol) obtained in Step 1 of Synthesis Example 7 were used as starting materials. (MS[M+H]+=674)

Synthesis Example 9. Synthesis of Compound 2-4

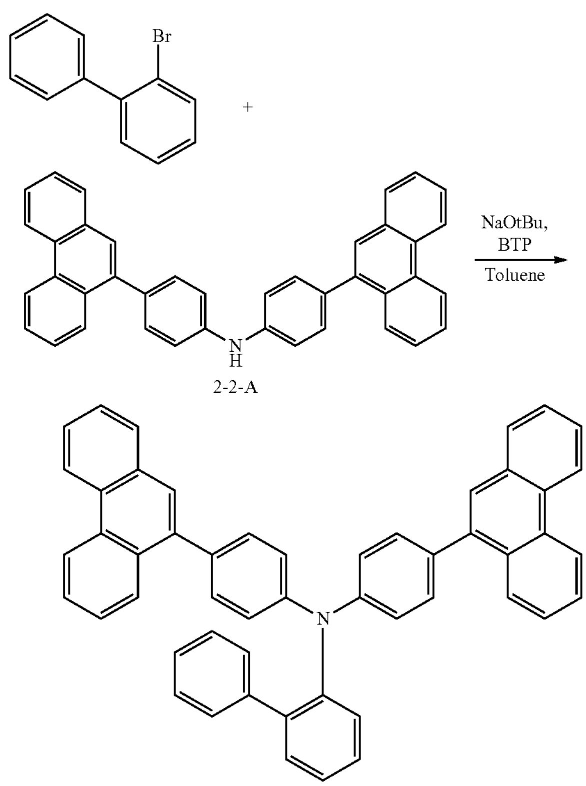

2-4

Compound 2-4 (33.5 g, 77.25% yield) was obtained in the same manner as in Step 2 of Synthesis Example 7 except that 2-bromo-1,1'-biphenyl (15.0 g, 64.35 mmol) and Compound 2-2-A (34.24 g, 65.63 mmol) obtained in Step 1 of Synthesis Example 7 were used as starting materials. (MS[M+H]+=674)

Synthesis Example 10. Synthesis of Compound 2-5

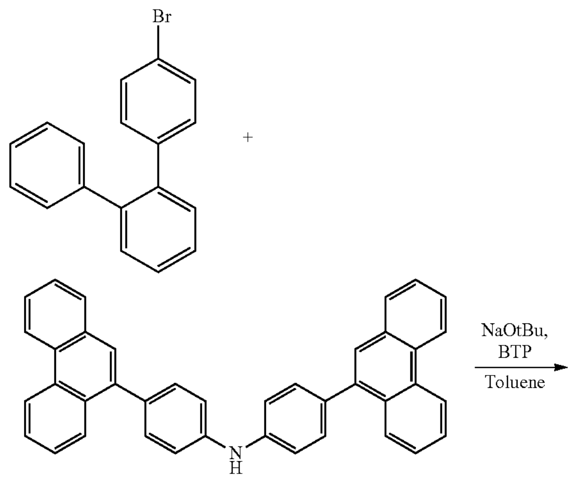

2-2-A

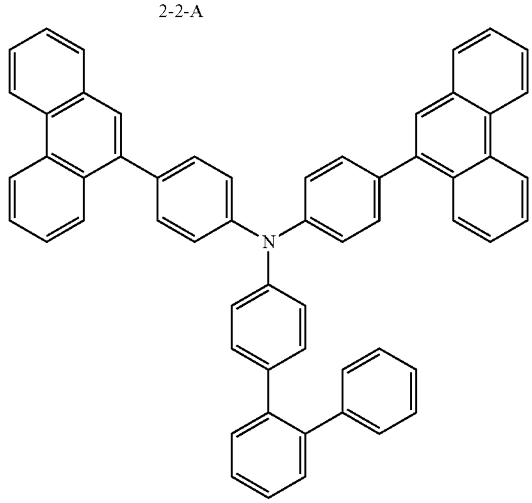

2-5

Compound 2-5 (28.8 g, 79.16% yield) was obtained in the same manner as in Step 2 of Synthesis Example 7 except that 4-bromo-1,1':2',1"-terphenyl (15.0 g, 48.51 mmol) and Compound 2-2-A (25.81 g, 49.48 mmol) obtained in Step 1 of Synthesis Example 7 were used as starting materials. (MS[M+H]+=750)

Synthesis Example 11. Synthesis of Compound 2-6

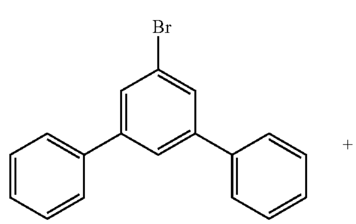

-continued

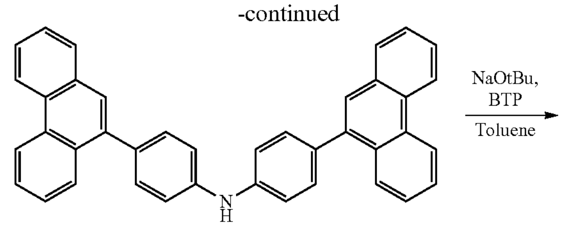

2-2-A

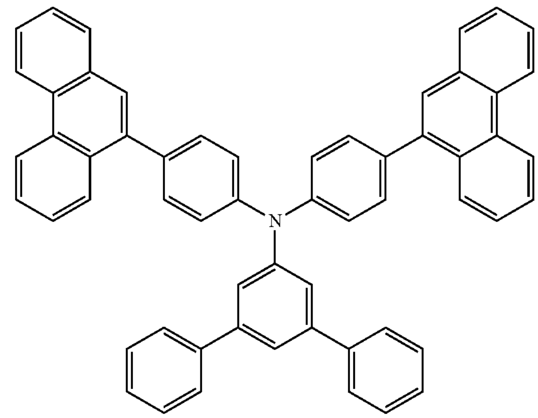

2-6

Compound 2-6 (29.30 g, 80.54% yield) was obtained in the same manner as in Step 2 of Synthesis Example 7 except that 5'-bromo-1,1':3',1"-terphenyl (15.0 g, 48.51 mmol) and Compound 2-2-A (25.81 g, 49.48 mmol) obtained in Step 1 of Synthesis Example 7 were used as starting materials. (MS[M+H]+=750)

Synthesis Example 12. Synthesis of Compound 2-7

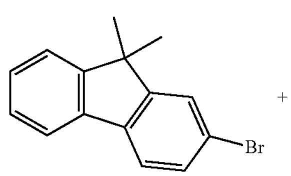

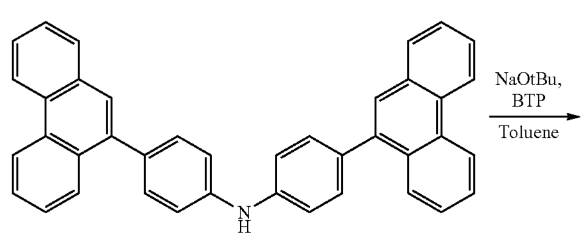

2-2-A

-continued

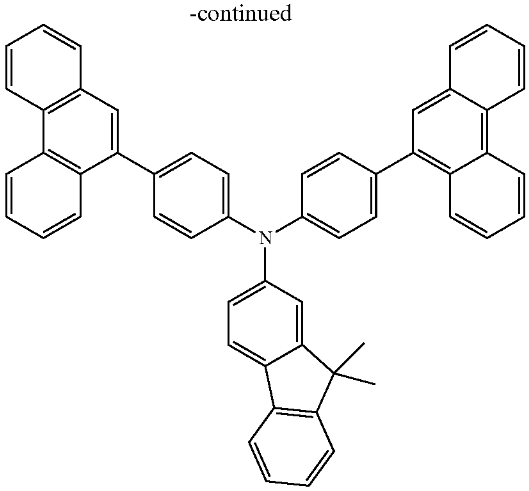

2-7

Compound 2-7 (30.30 g, 77.29% yield) was obtained in the same manner as in Step 2 of Synthesis Example 7 except that 2-bromo-9,9-dimethyl-9H-fluorene (15.0 g, 54.91 mmol) and Compound 2-2-A (29.22 g, 56.01 mmol) obtained in Step 1 of Synthesis Example 7 were used as starting materials. (MS[M+H]+=714)

Synthesis Example 13. Synthesis of Compound 2-8

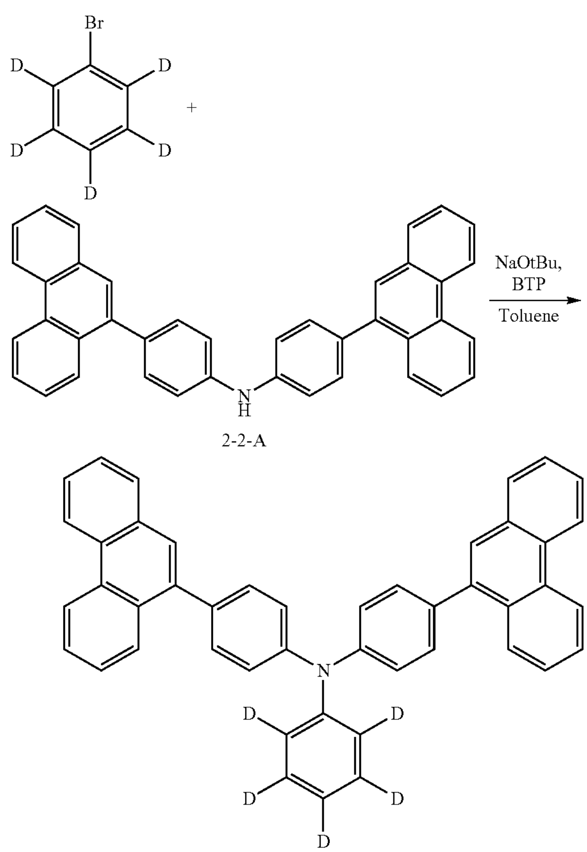

2-8

Compound 2-8 (30.0 g, 80.65% yield) was obtained in the same manner as in Step 2 of Synthesis Example 7 except that 1-bromobenzene-2,3,4,5,6-d5 (10.0 g, 61.71 mmol) and Compound 2-2-A (32.84 g, 62.95 mmol) obtained in Step 1 of Synthesis Example 7 were used as starting materials. (MS[M+H]+=603)

Synthesis Example 14. Synthesis of Compound 2-9

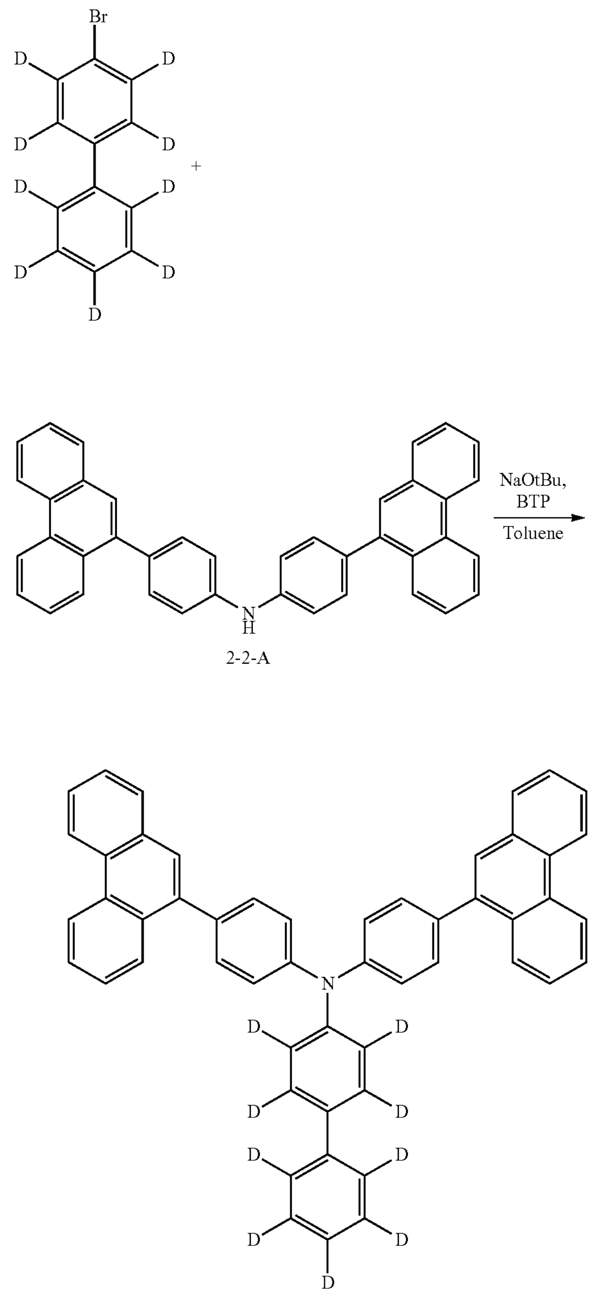

2-9

Compound 2-9 (23.0 g, 81.55% yield) was obtained in the same manner as in Step 2 of Synthesis Example 7 except that 4-bromo-1,1'-biphenyl-2,2',3,3',4',5,5',6,6'-d9 (10.0 g, 41.30 mmol) and Compound 2-2-A (21.97 g, 42.12 mmol) obtained in Step 1 of Synthesis Example 7 were used as starting materials. (MS[M+H]+=683)

Synthesis Example 15. Synthesis of Compound 2-10

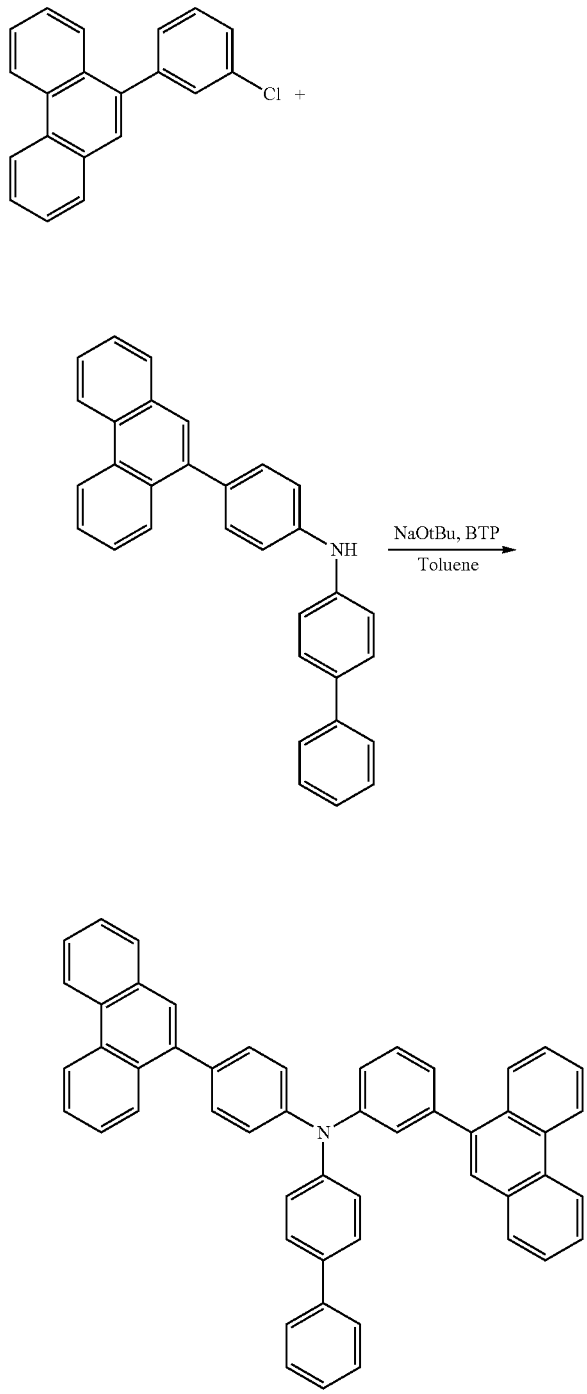

2-10

Compound 2-10 (28.0 g, 80.00% yield) was obtained in the same manner as in Synthesis Example 6 except that 9-(3-chlorophenyl)phenanthrene (15.0 g, 51.94 mmol) and N-(4-(phenanthren-9-yl)phenyl)-[1,1'-biphenyl]-4-amine (22.33 g, 52.98 mmol) were used as starting materials. (MS[M+H]+=674)

Synthesis Example 16. Synthesis of Compound 2-11

Step 1) Synthesis of Compound 2-11-A

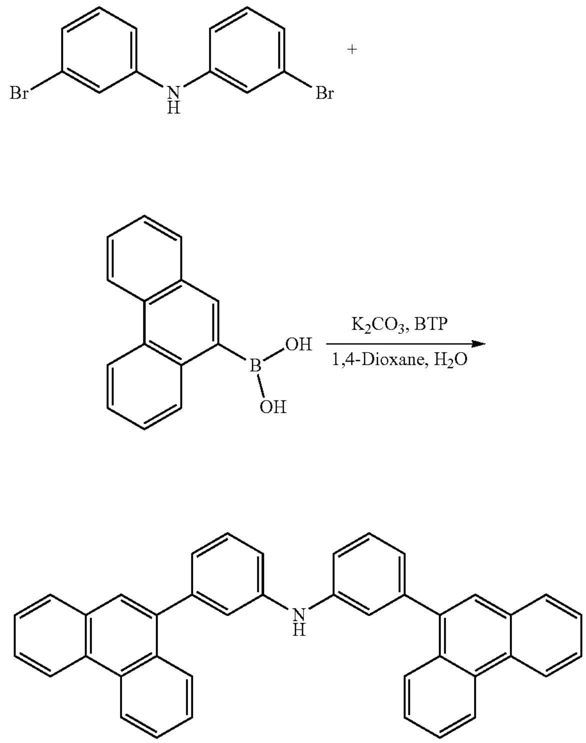

2-11-A

Compound 2-11-A (58.0 g, 72.72% yield) was obtained in the same manner as in Step 1 of Synthesis Example 7 except that bis(3-bromophenyl)amine (50.0 g, 152.90 mmol) and phenanthren-9-ylboronic acid (72.30 g, 321.08 mmol) were used as starting materials.

Step 2) Synthesis of Compound 2-11

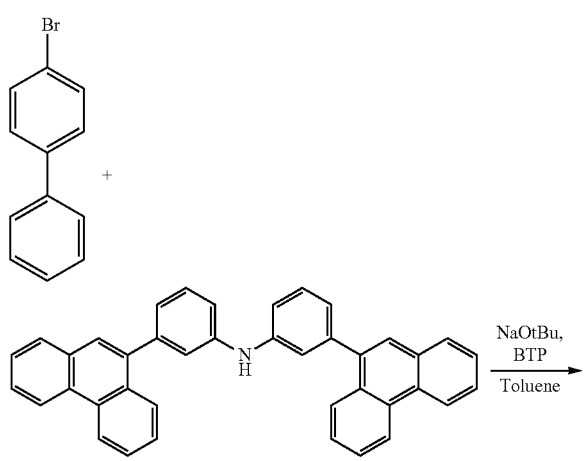

2-11-A

-continued

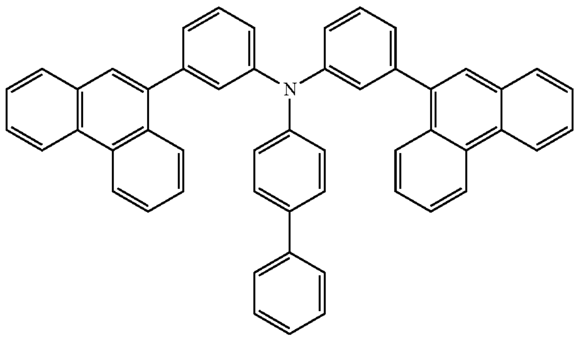

2-11

Compound 2-11 (32.8 g, 75.64% yield) was obtained in the same manner as in Step 2 of Synthesis Example 7 except that 4-bromo-1,1'-biphenyl (15.00 g, 64.35 mmol) and Compound 2-11-A (34.24 g, 65.63 mmol) obtained in Step 1 of Synthesis Example 16 were used as starting materials. (MS[M+H]+=674)

Synthesis Example 17. Synthesis of Compound 2-12

Step 1) Synthesis of Compound 2-12-A

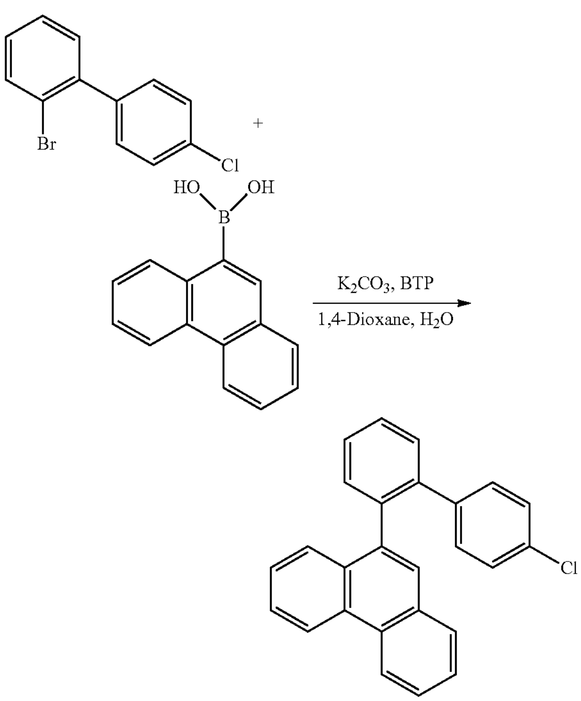

2-12-A

Compound 2-12-A (50.0 g, 73.33% yield) was obtained in the same manner as in Step 1 of Synthesis Example 7 except that 2-bromo-4'-chloro-1,1'-biphenyl (50.0 g, 186.88 mmol) and phenanthren-9-ylboronic acid (43.57 g, 196.23 mmol) were used as starting materials.

Step 2) Synthesis of Compound 2-12

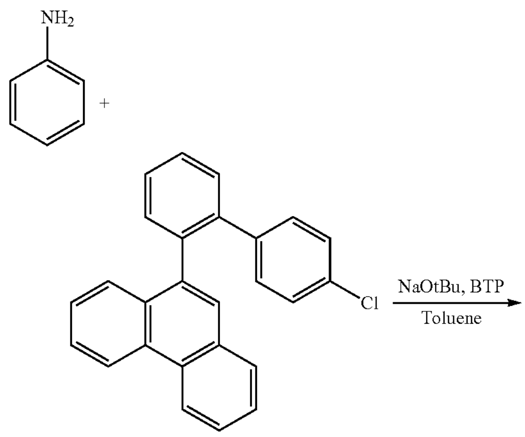

2-12-A

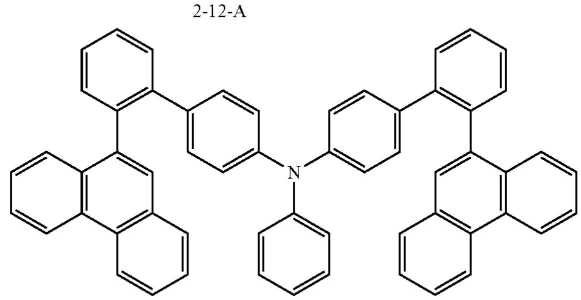

2-12

Compound 2-12 (32.0 g, 79.47% yield) was obtained in the same manner as in Step 2 of Synthesis Example 7 except that aniline (5.00 g, 53.69 mmol) and Compound 2-12-A (40.16 g, 110.06 mmol) obtained in Step 1 of Synthesis Example 17 were used as starting materials. (MS[M+H]+=750)

Synthesis Example 18. Synthesis of Compound 2-13

Step 1) Synthesis of Compound 2-13-A

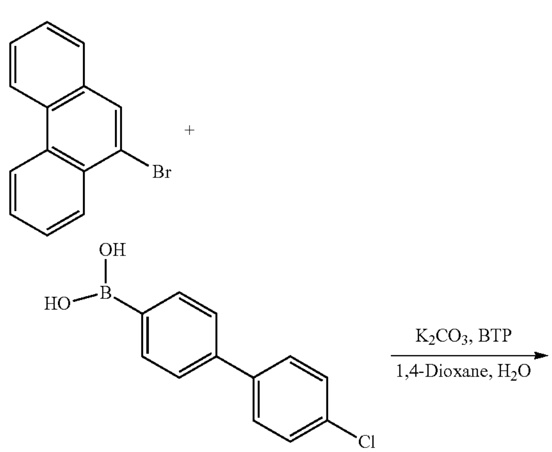

-continued

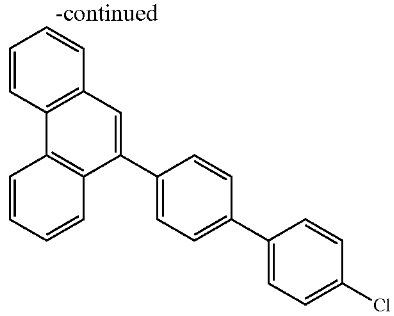

2-13-A

Compound 2-13-A (30.0 g, 70.47% yield) was obtained in the same manner as in Step 1 of Synthesis Example 7 except that 9-bromophenanthrene (30.0 g, 116.67 mmol) and (4'-chloro-[1,1'-biphenyl]-4-yl)boronic acid (28.48 g, 122.51 mmol) were used as starting materials.

Step 2) Synthesis of Compound 2-13

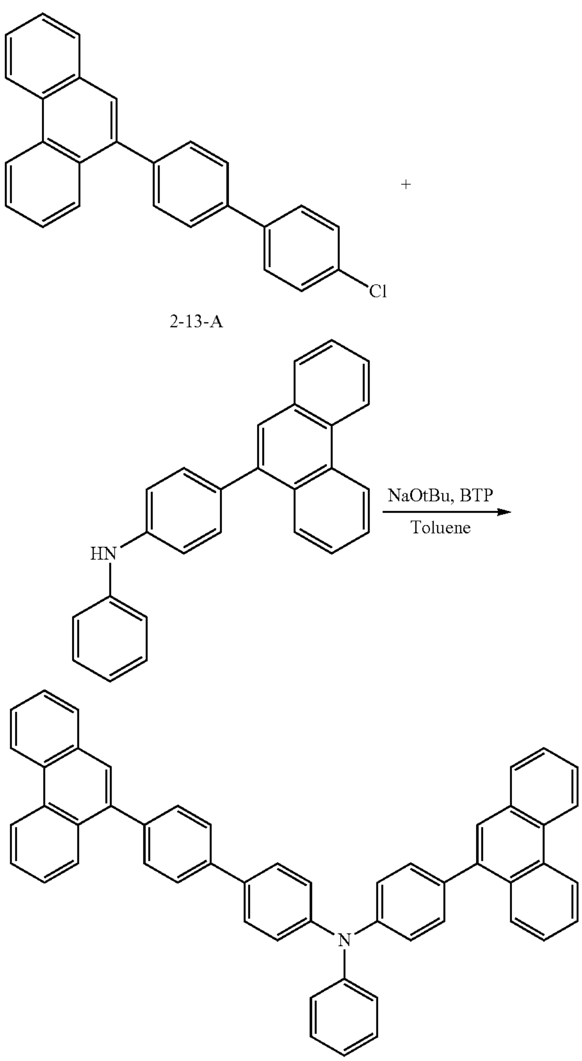

2-13-A 2-13

Compound 2-13 (22.2 g, 80.14% yield) was obtained in the same manner as in Step 2 of Synthesis Example 7 except that 9-(4'-chloro-[1,1'-biphenyl]-4-yl)phenanthrene (15.00 g, 41.11 mmol) and Compound 2-13-A (14.49 g, 41.93 mmol) obtained in Step 1 of Synthesis Example 18 were used as starting materials. (MS[M+H]+=674)

Synthesis Example 19. Synthesis of Compound 2-14

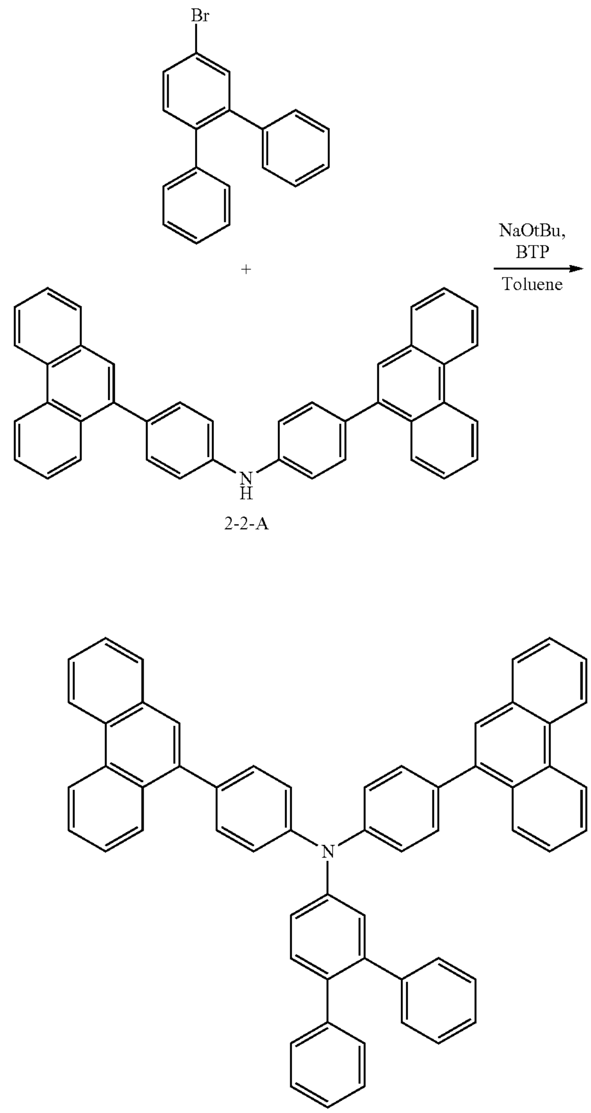

2-2-A 2-14

Compound 2-14 (29.5 g, 81.09% yield) was obtained in the same manner as in Step 2 of Synthesis Example 7 except that 4'-bromo-1,1':2',1"-terphenyl (15.0 g, 48.51 mmol) and Compound 2-2-A (25.81 g, 49.48 mmol) obtained in Step 1 of Synthesis Example 7 were used as starting materials. (MS[M+H]+=750)

Synthesis Example 20. Synthesis of Compound 2-15

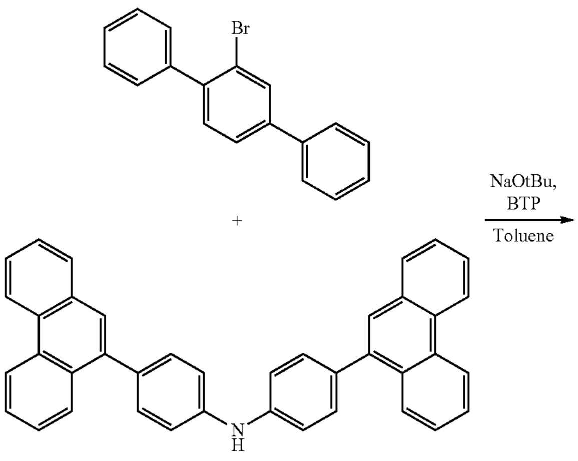

2-2-A

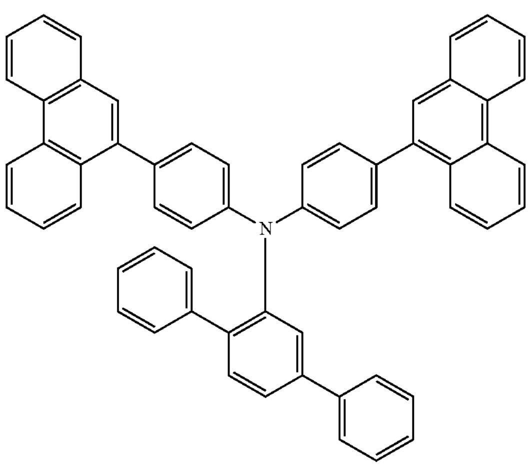

2-15

Compound 2-15 (28.5 g, 78.33% yield) was obtained in the same manner as in Step 2 of Synthesis Example 7 except that 2'-bromo-1,1':4',1"-terphenyl (15.0 g, 48.51 mmol) and Compound 2-2-A (25.81 g, 49.48 mmol) obtained in Step 1 of Synthesis Example 7 were used as starting materials. (MS[M+H]+=750)

Synthesis Example 21. Synthesis of Compound 2-16

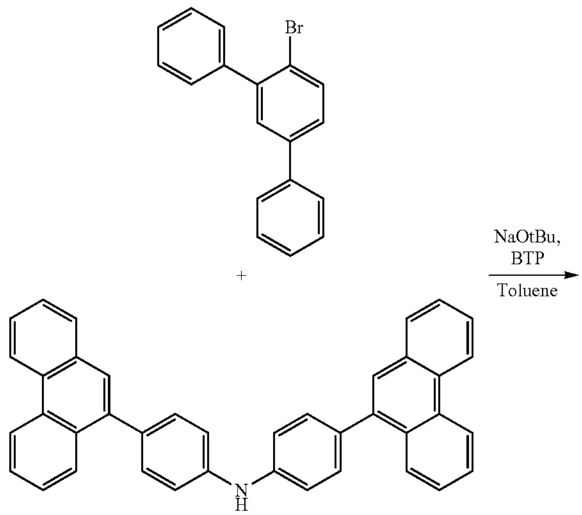

2-2-A

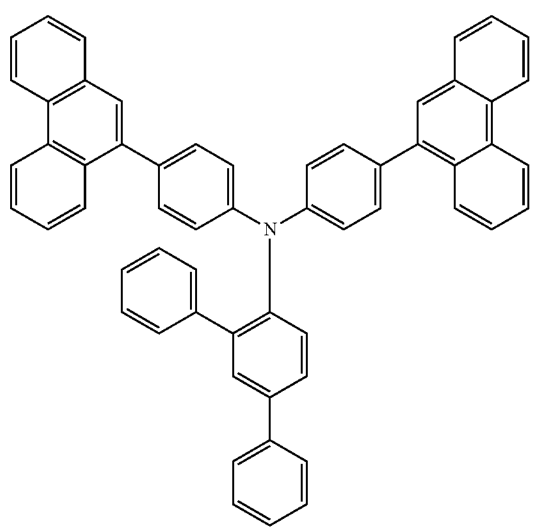

2-16

Compound 2-16 (29.3 g, 80.54% yield) was obtained in the same manner as in Step 2 of Synthesis Example 7 except that 4'-bromo-1,1':3',1"-terphenyl (15.0 g, 48.51 mmol) and Compound 2-2-A (25.81 g, 49.48 mmol) obtained in Step 1 of Synthesis Example 7 were used as starting materials. (MS[M+H]+=750)

Synthesis Example 22. Synthesis of Compound 2-17

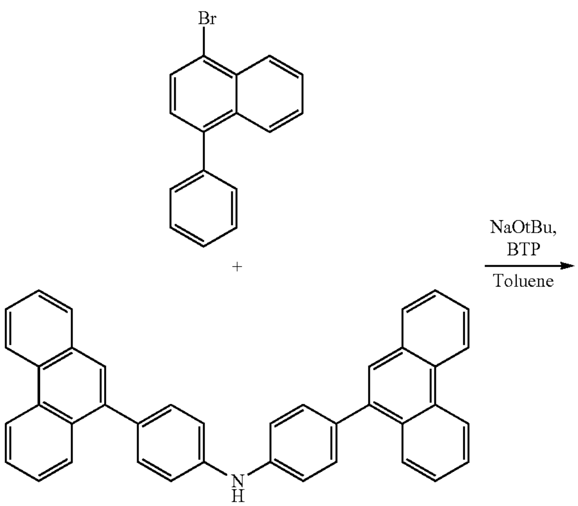

2-2-A

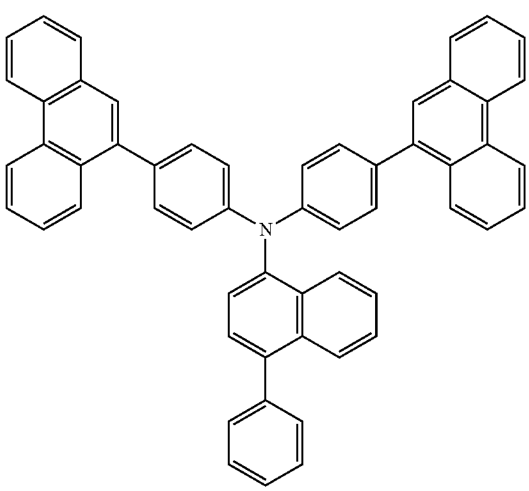

2-17

Compound 2-17 (30.0 g, 78.23% yield) was obtained in the same manner as in Step 2 of Synthesis Example 7 except that 1-bromo-4-phenylnaphthalene (15.0 g, 52.97 mmol) and Compound 2-2-A (28.19 g, 54.03 mmol) obtained in Step 1 of Synthesis Example 7 were used as starting materials. (MS[M+H]+=724)

Synthesis Example 23. Synthesis of Compound 2-18

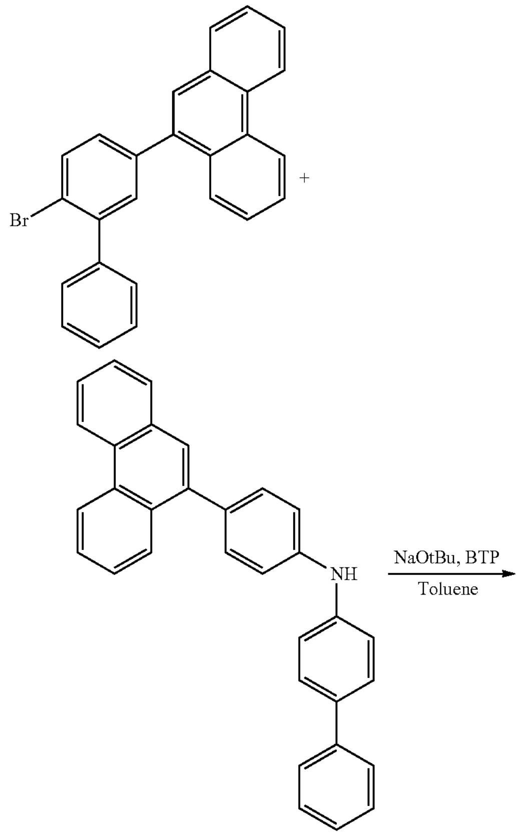

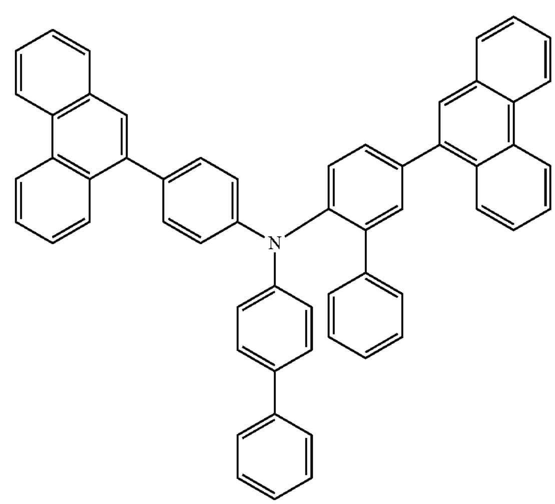

2-18

Compound 2-18 (22.0 g, 80.04% yield) was obtained in the same manner as in Step 2 of Synthesis Example 7 except that 9-(6-bromo-[1,1'-biphenyl]-3-yl)phenanthrene (15.0 g, 36.65 mmol) and N-(4-(phenanthren-9-yl)phenyl)-[1,1'-biphenyl]-4-amine (15.76 g, 37.38 mmol) were used as starting materials. (MS[M+H]+=750)

The organic light emitting device according to the present specification may be a top-emission type, a bottom-emission type or a dual-emission type depending on the materials used.

EXAMPLES AND COMPARATIVE EXAMPLES

Example 1

A glass substrate on which a thin film of indium tin oxide (ITO) coated to a thickness of 1,400 Å was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using oxygen plasma, and then transferred to a vacuum depositor.

On the transparent ITO electrode prepared as above, a compound represented by the following Chemical Formula HAT was thermal vacuum deposited to a thickness of 100 Å to form a hole injection layer. Compound 1-1 prepared in Synthesis Example 1 was vacuum deposited to a thickness of 1150 Å thereon as a hole transfer layer, and as an electron blocking layer, Compound 2-1 prepared in Synthesis Example 6 was thermal vacuum deposited to a thickness of 150 Å. Subsequently, a compound represented by the following Chemical Formula BH and a compound represented by the following Chemical Formula BD were vacuum deposited in a weight ratio of 25:1 to a thickness of 200 Å as a light emitting layer. Then, as a hole blocking layer, a compound represented by the following Chemical Formula HB1 was vacuum deposited to a thickness of 50 Å. Subsequently, a compound represented by the following Chemical Formula ET1 and a compound represented by the following LiQ were thermal vacuum deposited in a weight ratio of 1:1 to a thickness of 310 Å as a layer carrying out electron transfer and electron injection at the same time. On the electron transfer and electron injection layer, a cathode was formed by consecutively depositing lithium fluoride (LiF) to a thickness of 12 Å and aluminum to a thickness of 1000 Å, and as a result, an organic light emitting device was manufactured.

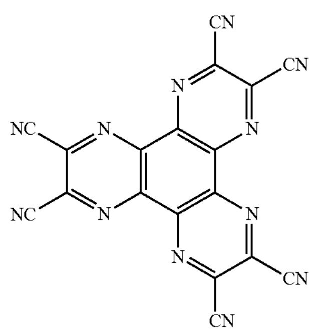

HAT

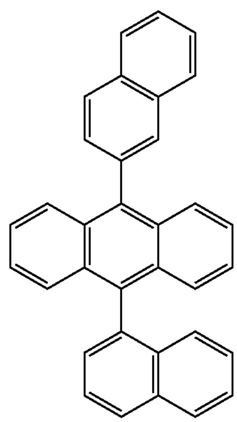

BH

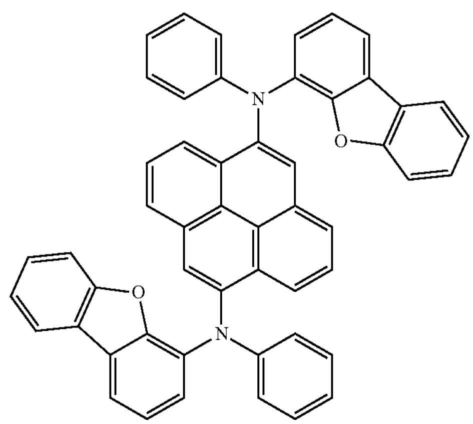

BD

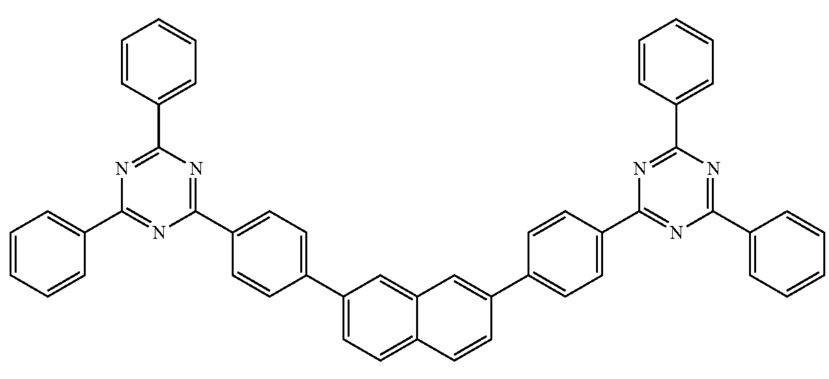

ET1

-continued

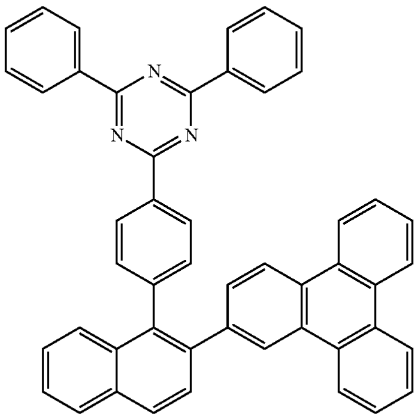

HB1

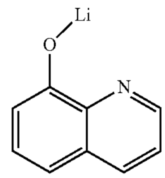

LiQ

Examples 2 to 51 and Comparative Examples 1 to 9

Organic light emitting devices of Examples 2 to 51 and Comparative Examples 1 to 9 were manufactured in the same manner as in Example 1 except that compounds described in the following Table 1 were used instead of Compound 1-1 as the hole transfer layer, and compounds described in the following Table 1 were used instead of Compound 2-1 as the electron blocking layer. When applying a current of 10 mA/cm$^2$ to each of the organic light emitting devices manufactured in the examples and the comparative examples, voltage, efficiency, color coordinate and lifetime were measured, and the results are shown in the following Table 1. Meanwhile, T95 means time taken for luminance decreasing to 95% from initial luminance (6000 nit).

In the following Table 1, Compounds HT1 and HT2 used as the hole transfer layer are represented by the following Chemical Formulae HT1 and HT2, respectively, and Compounds EB1 and EB2 used as the electron blocking layer are represented by the following Chemical Formulae EB1 and EB2, respectively.

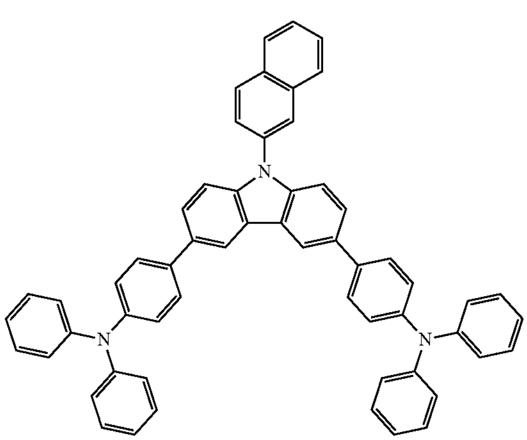

HT1

-continued

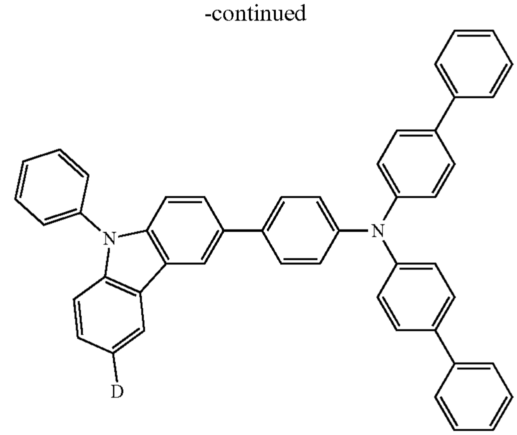

HT2

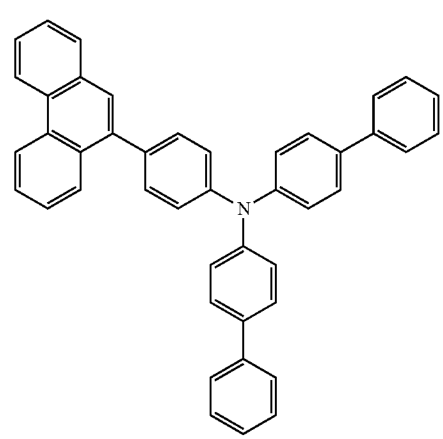

EB1

-continued

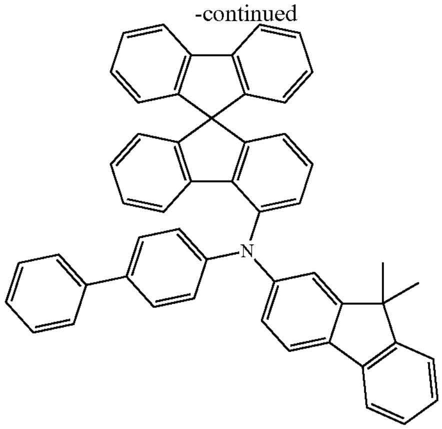

EB2

TABLE 1

| | Hole Transfer Layer | Electron Blocking Layer | Voltage (V @ 10 mA/cm$^2$) | Efficiency (cd/A @ 10 mA/cm$^2$) | Color Coordinate (x, y) | Lifetime (T95, hr) |
|---|---|---|---|---|---|---|
| Example 1 | Compound 1-1 | Compound 2-1 | 3.69 | 6.25 | 0.142, 0.044 | 250 |
| Example 2 | Compound 1-1 | Compound 2-2 | 3.62 | 6.42 | 0.142, 0.044 | 270 |
| Example 3 | Compound 1-1 | Compound 2-3 | 3.58 | 6.49 | 0.141, 0.043 | 280 |
| Example 4 | Compound 1-1 | Compound 2-4 | 3.58 | 6.43 | 0.141, 0.043 | 265 |
| Example 5 | Compound 1-1 | Compound 2-5 | 3.62 | 6.49 | 0.141, 0.044 | 280 |
| Example 6 | Compound 1-1 | Compound 2-6 | 3.67 | 6.33 | 0.141, 0.043 | 250 |
| Example 7 | Compound 1-1 | Compound 2-7 | 3.55 | 6.31 | 0.142, 0.043 | 260 |
| Example 8 | Compound 1-1 | Compound 2-8 | 3.62 | 6.41 | 0.142, 0.044 | 275 |
| Example 9 | Compound 1-1 | Compound 2-9 | 3.60 | 6.46 | 0.141, 0.043 | 280 |
| Example 10 | Compound 1-1 | Compound 2-10 | 3.62 | 6.45 | 0.142, 0.044 | 265 |
| Example 11 | Compound 1-1 | Compound 2-11 | 3.63 | 6.43 | 0.142, 0.043 | 260 |
| Example 12 | Compound 1-1 | Compound 2-12 | 3.62 | 6.47 | 0.141, 0.044 | 260 |
| Example 13 | Compound 1-1 | Compound 2-13 | 3.63 | 6.44 | 0.141, 0.044 | 270 |
| Example 14 | Compound 1-1 | Compound 2-14 | 3.69 | 6.40 | 0.141, 0.044 | 260 |
| Example 15 | Compound 1-1 | Compound 2-15 | 3.64 | 6.38 | 0.142, 0.044 | 265 |
| Example 16 | Compound 1-1 | Compound 2-17 | 3.62 | 6.41 | 0.141, 0.044 | 270 |
| Example 17 | Compound 1-2 | Compound 2-1 | 3.69 | 6.26 | 0.142, 0.044 | 255 |
| Example 18 | Compound 1-2 | Compound 2-2 | 3.61 | 6.31 | 0.141, 0.044 | 265 |
| Example 19 | Compound 1-2 | Compound 2-3 | 3.58 | 6.38 | 0.142, 0.044 | 275 |
| Example 20 | Compound 1-2 | Compound 2-4 | 3.57 | 6.33 | 0.142, 0.043 | 260 |
| Example 21 | Compound 1-2 | Compound 2-5 | 3.60 | 6.38 | 0.142, 0.044 | 275 |
| Example 22 | Compound 1-2 | Compound 2-6 | 3.65 | 6.30 | 0.142, 0.044 | 265 |
| Example 23 | Compound 1-2 | Compound 2-7 | 3.56 | 6.23 | 0.142, 0.044 | 260 |
| Example 24 | Compound 1-2 | Compound 2-8 | 3.61 | 6.30 | 0.141, 0.044 | 270 |
| Example 25 | Compound 1-2 | Compound 2-9 | 3.58 | 6.36 | 0.142, 0.044 | 275 |

TABLE 1-continued

| | Hole Transfer Layer | Electron Blocking Layer | Voltage (V @ 10 mA/cm$^2$) | Efficiency (cd/A @ 10 mA/cm$^2$) | Color Coordinate (x, y) | Lifetime (T95, hr) |
|---|---|---|---|---|---|---|
| Example 26 | Compound 1-2 | Compound 2-10 | 3.60 | 6.36 | 0.141, 0.044 | 260 |
| Example 27 | Compound 1-2 | Compound 2-11 | 3.63 | 6.35 | 0.142, 0.044 | 255 |
| Example 28 | Compound 1-2 | Compound 2-12 | 3.60 | 6.35 | 0.141, 0.044 | 265 |
| Example 29 | Compound 1-2 | Compound 2-13 | 3.63 | 6.32 | 0.142, 0.043 | 265 |
| Example 30 | Compound 1-2 | Compound 2-14 | 3.60 | 6.41 | 0.142, 0.043 | 270 |
| Example 31 | Compound 1-2 | Compound 2-15 | 3.64 | 6.38 | 0.141, 0.044 | 265 |
| Example 32 | Compound 1-2 | Compound 2-16 | 3.63 | 6.35 | 0.142, 0.044 | 260 |
| Example 33 | Compound 1-2 | Compound 2-18 | 3.64 | 6.39 | 0.142, 0.043 | 265 |
| Example 34 | Compound 1-3 | Compound 2-2 | 3.66 | 6.28 | 0.142, 0.044 | 260 |
| Example 35 | Compound 1-3 | Compound 2-3 | 3.63 | 6.33 | 0.142, 0.044 | 265 |
| Example 36 | Compound 1-3 | Compound 2-4 | 3.62 | 6.30 | 0.141, 0.043 | 260 |
| Example 37 | Compound 1-3 | Compound 2-5 | 3.62 | 6.32 | 0.142, 0.043 | 265 |
| Example 38 | Compound 1-3 | Compound 2-8 | 3.66 | 6.28 | 0.142, 0.044 | 265 |
| Example 39 | Compound 1-3 | Compound 2-12 | 3.64 | 6.30 | 0.141, 0.044 | 255 |
| Example 40 | Compound 1-4 | Compound 2-2 | 3.67 | 6.29 | 0.142, 0.043 | 260 |
| Example 41 | Compound 1-4 | Compound 2-3 | 3.62 | 6.33 | 0.141, 0.044 | 270 |
| Example 42 | Compound 1-4 | Compound 2-4 | 3.62 | 6.28 | 0.142, 0.043 | 260 |
| Example 43 | Compound 1-4 | Compound 2-5 | 3.64 | 6.30 | 0.141, 0.044 | 270 |
| Example 44 | Compound 1-4 | Compound 2-6 | 3.69 | 6.25 | 0.141, 0.044 | 260 |
| Example 45 | Compound 1-5 | Compound 2-2 | 3.62 | 6.28 | 0.141, 0.044 | 260 |
| Example 46 | Compound 1-5 | Compound 2-3 | 3.61 | 6.32 | 0.142, 0.043 | 265 |
| Example 47 | Compound 1-5 | Compound 2-4 | 3.60 | 6.29 | 0.141, 0.043 | 260 |
| Example 48 | Compound 1-5 | Compound 2-5 | 3.64 | 6.29 | 0.141, 0.044 | 260 |
| Example 49 | Compound 1-5 | Compound 2-6 | 3.68 | 6.27 | 0.142, 0.043 | 255 |
| Example 50 | Compound 1-5 | Compound 2-8 | 3.62 | 6.28 | 0.142, 0.044 | 265 |
| Example 51 | Compound 1-5 | Compound 2-12 | 3.62 | 6.30 | 0.141, 0.043 | 260 |
| Comparative Example 1 | Compound 1-1 | — | 5.50 | 3.25 | 0.145, 0.049 | 30 |
| Comparative Example 2 | — | Compound 2-2 | 6.21 | 3.10 | 0.145, 0.049 | 25 |
| Comparative Example 3 | HT1 | Compound 2-2 | 4.00 | 5.55 | 0.143, 0.047 | 215 |
| Comparative Example 4 | HT1 | Compound 2-3 | 4.05 | 5.66 | 0.143, 0.048 | 210 |
| Comparative Example 5 | HT2 | Compound 2-3 | 4.10 | 5.50 | 0.144, 0.048 | 220 |
| Comparative Example 6 | HT2 | Compound 2-5 | 4.07 | 5.55 | 0.144, 0.047 | 215 |
| Comparative Example 7 | Compound 1-1 | EB2 | 4.00 | 5.63 | 0.143, 0.048 | 225 |
| Comparative Example 8 | Compound 1-2 | EB1 | 4.01 | 5.35 | 0.143, 0.047 | 205 |
| Comparative Example 9 | Compound 1-2 | EB2 | 3.98 | 5.48 | 0.143, 0.048 | 215 |

As shown in Table 1, it was identified that the organic light emitting device using the compound represented by Chemical Formula 1 of the present disclosure as a hole transfer layer, and the compound represented by Chemical Formula 2 as an electron blocking layer was significantly effective in terms of driving voltage, efficiency and lifetime.

Particularly, when comparing Examples 1 to 16 and Comparative Example 1, the device including a hole transfer layer using Chemical Formula 1-1 without an electron blocking layer using the compound of Chemical Formula 2 had high voltage and low efficiency, and, particularly, significantly decreased lifetime.

When comparing Examples 2, 18 and 34 using both a hole transfer layer and an electron blocking layer using the compounds of the present disclosure with Comparative Example 2 using only an electron blocking layer, it was identified that Examples 2, 18 and 34 had significantly longer lifetime as well as having improved effects in terms of voltage and efficiency.

In addition, when comparing Comparative Examples 3 and 4 using HT1 in which the benzene rings of the carbazole are each substituted with two amine groups with Examples 2 and 3, it was seen that Examples 2 and 3 in which the benzene ring of the carbazole is substituted with only one amine group had properties of low voltage, high efficiency and long lifetime.

Comparative Examples 5 and 6 used HT2 in which the benzene ring of the carbazole not substituted with an amine group is substituted with deuterium. It was seen that Examples 3 and 5 using the compound of the present disclosure in which the corresponding benzene ring is not substituted with deuterium exhibited properties of low voltage, high efficiency and long lifetime.

In addition, it was seen that the organic light emitting device of the present disclosure exhibited properties of low voltage, high efficiency and long lifetime compared to Comparative Examples 7 to 9 using EB1 and EB2 in which the amine group is substituted with one phenanthrene group or not substituted.

The invention claimed is:

1. An organic light emitting device comprising:
a first electrode;
a second electrode provided to face the first electrode; and
an organic material layer having two or more layers provided between the first electrode and the second electrode,
wherein the organic material layer includes a first organic material layer including a compound of the following Chemical Formula 1 and a second organic material layer including a compound of the following Chemical Formula 2:

[Chemical Formula 1]

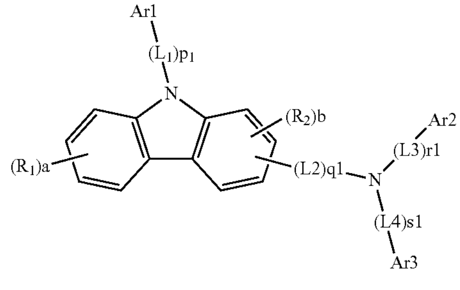

-continued

[Chemical Formula 2]

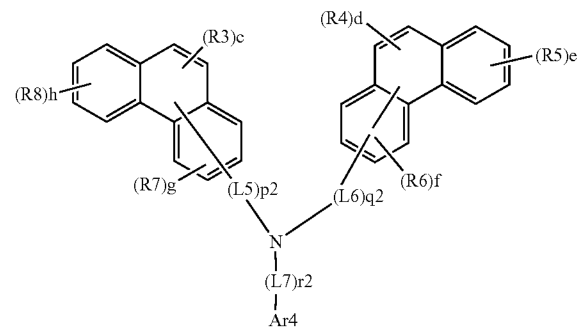

wherein, in Chemical Formulae 1 and 2:

Ar1 is hydrogen, deuterium, a nitrile group, a halogen group, a substituted or unsubstituted alkyl group, a substituted or unsubstituted aryl group, a substituted or unsubstituted arylalkyl group, a substituted or unsubstituted arylalkenyl group, or a substituted or unsubstituted heteroaryl group;

Ar2 and Ar3 are the same as or different from each other, and are each independently hydrogen, deuterium, a nitrile group, a halogen group, a substituted or unsubstituted alkyl group, a substituted or unsubstituted aryl group, a substituted or unsubstituted arylalkyl group, a substituted or unsubstituted arylalkenyl group, or a substituted or unsubstituted heteroaryl group having 3 to 12 carbon atoms;

Ar4 is hydrogen, deuterium, a nitrile group, a halogen group, a substituted or unsubstituted alkyl group, a substituted or unsubstituted aryl group; a substituted or unsubstituted arylalkyl group; a substituted or unsubstituted arylalkenyl group; or a heteroaryl group selected from among a carbazole group, a dibenzofuran group, and a dibenzothiophene group, wherein the carbazole group, the dibenzofuran group, or the dibenzothiophene group is unsubstituted or substituted with deuterium, a nitrile group, a phenyl group, a biphenyl group, a naphthyl group, a methyl group, an ethyl group, or a tert-butyl group;

R1 is hydrogen, a nitrile group, a halogen group, a substituted or unsubstituted alkyl group, a substituted or unsubstituted silyl group, an aryl group, a substituted or unsubstituted arylalkyl group, a substituted or unsubstituted arylalkenyl group, or a substituted or unsubstituted heteroaryl group;

R2 to R8 are the same as or different from each other, and are each independently hydrogen, deuterium, a nitrile group, a halogen group, a substituted or unsubstituted alkyl group, a substituted or unsubstituted silyl group, a substituted or unsubstituted aryl group, a substituted or unsubstituted arylalkyl group, a substituted or unsubstituted arylalkenyl group, or a substituted or unsubstituted heteroaryl group;

L1 to L5 are the same as or different from each other, and are each independently a direct bond, a substituted or unsubstituted alkylene group, a substituted or unsubstituted arylene group, or a substituted or unsubstituted heteroarylene group;

L6 is a substituted or unsubstituted alkylene group, a substituted or unsubstituted arylene group, or a substituted or unsubstituted heteroarylene group;

L7 is a direct bond, a substituted or unsubstituted alkylene group, or a substituted or unsubstituted arylene group, p1, q1, s1, p2, and r2 are each an integer of 0 to 2;

r1 is an integer of 1 to 2;

q2 is an integer of 1 to 2;

substituents in the parentheses are the same as or different from each other provided that p1, q1, r1, s1, p2, q2 and r2 are 2;

a and e to h are an integer of 0 to 4;

b is an integer of 0 to 3;

c and d are an integer of 0 to 2;

d+f≤5;

c+g≤5; and substituents in the parentheses are the same as or different from each other provided that a to f are 2 or greater.

2. The organic light emitting device of claim 1, wherein R1 is hydrogen, an aryl group having 6 to 30 carbon atoms, or a heteroaryl group having 3 to 30 carbon atoms.

3. The organic light emitting device of claim 1, wherein Ar1 to Ar3 are the same as or different from each other, and each independently hydrogen, deuterium, a nitrile group, a halogen group, a substituted or unsubstituted alkyl group having 1 to 10 carbon atoms, a substituted or unsubstituted aryl group having 6 to 30 carbon atoms, a substituted or unsubstituted arylalkyl group having 6 to 30 carbon atoms, a substituted or unsubstituted arylalkenyl group having 6 to 30 carbon atoms, or a substituted or unsubstituted heteroaryl group having 3 to 12 carbon atoms.

4. The organic light emitting device of claim 1, wherein L1 to L5 and L7 are the same as or different from each other, and each independently a direct bond; an arylene group having 6 to 30 carbon atoms that is unsubstituted or substituted with deuterium, an alkyl group or an aryl group; or a heteroarylene group that is unsubstituted or substituted with an aryl group having 3 to 30 carbon atoms and one or more heteroatoms selected from N, O and S.

5. The organic light emitting device of claim 1, wherein the first organic material layer includes a hole injection layer, a hole transfer layer, or a hole injection and transfer layer, and the hole injection layer, the hole transfer layer, or the hole injection and transfer layer includes the compound of Chemical Formula 1.

6. The organic light emitting device of claim 1, wherein the second organic material layer includes an electron blocking layer, and the electron blocking layer includes the compound of Chemical Formula 2.

* * * * *